United States Patent [19]

Kamata et al.

[11] Patent Number: 5,244,820
[45] Date of Patent: Sep. 14, 1993

[54] SEMICONDUCTOR INTEGRATED CIRCUIT DEVICE, METHOD FOR PRODUCING THE SAME, AND ION IMPLANTER FOR USE IN THE METHOD

[76] Inventors: Tadashi Kamata, 3-12-10-406, Minami-cho, Kokubunji-shi, Tokyo; Mitsuharu Honda, 250, Hitachi-wakakusaryo, 657-5, Nogami, Ohme-shi, Tokyo; Jun Sugiura, 1-22-16, Kichijojihigashi-cho, Musashino-shi, Tokyo; Nobuo Owada, 3-7-7, Daimon, Ohme-shi, Tokyo; Hizuru Yamaguchi, 103, Kohpoyamashita, 3-3-10, Kamidaira, Fussa-shi, Tokyo, all of Japan

[21] Appl. No.: 921,988

[22] Filed: Aug. 3, 1992

Related U.S. Application Data

[63] Continuation of Ser. No. 667,336, Mar. 11, 1990, abandoned.

[30] Foreign Application Priority Data

Mar. 9, 1990 [JP] Japan ................... 2-59100
Oct. 9, 1990 [JP] Japan ................... 2-271707

[51] Int. Cl.⁵ ........................................... H01L 21/265
[52] U.S. Cl. ............................. 437/20; 148/DIG. 83; 250/492.2; 315/111.81
[58] Field of Search ............ 437/20; 250/443.1, 492.7; 148/DIG. 83

[56] References Cited

U.S. PATENT DOCUMENTS

| 4,105,805 | 8/1978 | Glendinning et al. | 437/11 |
| 4,261,762 | 4/1981 | King | 437/20 |
| 4,453,080 | 6/1984 | Berkowitz | 250/443.1 |
| 4,659,392 | 4/1987 | Vasudev | 437/24 |
| 4,676,845 | 6/1987 | Spitzer | 437/25 |
| 4,806,769 | 2/1989 | Mori et al. | 250/492.2 |

FOREIGN PATENT DOCUMENTS

| 55-82771 | 6/1980 | Japan . |
| 59-28333 | 2/1984 | Japan . |
| 61-42843 | 3/1986 | Japan . |
| 61-264649 | 11/1986 | Japan . |

OTHER PUBLICATIONS

M. Salomi et al., "A Side-Entry Liquid Hi Cooled Stage . . . " *Journal of Physics E: Sci. Instrum.*, vol. 18, No. 4, pp. 331-333, Apr. 1985.
E. Bayer et al., "Cryo-Panel/Heat Absorber to Enhance Wafer Cooling . . . " *IBM Tech. Disc. Bulletin*, vol. 23, No. 10, pp. 4504-4505, Mar. 1981.
S. Wolf et al., *Silicon Processing for the VLSI Era:* vol. 1, Lattice Press, Sunset Beach, pp. 295-308 (1986).

*Primary Examiner*—Brian E. Hearn
*Assistant Examiner*—Laura M. Holtzman
*Attorney, Agent, or Firm*—Antonelli, Terry, Stout & Kraus

[57] ABSTRACT

The present invention relates to an ion implantation process in a wafer process for a semiconductor integrated circuit device. Particularly, according to the present invention, a shallow junction can be formed by performing the implantation of ion while holding a wafer to be processed at a low temperature.

37 Claims, 60 Drawing Sheets

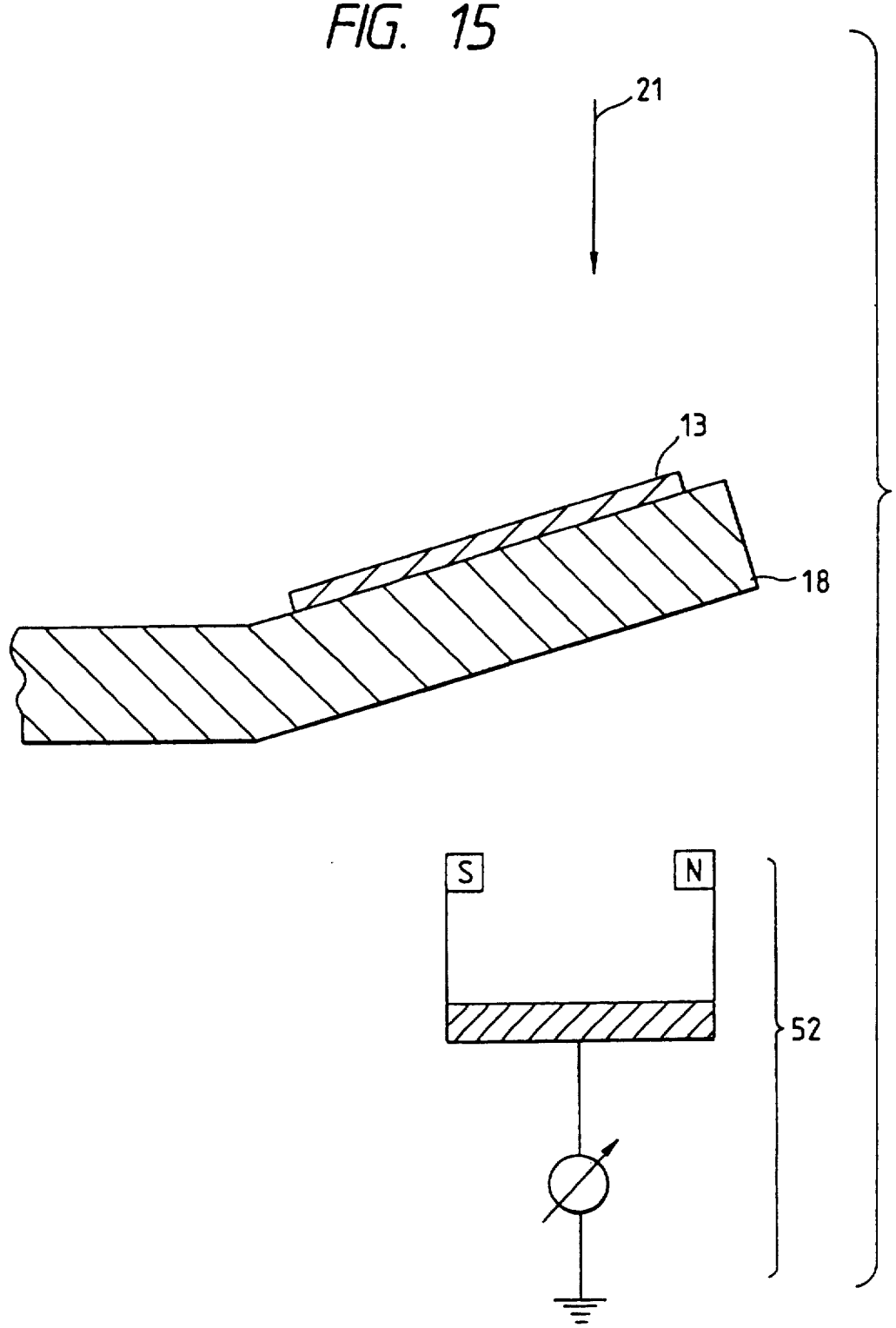

FIG. 16(a)  $P_2^+ + A \longrightarrow P^+ + P + A$

FIG. 16(b)  $P^{++} + A \longrightarrow P^+ + A^+$

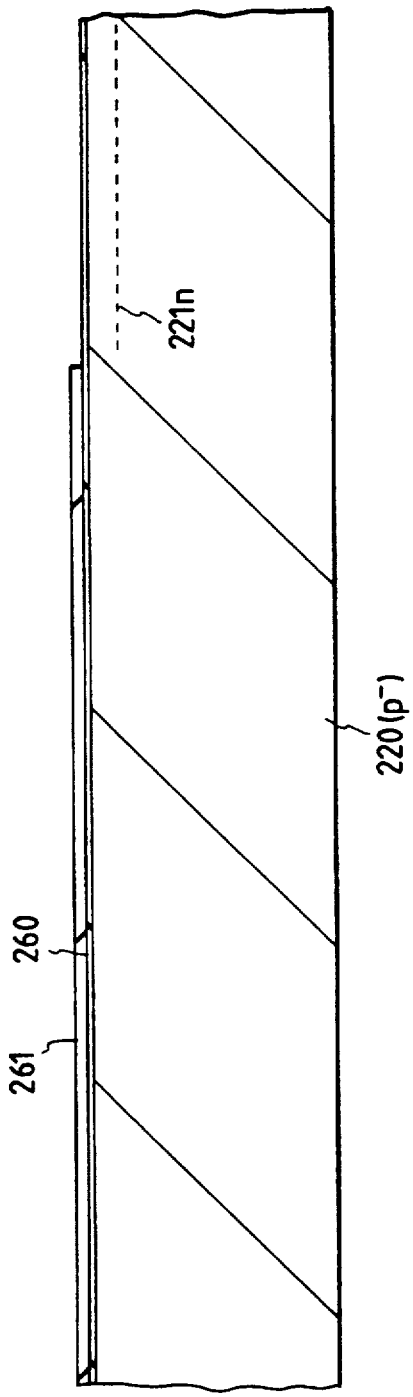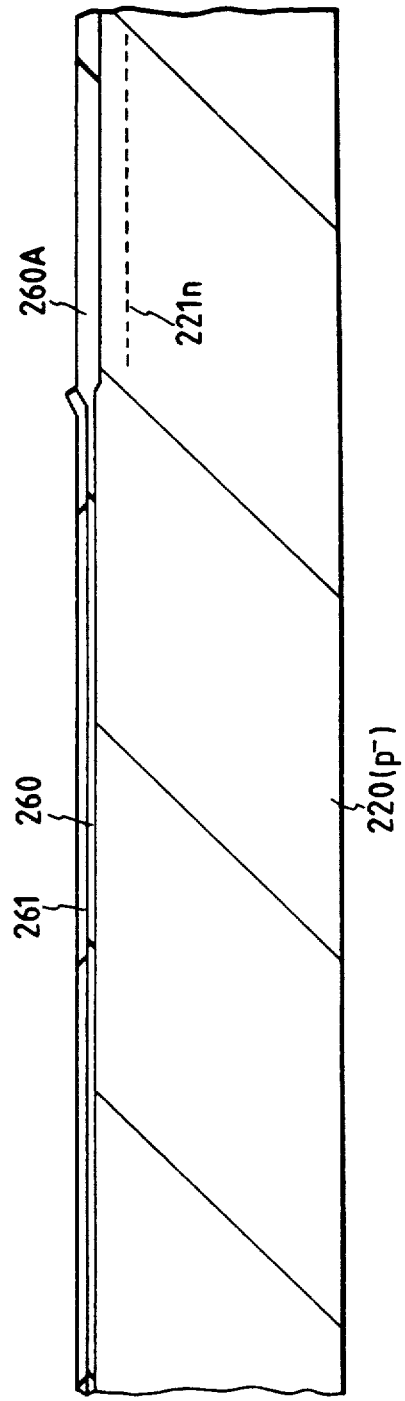

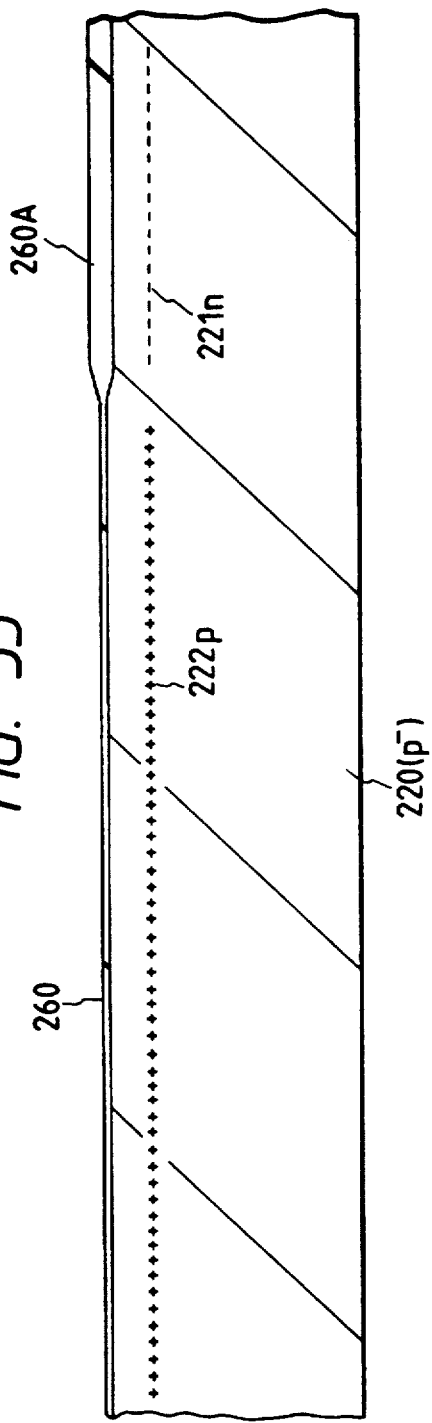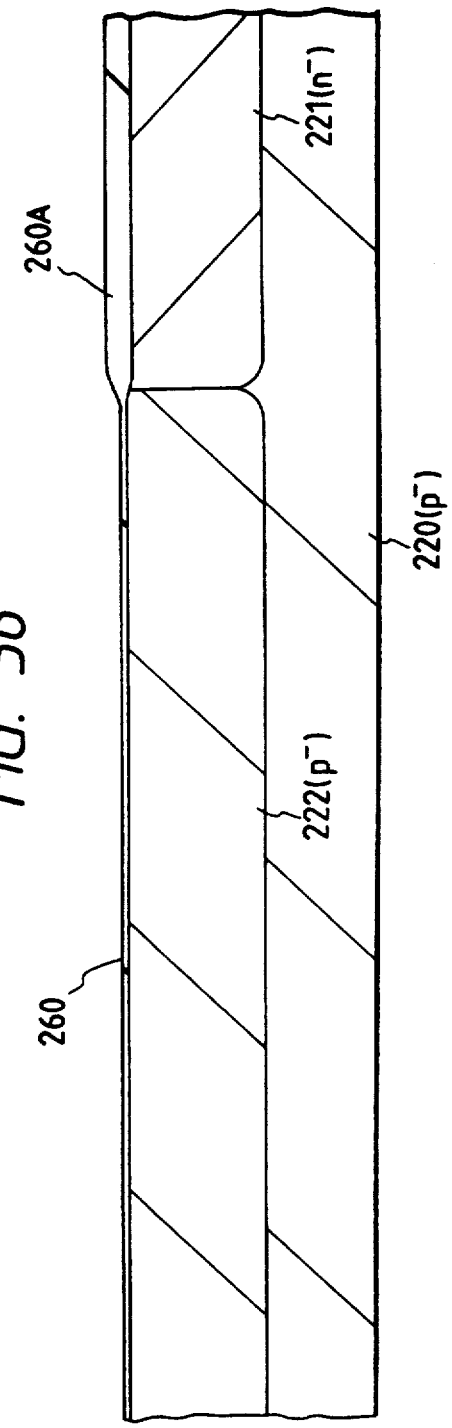

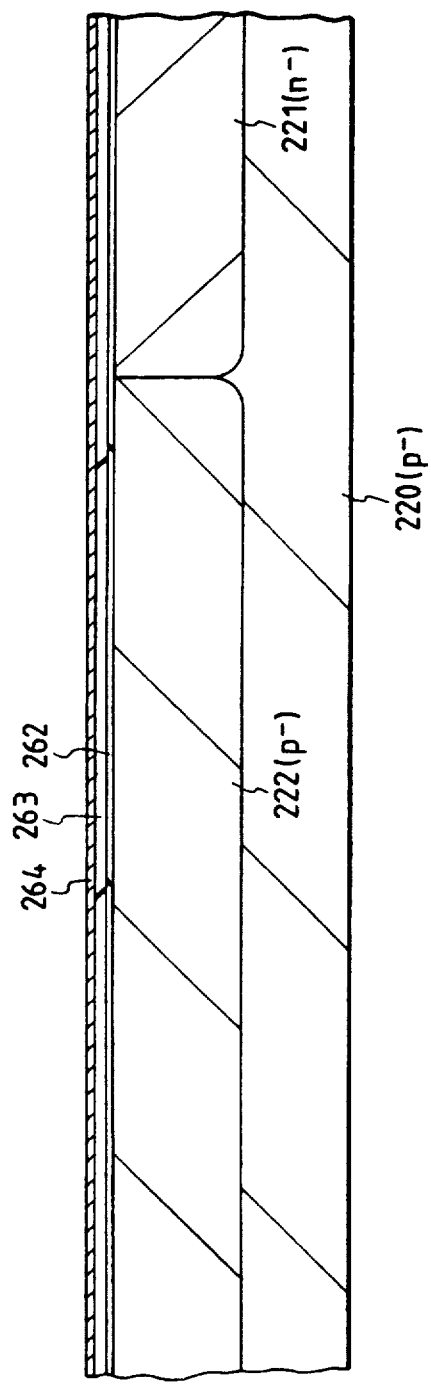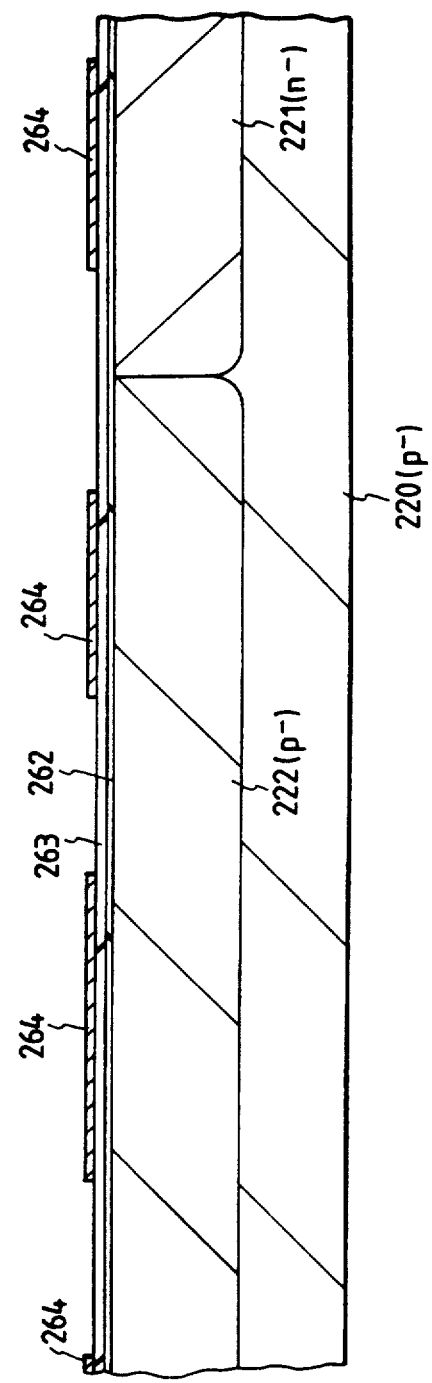

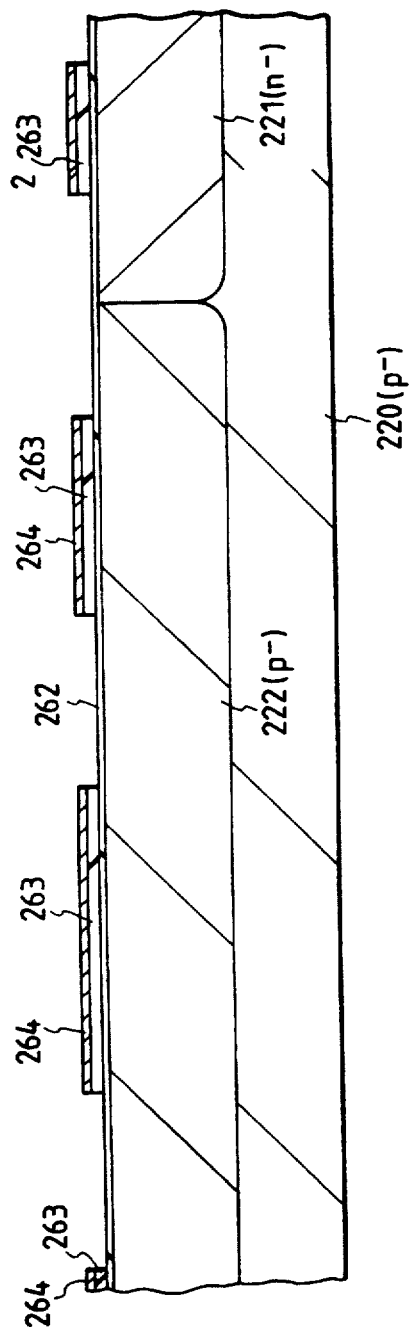

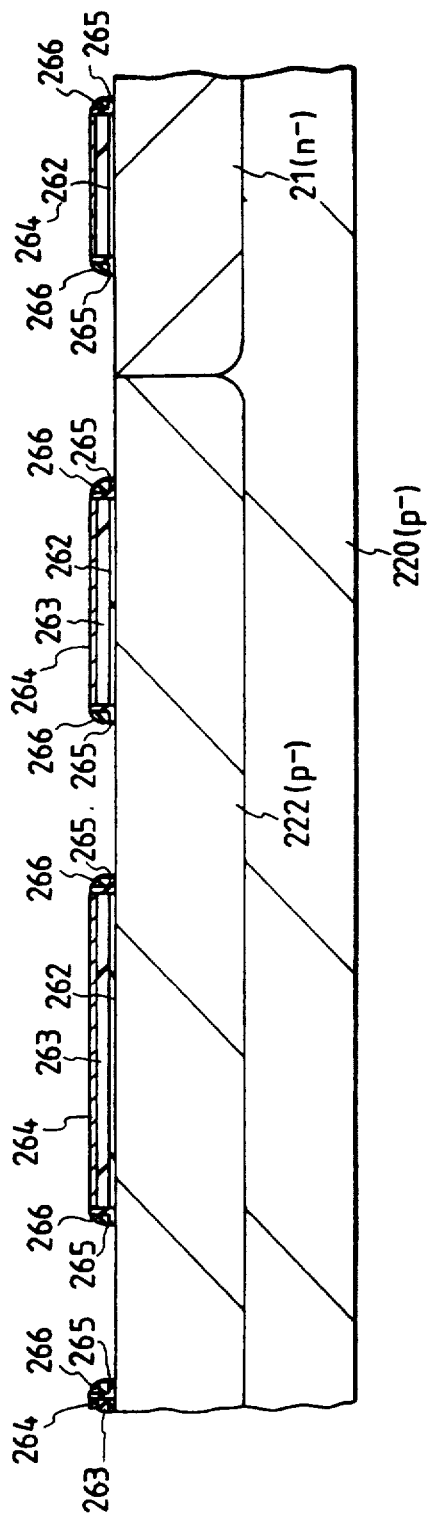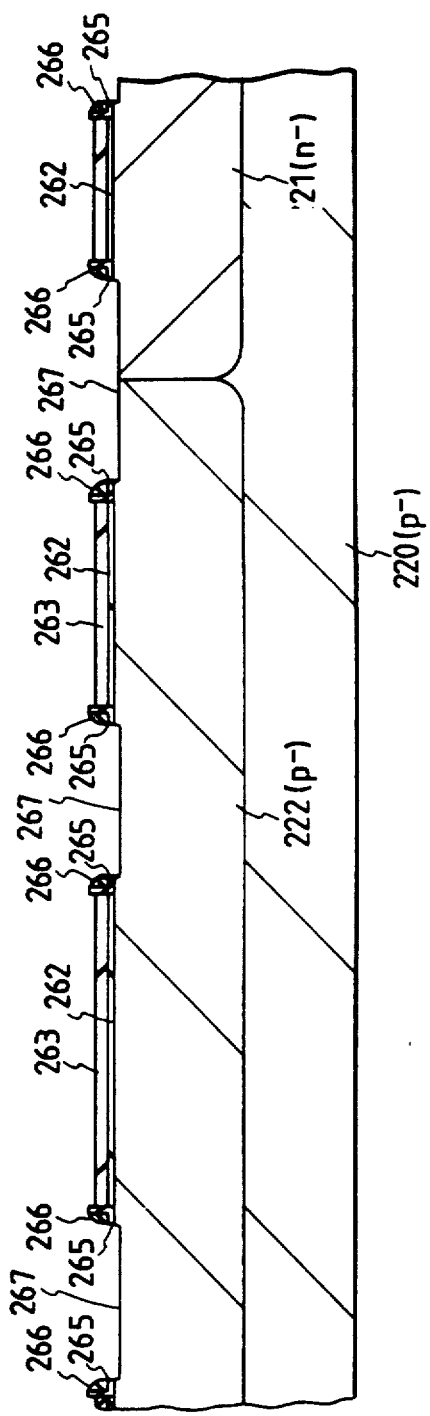

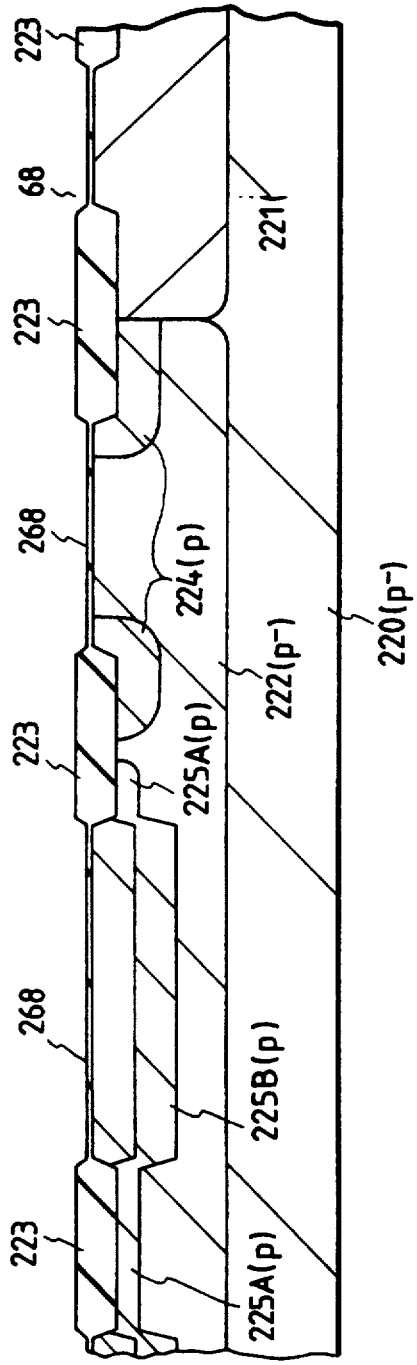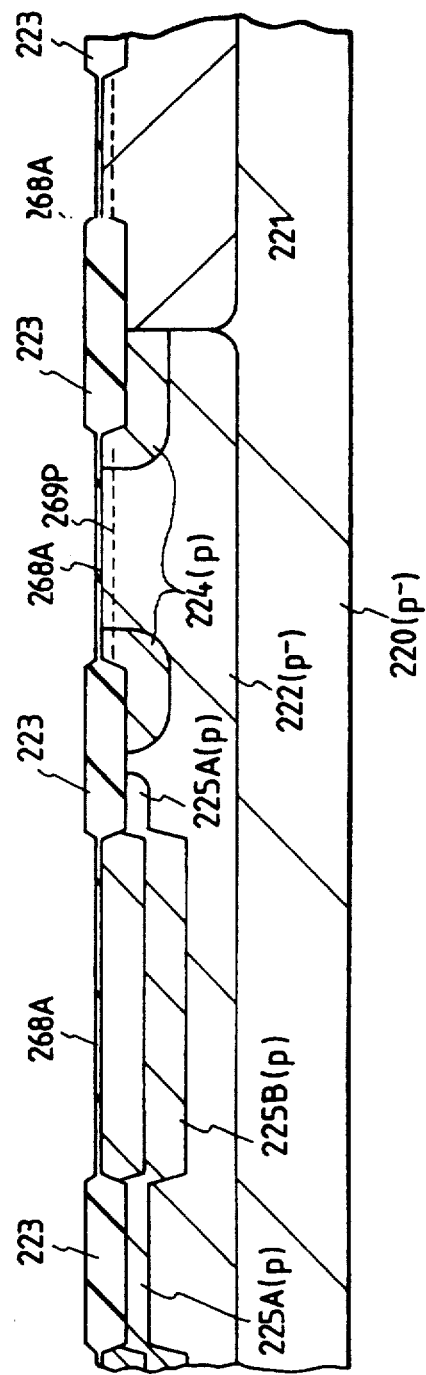

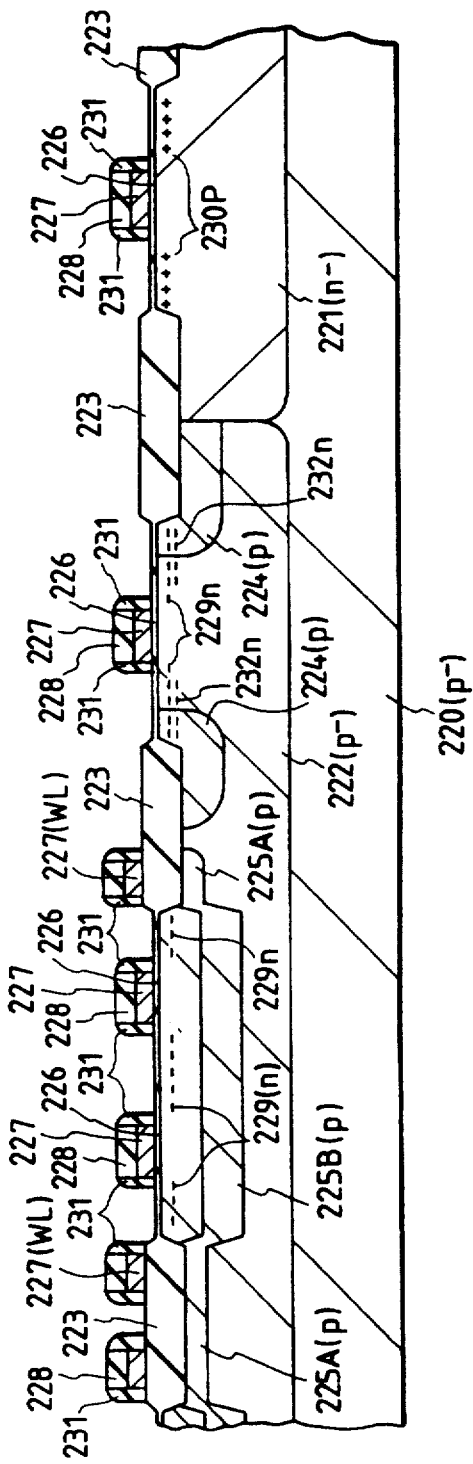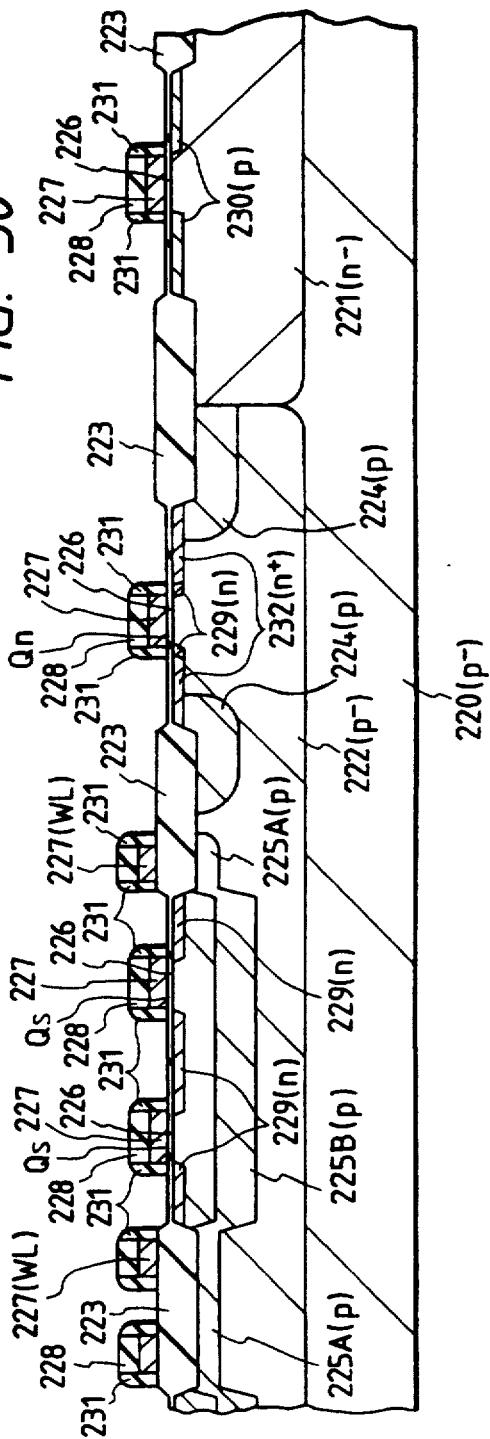

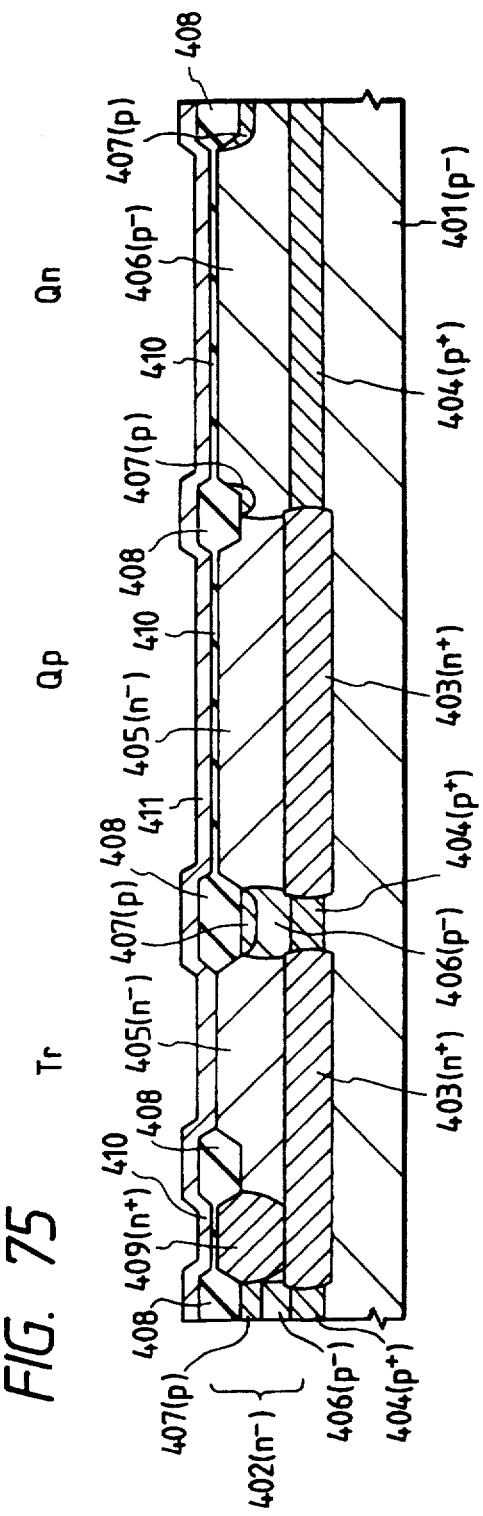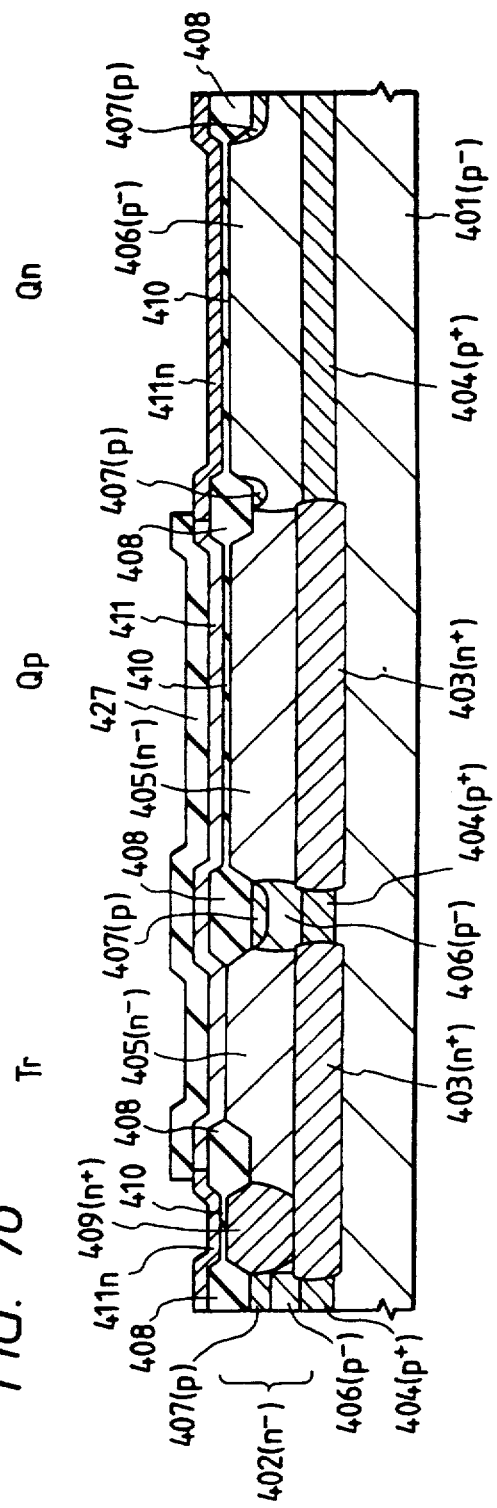

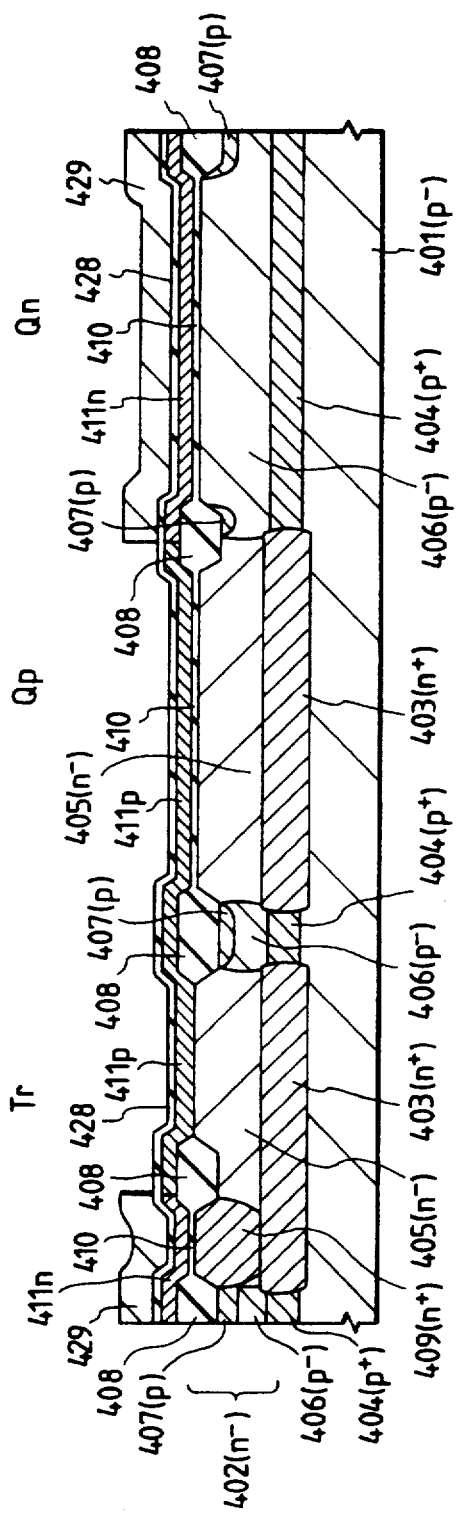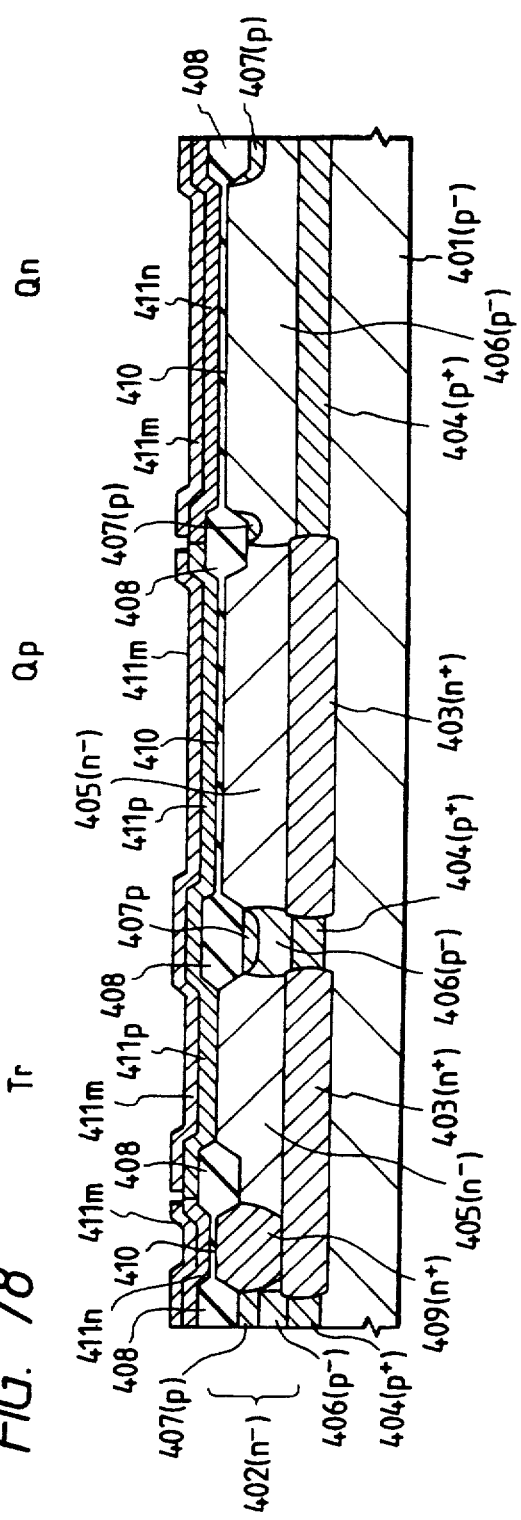

DEPENDENCE ON HEAT TREATMENT
TEMPERATURE OF THE RECRYSTALLIZING
SPEED OF AMORPHOUS LAYER

SEMICONDUCTOR INTEGRATED CIRCUIT DEVICE, METHOD FOR PRODUCING THE SAME, AND ION IMPLANTER FOR USE IN THE METHOD

This application is a continuation application of application Ser. No. 07/667,336, filed Mar. 11, 1990, now abandoned.

BACKGROUND OF THE INVENTION

The present invention relates to a technique which is effectively applicable to the ion implantation technique used in a semiconductor integrated circuit device manufacturing process.

The present invention is further concerned with a semiconductor integrated circuit device which requires a semiconductor region (a doped layer) of a small junction depth, as well as a method for producing the said device, and is particularly concerned with a technique which is effectively applicable to a self-aligned bipolar transistor of high speed and high integration density.

Recently, the application of the ion implantation technique to a semiconductor integrated circuit device using a high energy ion implanter, particularly a monolithic semiconductor integrated circuit device, has been attracting attention of many concerns. In this connection, problems have been pointed out, such as the rise in the temperature of wafer as a work, contamination, and element breakdown caused by charge-up. As examples of literatures describing these problems there are a magazine, "Denshi Zairyo," November 1980 number, pp.63–68 and 130; Japanese Patent Laid Open No.3403/86; a magazine, "Nikkei Microdevices," June 1986 number, pp.50–52; Kenji Gamo, "Handotai Ion Chunyu Gijutsu," Sangyo Tosho K. K. (Jul.31, 1986), pp.204–207; Japanese Patent Laid Open Nos. 17863/89, 162767/89, 28333/84, 10563/89 and 93247/83; and K. Izumi et al., "Nuclear Instruments and Methods in Physics Research," B37/38 North Holland Shuppan (1989), pp.299-303.

Further, as a bipolar transistor manufacturing technique there is known SEPT (Selective Etching of Polysilicon Technology). According to SEPT, base extraction electrode, emitter opening, emitter region and emitter extraction electrode can be formed by self-alignment with respect to a base region. In a bipolar transistor formed by this technique, therefore, it is not necessary to consider a mask alignment margin in the manufacturing process such as a base-emitter mask alignment margin, so that the area occupied by the bipolar transistor can be reduced. As a result, in a semiconductor integrated circuit device using such bipolar transistors, it is possible to attain a high frequency characteristic and a high integration density. But to this end it is important to reduce the depth of emitter junction.

According to a conventional method commonly used for forming an emitter junction in a self-aligned bipolar transistor, an impurity introduced into a polycrystalline silicon film which constitutes an emitter extraction electrode is drive-in diffused in a main surface of a monocrystalline semiconductor substrate to form an emitter region.

A bipolar transistor using a polycrystalline silicon film for each of base and emitter extraction electrodes is also called a double poly-silicon self-aligned bipolar transistor. A bipolar transistor having such a double poly-silicon structure is described, for example, in "Nikkei Microdevices," November 1985 number, pp.67-78.

In addition to the above drive-in diffusion technique, there is also known a preamorphous technique as a technique capable of forming a semiconductor region of a small junction depth. According to this technique, silicon (Si) or germanium (Ge) atoms are implanted in a main surface portion of a semiconductor substrate prior to the implantation of a desired ion which is performed for forming a semiconductor region (a doped layer) on the main surface of the semiconductor substrate, to thereby render the main surface portion amorphous, followed by the implantation of the desired ion, thereby preventing channelling of ions and permitting the formation of a shallow junction.

The above preamorphous technique is described, for example, in an article of Tanaka et al. in "1989, IEEE IEDM, pp.785–788."

In the Tanaka et al.'s article referred to above it is described that in the case where Si atoms are ion-implanted in a monocrystalline semiconductor substrate in advance, unless a heat treatment is performed so that a PN junction is formed in a depth three times as large as the boundary between an amorphous layer and a non-amorphous layer (a monocrystalline region) which are formed on a main surface of the semiconductor substrate, there will remain a crystal defect near the PN junction thus causing a leak current which exerts a bad influence on the device operation.

SUMMARY OF THE INVENTION

The present invention has been accomplished for remedying the above-mentioned problems of the prior art.

It is an object of the present invention to provide an ion implanter capable of performing ion implantation while holding the temperature of wafer stably at a level not higher than 0° C. to effect cooling.

It is another object of the present invention to provide an ion implanter capable of preventing the charge-up of wafer effectively.

It is a further object of the present invention to provide an ion implanter which does not cause contamination from a wafer stopper for example.

It is a still further object of the present invention to provide an ion implanter having a vacuum evacuation system capable of maintaining a high vacuum throughout an entire ion path.

It is a still further object of the present invention to provide an ion implanter suitable for a polyvalent ion implantation or a molecular ion implantation.

It is a still further object of the present invention to provide an ion implanter capable of preventing the moisture condensation when wafer is taken out to the exterior.

It is a still further object of the present invention to provide an ion implanter which does not cause an electrostatic breakdown of wafer even in the event of failure of an electron shower.

It is a still further object of the present invention to provide an ion implantation technique capable of making an ion-implanted layer free of defects even in annealing at a temperature as low as 900°–800° C. or lower.

It is a still further object of the present invention to provide an ion implantation technique capable of making a deep ion-implanted layer free of defects.

It is a still further object of the present invention to provide a semiconductor integrated circuit device manufacturing method suitable for the formation of a fine diffused layer (doped layer).

It is a still further object of the present invention to provide an ion implantation technique of a high throughput.

It is a still further object of the present invention to provide an impurity doping technique capable of forming a fine and deep diffused layer (doped layer).

It is a still further object of the present invention to provide a ion implantation technique capable of coping with design rules restricted to 0.50–0.3 μm and smaller.

It is a still further object of the present invention to provide an ion implanter having an evacuation system capable of maintaining the degree of vacuum of a post-acceleration tube at $5 \times 10^{-6}$ Torr or so during ion implantation.

It is a still further object of the present invention to provide an ion implanter capable of performing ion implantation while maintaining the wafer temperature at 0° C. to −50° C. or lower.

It is a still further object of the present invention to provide a method for producing a semiconductor integrated circuit device having a shallow defect-free diffused layer (doped layer) not deeper than 0.1 μm.

It is a still further object of the present invention to provide a semiconductor integrated circuit device having a semiconductor region of a small junction depth and a high electrical reliability, as well as a method for producing the same.

It is a still further object of the present invention to provide a bipolar transistor having an emitter region not larger than 0.2 μm in junction depth and with little leak current, as well as a method for producing the same.

It is a still further object of the present invention to provide a technique capable of attaining a high integration density of a double poly-silicon self-aligned transistor.

The above and other objects and novel features of the present invention will become apparent from the following description and the accompanying drawings.

Out of the inventions disclosed herein, typical ones will be outlined below.

(1) In an ion implanter, ①  a refrigerant which has been cooled by a cooler is passed for a contact portion of the back of wafer to cool the contact portion. Further, a gas is introduced in between the wafer and the cooling surface to improve the heat conduction therebetween. ② As a cooling method for the back contact portion of wafer, the cooling portion is used as a cold head by the application of the principle of a cryopump. Also in this case, a gas is introduced in between the wafer and the cooling surface to improve the thermal conductivity. As a result, the wafer temperature during ion implantation can be reduced to 0° C. to −100° C., so it is possible to diminish the occurrence of defects during ion implantation and thereby prevent crystal defects.

(2) In an ion implanter, ① wafer is heated to a temperature to an extent of not causing moisture condensation by the use of an infrared lamp after the completion of ion implantation in vacuum. ② After the completion of ion implantation, the wafer is transferred into a preliminary vacuum chamber from an ion implantation chamber, and the pressure is released slowly to the atmospheric pressure using dry heated nitrogen, whereby moisture condensation can be prevented at the time of taking out the wafer from the ion implanter into the atmosphere after the completion of ion implantation.

(3) In an ion implanter, an electron shower (an electron emission current) monitor and an ion source or an extraction electrode power source are electrically interlocked with each other to cut off ion beam even upon occurrence of failure in an electron shower generator during ion implantation, whereby an electrostatic breakdown of the device at the wafer surface can be prevented.

(4) In an ion implanter, ① a mechanical wafer stopper is eliminated and wafer is fixed using an electrostatic chuck to prevent ion beam from being directed to the wafer. ② The purity of a mechanical stopper is improved (3N or higher) and the shape of the beam-applied surface is improved so that a substance derived from sputtering does not come flying to wafer, whereby the material of a wafer-holding stopper and impurity contained therein are not sputtered by the impingement of ion beam on the wafer stopper. Consequently, it is possible to prevent contamination of the wafer caused by a secondary ion beam.

(5) In an ion implanter, ① a beam filter is disposed at an outlet of a mass spectrograph tube so that contamination ions generated between an ion source and the mass spectrograph outlet can be removed. ② A high vacuum pump is disposed between the mass spectrograph tube and a post-acceleration tube to obtain a degree of vacuum of [(mean free path of ion) $\geq 10 \times$ (distance from the mass spectrograph tube outlet to the post-acceleration tube outlet)]from the mass spectrograph tube outlet to the interior of the post-acceleration tube. ③ High vacuum pumps are disposed at a total of two places, one being between the mass spectrograph tube outlet and the post-acceleration tube and the other being on the outlet side of the post-acceleration tube, to obtain the same degree of vacuum as the above ②, whereby it is possible to prevent energy contamination during the implantation of a polyvalent ion or a molecular ion.

BRIEF DESCRIPTION OF THE DRAWINGS

FIG. 15 is a sectional view schematically showing the front end portion of the rotary stage illustrated in FIG. 13;

FIG. 16 illustrates an interaction or reaction between undesired ions and between ion and molecule in an ion beam path;

FIGS. 28 and 30 are schematic plan views each showing a boundary region between the memory cell array of the DRAM and a peripheral circuitry;

FIGS. 29 and 31 are each an enlarged plan view of a principal portion of the boundary region illustrated in FIGS. 28 and 30;

FIGS. 33 to 66 are sectional views of a principal portion according to manufacturing processes for the DRAM;

FIGS. 73 to 83 are sectional views of a principal portion, showing manufacturing steps for the semiconductor integrated circuit device illustrated in FIG. 71;

DETAILED DESCRIPTION OF THE INVENTION

Figure 1:
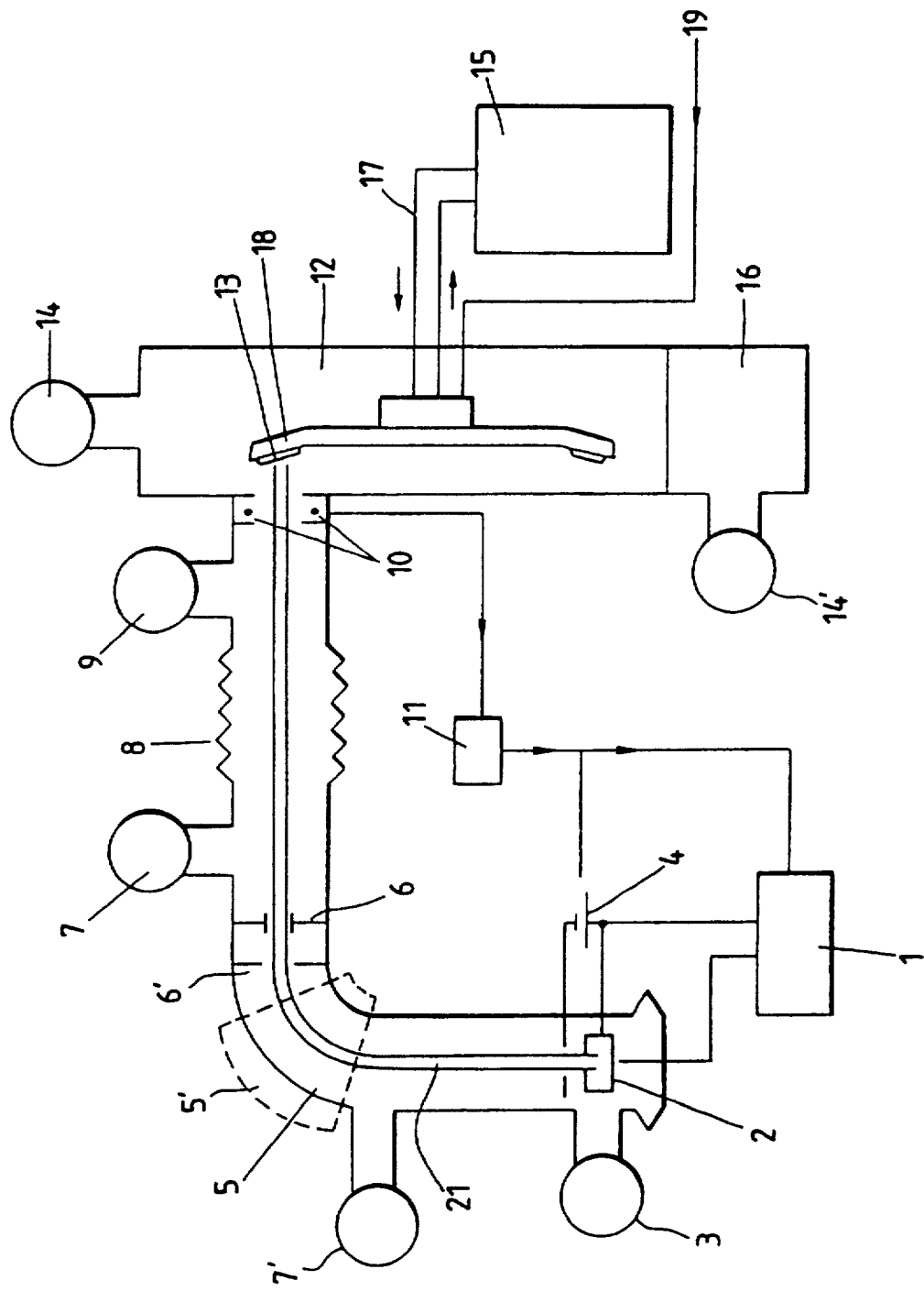
FIG. 1 is an entire view of an ion implanter according to an embodiment 1 of the present invention.

The present invention will be described concretely hereinunder. For the convenience of explanation, the invention will be explained for each of plural embodiments, the devices and processes of embodiments 2, 3 and 4 are attained in accordance with corresponding modes of the device of embodiment 1. In all of the drawings for illustration of the embodiments, components having the same functions are indicated by the same reference numerals and repeated explanations thereof will be omitted.

Embodiment 1

First, an embodiment 1 of the present invention will be outlined below with reference to FIGS. 1 to 3.

FIG. 1 is an entire schematic view of an ion implanter of this embodiment, which implanter is a batch processing type implanter of a high current type, like a single wafer type.

(1) In a wafer mechanism, a refrigerant 17 cooled by a refrigerator 15 is circulated through a rotary stage 18 carrying a wafer 13 thereon to cool the wafer 13 at a temperature in the range of 0° C. to −100° C. Helium gas and a helium compressor are used as the said refrigerant and refrigerator 15, respectively, to cool the rotary stage 18 through adiabatic expansion of helium. An auxiliary cooling gas 19 is sealed in the gap between the wafer 13 and the rotary stage 18 to reduce the resistance of heat between the wafer 13 and the rotary stage.

(2) An electron shower monitor 11 for an electron shower generator 10 and a power source 1 for ion source or an extraction electrode power source 4 are electrically interlocked with each other, and the power source 1 for ion source or the extraction electrode power source 4 is turned OFF the instant the electron shower became equal to a value smaller than a preset value, to thereby stop an ion beam 21, thereby preventing electrostatic breakdown of the wafer 13.

(3) In order to improve the purity of polyvalent ion and molecular ion, there is provided a slit electrode 6 for beam filter at the outlet of a mass spectrograph portion to remove energy contamination formed between an ion source 2 and the outlet of the mass spectrograph portion 5. To this end, there is adopted a method wherein a voltage corresponding to 50% or more of an extraction voltage is applied to the slit electrode 6 for beam filter. Further, for preventing the formation of energy contamination ion between the outlet of the mass spectrograph portion 5 and that of a post-acceleration tube 8, there are provided mechanical dry vacuum evacuation systems 7 and 9 to vacuum-evacuate this region.

Figure 2A:
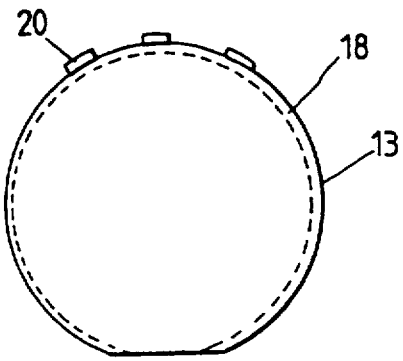
FIG. 2 illustrates a wafer holding portion of the ion implanter, in which (A) is a front view and (B) is a side view.
Figure 2B:
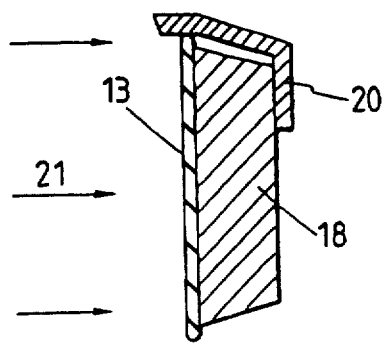
Figure 3A:
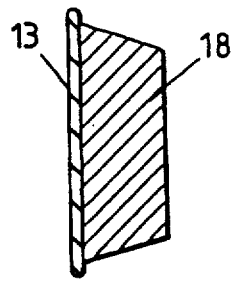
FIG. 3 shows another example of a wafer holding portion used in the ion implanter, in which (A) illustrates a state wherein wafer is held according to a method using an electrostatic chuck without using a stopper, (B) illustrates a wafer stopper improved in shape, and (C) shows a further example of a stopper.
Figure 3B:
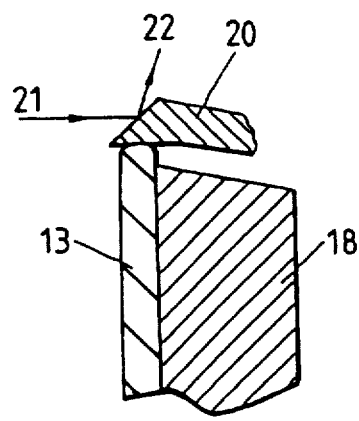
Figure 3C:
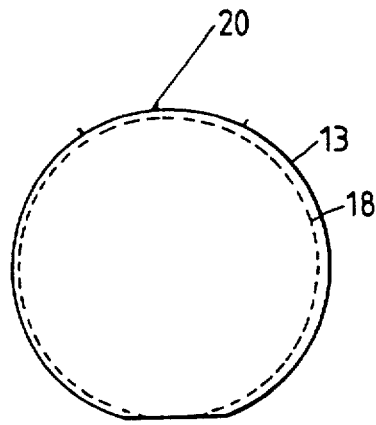

(4) In FIG. 2 there is illustrated a holding portion for the wafer 13. FIGS. 2(A) and (B) are a front view and a side view, respectively. As is seen from FIG. 2(B), since an ion beam 21 impinges on a wafer stopper 20, the material thereof, i.e., aluminum, and an impurity contained therein ar developed by sputtering and adhere to the wafer 13. FIG. 3 shows measures against this problem. In FIG. 3(A), the wafer 13 is held by an electrostatic chuck mechanism without disposing a metal around the wafer. In FIG. 3(B), the wafer stopper 20 is reverse-tapered so that even when the ion beam impinges on it, a sputtered substance 22 is difficult to come flying to the wafer 13. In FIG. 3(C), the wafer stopper 20 is shaped needle-like to minimize the impingement area of the ion beam 21, thereby preventing the formation of the sputtered substance 22.

The above constructions can afford the following effects. By the cooling of wafer, the extension of defects caused during ion implantation and a halfway recovery are suppressed, so there is obtained an ion implanted layer free of crystal defect by low-temperature annealing and it is possible to realize a deep submicron device. Besides, by interlocking the electron shower and the power source for ion source electrically with each other, it is possible to prevent electrostatic breakdown of wafer even in the event of failure of the electron shower generator. Moreover, by improving the impurity and shape of the wafer holding portion it is possible to prevent metal contamination of the wafer and it is possible to decrease the junction leak current and prevent the occurrence of crystal defects, so it is possible to improve the yield in the manufacture of a deep submicron device. Further, by the improvement in the degree of vacuum from the beam filter and mass spectrograph tube up to the outlet of the post-acceleration tube, it is possible to prevent energy contamination in the implantation of polyvalent ion and molecular ion, whereby it is possible to prevent variations in device characteristics and improve the yield and performance.

Now, the details of various portion of the ion implanter will be described with reference to FIGS. 1 to 3. The numeral 1 denotes a power source for ion source, which supplies an electric current to a filament of an ion source 2 and an electron shower generator. Numeral 2 denotes an ion source such as, for example, a Freeman source. Numeral 3 denotes an oil-free vacuum evacuation system comprising a series connection of a dry roughing vacuum pump and a turbo-molecular pump, for exhausting gas, etc. discharged from the ion source 2, such as, for example, SD series dry pump and KDM series molecular drag pump, manufactured by Kashiyama Kogyo K.K. Numeral 4 denotes an extraction electrode power source. In the event of failure of the electron shower generator 10, this power source is set to 0 [V] by the operation of the electron shower monitor 11 to stop the extraction of ion. Numeral 5 denotes a mass spectrograph portion (a mass spectrograph tube) comprising an analyzing magnet 5' for selecting a desired ion from among extracted ions. Numeral 6 denotes a slit electrode for beam filter provided at an outlet of the mass spectrograph portion 5. Like other slit electrodes, an opening for passing therethrough of an ion beam 21 is formed centrally of a disk such as a graphite disk, and a predetermined voltage is applied to that electrode plate, as explained previously or later. By the application of a voltage not less than 50% of an extraction voltage [$V_o$], the slit electrode 6 for beam filter selects only a desired ion in high purity at the time of implantation of polyvalent ion or molecular ion. Numeral 6' denotes a slit electrode similar to that just described above, which is for passing only the ion which has come flying to a predetermined position under the action of an analyzing magnet 5'. Numeral 7 denotes an oil-free vacuum evacuation system of the same construction as the oil-free vacuum evacuation system 3; numeral 8 denotes a post-acceleration portion (a post-acceleration tube) comprising about two to ten slit electrodes similar to that described above; numeral 9 denotes an oil-free vacuum evacuation system similar to that 7; numeral 10 denotes an electron shower generator for applying electrons to the ion beam 21 for preventing the breakdown of a wafer 13 caused by charge-up as explained previously or later; numeral 11 denotes an electron shower monitor for monitoring the electric current in the electron shower generator 10 and stopping the emission of ion from the ion source 2 when the said electric current lowered a predetermined certain value from a preset value, to prevent charge-up of the wafer 13; numeral 12 denotes an implantation chamber for receiving therein a large number of wafers 13 and carrying out ion implantation; and numeral 13 denotes a wafer to be ion-implanted, e.g. Si wafer or GaAs wafer in a wafer processing of a semiconductor integrated circuit device. Numeral 14 denotes a oil-free vacuum evacuation system which employs a dry roughing vacuum pump similar to that described previously as an initial dry roughing vacuum pump; numeral 7' denotes an oil-free vacuum evacuation system of a similar construction to that of the oil-free vacuum evacuation system for maintaining the mass spectrograph tube at a high vacuum; numeral 14' denotes an oil-free vacuum evacuation system of a load-lock chamber having a construction similar to that of the oil-free vacuum evacuation system 14; and numeral 15 denotes a refrigerator which cools (incl. compression, cooling and liquefying) the refrigerant 17 to room temperature, preferably 0° C. to −100° C. Numeral 16 denotes a load-lock chamber wherein the pressure is once adjusted to a predetermined degree of vacuum or the atmospheric pressure at the time of loading or unloading of the wafer 13. Numeral 17 denotes a refrigerant such as ethylene glycol, liquid $N_2$, or liquid He.

Numeral 18 denotes a rotary stage which contains 10 to 30 wafers 13 and moves in a parallel manner while rotating at high speed. Numeral 19 denotes an auxiliary cooling gas to be fed into a gap formed between the wafer 13 and the stage 18; numeral 20 denotes a wafer stopper for preventing jump-out of the wafer 13; numeral 21 denotes an ion beam; and numeral 22 denotes a secondary ion beam.

The following description is now provided about further details of various portions.

Figure 4:
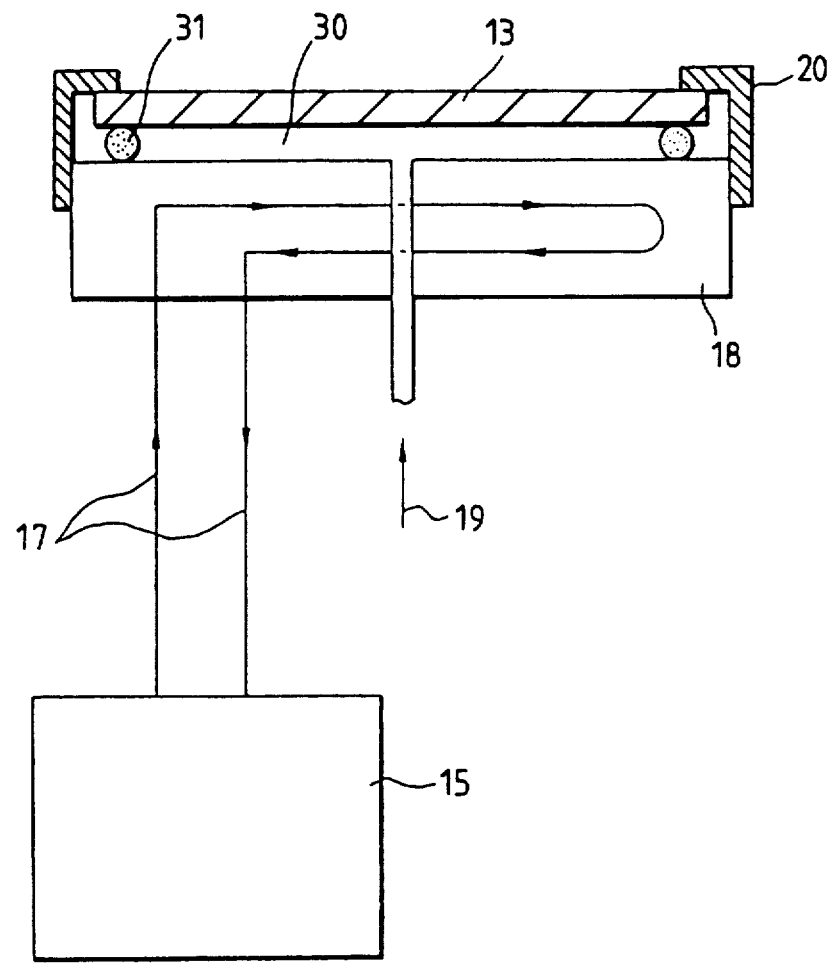
FIG. 4 is a sectional view schematically showing a chuck portion of a rotary stage used in the ion implanter.

FIG. 4 shows an example of a rotary stage and that of a cooling mechanism for the rotary stage. In the same figure, numeral 13 denotes a wafer; numeral 15 denotes a refrigerator; numeral 17 denotes a refrigerant such as ethylene glycol; numeral 18 denotes a stage; numeral 19 denotes an auxiliary cooling gas for improving the heat conduction between the stage 18 and the wafer 13 as well as an inlet path of the gas; numeral 20 denotes a wafer stopper; numeral 30 denotes a cooling gas introducing space; and numeral 31 denotes an O-ring. By such a cooling mechanism, the implantation surface temperature of wafer during ion implantation with a large current can be held at a low level in the range from room temperature to about 0° C. or lower.

Figure 5:
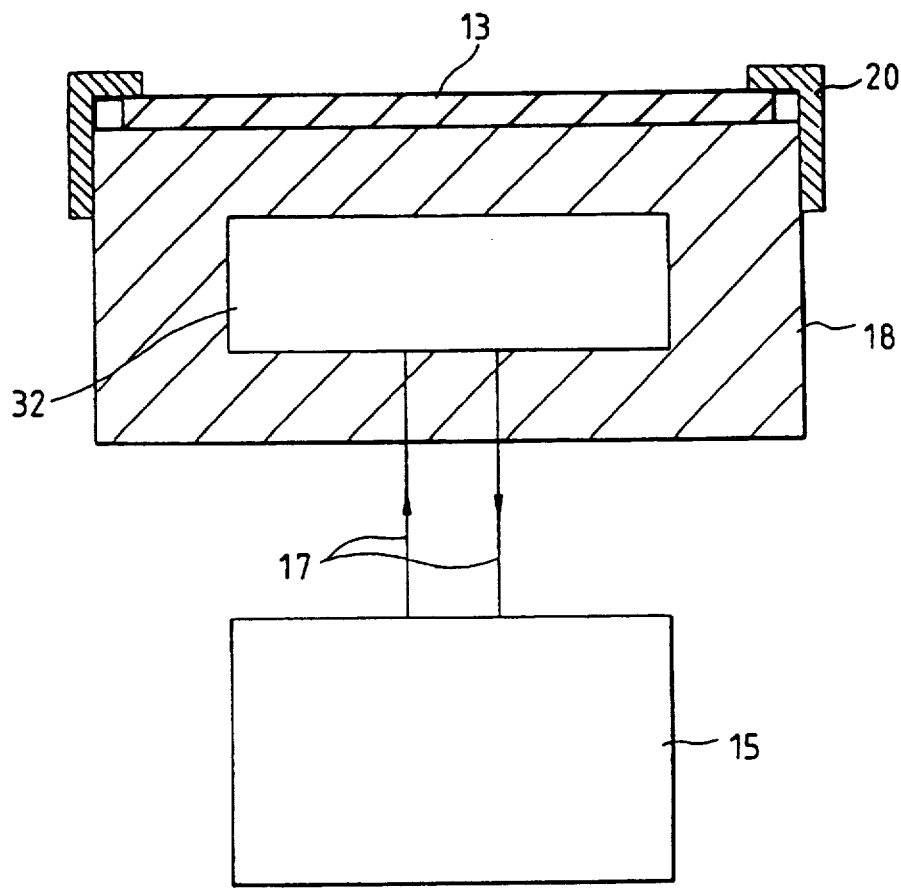
FIG. 5 is a sectional view schematically showing another example of a rotary stage used in the ion implanter.

FIG. 5 shows another example of a rotary state and a cooling mechanism for the rotary stage. In this example, like the cryopump, the stage is cooled to an ultra-low temperature by adiabatic expansion of helium, and the stage and wafer are brought into close contact with each other to improve the cooling efficiency. In the same figure, the numeral 13 denotes a wafer; numeral 15 denotes a He compressor; numeral 17 denotes He and its flowing path; numeral 18 denotes a cooling stage; numeral 20 denotes a wafer stopper; and numeral 32 denotes an adiabatic expansion chamber of He.

Figure 6:
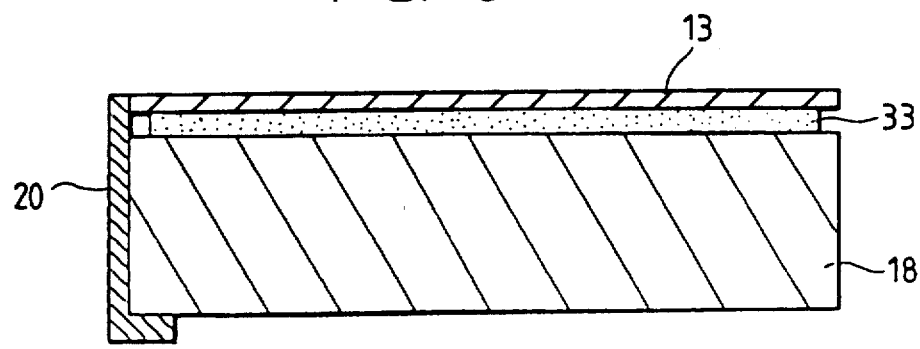
FIG. 6 is a sectional view schematically showing a further example of a rotary stage used in the ion implanter.

FIG. 6 shows a still further example of a rotary stage. This example shows a so-called electrostatic chuck, whereby wafer is attracted to the stage through an insulating sheet. In the same figure, the numeral 13 denotes a wafer and numeral 18 denotes a wafer cooling stage, which has a cooling mechanism using a conventional refrigerant such as $N_2$ or He like that referred to previously. Numeral 20 denotes a wafer stopper and numeral 33 denotes a silicone rubber.

Figure 7:
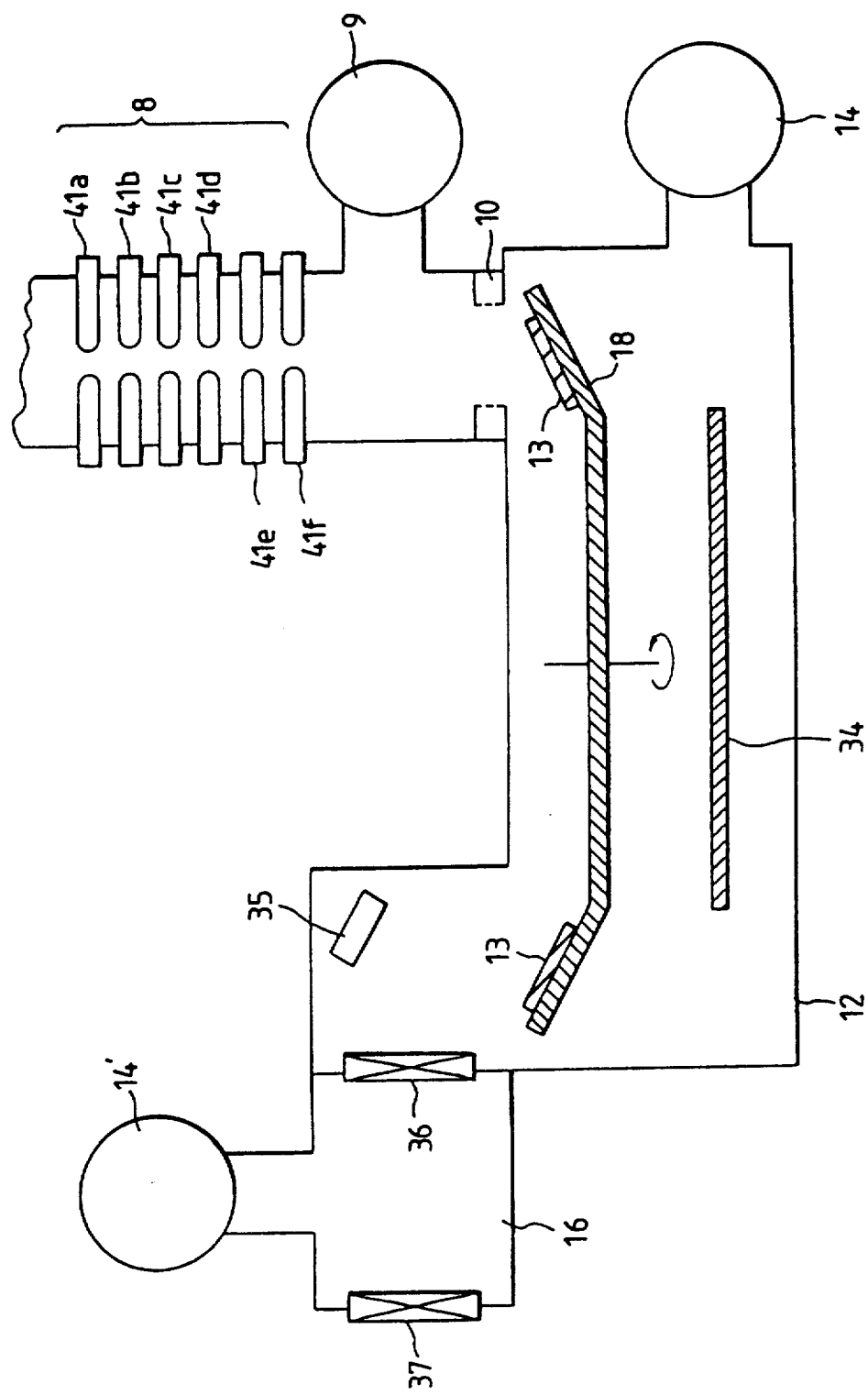
FIG. 7 is a sectional view schematically showing a detailed structure of an ion implantation chamber in the ion implanter and the vicinity thereof.

FIG. 7 shows the details of the post-acceleration tube and the implantation chamber in the entire device illustrated in FIG. 1. In FIG. 7, numeral 8 denotes a post-acceleration tube and numeral 9 denotes a vacuum evacuation system comprising a dry roughing vacuum pump and a turbo-molecular pump, which vacuum evacuation system is used to improve the degree of vacuum of an ion passage just before ion implantation. Numeral denotes an ion implantation chamber, which is at an earth potential of the system. Numeral 13 denotes a wafer and numeral 14 denotes a cryopump vacuum evacuation system. Numeral 14' denotes a cryovacuum evacuation system of a load-lock chamber. After evacuation up to a certain degree of vacuum by means of the dry roughing vacuum pump and subsequent evacuation up to a degree of vacuum about the same as that of the main ion implantation chamber by means of a cryopump, wafer is introduced into the ion implantation chamber. Numeral 16 denotes a load-lock chamber. When wafer is introduced, the degree of vacuum is increased from atmospheric pressure up to nearly an implantation chamber by evacuation using the roughing vacuum pump and cryopump.

On the other hand, at the time of discharge of the wafer, the whole of the wafer is heated to 10° C. or higher by spraying heated dry $N_2$ gas to the wafer which is at a low temperature, and thereafter the thus-heated wafer is discharged into the air, thereby preventing moisture condensation. Numeral 18 denotes a rotary stage; numeral 34 denotes a wafer surface condensation preventing shroud comprising a metallic surface which is held at a temperature 20°-50° C. lower than that of the wafer surface; numeral 35 denotes a wafer heating halogen lamp for heating the wafer alone or together with the aforementioned heated $N_2$ gas to prevent moisture condensation at the time of discharge of the wafer; numeral 36 denotes an automatic opening/closing door serving as a partition between the ion implantation chamber and the load-lock chamber; numeral 37 denotes an automatic opening/closing door serving as a partition between the load-lock chamber and the exterior (atmosphere); and numerals 41a to 41f denote acceleration electrodes each comprising a graphite disk having a central rectangular opening.

Figure 8:
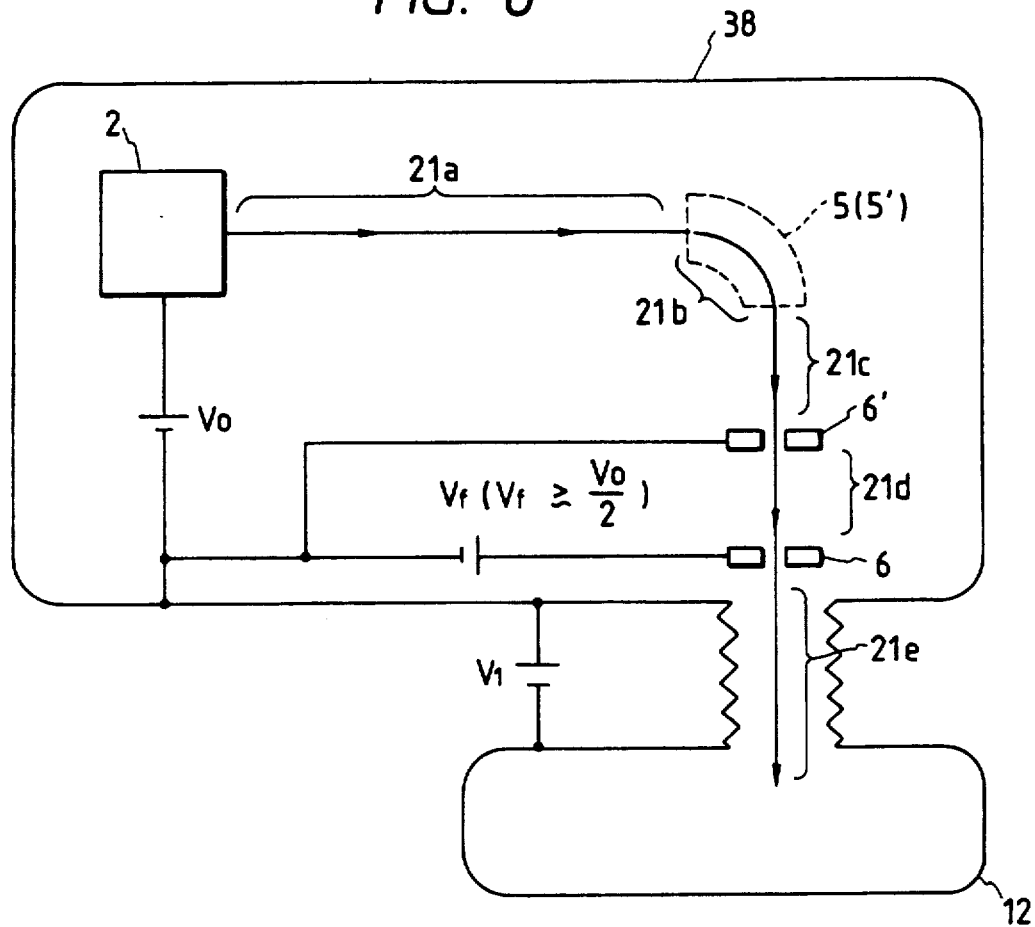
FIG. 8 is a sectional view schematically showing a potential relation of various portions of the ion implanter.

FIG. 8 illustrates a potential arrangement in an ion implanter. In the same figure, numeral 2 denotes an ion source; numeral 5 denotes a mass spectrograph tube; numeral 5' denotes an analyzing magnet; numeral 6 denotes a slit electrode for beam filter; numeral 6' denotes a mass spectrograph slit; and numeral 12 denotes an ion implantation chamber, which is connected to an earth potential. Numerals 21a to 21e each denote an ion beam path, of which 21a denotes an analyzer front passage, 21b an analizer center passage, 21c an analyzer rear passage, 21d an inter-filter passage and 21e an acceleration tube. Numeral 38 denotes a high voltage chamber (this potential is called a high voltage terminal or high voltage earth). $V_1$ denotes a post-acceleration voltage; $V_o$ denotes an ion source extraction voltage (20–30 KV); and $V_f$ denotes a filter voltage for blocking a monovalent ion, etc. incorporated at the time of polyvalent ion implantation. For example, in the case of implantation of a divalent ion, there is applied a voltage which is a little higher than a half of $V_o$.

Figure 9:
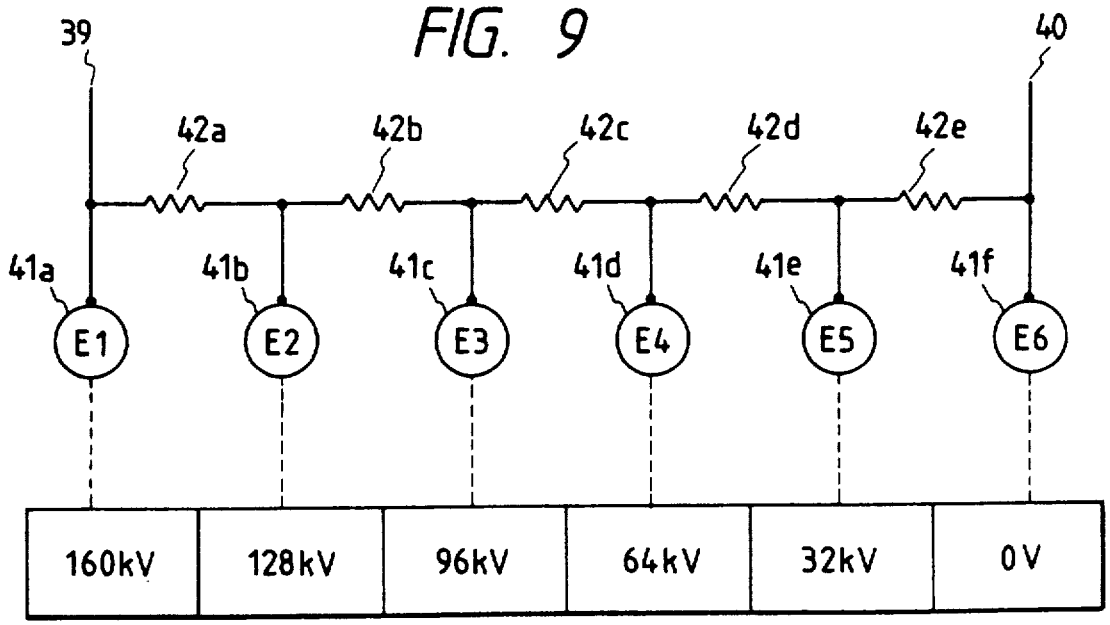
FIG. 9 is a circuit diagram of post-acceleration electrodes used in the ion implanter.

FIG. 9 illustrates a potential distribution to post-acceleration electrodes. In the same figure, $E_1$ to $E_6$ represent electrode potentials; numeral 39 represents $V_1$ potential; numeral 40 represents an earth potential; numerals 41a–41f represent acceleration electrodes; and numerals 42a–42e represent split resistors.

Figure 10:
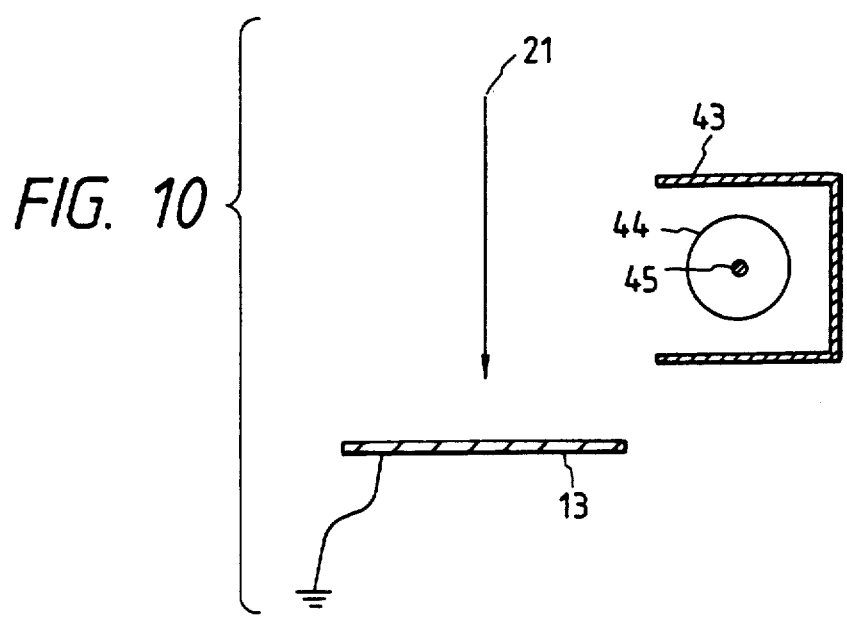
FIG. 10 is a sectional view schematically showing an electron shower portion of the ion implanter.

FIG. 10 shows a relation between wafer and electron shower. In the same figure, numeral 13 denotes a wafer, which is usually connected to an earth potential. Numeral 21 denotes an ion beam; numeral 43 denotes a plate of an electron shower generator, which plate is at the same potential as cathode, and numerals 44 and 45 represent grid and cathode thereof, respectively. Electrons of high energy (200–300 eV) extracted from the cathode 45 by the application of the grid voltage react with Ar gas contained in the interior of the electron shower and emit a large quantity of low energy electrons (about 10 eV).

Figure 11:
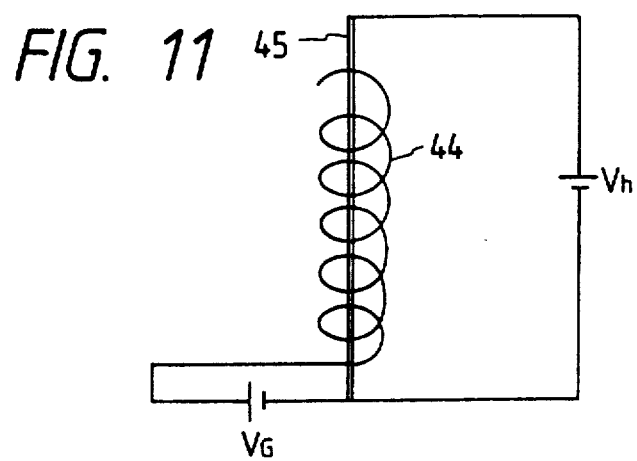
FIG. 11 is a circuit diagram of the electron shower portion shown in FIG. 10.

FIG. 11 is a schematic circuit diagram of the electron shower generator. In the same figure, $V_h$ and $V_G$ represent filament voltage and grid voltage, respectively; numeral 44 denotes a grid; and numeral 45 denotes a filament cathode.

Figure 12:
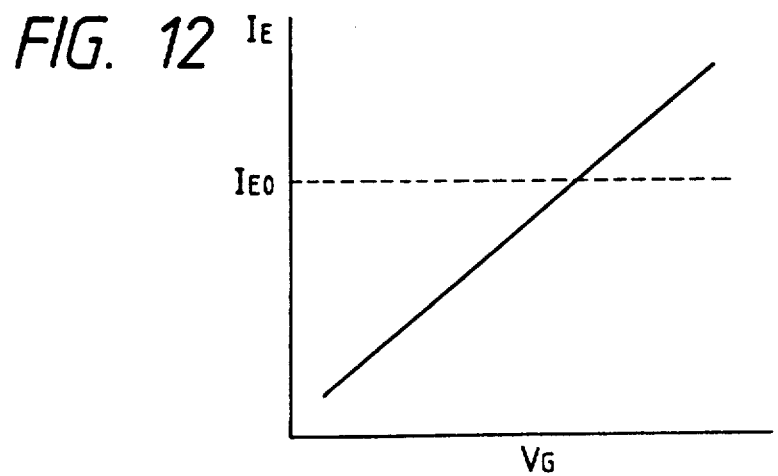
FIG. 12 is a graph showing a relation between an emission current of the electron shower illustrated in FIG. 10 and a gate voltage.

FIG. 12 illustrates a relation between an emission current $I_E$ from the cathode and the grid voltage $V_G$. In the Same figure, $I_{EO}$ represents an initial value of the emission current.

Figure 13:
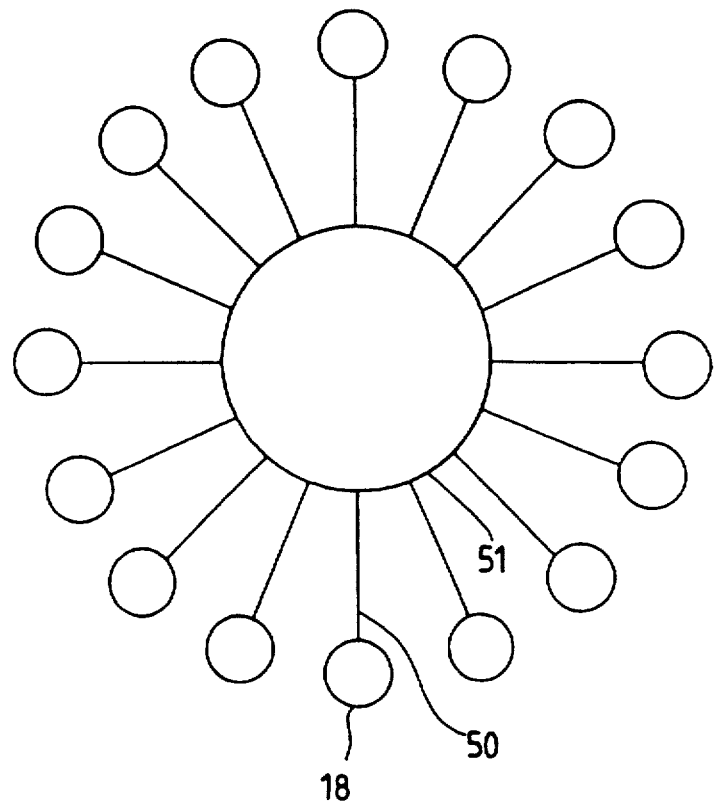
FIG. 13 is an entire front view of a wafer resting and rotating stage disposed in the ion implantation chamber of the ion implanter.

FIG. 13 is an entire diagram of the rotary stage. In the same figure, in order that a single lot of wafers, i.e., 20-25 wafers, can be processed at a time, the same number as or a little larger number than the number of wafers, of rotary stages 18 are provided. Numeral 50 denotes a support rod portion and numeral 51 denotes a central rotor portion.

Figure 14:
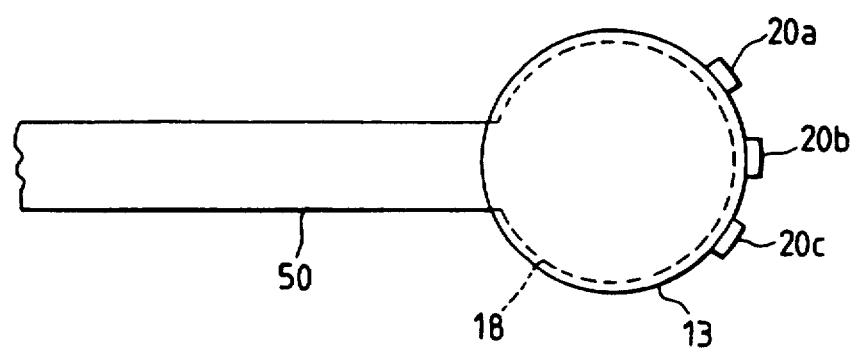
FIG. 14 is an enlarged front view of a wafer resting portion at the front end of the rotary stage shown in FIG. 13.

FIG. 14 illustrates a state with wafer resting on one of the rotary stages, as seen from a main surface (upper surface) of the wafer. In the same figure, the peripheral end portion of the wafer 13 is positioned outside the base portion of the rotary stage 18 and is held by wafer stoppers 20a-20c. In the interior of the support rod portion 50 there is provided a refrigerant passage (not shown).

FIG. 15 shows a wafer—Faraday cup relation. A Faraday cup 52 comprises an ion collecting cup (with lateral magnetic field) and an ammeter connected at one end to ground.

FIG. 16 shows examples of undesired reactions induced in the ion path. In the same figure, the mark A represents a residual gas molecule. The reactions illustrated therein take place in the implantation of divalent ions of phosphorus (P).

Figure 17:
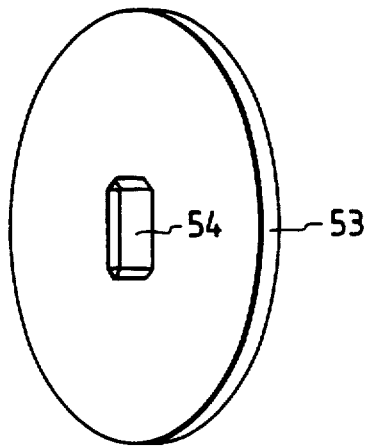
FIG. 17 is a sketch diagram of various portions, including extraction decelerating electrode, analyzer slit, beam filter and post-acceleration electrodes, disposed along the ion beam path in the ion implanter.

FIG. 17 is a sketch diagram of a slit electrode plate of graphite. In the same figure, the numeral 53 denotes an electrode plate and numeral 54 represents a rectangular aperture corresponding to a rectangular ion beam from a Freeman source. The ion source extraction electrode, mass spectrograph slit 6', slit electrode 6 for beam filter and post-acceleration electrodes 41a-41f, which have been referred to previously, are of about the same shape as the illustrated shape.

Figure 18:
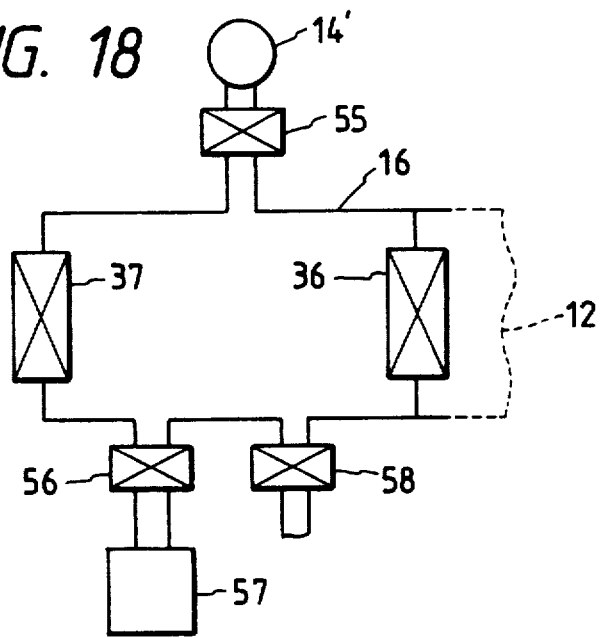
FIG. 18 is a sectional view schematically showing the details of a load-lock chamber in the ion implanter and a moisture condensation preventing device.

FIG. 18 shows a detailed structure of the load-lock chamber 16. In the same figure, numeral 12 denotes an ion implantation chamber; numeral 14' denotes a cryovacuum evacuation system; numeral 36 denotes an automatic opening/closing door between the load-lock chamber and the ion implantation chamber; and numeral 37 denotes an automatic opening/closing door between the load-lock chamber and the exterior. Through these components there are performed loading and unloading of wafer. Numeral 55 denotes an on-off valve for isolating the cryovacuum evacuation system 14' from the load-lock chamber 16; numeral 56 denotes an on-off valve for providing communication between a heated $N_2$ gas feeder 57 which is for heating the wafer to 10° C. or so and the load-lock chamber 16; and numeral 58 denotes an on-off valve for exhausting heated $N_2$ gas from the load-lock chamber 16.

Figure 19A:
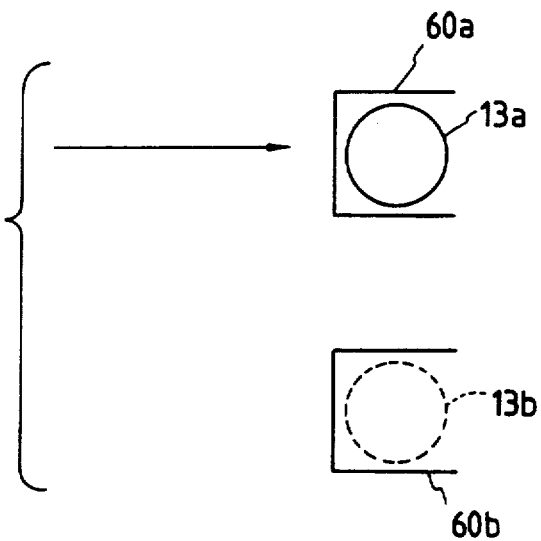
FIGS. 19(a) to (c) are diagrams each schematically showing a wafer being processed in the load-lock chamber illustrated in FIG. 18.
Figure 19B:
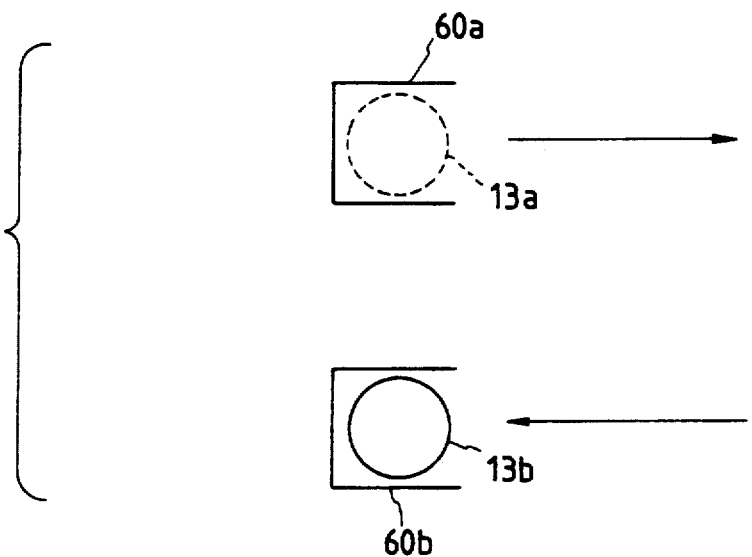
Figure 19C:
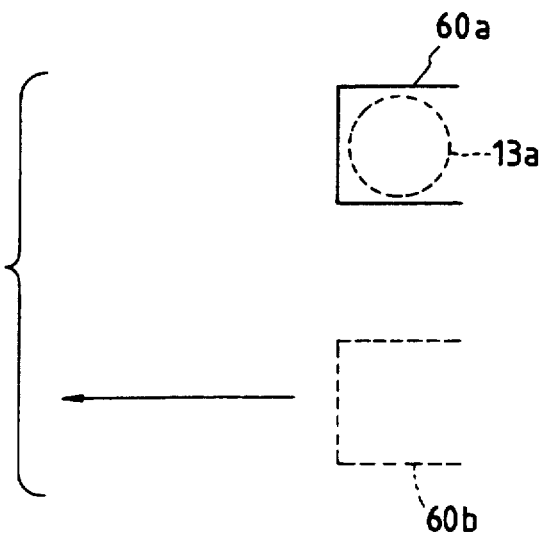

FIGS. 19(a) to (c) are schematic diagrams showing movements of wafers and wafer cassettes in the load-lock chamber. In the same figure, numeral 60b denotes a first wafer cassette; numeral 60a denotes a second wafer cassette; numeral 13b denotes a wafer belonging to a first wafer group (lot); and numeral 13a denotes a wafer belonging to a second wafer group.

Figure 20:
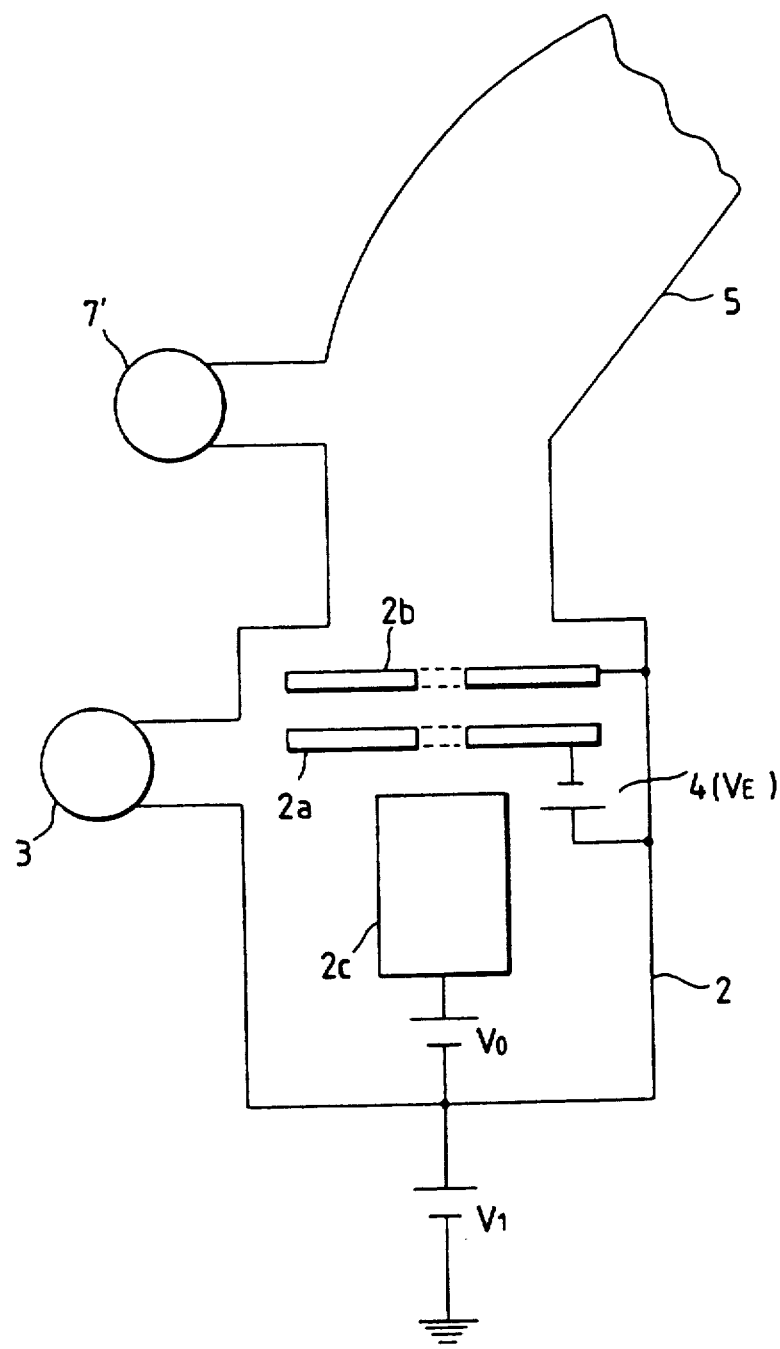
FIG. 20 is a sectional view showing a detailed structure of an ion source used in the ion implanter and the vicinity thereof as well as a potential relation of various portions.

FIG. 20 is an enlarged schematic sectional view showing the details of the ion source and the vicinity thereof. In the same figure, the numeral 2 denotes a housing of the ion source; numeral 2a denotes an extracting acceleration electrode ($V_E = -2-30$ KV); numeral 2b denotes a deceleration electrode (or a ground electrode); numeral 2c denotes an ion source body (an arc chamber or an ion generating chamber); numeral 3 denotes a vacuum evacuation system; numeral 4($V_E$) represents an extraction electrode power source and an acceleration voltage; numeral 5 denotes a mass spectrograph tube; numeral 7' denotes a vacuum evacuation system; $V_o$ denotes an ion extraction voltage (applied to the arc chamber); and $V_1$ denotes a post-acceleration voltage. Generally, $V_o$ is in the range of 20 to 30 KV, $V_E$ is in the range of $-2$ to 30 KV, and the deceleration electrode 2b is at a high earth potential of a high voltage vessel, namely, the post-acceleration voltage $V_1$. The numerals 2a and 2b are generically termed an extraction electrode or an extraction electrode group.

Constructions of various portions have been described above. Now, the operation will be described below with reference to FIGS. 1 to 20.

The ion beam 21 and the ion implantation chamber 12 in the ion implanter of FIG. 1 are in an evacuated state to about $5 \times 10^{-7}$ Torr (stand-by state) except when the ion implanter is repaired. In this state there is made replacement with wafer to be processed.

As shown in FIGS. 18 and 19(a) to (c), twenty-five wafers, which are designated one lot, are replaced in the unit of cassette. FIG. 19(a) shows a state in which a wafer 13a belonging to a new lot was introduced into the load-lock chamber 16 through the automatic opening/closing door 37 after the completion of loading of the wafer 13b. Thereafter, as shown in FIG. 19(b), the on-off valve 55 is opened while the automatic opening/closing doors 36, 37 and the on-off valves 56, 58 are closed until the completion of ion implantation for wafer group 13b (loading and unloading times: each 2 minutes, ion implantation time: about 5 minutes), and evacuation is performed up to $5 \times 10^{-5} - 5 \times 10^{-7}$ Torr by the vacuum evacuation system 14' in the order of the dry roughing vacuum pump and cryopump. After the completion of ion implantation for the wafer group 13b, the wafer group 13b are received into the first cassette 60b through the automatic opening/closing door 36. On the other hand, the wafer group 13a is set on the rotary stage 18 in the ion implantation chamber 12. When the wafer group 13a is set completely, the automatic opening/closing door 36 is closed and the on-off valve 56 becomes open, whereby an $N_2$ gas stream held at 20° C. or higher is fed into the load-lock chamber 16 from a dry $N_2$ source, and after atmospheric pressure is reached, the gas is discharged through the on-off valve 58, whereby there is formed an $N_2$ gas stream within the load-lock chamber 16 and the temperature of the wafer 13b cooled on the rotary stage 18 is increased to 10° C. or higher. The wafer 13b thus heated is discharged to the exterior through the automatic opening/closing door 37, as shown in FIG. 19(c).

The wafer 13 set on the rotary stage is cooled to a temperature of 0° C. to 150° C. in such a state shown in FIGS. 1-7 and 13-15, whereby the ion-implanted surface temperature of the wafer during ion implantation can be controlled to a temperature of several ten degrees centigrade to $-120°$ C.. In the case of cooling to a temperature of about $-20°$ C. to 30° C., as shown in FIG. 4, it is effective to improve the heat conduction by introducing a gas such as, for example, N$_2$, He, or Ar, for the back of the wafer 13. In the case of a still lower temperature, the circulation of nitrogen (liquid) is used in FIG. 4, or adiabatic expansion of helium is used like a cryopump as in FIG. 5. In the case of using such an electrostatic chuck as shown in FIG. 6, it is necessary to interpose an elastomer 33 between the wafer 13 and the rotary stage 18 for insulation of the two, so the thermal efficiency (cooling efficiency) somewhat lowers, but it is possible to utilize such refrigerant circulating mechanisms as shown in FIGS. 4 and 5.

When the wafer 13 is cooled to a predetermined temperature on the rotary stage 18 which is held at the predetermined temperature, the stage 18 starts rotating as shown in FIG. 7 and moves in a parallel and reciprocative manner (about 10 second cycle) in a direction perpendicular to the rotational axis thereof while maintaining a number of revolutions of about 1000 rpm, whereby ion implantation is performed in such a manner that an ion beam of 60 mm×60 mm in section covers the whole wafer surface uniformly. The amount of ion implanted is monitored by catching the beam passing backwards through a gap or the like in the rotary stage 18, using such a Faraday cup 52 as shown in FIG. 15. On the other hand, the supply of refrigerant to the vicinity of the wafer 13 is performed from the refrigerator 15 through the central rotor portion 51 (FIG. 13) and the support rod portion 50. The supply of refrigerant is continued also during rotation of the stage 18, whereby the surface temperature of the wafer 13 is kept constant also during ion implantation using a large current flow.

Now, the operation of a beam line will be described. First, as shown in FIGS. 20 and 8, a predetermined gas or vapor which produces a desired ion is fed in steps each in a very small amount to the body 2c of the ion source 2, but by the action of the vacuum evacuation systems 3 and 7' a beam line from the extracting acceleration and deceleration electrode groups 2a, 2b to the mass spectrograph 5 is held at a high vacuum of approximately $5 \times 10^{-6}$ Torr or higher (during ion implantation). The ion generated within the ion source body 2c is accelerated to various kinds of energies by the action of the acceleration and deceleration electrode groups 2a, 2b and flies toward the mass spectrograph portion 5. The ion to be implanted, e.g. P$^{++}$ (positive divalent phosphorus ion), which has passed through the analyzer front path 21a is deflected while passing through the analyzer center path 21b and then passes through the aperture (FIG. 17) of the mass spectrograph slit electrode 6' provided at a terminal end portion of the analyzer rear path 21c. The normal ion (P$^{++}$) further passes through the inter-filter path (about 20 cm long) and through the aperture 54 (FIG. 17) formed in the slit electrode 6 for beam filter to block abnormal ions (e.g. P$^-$), then passes through the post-acceleration tube path 21e (potential difference V$_1$) which is set to pass a desired ion energy and is implanted into the wafer 13 which is rotating, as shown in FIG. 7.

Next, the operation of the slit electrode 6 for beam filter, etc. will be described below with reference to FIGS. 8, 16 and 20.

For example, a consideration will now be made about the implantation of P$^{30}$ +. P$_2$+ emitted from the ion source 2 impinges on and reacts with a residual gas ion A to form P+, P and A in the analyzer front path 21a as in FIG. 16(a). The P and A are analyzed in the mass spectrograph portion 5 and do not come out rearwards of the slit electrode 6', while the P+ passes through the slit electrode 6' despite of the difference in a mass load ratio (m/e) due to an offsetwise action of the difference in speed between P$_2$+ and P+ before reaction. When this abnormal P+ ion reaches the post-acceleration tube 8, it is implanted into the wafer 13 in a state in which acceleration is up to only a considerably lower energy than the desired energy, thus causing so-called energy contamination. It is the slit electrode 6 for beam filter that is provided for the purpose of removing such abnormal ion before reaching the post-acceleration tube 8. The slit electrode 6 for beam filter is such a graphite electrode as shown in FIG. 17 and is disposed in the beam path substantially perpendicularly to the beam path at its main surface so that the normal beam coincides with the central aperture 54. The potential thereof V$^f$ (based on the earth potential) is set to a voltage a little higher than a half of V$_o$ in the case where P$^{++}$ is normal and P+ (formed from P$_2$+ by the reaction shown previously) is abnormal. As a result, the faster P$^{++}$ can get over this potential crest, but the slow P+ (caused by P$_2$+) cannot get over the potential crest so cannot appear behind the slit electrode 6 for beam filter. In this way the implantation of di- and trivalent ions which induce abnormal ions frequently is realized in high purity.

Even with such slit electrode 6 for beam filter it is difficult to completely eliminate energy contamination generated behind (in the inter-filter path 21d or the acceleration tube path 21e) the mass spectrograph portion 5. For example, when such a collision reaction as that shown in FIG. 16(b) takes place in the implantation of P$^{++}$, there is no appropriate method for effectively preventing the entry of these ions into the post-acceleration tube 8. For eliminating the energy contamination caused by such reaction it is effective to connect, for exhaust (also during ion implantation), an exhaust port of the vacuum evacuation system to a position near each of the acceleration tube paths 21d and 21e so that the degree of vacuum in the slit electrode for beam filter and in acceleration tube paths 21d, 21e can be held at $1 \times 10^{-5}$ Torr, preferably $5 \times 10^{-6}$ Torr, during ion implantation. The vacuum evacuation systems 7 and 9 are provided for this purpose.

Further, coupled with the above slit electrode beam filter, the vacuum evacuation system 7' maintains the degree of vacuum of the beam line in the analyzer front path 21a (FIG. 8) and the vicinity thereof at a high level of $1 \times 10^5$ Torr, preferably $5 \times 10^6$ Torr, or higher during ion implantation, thereby reducing the occurrence of undesired reactions to prevent the formation of energy contamination.

Next, the operation of the charge-up preventing electron shower generator 10 (hereinafter referred to simply as "E-generator") and that of the monitor mechanism for same will be described below with reference to FIGS. 1, 7 and 10–12.

Electrons generated by the E-generator 10 in interlock with the formation of the implanting ion beam 21 shower over the wafer 13 together with the ion beam 21 to prevent charge-up of various portions of the wafer 13. However, although the initial value (I$_{EO}$) (emission) of the E-generator 10 ought to be kept constant, there sometimes occurs a change or stop by some cause or other. In this case, unless the ion extraction from the ion source 2 is stopped within an extremely short time, it is impossible to prevent the breakdown of elements on the wafer 13 or of oxide film, etc. as materials of the elements. In the present invention, the electron shower monitor 11 monitors the emission current $I_E$ in the E-generator 10, and when Is lowers to 90% or less of the set value IEO, a power-down signal is transmitted to the power source 1 for ion source by the operation of a microcomputer which constitutes the monitor 11 to lower the extraction voltage to a predetermined level (a high-voltage terminal level) at an instant, thereby preventing the formation of the ion beam 21 itself.

Next, the relation between ion implantation processes 1-10 in later-described embodiments 2, 3 and this embodiment 1 will be described below. The various variations shown above in the embodiment 1 are all applicable to the said ion implantation processes, but concrete examples of suitable combinations will be shown below.

The slit electrode for beam filter is effective particularly in the implantation of polyvalent ions, but is also effective in other cases as a method for removing undesired ions. Therefore, particularly effective processes are the ion implantation processes 1, 2, 4 and 10 which will be described in detail later.

The cooling of wafer at the time of ion implantation is effective in all of the processes, particularly effective in promoting the formation of an amorphous layer to prevent the formation of a transition layer between the amorphous layer and the normal layer. Thus, such cooling of wafer is effective in the case where such transition layer is to be made as thin as possible to facilitate and complete the remedy of defects caused by annealing, and hence it is particularly effective in later-described ion implantation processes 8, 9 and modifications thereof. In this case, the upper surface temperature of wafer during ion implantation is held in the range from room temperature to $-15°$ C., preferably not higher than $0°$ C. Especially, at a density at which an amorphous state is not complete, it is desirable to maintain the wafer upper surface temperature at $-5°$ C. to $-100°$ C. As preamorphous implantation, in the case of implanting a heavy ion such as $Ge^+$ followed by implantation of an impurity which is relatively difficult to be rendered amorphous such as $B^+$, it is possible to prevent the remaining of defects after annealing almost completely if the water temperature is held at $-50°$ C. to $-100°$ C. from the start of pre-amorphous implantation and then there is performed $B^+$ implantation in this state.

In the ion implantation processes 1 to 10, the annealing after ion implantation can be conducted at a temperature as low as $900°$ to $800°$ C. in the case where such cooling of wafer is performed.

In connection with lamp annealing, there may be disposed a large number of halogen lamps in the portion of the wafer heating lamp 35 in FIG. 7 to effect RTA (Rapid Thermal Annealing). At this time, the annealing may be carried out in a state wherein the wafer 13 has been transferred from the rotary stage 18 to a wafer holder and is held thereby. But in the case of ion implantation at a low temperature, it is desirable to rotate the rotary stages 18 and subject all the wafers 13 to RTA treatment directly while holding the wafers on the stage held at an implantation temperature, in order to prevent the increase of temperature, whereby the removal of defects is facilitated.

The "surface temperature or upper surface temperature of wafer (indicating silicon single crystal as an example)" as referred to herein corresponds to a macroscopic average temperature of a laminar region located about several $\mu m$ from the interface of an oxide film, etc. on the upper surface of silicon single crystal in which defects are induced by ion implantation.

Embodiment 2

A concrete semiconductor integrated circuit device manufacturing method using the ion implanter of the above embodiment 1 will be described below. In the following description, an implanted ion density is indicated in terms of the number of ions implanted actually, not an integral value in an electric current system. Likewise, an implantation energy is indicated by an actual ion energy, not corresponding to an acceleration voltage. (This also applies to other embodiments.)

The following explanation will be made with reference to FIGS. 21 to 66.

Figure 21:
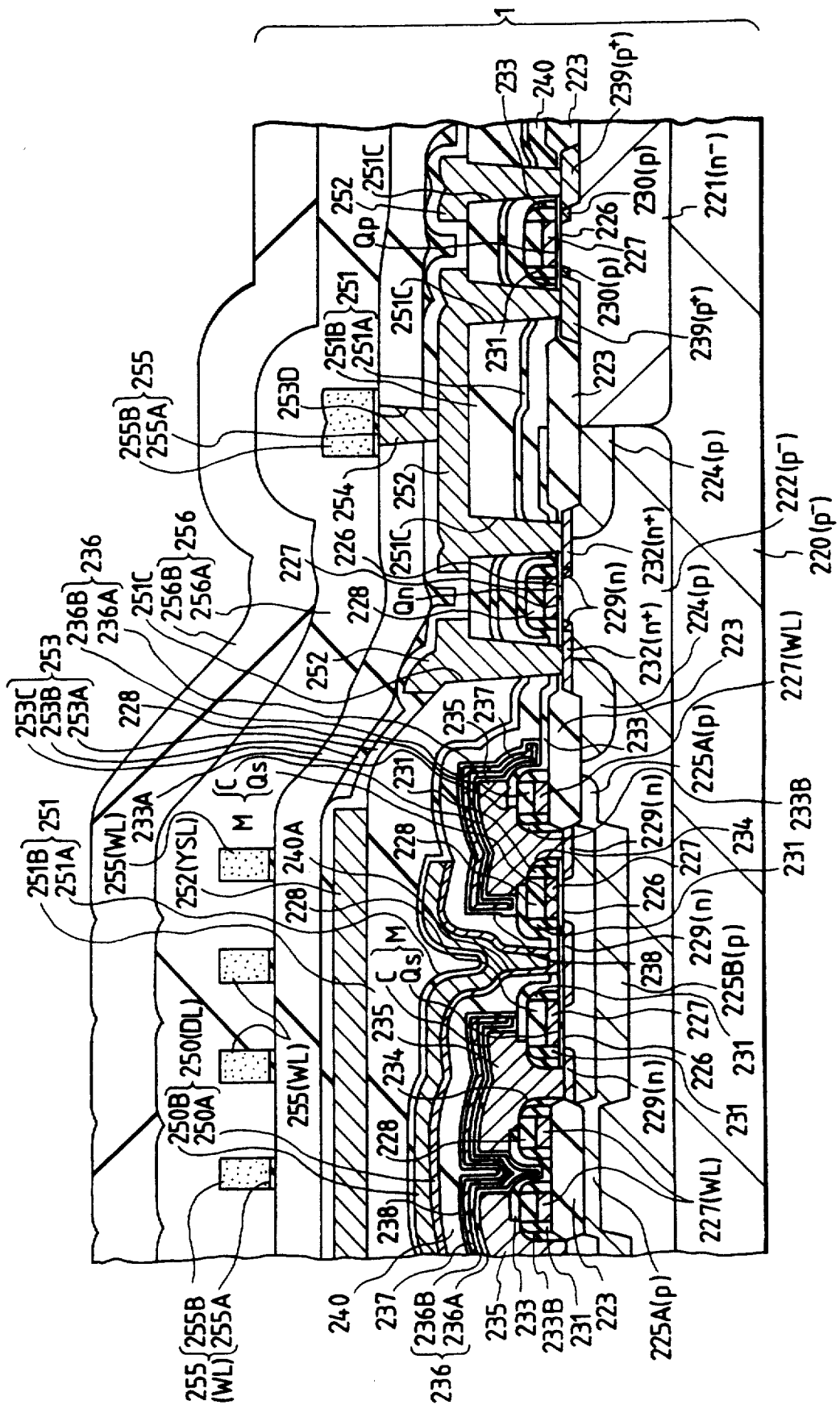
FIG. 21 is a sectional view of a principal portion of a DRAM, showing a method for producing a semiconductor integrated circuit device according to an embodiment 2 of the present invention.
Figure 22:
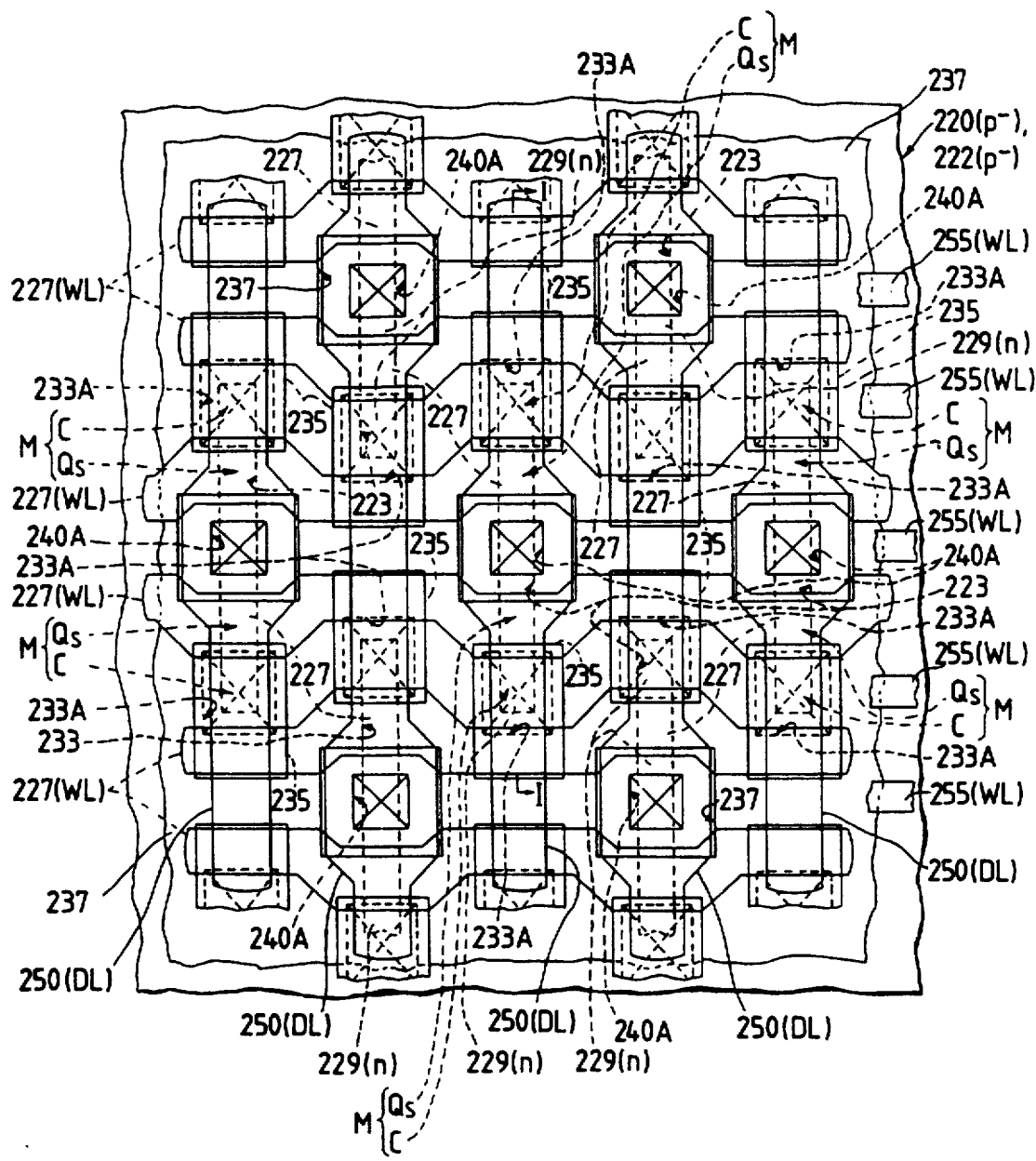
FIG. 22 is a plan view of a principal portion of a memory cell array in the DRAM.

First, concrete structures of memory cells M of a DRAM (Dynamic Random Access Memory) 201 and elements constituting a peripheral circuitry (sense amplifier circuit, decoder circuit, etc.) will be described. A planar structure of a memory cell array 211E is shown in FIG. 22 (a plan view of a principal portion), while a sectional structure of the memory cell array 211E and that of the peripheral circuit elements are shown in FIG. 21 (a sectional view of a principal portion). A sectional structure of the memory cell M shown on the left-hand side of FIG. 21 corresponds to a sectional structure of the portion cut along line I—I in FIG. 22. The right-hand side of FIG. 21 shows a sectional structure of a complementary MISFET (CMOS) which constitutes the peripheral circuitry.

As illustrated in FIGS. 21 and 22, the DRAM 201 comprises a $p^-$-type semiconductor substrate 220 formed by single crystal silicon. The $p^-$-type semiconductor substrate 220 employs (100) single crystal plane as an element forming plane and is formed at a resistance value of, say, 10 $\Omega cm$. A main surface of the $p^-$-type semiconductor substrate 220 is not implanted with an n-type impurity of about $10^{15}$ atoms/cm$^2$ or more by an ion implantation method. The said partial main surface portion indicates at least the region of the memory cell array 211E. The above introduction of n-type impurity causes a large quantity of crystal defects, thus allowing an electric charge as information to leak, so the impurity introduction region is partially restricted. Therefore, in order to diminish contamination caused by a heavy metal such as Fe, the DRAM 201 used in this embodiment has a gettering layer in a deep region of the semiconductor substrate 220.

In the main surface portion of the $p^-$-type semiconductor substrate 220 where there are formed the memory cell M and an n-channel MISFET Qn there is provided a $p^-$ type well region 222. Further, an $n^-$-type well region 221 is provided in the main surface portion of the substrate 220 where there is formed a p-channel MISFET Qp. That is, the DRAM 201 in this embodiment is of a twin well structure. The $p^-$-type well region 222 is formed by self-alignment with respect to the $n^-$-type well region 221, although this point will be explained later in connection with a manufacturing method.

On the main surface portion (a non-active region) between semiconductor element forming regions in each of the well regions 221 and 222 there is provided an insulating film (field insulating film) 223 for element isolation. In the main surface portion corresponding to the region where the memory cell array 211E of the $p^-$-type well region 222 is formed, there is provided a p-type channel stopper region 225A. Since a parasitic MOS using the insulating film 223 for element isolation is apt to undergo n-type inversion, the channel stopper region is provided at least in the main surface portion of the p⁻-type well region 222. The p-type channel stopper region 225A is constituted at a high impurity concentration as compared with the p⁻-type semiconductor substrate 220 and p³¹-type well region 222.

In the memory cell M forming region of the memory cell array 211E, a p-type semiconductor region 225B is provided in the main surface portion of the p⁻-type well region 222. The p-type semiconductor region 225B is provided substantially throughout the whole surface of an active region of the memory cell array 211E, and it is formed by the same manufacturing process as that of the p-type channel stopper region 225A. Although the details will be described later, the p-type semiconductor region 225B and the p-type channel stopper region 225A are formed by introducing impurity into the main surface portion of each of the active and nonactive regions of the memory array 211E of the p⁻-type well region 222 and then activating the impurity. As the impurity there is used boron for example, which is introduced by an ion implantation method using high energy. Into the main surface portion of the non-active region of the p⁻-type well region 222 is introduced impurity by passing it through the insulating film 223 for element isolation. Into the main surface portion of the active region (memory cell M forming region) of the p⁻-type well region 222 is introduced the said impurity in a deep position from the said main surface portion corresponding to the thickness of the insulating film 223.

The p-type channel stopper region 225A thus constructed is formed by self-alignment with respect to the insulating film 223 for element isolation, and since it is formed after a heat treatment for forming the insulating film 223, as will be described later, it is possible t decrease the amount of diffusion to the active region side of the p-type impurity which forms the p-type channel stopper region 225A. As a result of this decrease in the amount of diffusion of the p-type impurity, it is possible to reduce a channel narrowing effect of a memory cell selecting MISFET Qs. Since the p-type semiconductor region 225B is formed below the memory cells M and acts as a potential barrier region against minority carrier, it is possible to increase an α-ray soft error withstand voltage. Further, since the p-type semiconductor region 225B can somewhat increase the impurity concentration of the main surface of the p⁻-type well region 222 and increase a threshold voltage of the memory cell selecting MISFET Qs, there is no fear of misconduction even in the event of noise in a word line WL which is in an unselected state. Moreover, since the p type semiconductor region 225B can increase pn junction capacitance formed in a semiconductor region 229 on a connected side with an electrode of an information storage capacitor C of the memory cell selecting MISFET Qs, it is possible to increase the amount of an electric charge stored in the information storage capacitor C.

Figure 23:
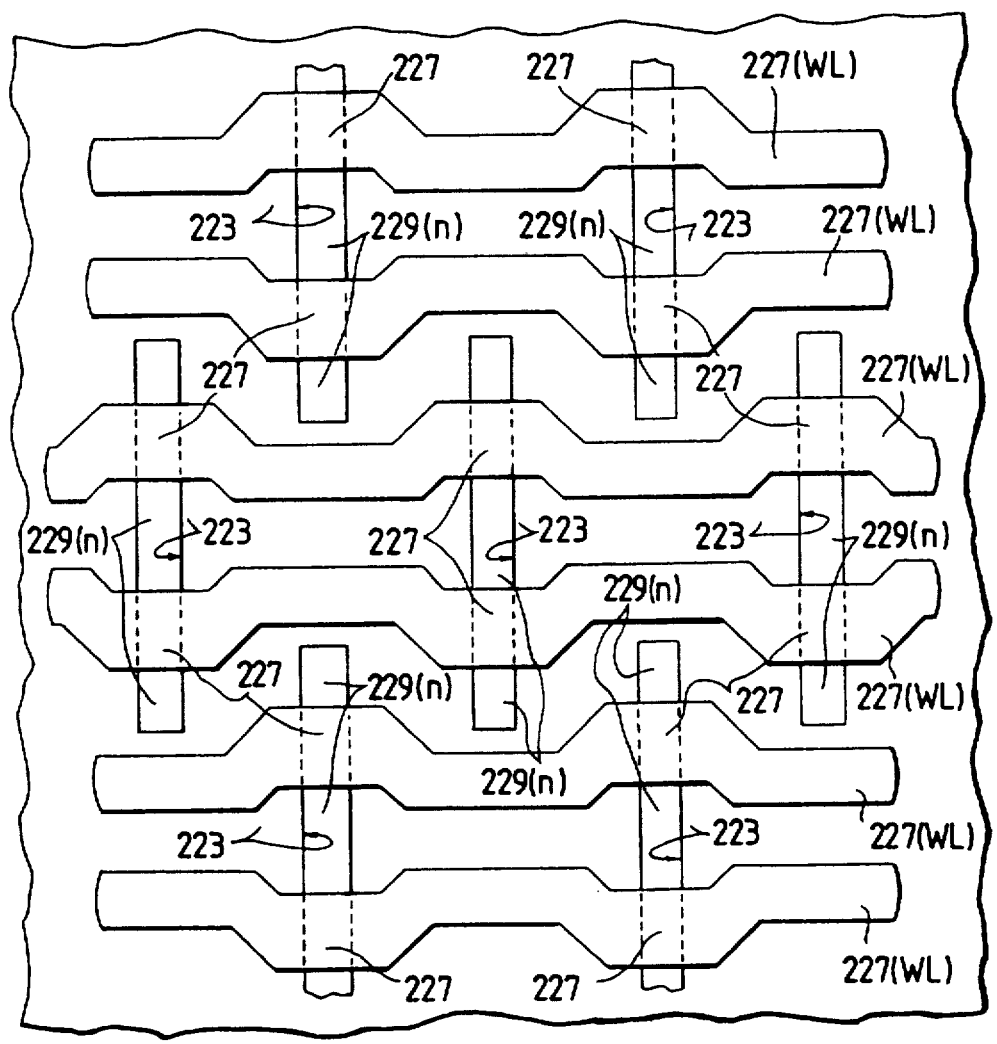
FIGS. 23 and 24 are each a plan view of a principal portion in a predetermined manufacturing process for the memory cell array in the DRAM.

The memory cell selecting MISFET Qs of the memory cell M is formed on the main surface of the p⁻-type well region 222, as shown in FIGS. 21, 22 and 23 (each being a plan view of a principal portion in a predetermined manufacturing process). Actually, the memory cell selecting MISFET Qs is formed on a main surface portion of the p⁻-type well region 222 which is surrounded by the p-type semiconductor region 225B and has a somewhat high impurity concentration. The memory cell selecting MISFET Qs is constituted within the region defined by both the insulating film 223 for element isolation and the p-type channel stopper region 225A. The memory cell selecting MISFET Qs mainly comprises p⁻-type well region 222, gate insulating film 226, gate electrode 227 and a pair of n-type semiconductor regions 229 which are source and drain regions.

The p⁻-type well region 222 is used as a channel forming region. The gate insulating film 226 is a silicon oxide film formed by oxidizing the main surface of the p⁻-type well region 222. When the gate insulating film 226 is made thin and dielectric strength is to be ensured, the gate insulating film 226 may be a composite film formed by successively laminating a silicon oxide film and a silicon nitride film together.

The gate electrode 227 is formed on the gate insulating film 226. For example, the gate electrode 227 is a polycrystalline silicon film formed by deposition according to a CVD (Chemical Vapor Deposition) method. It has a thickness of about 200 to 300 nm. The polycrystalline silicon film just referred to above incorporates therein an n-type impurity (P or As) which reduces a resistance value. The gate electrode 227 may be constituted by a single layer of a transition metal (a high-melting metal Mo, Ti, Ta, or W) film or a transition metal silicide (a high-melting metal silicide $MoSi_2$, $TiSi_2$, $TaSi_2$, or $WSi_2$) film. Also, the gate electrode 227 may be a composite film formed by laminating the above transition metal film or transition metal silicide film onto a polycrystalline silicon film.

As shown in FIGS. 22 and 23, the gate electrode 227 is constituted integrally with the word line (WL) 227 extending in the column direction. That is, the gate electrode 227 and the word line 227 are formed by the same electroconductive layer. Each word line 227 is constituted for interconnection of gate electrodes 227 of the memory cell selecting MISFET Qs's in plural memory cells M which are disposed in the row direction.

As shown in FIG. 23, the gate length of the gate electrode 227 of each memory cell selecting MISFET Qs is made larger than the width of the word line 227. For example, the gate length of the gate electrode 227 is 0.7 μm, while the width of the word line 227 is 0.5 μm. In other words, the memory cell selecting MISFET Qs is constituted so as to ensure an effective gate length (effective channel length) and thereby reduce a short channel effect. On the other hand, the word line 227 is constituted so as to minimize the spacing between word lines 227 to reduce the area of the memory cell M and thereby improve the integration density. Since the word line 227 is reduced in its resistance value by a shunting word line (WL) 255 as will be described later, the speed of information writing operation and that of reading operation are not decreased even when the word line width is reduced. In this embodiment 2 there is adopted a so-called 0.5 μm manufacturing process wherein the minimum processing size for the DRAM 201 is set at 0.5 μm.

The n-type semiconductor region 229 is formed at an impurity concentration lower than that of an n⁺-type semiconductor region 232 of the MISFET Qn which constitutes a peripheral circuitry. More specifically, the n-type semiconductor region 229 is formed by an ion implantation method using an impurity concentration lower than $1 \times 10^{14}$ atoms/cm². That is, the n-type semiconductor region 229 is formed so as to reduce crystal defects caused by the introduction of impurity and fully remedy crystal defects by heat treatment after the introduction of impurity. In the n-type semiconductor region 229, therefore, the amount of leak current in the pn junction of the p⁻-type well region 222 is small and so it is possible to stably hold the electric charge stored as information in the information storage capacitor C.

The n-type semiconductor region 229 is formed by self-alignment with respect to the gate electrode 227 and the channel forming region side is constituted at a low impurity concentration, thus constituting the memory cell selecting MISFET Qs which has an LDD (Lightly Doped Drain) structure.

One n-type semiconductor region 229 (on the connection side of a complementary data line 250) of the memory cell selecting MISFET Qs is formed somewhat high in impurity concentration by the diffusion of an n-type impurity into a polycrystalline silicon film 250A which underlies the complementary data line 250, in a region defined by a later-described connection hole 240A. The n-type impurity introduced into the n-type semiconductor region 229 permits an ohmic connection of the n-type semiconductor region 229 and the complementary data line 250, so it is possible to reduce the resistance value of the connection. Even in the case where there occurs a mask alignment error between the n-type semiconductor region 229 and the connection hole 240A in the manufacturing process, so the connection hole 240A overlaps the insulating film 223 for element isolation and the main surface of the p⁻-type well region 222 is exposed to the interior of the connection hole 240A, the aforesaid n-type impurity forms an n-type semiconductor region so as to prevent shortcircuit between the complementary data line 250 and the p⁻-type well region 222.

The other n type semiconductor region 229 (on the connection side of the information storage capacitor C) of the memory cell selecting MISFET Qs is formed somewhat high in impurity concentration by the diffusion of an n-type impurity into a lower electrode layer 235 of the information storage capacitor C which will be described later, in a region defined by a connection hole 234. Since this n-type impurity permits an ohmic connection of the n-type semiconductor region 229 and the lower electrode layer 235, it is possible to reduce the resistance value of the connection. Further, since the said n-type impurity can increase the impurity concentration of the n-type semiconductor region 229 and increase a pn junction capacitance formed by both the n-type semiconductor regions 229 and the p⁻-type well region 222, it is possible to increase the amount of the electric charge stored in the information storage capacitor C.

On the gate electrode 227 of the memory cell selecting MISFET Qs there is formed an insulating film 228 as an overlying layer, and a side wall spacer 231 is provided on each side wall of the gate electrode 227 and the insulating film 228. The insulating film 228 is formed so as to electrically separate the gate electrode 227 and each electrode (especially 235) of the information storage capacitor C formed thereon from each other. The side wall spacers 231 are formed by self-alignment with respect to the gate electrode 227 of the memory cell selecting MISFET Qs in the memory cell M forming region for the connection of the other n-type semiconductor region 229 and the lower electrode layer 235 of the information storage capacitor C. The side wall spacers 231 are formed for providing an LDD structure of the CMOS in the peripheral circuitry forming region.

The insulating film 228 and the side wall spacer 231 are formed using a silicon oxide film obtained by deposition according to a CVD method which employs an inorganic silane gas and nitrogen oxide gas as source gases, although the details of the manufacturing process will be given later. In this silicon oxide film, as compared with a silicon oxide film formed by deposition according to a CVD method which employs an organic silane gas as a source gas, the step coverage at a stepped portion of the base is high and the film shrinkage is small. In other words, in the insulating film 228 and the side wall spacer 231 which are formed by the said method, it is possible to reduce the separation of the two caused by film shrinkage and hence it is possible to prevent short-circuit between the gate electrode 227 and other electroconductive layers, e.g. the lower electrode layer 235.

Figure 24:
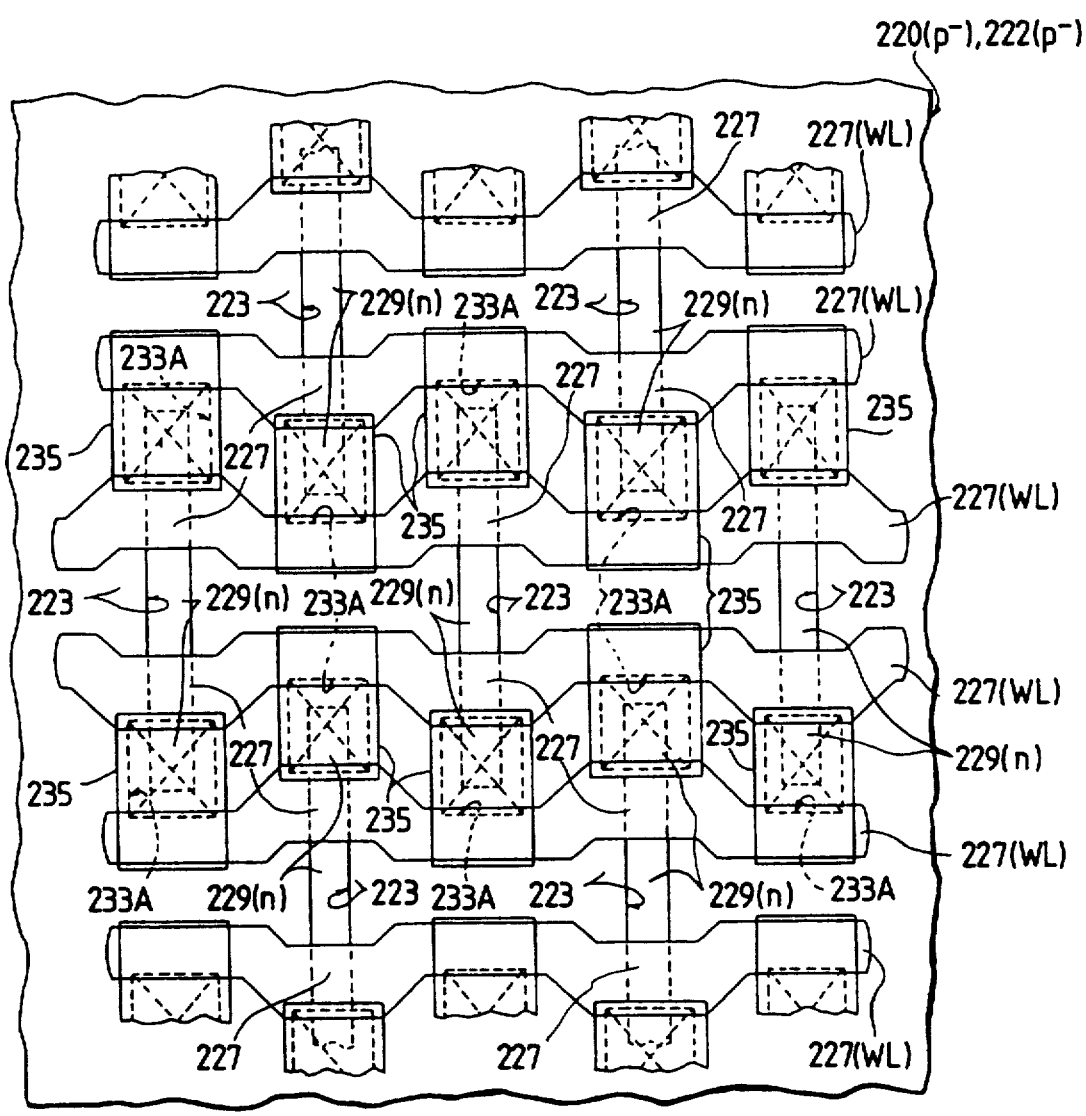

The information storage capacitor C of the memory cell M is constituted mainly by successive lamination of the lower electrode layer 235, a dielectric film 236 and an overlying electrode layer 237, as shown in FIGS. 21, 22 and 24 (each being a plan view of a principal portion in a predetermined manufacturing process). The capacitor C has a so-called stacked structure (STC).

A part (central part) of the information storage capacitor C having such stacked structure is connected to the other n-type semiconductor region 229 of the memory cell selecting MISFET Qs. This connection is made through connection holes 233A formed in an interlayer insulating film 233 and also through connection holes 234 defined by side spacers 231, 233B. The opening size in the row direction of each connection hole 234 is defined by the spacing of gate electrodes 227 of the memory cell selecting MISFET Qs's, that of word lines 227 adjacent thereto and also by the film thicknesses of the side wall spacers 231, 233B. The difference in the opening size between the connection holes 233A and 234 is at least larger than the size corresponding to a mask alignment margin in the manufacturing process. The other portion (peripheral portion) of the lower electrode layer 235 is extended up to positions above the gate electrode 227 and the word line 227.

The interlayer insulating film 233 is formed by an insulating film similar to the underlying insulating film 228 and side wall spacer 231. That is, the interlayer insulating film 233 is a silicon oxide film formed by deposition according to a CVD method which employs an inorganic silane gas and nitrogen oxide gas as source gases.

The lower electrode layer 235 is formed, for example, by a polycrystalline silicon film deposited according to a CVD method. In this polycrystalline silicon film is incorporated at a high concentration an n-type impurity (As or P) which reduces the resistance value. The lower electrode layer 235 is constituted so that the side wall area out of its surface portion is increased to increase the amount of the electric charge stored in the information storage capacitor C of a stacked structure. The lower electrode layer 235 is formed at a film thickness equal to or larger than one half in the gate length direction of the opening size of the connection hole 234 so that its surface is flattened. For example, the lower electrode layer 235 has a relatively large thickness of about 400 to 600 μm. In plan view, the lower electrode layer 235 has a rectangular shape longer in the row direction in which the complementary data line 250 extends, as shown in FIGS. 22 and 24.

The dielectric film 236 basically has a laminated two-layer structure comprising a silicon nitride film 236A formed on the upper surface of the lower electrode layer (polycrystalline silicon film) 235 by deposition according to a CVD method and a silicon oxide film 236B formed by oxidizing the silicon nitride film 236A at a high pressure. Actually, since a native silicon oxide film (not shown because of a very thin film thinner than 5 nm) is formed on the surface of the polycrystalline silicon film as the lower electrode layer 235, the dielectric film 236 has a successively laminated three-layer structure comprising the native silicon oxide film, the silicon nitride film 236A and the silicon oxide film 236B. Since the silicon nitride film 236A as a constituent of the dielectric film 236 is formed by deposition according to a CVD method, it can be formed under process conditions independent of the base layer without being influenced by the state of crystals and the shape of stepped portion of the polycrystalline silicon film (the lower electrode layer 235) as the base layer. In other words, as compared with the silicon oxide film formed by oxidizing the surface of the polycrystalline silicon film, the silicon nitride film 236A is higher in dielectric strength and smaller in the number of defects per unit area, so the leak current flow is very small. Besides, the silicon nitride film 236A is characterized by being higher in dielectric constant than the silicon oxide film. Since the silicon oxide film 236B can be formed of a film having very good quality, the above-mentioned characteristics of the silicon nitride film 236A can be further improved. Further, since the silicon oxide film 236B is formed by a high-pressure oxidation (1.5 to 10 Torr), although this point will be described in detail later, it can be formed in a shorter oxidation time, or heat treatment time, than in atmospheric oxidation.

The dielectric film 236 is formed along the upper surface and side walls of the lower electrode layer 235 and thus the side wall portion of the lower electrode layer 235 is utilized for the contribution to the increase of area in the height direction. This increase in the area of the dielectric film 236 permits improvement in the amount of the electric charge stored in the information storage capacitor C having a stacked structure. A planar shape of the dielectric film 236 is defined by that of the overlying electrode layer 237, and the dielectric film 236 is substantially in the same shape as the upper electrode layer 237.

The upper electrode layer 237 is formed over the lower electrode layer 235 so as to cover the latter through the dielectric film 236. It is formed integrally with the upper electrode layer 237 of the information storage capacitor C having a stacked structure of the adjacent memory cell M. To the upper electrode layer 237 is applied a low source voltage of ½ Vcc. The upper electrode layer 237 is a polycrystalline silicon film formed by vapor deposition according to a CVD method for example. Into this polycrystalline silicon film is incorporated an n-type impurity which reduces the resistance value. The upper electrode layer 237 has a small film thickness as compared with the lower electrode layer 235 for example. On the surface of the upper electrode 237 is formed an insulating film 238. The insulating film 238 is formed at the time of removing a residual portion remaining after etching in the stepped portion of the base layer surface in the processing of the upper electrode layer 237 though this point will be described later.

The dielectric film 236 of the information storage capacitor C having a stacked structure is formed on the interlayer insulating film 233 in the other region than the lower electrode layer 235. The interlayer insulating film 233 is formed by a silicon oxide film deposited according to a CVD method which employs an inorganic silane gas and nitrogen oxide gas as source gases as noted previously. Particularly, the lower silicon nitride film 236A of the dielectric film 236 is in contact with the interlaying insulating film 233 which exhibits little shrinkage with respect to the silicon nitride film 236A, so the information storage capacitor C of a stacked structure is constituted so that it can prevent a breakdown based on stress of the dielectric film 236.

The memory cell M is connected to another memory cell M adjacent thereto in the row direction, as shown in FIGS. 21, 22, 23 and 24. More specifically, in two memory cells M adjacent to each other in the row direction, one n-type semiconductor region 229 of the respective memory cell selecting MISFET Qs are integrally constituted, with an inversion pattern centered on this portion. These two memory cells M are arranged in a plural number in the column direction, and these two memory cells M and other two memory cells M adjacent thereto in the column direction are displaced from each other by one-half pitch in the row direction.

To one n type semiconductor region 229 of the memory cell selecting MISFET Qs of the memory cell M there is connected the complementary data line (DL) 250, as shown in FIGS. 21 and 22. The complementary data line 250 is connected to the n-type semiconductor region 229 through the connection holes 240A formed in the interlayer insulating films 233 and 240.

The interlayer insulating film 240 is a silicon oxide film formed by deposition according to a CVD method which employs an inorganic silane gas and nitrogen oxide gas as source gases for example. The information storage capacitor C of a stacked structure is formed by successive lamination of the lower electrode layer 235, dielectric film 236 and upper electrode layer 237; besides, the lower electrode layer 235 has a large film thickness, thus resulting in a large stepped shape. In view of this point, the surface of the interlayer insulating film 240 is made flat. More particularly, the surface stepped shape of the interlayer insulating film 240 grows large by an amount corresponding to the thickness of the lower electrode layer 235, so the spacing between the above lower electrode layer 235 and the other lower electrode layer 235 adjacent thereto is filled up with the interlayer insulating film 240, whereby the surface of the interlayer insulating film 240 is rendered flat. In the spacing between the lower electrode layers 235 of the information storage capacitors C having a stacked structure of adjacent memory cells M, the minimum spacing area forms a large stepped shape greater than 1 in terms of aspect ratio. In this embodiment 2, the minimum spacing between the lower electrode layers 235 is about 0.5 μm. Between the lower electrode layers 235 are interposed the dielectric film 236 and the upper electrode layer 237. Therefore, the interlayer insulating film 240 is formed at a film thickness of one half or larger of the minimum spacing between the lower electrode layers 235 wherein the dielectric film 236 and the upper electrode layer 237 are interposed. Besides, the interlayer insulating film 240 is formed so as to have a thickness capable of ensuring dielectric strength and reducing parasitic capacitance. For example, the interlayer insulating film 240 has a thickness of 250 to 350 nm.

The complementary data line 250 comprises a composite film of a two-layer structure formed by successive lamination of the polycrystalline silicon film 250A and the transition metal silicide film 250B. The polycrystalline silicon film 250A as a lower layer is formed at a thickness of, say, 100 to 150 nm by deposition according to a CVD method. Into this polycrystalline silicon film 250A is incorporated an n-type impurity, e.g. P, which reduces the resistance value. Since the step coverage at the stepped portion of the base layer is good, the polycrystalline silicon film 250A can reduce the breaking of the complementary data line 250. The transition metal silicide film 250B as an upper layer is formed at a thickness of, say, 100 to 200 nm, by deposition according to a CVD method (or a sputtering method). It can reduce the resistance value of the complementary data line 250 and increase the speed of information writing operation and that of information reading operation. Further, since the step coverage at the stepped portion of the base layer is good, the transition metal silicide film 250B as an upper layer can reduce the breaking of the complementary data line 250. The lower polycrystalline silicon film 250A and the upper transition metal silicide film 250B of the complementary data line 250 each have heat resistance and oxidation resistance. The complementary data line 250 has a width of, say, 0.6 μm.

Thus, in the DRAM 201, the memory cell M is constituted by a series circuit comprising the memory cell selecting MISFET Qs wherein the complementary data line 250 is connected to one n-type semiconductor region 229 and the information storage capacitor C of a stacked structure formed above the MISFET Qs by successive lamination of the lower electrode layer 235, dielectric film 236 and upper electrode layer 237. Further, the complementary data line 250 formed as a composite film by successive lamination of the polycrystalline silicon film 250A deposited according to a CVD method and the transition metal silicide film 250B is provided above the upper electrode layer 237 of the information storage capacitor C of a stacked structure through the interlayer insulating film 240. The interlayer insulating film 240 between the upper electrode layer 237 and the complementary data line 250 is formed thicker than one half of the interposed spacing of the upper electrode layer 237 between the lower electrode layer 235 of the information storage capacitor C of a stacked structure of the above memory cell M and the lower electrode layer 235 of the information storage capacitor C of a stacked structure of the other memory cell M which is adjacent to the above lower electrode layer 235 through a minimum spacing. Under this construction, there occurs interdiffusion of impurity in the transition metal silicide layer 250B as an upper layer of the complementary data line 250, so flow is applied using BPSG film or PSG film as the interlayer insulating film 240. Although flattening of the base layer surface of the complementary data line 250 cannot be promoted, the thickness of the interlayer insulating film 240 is controlled on the basis of the spacing between the lower electrode layers 235 which are adjacent t each other through the foregoing minimum spacing, and the said space between the lower electrodes 235 is filled up with the interlayer insulating film 240, whereby the surface flattening of the interlayer insulating film 240 can be attained. Consequently, it is possible to prevent short-circuit between complementary data lines 250 caused by the residue remaining after etching in the stepped portion of the interlayer insulating film 240 in between the above lower electrode layers 235 during processing of the complementary data line 250, whereby the electrical reliability can be improved.

Above the complementary data line 250 there is formed a column select signal line (YSL) 252 through an interlayer insulating film 251. For example, the interlayer insulating film 251 is a composite film of a two-layer structure formed by successive lamination of a silicon oxide film 251A deposited according to a CVD method and a BPSG film 252B deposited also according to a CVD method. The silicon oxide film 251A as a lower layer is provided for preventing B or P incorporated in the BPSG film 251B as an upper layer from leaking downwards. For example, the underlying silicon oxide film 251A is formed by deposition according to a CVD method which employs an inorganic silane gas and nitrogen oxide gas as source gases. It has a thickness of, say, 100 to 200 nm. Flow is applied to the overlying BPSG film 251B to flatten the surface thereof. The BPSG film 251B has a thickness of, say, 250 to 350 nm.

The column select signal line 252 is deposited on the surface of the interlayer insulating film 251 of the base layer and so, for example, it is formed by a transition metal film deposited according to sputtering method. For example, this transition metal film is a tungsten film. The column select signal line 252 has a film thickness of, say, 350 to 450 nm. Since the column select signal 252 is formed by an upper layer different from the complementary data line 250, it is not restricted by the wiring pitch of the data line 250, nor is it necessary to avoid the connection between the complementary data line 250 and the memory cell M. In other words, since the column select signal line 252 can be extended wider than the width of the complementary data line 250 and substantially rectilinearly, it is possible to reduce the resistance value. For example, the column select signal line 252 has a width of about 2.0 μm.

Above the column select signal lines 252 there are formed shunting word lines (WL) 255 through an interlayer insulating film 253. The shunting word lines 255 are connected to the word lines (WL) 227 each in a corresponding predetermined region for each several ten to several hundred memory cells M, though not shown. In the memory cell array 211E, the word lines 227 are in a divided form into plural lines in the extending direction thereof. The shunting word lines 255 are connected to the plural word lines 227 thus divided. The shunting word lines 255 are constructed so that they can decrease the resistance value of the word lines 227 and increase the memory cell M selecting speed in each of information writing and reading operations.

As shown in FIG. 21, the inter-layer insulating film 253 is a composite film of a three-layer structure formed by successive lamination of silicon oxide film (deposited insulating film) 253A, silicon oxide film (applied insulating film) 253B and silicon oxide film (deposited insulating film) 253C. The lower silicon oxide films 253A and upper silicon oxide film 253C of the inter-layer insulating film 253 are formed by deposition according to a conformal plasma CVD method (hereinafter referred to a the "C-CVD method") using tetraethoxysilane [TEOS: $Si(OC_2H_5)_4$] gas as a source gas. Both lower and upper silicon oxide films 253A, 253C can be formed by a low temperature (about 400° C. or lower) deposition according to the C-CVD method and has a high step coverage. For example, both films are formed at a thickness of 250 to 350 nm. The silicon oxide film 253B as a middle layer of the inter-layer insulating film 253 is formed by application according to an SOG (Spin On Glass) method and subsequent baking treatment. The middle silicon oxide film 253B is formed for the purpose of flattening the surface of the interlayer insulating film 253. It is formed in an embedded fashion only in concaves of stepped portions formed by etching throughout the whole surface which is performed after the application of silicon oxide and subsequent baking treatment. Particularly, the middle silicon oxide film 253B is removed by etching from the inner wall surface of a connection hole 253D formed in the inter-layer insulating film 253 so as not to remain on the said inner wall surface as will be described later. That is, the middle silicon oxide film 253B is formed so that it can reduce the corrosion of an aluminum film or an alloy film thereof of the shunting word lines 255 caused by moisture contained in the film 253B. The middle silicon oxide film 253B is formed at a thickness of, say, 100 nm.

The shunting word lines 255 are each a composite film formed by successive lamination of a transition metal nitride film (or a transition metal silicide film) 255A and an aluminum alloy film (or an aluminum film) 255B.

In the case where Cu is incorporated in the aluminum alloy film 255B as the upper layer, the transition metal nitride film 255A as the lower layer is, for example, a TiN film having barrier properties. Where Si is incorporated in the upper aluminum alloy film 255B, the lower transition metal nitride film 255A is a transition metal silicide film, e.g. MoSi$_2$ film. The lower transition metal nitride film 255A is formed at a thickness of about 100 nm, for example by deposition according to a sputtering method. In the case of using a TiN film as the lower transition metal nitride film 255A, there is used a TiN film having a crystal orientating property of (200).

The upper aluminum alloy film 255B has Cu and Si incorporated in aluminum. Cu is used in an amount of, say, 0.5 wt% for diminishing a migration phenomenon, while Si is used in an amount of, say, 1.5 wt% for diminishing an alloy spike phenomenon. The aluminum alloy film 255B is formed at a thickness of about 600 to 800 nm by deposition according to a sputtering method for example.

The shunting word lines 255 have a width of, say, 0.7 μm.

Thus, the memory cell array 211E has a multilayer interconnection structure of six layers in all comprising a four-layer gate wiring structure and a two-layer wiring structure provided thereon. The said four-layer gate wiring structure comprises the gate electrode 227 (or word line 227) of the memory cell selecting MISFET Qs, the lower electrode layer 235 of the information storing capacitor C of a stacked structure, the upper electrode layer 237 and the complementary data line 250. The said two-layer wiring structure comprises the column select signal line 252 and the shunting word line 255.

The CMOS which constitutes a peripheral circuitry of the DRAM 201 is constructed as shown on the right-hand side of FIG. 21. The n-channel MISFET Qn of the CMOS is formed on the main surface of the p$^-$-type well region 222. The n-channel MISFET Qn mainly comprises p$^-$-type well region 222, gate insulating film 226, gate electrode 227, a pair of n-type semiconductor regions 229 and a pair of n$^+$-type semiconductor regions 232, serving as source and drain regions.

The p-type channel stopper region 224 which surrounds the n-channel MISFET Qn is formed by a manufacturing process separate from that of the p-type channel stopper region 225A which surrounds the memory cell selecting MISFET Qs of the memory M. The p-type channel stopper region 224 is formed by introducing p-type impurity using the same mask as that used in forming the insulating film 223 for element isolation and then activating the p-type impurity by the heat treatment for forming the insulating film 223. Since the p-type channel stopper region 224 is formed by the same manufacturing process as that for the insulating film 223 for element isolation, the amount of the p-type impurity diffused to the active region side is somewhat large, but since the n-channel MISFET Qn is formed in a size larger than that of the memory cell selecting MISFET Qs, the amount of the p-type impurity diffused is relatively small. Therefore, the n-channel MISFET Qn is little influenced by a narrow channel effect. Conversely, the impurity concentration of the main surface in the active region of the p$^-$-type well region 222 can be made low because the p-type impurity which forms the p-type channel stopper region 224 is introduced in only the main surface portion of an inactive region of the p$^-$-type well region 222. That is, since the n-channel MISFET Qn can be lowered in threshold voltage, it is possible to reduce the substrate effect and enhance the driving ability. Particularly, in the case where the n-channel MISFET Qn is used as an output-stage circuit, it is possible to ensure a sufficient output signal level.

The p$^-$-type well region 222, gate insulating film 226, gate electrode 227 and n-type semiconductor region 229 are formed by the same manufacturing process as that for the memory cell selecting MISFET Qs and substantially have the same functions. That is, the n-channel MISFET Qn has an LDD structure.

The n$^+$-type semiconductor regions 232 of a high impurity concentration are formed so as to reduce the specific resistance value of the source region and that of the drain region. The n$^+$-type semiconductor region 232 is formed while being restricted by side wall spacers 231 formed by self-alignment on the side walls of the gate electrode 226, and it s is formed by self-alignment with respect to the gate electrode 227. The side wall spacers 231 define the length in the gate length direction of the n-type semiconductor regions 229 forming the LDD structure. Since the side wall spacers 231 are each formed as a single layer in the region of the n-channel MISFET Qn, it is possible to reduce the size in the gate length direction of the n-type semiconductor regions 229. The n-type semiconductor regions 229 have a high resistance value because of a low impurity concentration, but since they are short, the n-channel MISFET Qn can be improved in transfer conductance.

Among the n-channel MISFETs Qn, those used in input- and output-stage circuits are interfaced with external devices by a single source voltage Vcc (5V), so are driven by the source voltage Vcc. These n-channel MISFETs Qn are formed at a gate length of, say, 8 nm to mitigate the electric field intensity in the vicinity of the drain regions. On the other hand, the n-channel MISFETs Qn used in internal circuits, e.g. direct and indirect peripheral circuits, are driven by a low source voltage Vcc (about 3.3V) in order to attain a low power consumption.

These n-channel MISFETs Qn are formed at a gate length of, say, 0.8 to 1.4 μm for attaining a high integration density, and the electric field intensity near the drain region is mitigated by the introduction of the low source voltage Vcc. The n-channel MISFETs Qn in the input/output stage circuits and the internal circuits are formed substantially at the same structure by merely changing the gate length and the power source to be used. That is, the n-channel MISFETs Qn in the input/output stage circuits and the internal circuits can each be constituted by the gate insulating film 226 gate electrode 227, n-type semiconductor regions 229 and n+-type semiconductor regions 232. In these n-channel MISFETs Qn, moreover, the side wall spacers 231 can be formed to have substantially the same size in the gate length direction.

Thus, in the DRAM 201 having the n-channel MISFET Qn of the LDD structure used in input/output stage circuits and internal circuits, respectively, the n-channel MISFETs Qn in the input/output stage circuits are formed higher in working voltage and larger in gate length than the n-channel MISFETs Qn in the internal circuits, and the n-type semiconductor regions 229 of a low impurity concentration forming the LDD structure of the n-channel MISFETs in the input/output stage circuits and the internal circuits have substantially the same size in the gate length direction. In this construction, since the n-channel MISFETs Qn in the input/output stage circuits are longer in the gate length direction to improve the hot carrier withstand voltage, it is possible to reduce the deterioration of threshold voltage even with the lapse of time and hence improve electrical characteristics. Besides, in the n-channel MISFETs Qn of the internal circuits, the use of the low source voltage Vcc permits the attainment of a low power consumption while ensuring a hot carrier withstand voltage by using the low source voltage Vcc. Further, the n-channel MISFETs Qn in the input/output circuits and in the internal circuits are improved in hot carrier withstand voltage by enlarging the gate length and by using the low source voltage Vcc, respectively, so it is possible to independently control the length in the gate length direction of the n-type semiconductor regions 229 of a low impurity concentration forming the LDD structure, and in the n-length channel MISFETs Qn of both the input/output stage circuits and the internal circuits, the length in the gate length direction of the n-type semiconductor regions 229 of a low impurity concentration (or the length in the gate length direction of the side wall spacers 231) can be made substantially the same. That is, in the DRAM 201, not only it is possible to attain a low power consumption and improve the hot carrier withstand voltage, but also it is possible to decrease the number of manufacturing processes for forming the n-channel MISFETs Qn, though this point will be described later.

To each n+-type semiconductor region 232 of the n-channel MISFET Qn is connected a line 252 through a connection hole 251C formed in the inter-layer insulating films 240, 251. The line 252 is formed by the lower wiring layer of a two-layer wiring structure which is the same electroconductive layer as the column select signal line 252.

The p-channel MISFET Qp of the CMOS is formed on the main surface portion of the n−-type well region 221 in the region surrounded by the insulating film 223 for element isolation. The p-channel MISFET Qp mainly comprises n−-type well region 221, gate insulating film 226, gate electrode 227, a pair of p-type semiconductor regions 230 and a pair of p+-type semiconductor regions 239, serving as source and drain regions.

The n−-type well region 221, gate insulating film 226 and gate electrode 227 have substantially the same functions as those of the memory cell selecting MISFET Qs and n-channel MISFET Qn.

The p-type semiconductor regions 230 of a low impurity concentration constitute the p-channel MISFET Qp of the LDD structure. The p+-type semiconductor regions 239 of a high impurity concentration are formed by self-alignment with respect to side wall spacers 231 and 233C which are formed by self-alignment on the side walls of the gate electrode 227. That is, the p+-type semiconductor regions 239 of a high impurity concentration in the p-channel MISFET Qp each have a two-layer structure comprising the side wall spacer 231 and the side wall space 233C laminated to a side wall of the spacer 231. As compared with the side wall spacers 231 of the n-channel MISFET Qn, the side wall spacers 231 and 233C are longer in the gate length direction by a distance corresponding to the side wall spacer 233C. In other words, since the side wall spacers 231 and 233C are longer in the gate length direction, it is possible to decrease the amount of the p-type impurity of the p+-type semiconductor regions 239 diffused toward the channel forming region, so that a short channel effect of the p-channel MISFET Qp can be reduced while ensuring an effective channel length. Since the diffusion coefficient of the p-type impurity is larger than that of the n-type impurity, the p-channel MISFET Qp has the foregoing structure.

Thus, in the DRAM 201 having the n-channel MISFET Qn of LDD structure and the p-channel MISFET Qp of LDD structure, the side wall spacers 231 and 233C formed by self-alignment on the side walls of the gate electrode 227 of the p-channel MISFET Qp are made longer in the gate length direction than the side wall spacers 231 formed by self-alignment on the side walls of the gate electrode 227 of n-channel MISFET Qn. By this construction, it is made possible to shorten the side wall spacers 231 of the n-channel MISFET Qn and shorten the n-type semiconductor regions 229 of a low impurity concentration forming the LDD structure, both in the gate length direction. Consequently, it is possible to improve the transfer conductance of the n-channel MISFET Qn and attain the speed-up of operation. Further, since the side wall spacer 231 and 233C of the p-channel MISFET Qp can be made long in the gate length direction and the spreading of the p+-type semiconductor regions 239 of a high impurity concentration toward the channel forming region can be decreased, it is possible reduce the short channel effect of the p-channel MISFET Qp and attain a high integration density.

To each p+-type semiconductor region 239 of the p-channel MISFET Qp is connected a line 252 through the connection hole 251C.

As shown on the right-hand side of FIG. 21, the line 252 is connected to an upper line 255 through a transition metal film 254 embedded in the connection hole 253D which is formed in the inter-layer insulating film 253. The line 255 extending on the inter-layer insulating film 253 is formed by the upper wiring layer of a two-layer wiring structure which is the same electroconductive layer as the shunting word line 255. The transition metal film 254 embedded in the connection holes 253D is a tungsten film formed by selective deposition on the surface of the line 252 which is exposed from the interior of the connection hole 253D, according to a selective CVD method for example. The transition metal film 254 is formed for improving the step coverage in a stepped shape formed by the connection hole 253D of the line 255.

The line 255 (incl. the shunting word line 255) is a composite film formed by successive lamination of a transition metal nitride film 255A and an aluminum alloy film 255B, as mentioned previously. In the line 255, the signal transfer speed is determined mainly by the aluminum alloy film 255B as upper layer. In the case where Si is incorporated in the upper aluminum alloy film 255B, the transition metal nitride film (or a transition metal silicide film) 255 as a lower layer of the line 255 is provided throughout the whole area between the upper aluminum alloy film 255B and the inter-layer insulating film 253, including the connection between the line 255 and the transition metal film 254 embedded in the connection hole 253D. That is, in the line 255, the base material of the upper aluminum alloy film 255B is rendered uniform in each of the connection hole 253D portion and the inter-layer insulating film 253 portion. The lower transition metal film 255A of the line 255 is higher in migration withstand voltage than the upper aluminum alloy film 255B. That is, even in the event of disconnection of the upper aluminum alloy film 255B due to a migration phenomenon, it is possible to effect the transfer of signal through the lower transition metal film 255A, so it is possible to diminish the disconnection of the line 255.

Thus, in the DRAM 201 wherein the transition metal film 254 embedded by a selective CVD method into the connection hole 253D formed in the inter-layer insulating film 253 as a base film and the aluminum alloy film 255B extending on the film 253 and with Si incorporated therein are connected together, there is provided the transition metal nitride film (or transition metal silicide film) 255A between the aluminum alloy film 255B and the inter-layer insulating film 253 as a base film, including the portion between the transition metal film 254 embedded in the connection hole 253 and the aluminum alloy film 255B. With this construction, the base material of the aluminum alloy film 255B can be rendered uniform on each of the transition metal film 254 embedded in the connection hole 253D and the inter-layer insulating film 253. And it is possible to diminish the deposition of the Si incorporated in the aluminum alloy film 255B onto the interface of the transition metal film 254 embedded in the connection hole 253D and the aluminum alloy film 255B, whereby the resistance value of the said interface can be reduced. Even in the event of disconnection of the aluminum alloy film 255B due to a migration phenomenon for example, the transition metal nitride film 255A which underlies the aluminum alloy film 255B permits connection between portions of the film 255B through the disconnected portion, so it is possible to diminish the disconnection of the line 255.

In the line 255 (incl. the shunting word line 255), in the case where Cu is incorporated in the upper aluminum alloy film 255B, the transition metal nitride film 255A is provided at least in the connection (interface portion) between the aluminum alloy film 255B and the transition metal film 254 embedded in the connection hole 253D. As mentioned previously, the transition metal nitride film 255A has barrier properties. That is, the line 255 is formed so as to prevent an alloying reaction induced by mutual diffusion of aluminum of the upper aluminum alloy film 255B and tungsten of the transition metal film 254 embedded in the connection hole 253D.

Thus, in the DRAM 201 wherein the transition metal film 254 embedded by a selective CVD method in the connection hole 253D formed in the inter-layer insulating film 253 as a base film and the Cu-incorporated aluminum alloy film 255B extending on the inter-layer insulating film 253 are connected together, there is provided the transition metal nitride film 255A having barrier properties between the transition metal film 254 embedded in the connection hole 253D and the aluminum alloy film 255B. With this construction, it is made possible to prevent an alloying reaction induced by mutual diffusion of the transition metal and aluminum at the interface of the transition metal film 254 embedded in the connection hole 253D and the aluminum alloy film 255B, and the resistance value of the said interface can be reduced.

As the lower transition metal nitride film 255A of the line 255, one having a crystal orientation of (200) in terms of miller plane indices is used positively.

Figure 25:
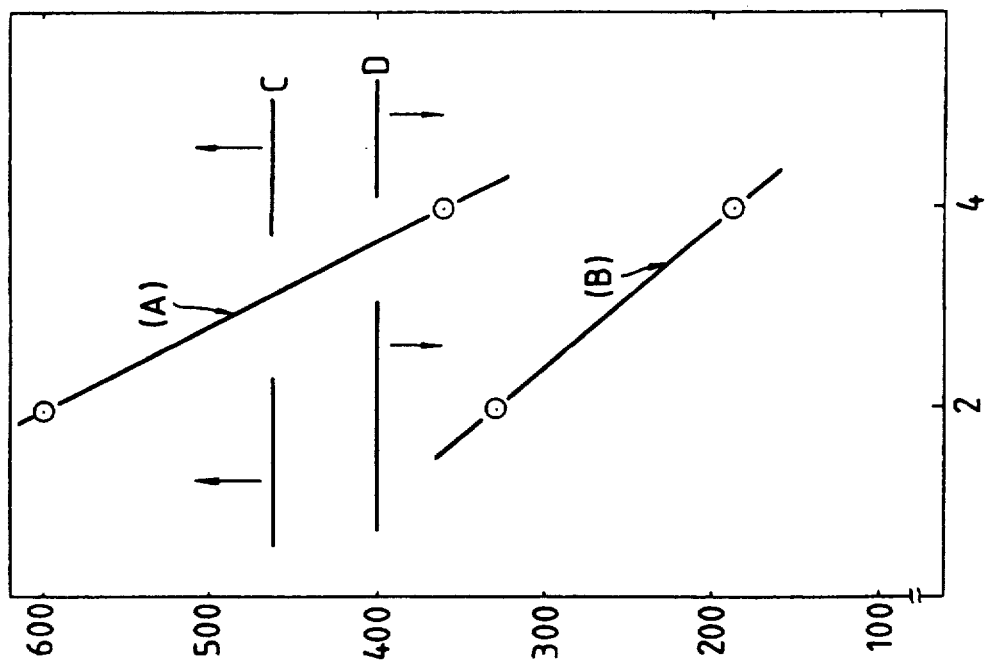
FIG. 25 is a diagram showing a target voltage—specific resistance value relation during sputtering of film used in the DRAM.

Referring now to FIG. 25, there is illustrated a relation between target voltage [kW] and specific resistance value [$\mu\Omega$-cm] during sputtering. In the same figure, data (A) and (B) each represent a distance from the center of a semiconductor wafer of TiN film formed on the wafer surface by deposition according to a a sputtering method. Data (A) represent characteristics of the TiN film at a distance of 0 $\mu$m from the center of the semiconductor wafer, that is, at the center of the wafer, while data (B) represent characteristics of the same film at a distance of 50 $\mu$m from the wafer center.

Figure 26:
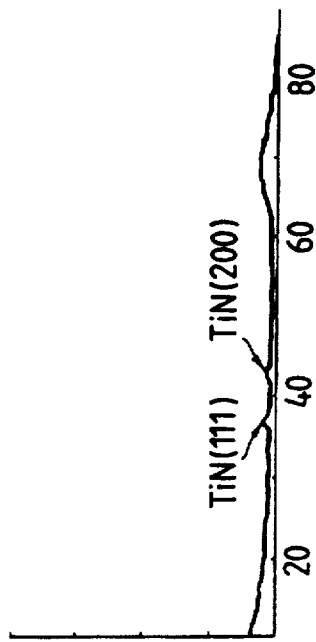
FIGS. 26 and 27 are diagrams each showing an X-ray incident angle—X-ray diffraction spectrum relation of the film illustrated in FIG. 25.
Figure 27:

As shown in FIG. 25, it is seen from data (B) that the farther the distance from the center of the semiconductor wafer, the lower the specific resistance value of the TiN film. In a region C of high specific resistance value, for example in a region of about 460 $\mu\Omega$-cm and higher, in FIG. 25, there was conducted X-ray diffractometric analysis for the TiN film. The results are as shown in FIG. 26, which illustrates a relation between X-ray incident angle and X-ray diffraction intensity. Also, in a region D of low specific resistance value, for example in a region of about 400 $\mu\Omega$-cm and lower, there was conducted X-ray diffractometric analysis for the TiN film. The results are as shown in FIG. 27, which illustrates a relation between X-ray incident angle and X-ray diffraction intensity. As shown in FIG. 26, the crystal orientations (111) and (200) of the TiN film are mixed together in the region of high specific resistance value. On the other hand, as shown in FIG. 27, the TiN film has a single crystal orientation of (200). That is, as compared with TiN films having a crystal orientation of (111) alone or both (111) and (200) mixed together, the TiN film having the crystal orientation (200) is lower in specific resistance value as in FIG. 25, so has a physical property of being high in film density. Therefore, the TiN film having the crystal orientation (200) is characteristic in that it is superior in heat resistance (barrier properties) and can diminish the precipitation of Si.

Thus, the transition metal nitride film 255A as a lower layer of the line 255, particularly at least the transition metal nitride film 255A portion positioned between the transition metal film 254 embedded in the connection hole 253D and the overlying aluminum alloy film 255B, is formed by a TiN film having a crystal orientation of (200). In this construction, as compared with TiN film having the crystal orientation (111) and TiN film having both crystal orientations (111) and (200), the TiN film having the crystal orientation (200) permits decreasing the amount of Si precipitated, so it is possible to further reduce the resistance value of the foregoing interface (254-255B interface). Besides, because of a smaller specific resistance value than those of the TiN films having such other crystal orientations, it is possible to further reduce the resistance value at the above interface, and because of a high film density, it is possible to improve the barrier properties.

Figure 32:
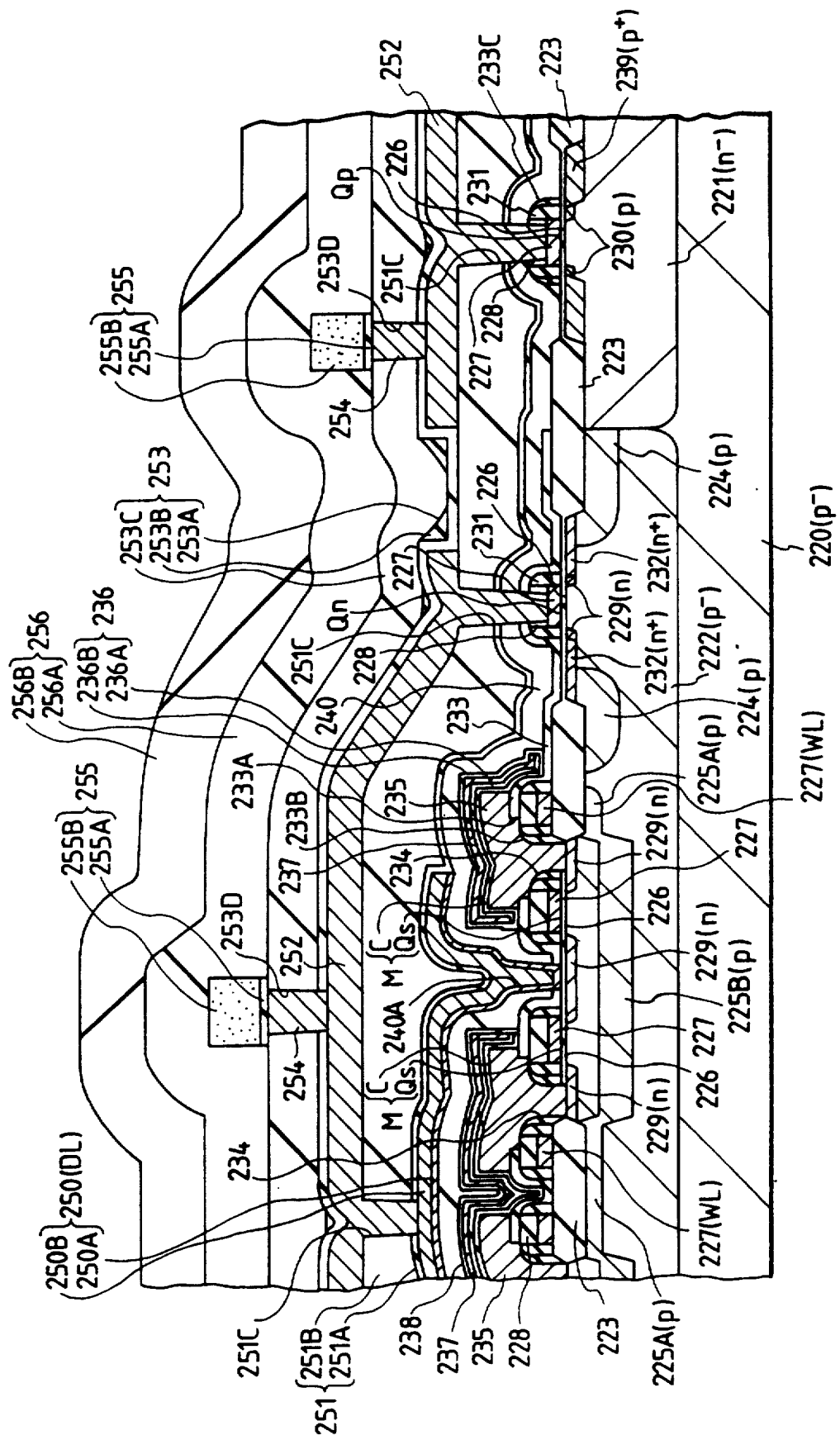
FIG. 32 is a sectional view of a principal portion in another position of the DRAM.

As shown in FIGS. 21 and 32 (a sectional view of a principal portion, showing a sectional structure in a position different from that in the sectional structure illustrated in FIG. 21), in the peripheral circuit region of the DRAM 201, as the lower-layer line 252 of the two-layer wiring structure there is used a transition metal film as described above because the line width is narrowed due to the attainment of a higher integration density and the use of aluminum film or aluminum alloy film cannot ensure a high migration withstand voltage. In the peripheral circuit, particularly in the direct peripheral circuit, n-channel MISFET Qn and p-channel MISFET Qp are disposed in corresponding relation to the array pitch of the memory cells M in the memory cell array 211, so there is adopted a strict layout rule for the line 252.

In the peripheral circuit region, if a line is formed by a transition metal silicide film or a laminated film thereof (for example, the same electroconductive layer as the complementary data line 250) for the connection of n+- and p+-type semiconductor regions 232, 239 of n- and p-channel MISFETs Qn and Qp, respectively, there will arise a mutual diffusion of impurities. To avoid this, the aforementioned transition metal film which does not cause such mutual diffusion of impurities is used as the line 252 without using the same electroconductive layer as the complementary data line 250 which is used in the memory cell array 211E.

Thus, in the DRAM 201 having complementary data lines, shunting word lines and column select signal lines on the memory cell array 211E and having a two-layer wiring structure in the peripheral circuit region of the memory cell array 211E, the complementary data lines 250 on the memory cell array 211E are each constituted using a composite film formed by successive lamination of the polycrystalline silicon film 250A and the transition metal silicide film 250B depositionwise according to a CVD method; the column select signal lines 252 are each constituted using a transition metal film formed by deposition according to a sputtering method as a layer which overlies the complementary data lines 250; the shunting word lines 255 are each constituted using the aluminum alloy film 255b (incl. the transition metal nitride film 255A) formed by deposition according to a sputtering method as a layer which overlies the column select signal lines 252; the same electroconductive layer 255 as the shunting word line 255 and the same electroconductive layer 252 as the underlying column select signal line 252 are connected together through the transition metal film 254 embedded by a selective CVD method in the connection hole 253D which is formed in the inter-layer insulating film 253 positioned between both said electroconductive layers; the lower-layer line 252 of the two-layer wiring structure in the foregoing peripheral circuit region is constituted by the same electroconductive layer as the column select signal line 252, while the upper-layer line 255 of the said two-layer wiring structure is constituted by the same electroconductive layer as the shunting word line 255; and the lower- and upper-layer lines 252, 255 of the two-layer wiring structure are connected together through the transition metal film 254 embedded in the connection hole 253D by the foregoing selective CVD method.

As shown in FIG. 21, there is provided a passivation film 256 which overlies the shunting word lines 255 and lines 255 in the DRAM 201. The passivation film 256 is a composite film formed by successive lamination of a silicon oxide film 256A and a silicon nitride film 256B.

The silicon oxide film 256A as a lower layer is formed so as to flatten the surface thereof, i.e., the underside of the overlying silicon nitride film 256B. Since the aluminum alloy films 255B as upper layers of the underlying shunting word lines 255 and lines 255 are present, the silicon oxide film 256A is formed by deposition at a low temperature so as not to melt the aluminum alloy film 255B. More specifically, the lower silicon oxide film 256A is formed, for example, by deposition according to a C-CVD method using tetraethoxysilane gas as a source gas. Since the step coverage of stepped portions of the underside of the upper silicon nitride film 256B is high, in order to flatten the surface of the lower silicon oxide film 256A, the film 256A is formed at a thickness of one half or more of the spacing between the shunting word lines 255 or lines 255 in a region having an aspect ratio of one or more which is the ratio of such spacing and the film thickness. The region having such aspect ratio of one or more corresponds to a minimal line spacing or a size close thereto. In the region where the aspect ratio is lower than 1, the step coverage of the upper silicon nitride film 256 does not come into question. Since the spacing of the shunting word lines 255 is about 0.7 μm, the lower silicon oxide film 256A is formed at a thickness of about 350 to 500 nm.

The upper silicon nitride film 256B of the passivation film 256 is formed to improve the moisture resistance. For example, it is formed at a thickness of 1,000 to 1,200 nm by deposition according to a plasma CVD method. Since the surface of the lower silicon oxide film 256A is made flat, it is possible to prevent the formation of cavity, etc. due to the growth of an overhang shape at the underside stepped portions of the upper silicon nitride film 256B.

Thus, in the DRAM 201 having the passivation film 256 on the lines 255 consisting mainly of the aluminum alloy films 255B, the passivation film 256 constituted using a composite film formed by successive lamination of the silicon oxide film 256A formed by deposition according to a C-CVD method using tetraethoxysilane gas as a source and the the silicon nitride film 256B formed by deposition according to a plasma CVD method, and the lower silicon oxide film 256A of the passivation film 256 is formed at a thickness of one half or more of the spacing between the lines 255 in the region having an aspect ratio of the spacing and film thickness of the lines 255 of 1 or more. By this construction, the lower silicon oxide film 256A of the passivation film 256 can be formed by deposition at a low temperature not melting the aluminum alloy film 255B of the each line 255 and that at a high the step coverage, and the stepped shape formed by the lines 255 can be flattened. Therefore, the upper silicon nitride film 256B superior in moisture resistance of the passivation film 256 can be formed without the formation of cavity based on the said stepped shape. Consequently, there is neither cracking of the silicon nitride film 256 nor staying of wafer in the cavity, and hence it is possible to improve the moisture resistance of the passivation film 256.

Figure 29:
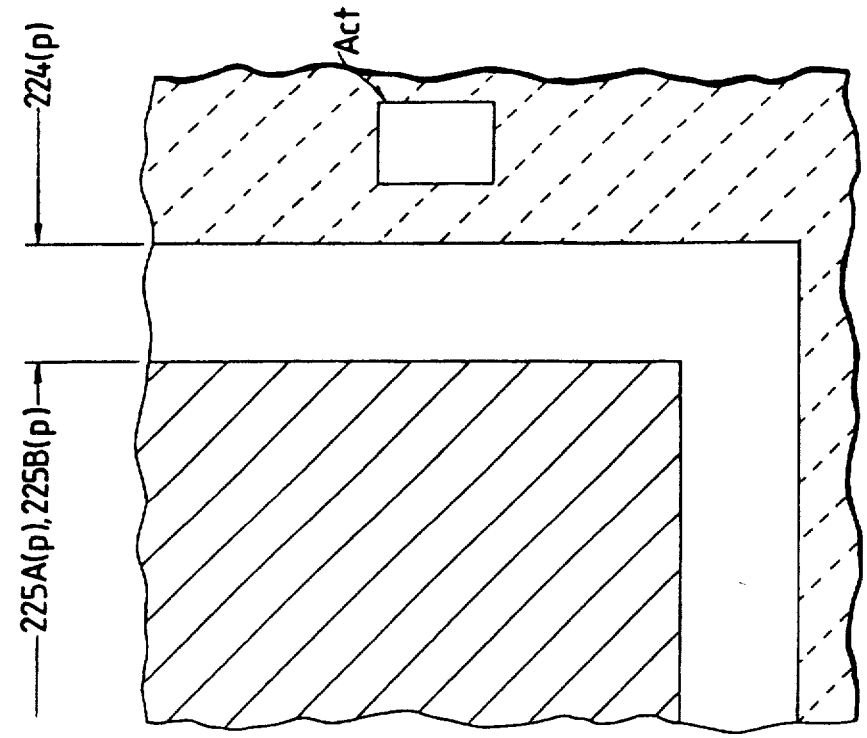
Figure 28:
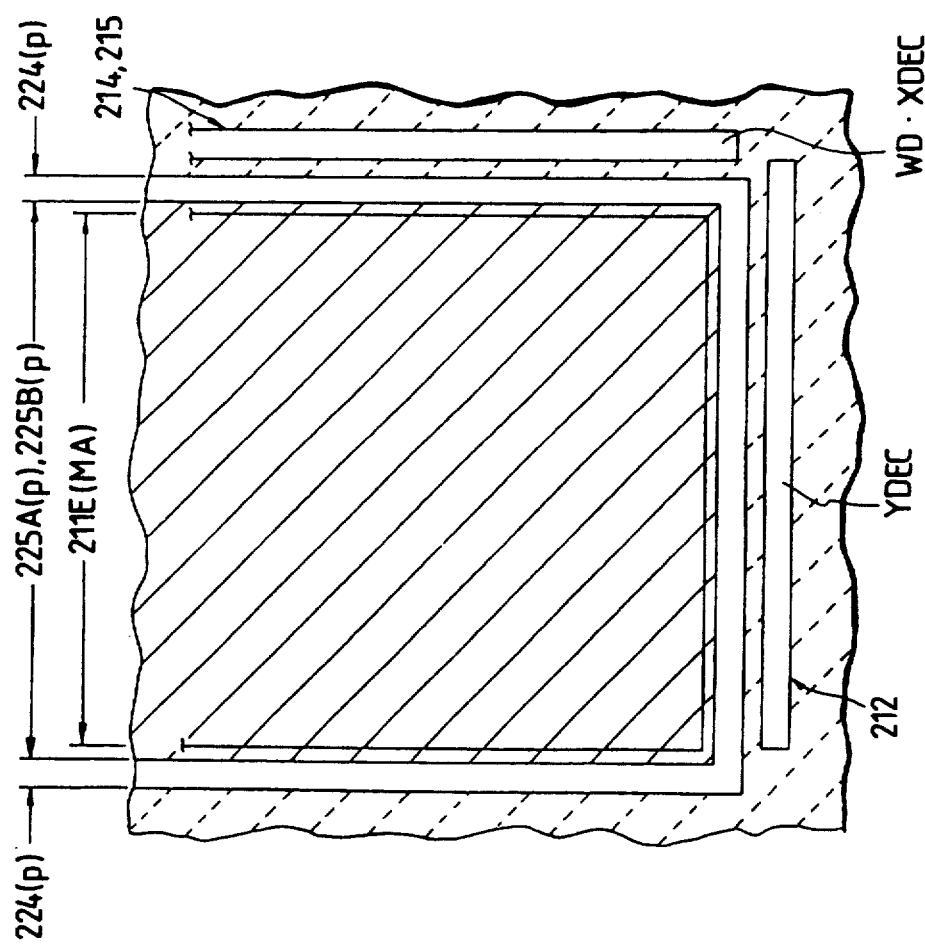
Figure 3I:
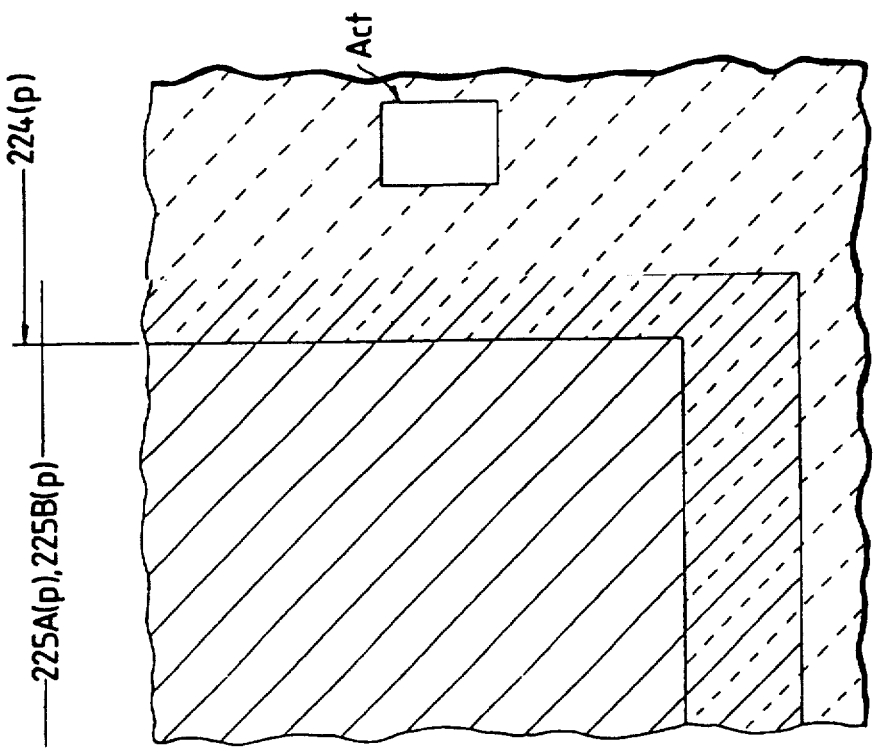
Figure 3O:
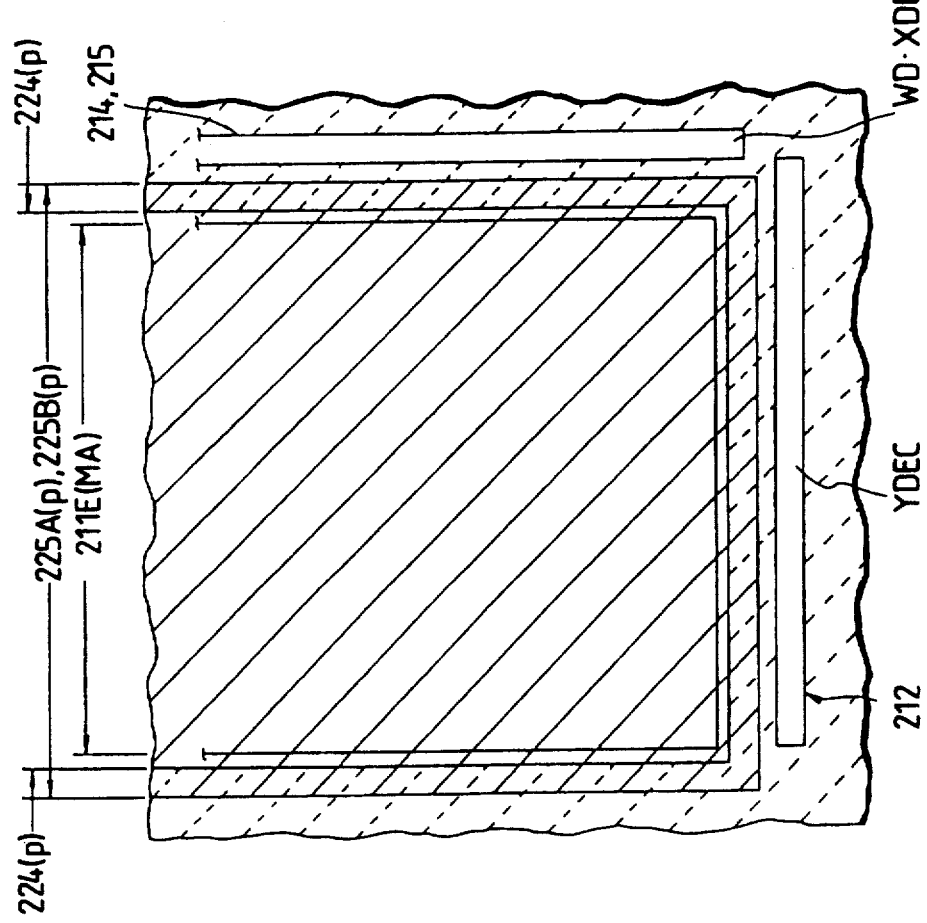

A boundary region between the memory array (MA) 211E and the peripheral circuitry of the DRAM 201 is constituted as shown in FIGS. 28 (a schematic plan view) and FIG. 29 (an enlarged plan view of a principal portion of FIG. 28). As illustrated therein, the p-type channel stopper region 225A formed in an inactive region of the memory cell array 211E and the p-type channel stopper region 224 formed in an inactive region of the peripheral circuitry are not overlapped each other in the above boundary region. Since the p-type channel stopper regions 225A and 224 are formed in separate manufacturing processes, the impurity concentration of the boundary region as an inactive region is kept low, whereby it is made possible to increase the pn junction withstand voltage between the n$^-$ and n$^+$-type semiconductor regions 229, 232 formed in the active region and the main surface portion of the p$^-$-type well region 222 in the above boundary region. Since the impurity concentration of the main surface of the p$^-$-type well region 222 in the above boundary region is low, the threshold voltage of the parasitic MOS drops and an n-type inversion layer is apt to be formed. This n-type inversion layer is formed over a large area surrounding the memory cell array 211E, and if an active region is present across or in the vicinity of the boundary region, the area of the active region increases by an amount corresponding to the area of the said n-type inversion layer. In appearance, this increases the pn junction area and increases the amount of leak current in the pn junction. As shown in FIG. 29, therefore, an active region Act, e.g. the n-channel MISFET Qn of a peripheral circuit, is isolated from the boundary region (not crossing the boundary region). The distance of this isolation is determined in consideration of the amount of mask alignment error at least in the manufacturing process and the amounts of n-type impurities diffused in the n$^-$ and n$^+$-type semiconductor regions 229, 232.

The boundary region between the memory cell array (MA) 211E and the peripheral circuitry may also be constructed as shown in FIG. 30 (a schematic plan view) and FIG. 31 (an enlarged plan view of a principal portion of FIG. 30). As shown therein, the p-type channel stopper region 225A of the memory cell array 211E and the p-type channel stopper region 224 of the peripheral circuitry are overlapped together in the foregoing boundary region. The width of this overlap corresponds to a mask alignment margin at least in the manufacturing process. In the case where the p-type channel stopper regions 224 and 225A are thus overlapped together, the impurity concentration of the boundary region as an inactive region becomes higher. When the impurity concentration of the main surface portion of the p$^-$-type well region 222 in the inactive region is increased, the separating ability can be improved by increasing the threshold voltage of the parasitic MOS, but the pn junction withstand voltage between the n$^-$ and n$^+$-type semiconductor regions 229, 232 formed in the boundary region and the active region is deteriorated. Therefore, as shown in FIG. 31, an active region Act, e.g. the n-channel MISFET Qn of a peripheral circuit, is isolated from the boundary region. The distance of this isolation is determined in consideration of the amount of mask alignment error at least in the manufacturing process as well as the amounts of p-type impurities diffused in the p-type channel stopper regions 224, 225A and the amounts of n-type impurities diffused in the n$^-$ and n$^+$-type semiconductor regions 229, 232.

In the boundary region there is disposed a guard ring region (not shown) to prevent the entry of minority carrier usually from a substrate potential generator circuit (V$_{BB}$ generator circuit) into the memory cell array 211E. The guard ring region is disposed along the peripheral portion of the memory cell array 211E and comprises n$^-$ or n$^+$-type semiconductor regions 229 or 232. It is provided in the memory state cell array 211 (in an isolated state from the boundary region) inside the boundary region of the p-type channel stopper regions 225A and 224. Above the guard ring region there are provided the lower and upper electrode layers 235, 237 of the information storage capacitor C having a stacked structure of the memory cell M, or is provided a step mitigating layer formed by the same electroconductive layer as both said electrode layers. The step mitigating layer is formed to mitigate a stepped shape between the memory array 211E and the peripheral circuitry, improve the processing accuracy for upper lines, e.g. column select signal lines 252 and shunting word lines 255, and diminish disconnection.

Thus, in the DRAM 201 wherein the memory cell M and the n-channel MISFET Qn of a peripheral circuit are disposed on the main surface portion of the p$^-$-type well region 222 in different active regions each defined the surroundings by the p-type channel stopper region which is formed in the main surface portion of the p$^-$-type well region 222 in an inactive region, the p-type channel stopper region 225A which surrounds the memory cell M and the p-type channel stopper region 224 which surrounds the n-channel MISFET Qn of the peripheral circuit are formed each independently in separate manufacturing processes, and in the boundary region between the p-type channel stopper region 225A and the p-type channel stopper region 224 there is not disposed the active region Act, including the memory cell M and the n-channel MISFET Qn of the peripheral circuit. In this construction, in the case where the p type channel stopper regions 225A, 224 are each isolated in the boundary region, a large n-type inversion layer corresponding to the area of the boundary region is apt to be formed in the boundary region. If the active region Act is present in the boundary region, the area of the n$^-$ and n$^+$-type semiconductor regions 229, 232 formed in the active region Act apparently increases by an amount a corresponding to the area of the n-type inversion layer, so that the amount of leak current increases in the junction between the p-type well region 222 and the n$^-$ or n$^+$-type semiconductor region 229 or 232, but since the boundary region Act is not disposed, it is possible to decrease the amount of leak current in the said junction. In the case where the p-type channel stopper regions 225A and 224 overlap each other in the boundary region, the impurity concentration of this portion increases, but since the active region Act is not disposed in the boundary region, it is possible to improve the pn junction withstand voltage between the p$^-$-type well region 222 and the n- or n$^+$-type semiconductor region 229 or 232.

Now, a concretely manufacturing method for the DRAM 201 described above will be explained below briefly with reference to FIGS. 33 to 66 (sectional views of a principal portion, showing manufacturing processes, respectively).

First, there is provided a p$^-$-type semiconductor substrate 220 formed by a single crystal silicon.

Well Forming Process

Onto the main surface of the p⁻-type semiconductor substrate 220 there are laminated a silicon oxide film 260 and a silicon nitride film 261 in this order. The silicon oxide film 260 is formed by a steam oxidation method at a high temperature of about 900° to 1000° C. so as to have a thickness of, say, 40 to 50 nm. The silicon oxide film 260 is used as a buffer layer. The silicon nitride film 261 is formed at a thickness of about 40 to 60 nm by deposition according to a CVD method for example and it is used as both an impurity introducing mask and an oxidation resisting mask. Then, the silicon nitride film 261 in the region where the n⁻-type well region is formed is removed to form a mask. The formation of the mask 261 is performed using a photolithography technique (a photoresist mask forming technique) and an etching technique.

Next, as shown in FIG. 33, an n-type impurity 221n is introduced into the main surface of the p⁻-type semiconductor substrate 220 through the silicon oxide film 260, using the mask 261, (ion implantation process 1). As the n-type impurity 221n there is used a di- or trivalent ion of phosphorus at an impurity concentration of, say, $2 \times 10^{13}$ atoms/cm², and it is introduced by an ion implantation method using energy of about 400 to 900 KeV (implantation current = 30 μA or so).

Then, as shown in FIG. 34, using the mask 261, the silicon oxide film 260 exposed from the mask is allowed to grow to form a silicon oxide film 260A which is thicker than the silicon oxide film 260. The silicon oxide film 260A is formed only in the region where the n⁻-type well region 221 is formed, and it is used as both a mask for removing the mask 261 and an impurity introducing mask. The silicon oxide film 260A is formed by a steam oxidation method at a high temperature of about 900° to 1,000° C. so as to have a final thickness of, say, 110 to 130 nm. The n-type impurity 221n which has been introduced is somewhat diffused by a heat treatment process which is carried out to form the silicon oxide film 260A.

Next, the mask 261 is removed selectively using hot phosphoric acid for example.

Then, as shown in FIG. 35, a p-type impurity 222p is introduced into the main surface of the p⁻-type semiconductor substrate 220 through the silicon oxide film 260, using the silicon oxide film 260A as an impurity introducing masks, (ion implantation process 2). As the p-type impurity there is used a di- or trivalent ion of boron at an impurity concentration of, say, $5 \times 10^{12}$ atoms/cm², and it is introduced by an ion implantation method using energy of about 300 to 800 Key (implantation current: 30 μA). Since the silicon oxide film 260A is formed thick, the p-type impurity 222p is not introduced into the region where the n⁻-type well region 221 is formed.

Next, the n- and p-type impurities 221n, 222p are subjected to stretch-diffusion to form an n⁻-type well region 221 and a p⁻-type well region 222, as shown in FIG. 36. In forming both regions 221 and 222 there is performed a heat treatment in a high temperature atmosphere of 1,100° to 1,300° C. Eventually, the p⁻-type well region 222 is formed by self-alignment with respect to the n⁻-type well region 221.

Isolation Region Forming Process

Next, the silicon oxide films 260 and 260A are removed to expose the main surface of the n⁻-type well region 221 and that of the p⁻-type well region 222.

Then, as shown in FIG. 37, a silicon oxide film 262, a silicon nitride film 263 and a polycrystalline silicon film 264 are successively laminated onto the main surface of each of the n⁻- and p⁻-type well regions 221, 222. The silicon oxide film 262 as a lower layer is formed at a thickness of 15 to 25 nm by a steam oxidation method using a high temperature of about 900° to 1,000° C. for example, and it is used as a buffer layer. The silicon nitride film 263 as a middle layer is formed at a thickness of 150 to 250 nm by deposition according to a CVD method for example and it is used mainly as an oxidation resisting mask. The polycrystalline silicon film 264 as an upper layer is used mainly as an etching mask for the lower silicon nitride film 263, as a trench depth judging mask and also as a side wall spacer length controlling mask. The polycrystalline silicon film 264 is formed at a thickness of 80 to 120 nm by deposition according to a CVD method for example.

Then, as shown in FIG. 38, the upper polycrystalline silicon film 264 on the main surface portions of inactive regions of the n⁻- and p⁻-type well regions 221, 222 is removed, allowing the polycrystalline silicon film 264 remaining in active regions to act as a mask. In forming this mask 264 there is used a photolithography technique and an etching technique. After the mask 264 is formed, the etching mask (photoresist film) formed by the photolithography technique is removed.

Next, as shown in FIG. 39, using the mask 264 as an etching mask, the silicon nitride film 263 exposed to the inactive regions is removed to form a mask under the mask 264. Patterning of the mask 263 is performed using the mask 264 without using the photoresist film which patterns the mask 264 so that a contaminant from the photoresist film may be prevented from being captured into the main surfaces of the n⁻- and p⁻-type well regions 221, 222 or into the silicon oxide film 262.

Then, as shown in FIG. 40, a silicon nitride film 265 and a silicon oxide film 266 are successively laminated onto the whole surface of the substrate, including the upper surface of the mask 264. The silicon nitride film 265 as a lower layer is used mainly as an oxidation resisting mask and it is formed thin as compared with the mask 263. The silicon nitride film 265 is formed at a thickness of 15 to 25 nm by deposition according to a CVD method for example. The silicon oxide film 266 as an upper layer, which is used mainly as an etching mask, is formed at a thickness of 150 to 250 nm by deposition according to a CVD method using, for example, an inorganic silane gas (SiH₄ or SiH₂Cl₂) and nitrogen oxide gas (N₂O) as source gases.

Next, as shown in FIG. 41, the silicon oxide film 266 and the silicon nitride film 265 are subjected to anisotropic etching by an amount corresponding to the deposited film thickness, and masks 265 and 266 are formed by self-alignment for the side walls of the masks 263 and 264. The masks 265 and 266 are each formed as a so-called side wall spacer.

Then, as shown in FIG. 42, using the masks 264 and 266 as etching masks, there are formed shallow trenches 267 in the main surfaces of inactive regions of the n⁻- and p⁻-type well regions 221, 222. The shallow trenches 267 are each formed so that the underside of an insulating film 223 for element isolation to be formed in a later process is in a deep position as compared with the junction depth of the n-type semiconductor regions 229 and 232 for example to enhance the interelement isolating ability. The depth of the shallow trench 267 is controlled by the film thickness of the mask 264. More specifically, the mask 264 is removed upon formation of the shallow trench 267 and a reaction gas component of the mask 264 is detected, then etching is stopped when the reaction gas component of the mask 264 is extinguished or thereabouts. The shallow trench 267 is formed at a depth of about 80 to 120 nm by anisotropic etching, e.g. RIE.

Thus, using the mask 264 formed by a material having substantially the same etching speed as that of the $n^-$- and $p^-$-type well regions 221, 222, the main surfaces of inactive regions of both well regions 221 and 222 are etched by an amount corresponding to the film thickness of the mask 264 to form the shallow trench 267. In this construction, the depth of the shallow trench 267 can be controlled by the film thickness of the mask 264, so it is possible to improve the controllability for the depth of the shallow trench 267.

Next, a silicon oxide film 262A is formed on the main surface of each inactive region of the $n^-$- and $p^-$-type well regions 221, 222 exposed by the formation of the shallow trenches 267. The silicon oxide film 262A is formed at a thickness of 8 to 12 nm by a thermal oxidation method for example.

Figure 43:
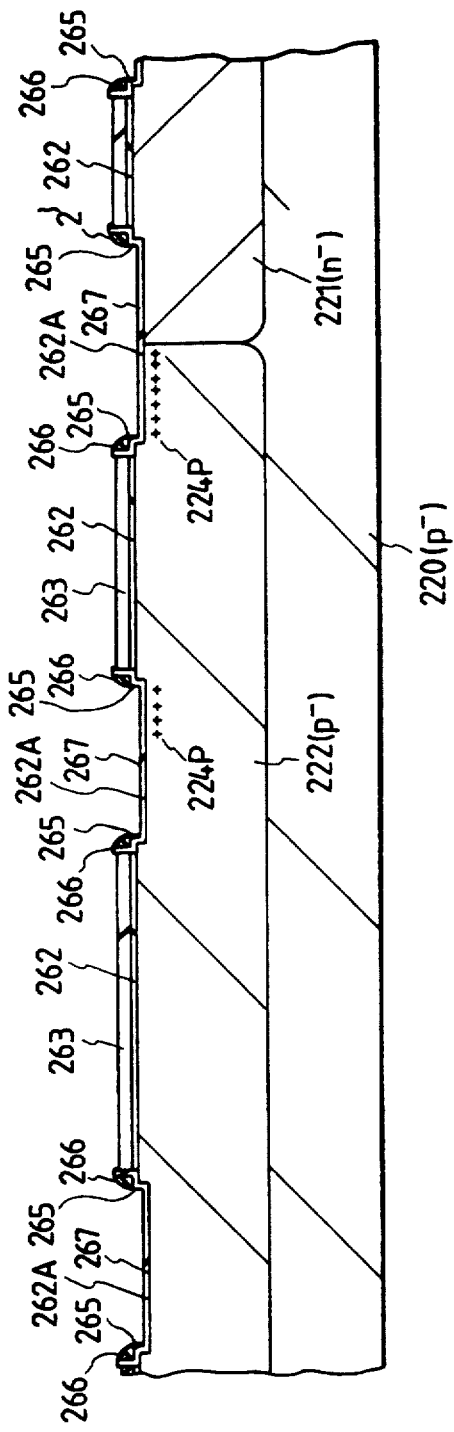

Then, as shown in FIG. 43, in the region where a peripheral circuitry is formed, a p-type impurity 224$p$ is introduced through the silicon oxide film 262A into the main surface portions of inactive regions of the $p^-$-type well region 222 (ion implantation process 3). In introducing the p-type impurity 224$p$, there are used the masks 263, 266 and a photoresist mask (not shown) as impurity introducing masks. For example, the p-type impurity 224$p$ is introduced by an ion implantation method using an energy of 50 to 70 KeV and using BF$_2$ at an impurity concentration of, say, $3 \times 10^{13}$ atoms/cm$^2$ (implantation current: 30 $\mu$A). In the region where the peripheral circuitry is formed, the p-type impurity 224$p$ is introduced by self-alignment with respect to the active region.

Next, using the masks 263 and 265 mainly as oxidation resisting masks, an insulating film (field insulating film) 223 for element isolation is formed in the silicon oxide film 262A portion of the main surface of each inactive region of the $n^-$- and $p^-$-type well regions 221, 222. In this case, the silicon oxide film 266 is removed using a hydrofluoric acid-based etching solution before the formation of the insulating film 223 for element isolation. The insulating film 223 for element isolation can be formed by performing a heat treatment in a nitrogen gas atmosphere containing a very small amount (about 1% or less) of oxygen at a fairly high temperature of, say, 1,050° to 1,150° C. for about 30 to 40 minutes, followed by oxidation for about 30 to 50 minutes according to a steam oxidation method. For example, the insulating film 223 is formed to have a thickness of 400 to 600 nm.

Since the thin masks 265 are in direct contact with the substrate, a sideways growth (toward the active region side) of the active region-side ends of the insulating film 223 for element isolation is weakened in the initial stage of oxidation, and the thick masks 263 can weaken their sideways growth even when oxidation proceeds, so it is possible to reduce bird's beaks. On the other hand, the thin masks 265 each rise onto a bird's beak as oxidation proceeds, thus making it possible to mitigate stress and diminish the occurrence of defects. That is, the insulating film 223 for element isolation, with few bird's beaks, can be formed thick and hence at a size somewhat equal to the size of the mask 263 which defines the insulating film. Consequently, it is possible to reduce the isolation area between elements and increase an effective area of the active region.

By the heat treatment for forming the insulating film 223 for element isolation and in substantially the same manufacturing process the p-type impurity 224$p$ which has been introduced into the main surface of the $p^-$-well region 222 is stretch-diffused to form p-type channel stopper regions 224. The heat treatment causes the p-type impurity to be diffused also sideways (toward the active region side), but since the n-channel MISFET Qn of the peripheral circuit is larger in size than the memory cell selecting MISFET Qs of the memory cell M, the amount of the sideway diffusion of the p-type impurity 224$p$ is relatively small. That is, a narrow channel effect is little influenced in the n-channel MISFET Qn.

Figure 44:
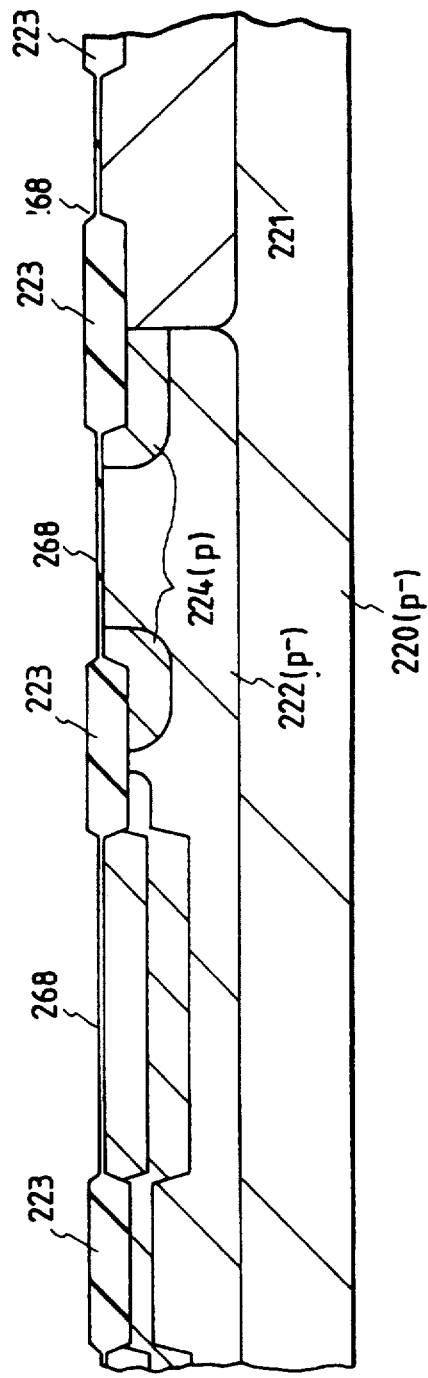

Next, the masks 263, 265 and the silicon oxide film 262 are removed to expose the main surface portions of the inactive regions of the $n^-$- and $p^-$-type well regions 221, 222. Thereafter, as shown in FIG. 44, a silicon oxide film 268 is formed on the main surface of each of the $n^-$- and $p^-$-type well regions 221, 222 thus exposed. The silicon oxide film 268 is formed for oxidizing silicon nitride, so-called white ribbon, formed at end portions of the insulating films 223 for element isolation by both the silicon nitride films (masks) 263 and 265 which are used in forming the insulating films 223. The silicon oxide film 268 is formed at a thickness of 40 to 100 nm, for example by a steam oxidation method using a high temperature of 900° to 1,000° C.

Then, as shown in FIG. 45, in the region where the memory array 211E is formed, a p-type channel stopper region 225A and a p-type semiconductor region 225B are formed in the main surface portion of the $p^-$-type well region, the p-type channel stopper region 225A being formed in the inactive region under the insulating film 223 for element isolation, (ion implantation process 4). The p-type semiconductor region 225B is formed in the active region where the memory cell M is formed. For example, the p-type channel stopper region 225A and the p-type semiconductor region 225B are formed by introducing B$^{++}$ at an impurity concentration of $1 \times 10^{13}$ atoms/cm$^2$ according to an ion implantation method using a high energy of about 200 to 300 KeV (implantation current: 20 $\mu$A). In the main surface portion of the inactive region of the $p^-$-type well region 222, the p-type impurity is introduced through the insulating film 223 for element isolation. In the main surface portion of the active region, the p-type impurity is introduced in a deep position of the main surface portion of the $p^-$-type well region 222 by an amount corresponding to the thickness of the insulating film 223. According to this method, the p-type channel stopper region 225A and the p-type semiconductor region 225B are formed by self-alignment with respect to the insulating film 223 for element isolation.

Thus, in the DRAM 201 wherein the memory cell selecting MISFET Qs is formed on the main surface in the active region surrounded by inactive regions of the $p^-$-type well region 222, the method of the present invention includes a process of forming a first mask by successive lamination of masks 263 and 264 onto the main surface of the active region of the $p^-$-type well region 222; a process of forming a second mask thinner than the first mask by successive lamination of masks 265 and 266 onto each side wall of the first mask through self-alignment with respect to the said side wall; a process of forming a shallow trench 267 in each inactive region of the p⁻-type well region 222 by etching the main surface thereof, using the first and second masks; a process of forming an insulating film (field insulating film) 223 for element isolation on the main surface of the inactive region of the p⁻-type well region 222 by applying a thermal oxidation treatment thereto, using the first and second masks, and a process of introducing a p-type impurity into the whole main surface portion, including the active and inactive regions of the p⁻-type well region 222 after removal of the first and second masks to form the p-type channel stopper region 225A in the main surface under insulating film 223 for element isolation. By this construction, the amount of sideway oxidation of the insulating film 223 can be decreased, so it is possible to reduce the size of the insulating film 223 and enlarge the thickness thereof. Besides, by utilizing the shallow trench 267, the underside position of the insulating film 223 for element isolation can be made deeper than the main surface of the active region of the p⁻-type well region 222, and in connection with the spacing between memory cell selecting MISFETs Qs, an increase can be attained in the depth direction of the p⁻-type well region 222, so it is possible to enhance the separating ability between memory cell selecting MISFETs Qs. Further, the insulating film 223 for element isolation can be formed thick, and at the time of introducing the p-type impurity which forms the p⁻-type channel stopper region 225a, the p-type impurity to be introduced into the main surface portion of the active region of the p⁻-type well region 222 can be introduced in a deep position of the well regions 222, so it is possible to diminish variations in threshold voltage of the memory cell selecting MISFET Qs caused by the introduction of the p-type impurity.

The process of forming the insulating film 223 for element isolation is carried out by a high-temperature oxidation method at a temperature in the range of about 1,050° to 1,150° C. In this construction, it is possible to promote the fluidity of the silicon oxide film based on the high-temperature oxidation method the time of forming the insulating film 223 for element isolation, and reduce the stress induced between the insulating film 223 for element isolation and the main surface of the inactive region of each of the n⁻- and p⁻-type well regions 221, 222. Consequently, it is possible to reduce the occurrence of crystal defects at corner portions of the shallow trenches formed in the main surfaces of the inactive regions of the n⁻- and p⁻type well regions 221, 222.

The shallow trenches 267 formed in the main surfaces of the inactive regions of the n⁻- and p⁻-type well regions 221, 222 may be omitted in the case where a crystal defect thereof cannot be remedied or when it is not specially necessary to provide such trenches. In this case, the mask 264 may be omitted, while the thickness of the mask 265 may be set at 200 to 300 nm.

Further, in the DRAM 201 wherein the memory cell selecting MISFET Qs which forms the memory cell M and the n-channel MISFET Qn which forms the peripheral circuit are each formed on the main surface of an active region surrounded with inactive regions formed by the insulating film 223 for element isolation in the p⁻-type well region 222 and the p-type channel stopper region, a p-type channel stopper region 225A is formed by introducing a p-type impurity through the insulating film 223 for element isolation into the main surface portion of each of inactive regions surrounding active region which forms the memory cell selecting MISFET Qn in the p⁻-type well region 222, and a p-type channel stopper region 224 is formed by introducing the p-type impurity 224 into the main surface portion of each of inactive regions surrounding active region which forms the n-channel MISFET Qn in the p⁻-type well region 222. In this construction, it is possible to increase the threshold voltage of the parasitic MOS in the p-type channel stopper region 225A and ensure the separating ability between the memory cell M as well as the memory cell selecting MISFET Qs as a constituent of the memory cell and the surrounding memory cells M. Besides, the p-type channel stopper region 225A is formed by self-alignment with respect to the insulating film 223 for element isolation and the amount of diffusion toward the active region side of the p-type impurity which forms the p-type channel stopper region 225A can be made small, so it is possible to reduce the narrow channel effect of the memory cell selecting MISFET Qs. Further, since the p-type impurity 224p which forms the p-type channel stopper regions 224 is introduced into only inactive regions and not introduced into the active region which forms the n-channel MISFET Qn, it is possible to reduce the influence of the substrate effect and there diminish variations in threshold voltage of the n-channel MISFET Qn. As noted previously, the n-channel MISFET Qn is larger in size than the memory cell selecting MISFET Qs of the memory cell M, so in the n-channel MISFET Qn the amount of diffusion to the active region side of the p-impurity 224p which forms the p-type channel stopper 224p is relatively small and a narrow channel effect is scarcely developed. In the n-channel MISFET Qn, moreover, the p-type impurity 224p which forms the p-type channel stopper region 224 is not introduced into the active region and the surface impurity concentration of the active region can be decreased, so it is possible to reduce the threshold voltage and increase the driving ability. In particular in the case where the n-channel MISFET Qn is used as an output stage circuit, it is possible to ensure a sufficient output signal level.

The memory cell selecting MISFET Qs of the memory cell M and the n-channel MISFET Qn are provided on the main surface of the p⁻-type well region 222 having an impurity concentration higher than that of the p⁻-type semiconductor substrate 220. By this construction, the channel forming region of the memory cell selecting MISFET Qs and that of the n-channel MISFET Qn in the p⁻-type well region 222 can be increased in impurity concentration, so not only it is possible to reduce the short channel effect but also a potential barrier region can be formed on the basis of the difference in impurity concentration between the p⁻-type well region 222 and the p⁻-type semiconductor substrate 220. Consequently, it is possible to improve an α-ray soft error withstand voltage of the memory cell M. Also, in the case where the n-channel MISFET Qn constitutes a direct peripheral circuit such as a column address decoder circuit (YDEC) or a sense amplifier circuit (SA), it is possible to improve the α-ray soft error withstand voltage.

Gate Insulating Film Forming Process

Next, in the n⁻- and p⁻-type well regions 221, 222, a silicon oxide film 268A is formed on the main surface of each active region after the removal of the silicon oxide film 268. The thickness of the silicon oxide film 268A may be in the range of 15 to 25 nm.

Then, as shown in FIG. 46, in the peripheral circuit forming region, a p-type impurity 269p for regulating the threshold voltage is introduced into the main surface portion of each active region defined by the insulating films 223 for element isolation in each of the n⁻- and p⁻-type well regions 221, 222 (ion implantation process 5). For example, the p-type impurity 269p is introduced by an ion implantation method with energy of about 20 to 30 Key, using boron at an impurity concentration of $2 \times 10^{12}$ atoms/cm² (implantation current: 10 μA). The p-type impurity 269p is introduced mainly for adjusting the threshold voltage of each of the n-channel MISFETs Qn and Qp. It may be introduced through separate processes into the main surface portion of the n⁻-type well region 221 and that of the p⁻-type well region 222.

Next, the silicon oxide film 268A is removed selectively to expose the main surfaces of the p⁻- and n⁻-type well regions 222, 221.

Then, a gate insulating film 226 is formed on main surface of each of the thus-exposed p⁻- and n⁻- type well regions 222, 221. The gate insulating film 226 is formed at a thickness of 12 to 18 nm by a steam oxidation method using a high temperature of 800° to 1,000° C.

Gate Wiring Process 1

Next, a polycrystalline silicon film is formed on the whole substrate surface including the upper surfaces of the gate insulating film 226 and the insulating film 223 for element separation. It is formed at a thickness of 200 to 300 nm by deposition according to a CVD method. In the polycrystalline silicon film is introduced an n-type impurity, e.g. phosphorus, by a thermal diffusion method for reducing the resistance value. Thereafter, a silicon oxide film (not shown) is formed on the surface of the polycrystalline silicon film. This polycrystalline silicon film is formed by a first-layer gate wiring process during the manufacture of the semiconductor device.

Then, an inter-layer insulating film 228 is formed on the whole surface of the said polycrystalline silicon film at a thickness of, say, 250 to 350 nm by a CVD method using an inorganic silane gas and nitrogen oxide gas as source gases.

Figure 47:
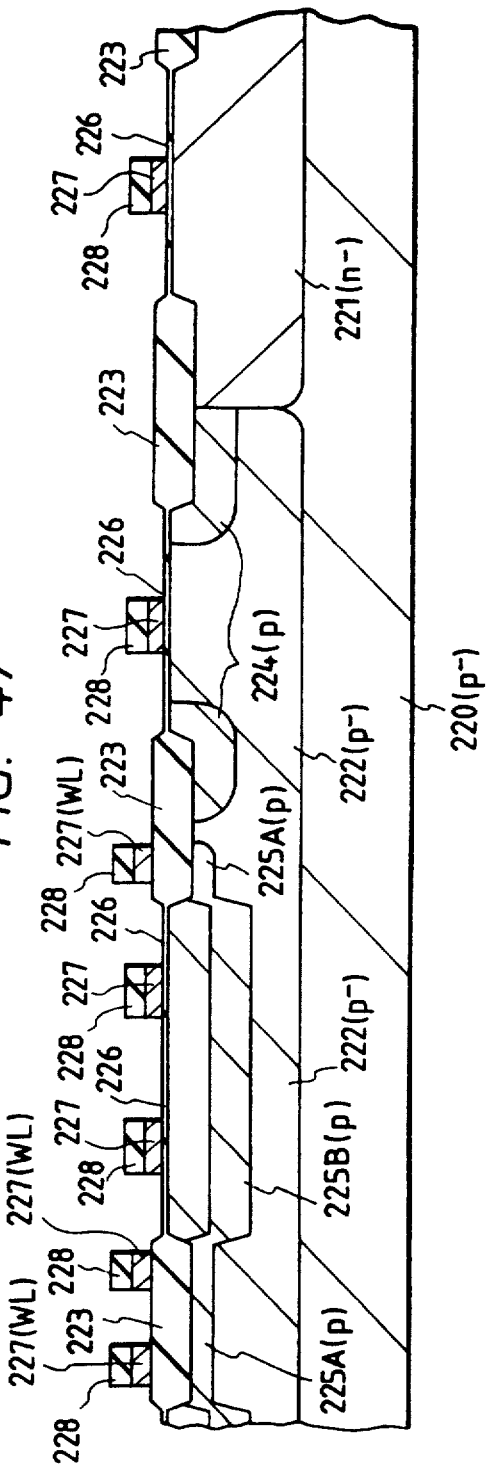

Next, as shown in FIG. 47, the inter-layer insulating film 228 and the polycrystalline silicon film are etched successively using an etching mask (not shown) to form gate electrodes 227 and word lines (WL) 227. In this case, the inter-layer insulating film 228 is allowed to remain on the gate electrodes 227 and the word lines 227. For this etching there is adopted anisotropic etching.

Low-Concentration Semiconductor Region Forming Process

Then, in order to diminish the contamination caused by the introduction of impurity, a silicon oxide film (with no reference numeral affixed thereto) is formed on the whole substrate surface. This silicon oxide film is formed on the main surfaces of the p⁻- and n⁻-type well regions exposed by the above etching and also on the side walls of the gate electrodes 227 and word lines 227. For example, the silicon oxide film is formed at a thickness of 10 to 20 nm in an oxygen gas atmosphere of a high temperature of, say, 850° to 950° C.

Next, using the insulating films 223 for element isolation and the inter-layer insulating films 228 (and the gate electrodes 227) as impurity introducing masks, an n-type impurity is introduced into the main surface portion of the p⁻-type well region 222 in each of the memory cell array 211E forming region and the n-channel MISFET Qn forming regions (ion implantation process 6). The n-type impurity 229n is introduced by self-alignment with respect to the gate electrodes 227. For example, it is introduced with energy of 30 to 50 Key, using phosphorus (or arsenic) at an impurity concentration of $1 \times 10^{13}$ atoms/cm² (implantation current: 20–30 μA). During the introduction of the n-type impurity 229n, the p-channel MISFET Qp forming region is covered with an impurity introducing mask (e.g. a photoresist film), though not shown.

Figure 48:
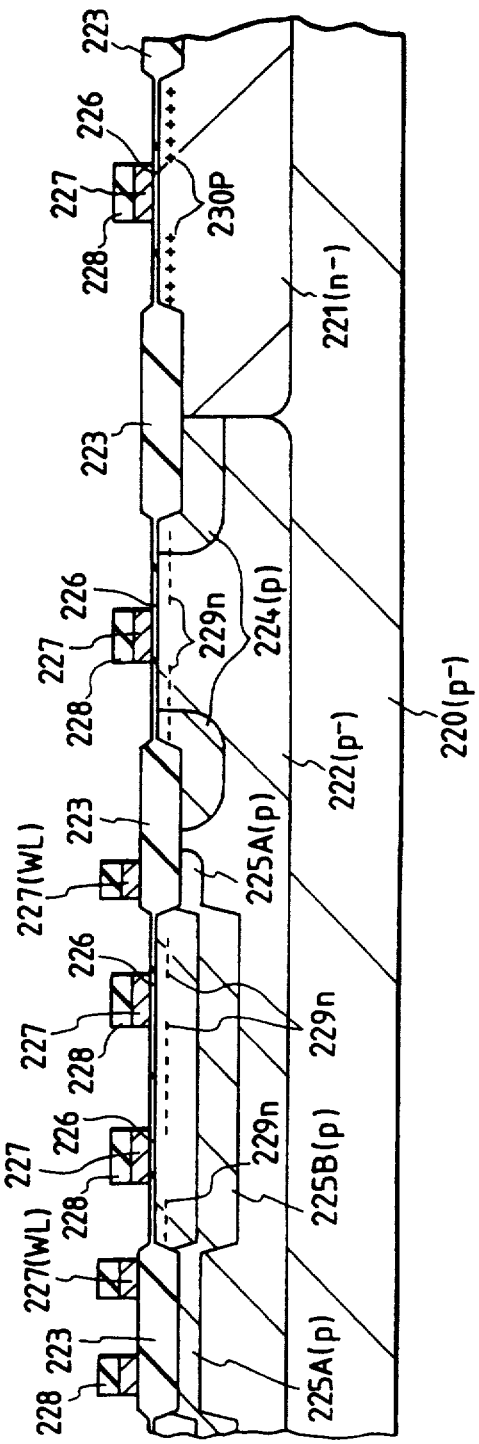

Then, as shown in FIG. 48, using the insulating films 223 for element isolation and the inter-layer insulating film 228 (and the gate electrode 227) as impurity introducing masks, a p-type impurity 230p is introduced into the main surface portion of the n⁻-type well region 221 in the p-channel MISFET Qp forming region (ion implantation process 7). The p-type impurity 230p is introduced by self-alignment with respect to the gate electrode 227. For example, it is introduced by an ion implantation method with energy of about 80 KeV, using BF₂ at an impurity concentration of $1 \times 10^{13}$ atoms/cm² or so (implantation current: 10 μA).

During the introduction of the p-type impurity 230p, the memory cell array 211E and n-channel MISFET Qn forming regions are each covered with an impurity introducing mask (a photoresist film), though not shown.

High-Concentration Semiconductor Region Forming Process 1

Next, side wall spacers 231 are formed on the side walls of each of the gate electrodes 227, word lines 227 and the overlying inter-layer insulating films 228. The side wall spacers 231 can be formed by depositing a silicon oxide film followed by anisotropic etching such as RIE to an extent corresponding to the thickness of the silicon oxide film thus formed by deposition. The silicon oxide film of the side wall spacer 231 is formed by a CVD method using an inorganic silane gas and nitrogen oxide gas as source gases which afford the same film quality as that of the inter-layer insulating film 228. For example, it is formed at a thickness of 130 to 180 nm. The length in the gate length direction (channel length direction) of the side wall spacer 231 is about 150 nm.

Then, an n-type impurity 232n is introduced in the n-channel MISFET Qn forming region of the peripheral circuit, as shown in FIG. 49, (ion implantation process 8). During the introduction of the n-type impurity 232n, the side wall spacers 231 are mainly used as impurity introducing masks, while the other regions than the n-channel MISFET Qn forming region, namely, the memory cell array 211E and p-channel MISFET Qp forming regions, are each covered with an impurity introducing mask (a photoresist film) (not shown). For example, the n-type impurity 232n is introduced by an ion implantation method with energy of 70 to 90 KeV, using As (or P) at an impurity concentration of $5\times10^{15}$ atoms/cm$^2$ (implantation current: 20 μA, for 10 minutes or so).

Next, as shown in FIG. 50, the n-type impurities 229n, 232n and the p-type impurity 230p are subjected to stretch-diffusion under heat treatment to form n-, n+- and p-type semiconductor regions 229, 232, 230. For example, the said heat treatment is performed at a high temperature of 900° to 1,000° C. for 20 to 40 minutes. By forming the n-type semiconductor regions 229 there is completed a memory cell selecting MISFET Qs having an LDD structure in the memory cell M, while by forming the n- and n+-type semiconductor regions 229, 232 there is completed an n-channel MISFET Qn of an LDD structure. This n-channel MISFET Qn is used in a peripheral circuit (for low voltage) or in an input or output stage circuit (for high voltage) of the DRAM 201. Although the p-type semiconductor regions 230 which constitute the LDD structure of the p-channel MISFET Qp are completed, p+-type semiconductor regions 239 are formed after the completion of the memory cell M, so a p-channel MISFET Qp will be completed in a post-process.

Thus, in the DRAM 201 having both the n-channel MISFET Qn of an LDD structure for high voltage used as an input or output stage circuit and the n-channel MISFET Qn of an LDD structure for low voltage used as a peripheral circuit, the method of the present invention includes a process of forming in the same manufacturing process the gate insulating film 226 and the gate electrode 227 of each of the n-channel MISFET Qn for high voltage and the n-channel MISFET Qn for low voltage on the main surfaces portions of different active regions of the p⁻-type well region 222; a process of forming in the same manufacturing process the n-type semiconductor regions 229 of a low impurity concentration forming the LDD structure by self-alignment with respect to the gate electrode 227 of each of the n-channel MISFET Qn for high voltage and the n-channel MISFET Qn for low voltage; a process of forming side wall spacers 231 on the side walls of the gate electrode 227 of each of the n-channel MISFETs Qn for high and low voltages, respectively; and a process of forming n⁻-type semiconductor regions 232 of a high impurity concentration by self-alignment with respect to the side wall spacers 231 on the main surface portions of the n-channel MISFETs Qn for high and low voltages, respectively, in active regions of the p⁻-type well region 222. By this construction, forming processes can be used in common to both the n-channel MISFET Qn for high voltage and the n-channel MISFET Qn for low voltage, particularly the respective side wall spacers 231 can be formed in the same manufacturing process, so it is possible to reduce the number of manufacturing processes for the DRAM 201.

Inter-layer Insulating Film Forming Process 1

Next, an inter-layer insulating film 233 is formed throughout the whole substrate surface including the upper surfaces of the inter-layer insulating films 228 and the side wall spacers 231. The inter-layer insulating film 233 is used as an etching stopper layer at the time of processing the electrode layers of the information storage capacitors C of a stacked structure. It is formed for electrical isolation between the lower electrode layers of the information storage capacitor C of a stacked structure and the gate electrodes 227, word lines 227, of the memory cell selecting MISFETs Qs. The inter-layer insulating film 233 is formed to thicken the side wall spacers 231 of a p-channel MISFET Qp. The thickness of the inter-layer insulating film 233 is set in anticipation of scraping thereof due to overetching mainly at the time of processing of an overlying electroconductive layer and also in anticipation of scraping in a washing process. The inter-layer insulating film 233 is formed by a silicon oxide film deposited according to a CVD method using an inorganic silane gas and nitrogen oxide gas as source gases. That is, the inter-layer insulating film 233 permits the reduction of stress induced on the basis of the difference in linear expansion coefficient between it and the dielectric film 236 of the information storage capacitor C of a stacked structure or the underlying inter-layer insulating film 228. For example, the inter-layer insulating film 233 is formed at a thickness of 130 to 180 nm.

Figure 51:
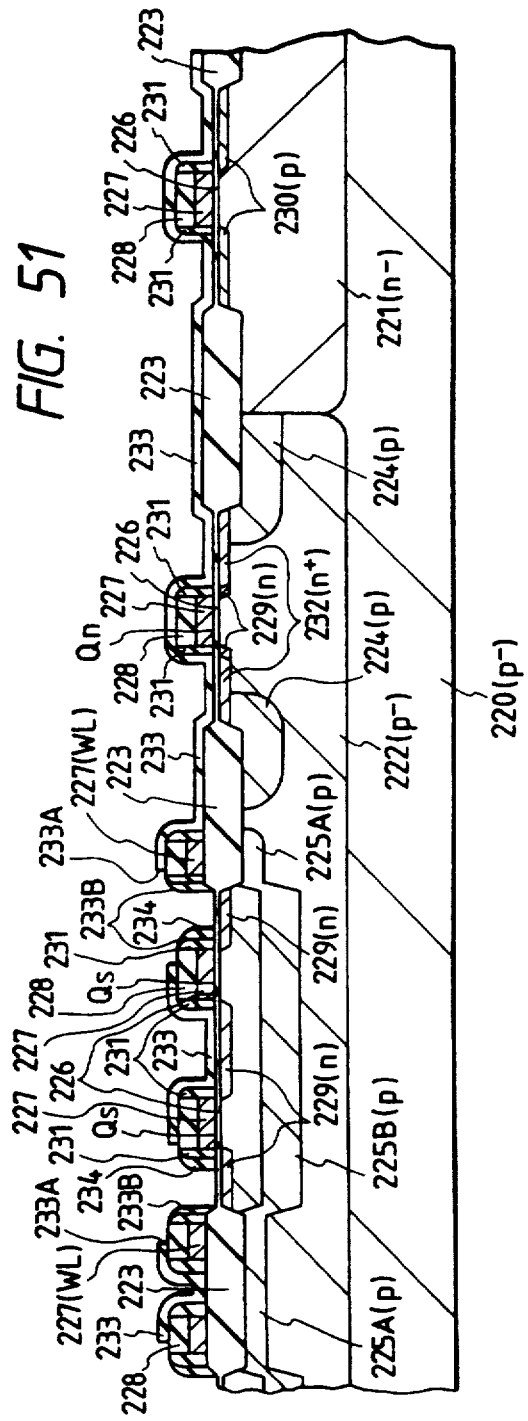

Next, as shown in FIG. 51, the inter-layer insulating film 233 on the other n-type semiconductor region (the connected side of the lower electrode layer 235 of the information storage capacitor C) of the memory cell selecting MISFET Qs in the memory cell M forming region is removed to form connection holes 233A and 234. The connection hole 234 is formed in a region defined by side wall spacers 233B which are deposited on the side walls of the side wall spacers 231 at the time of etching of the side wall spacers 231 and the inter-layer insulating film 233.

Gate Wiring Forming Process 2

Figure 52:
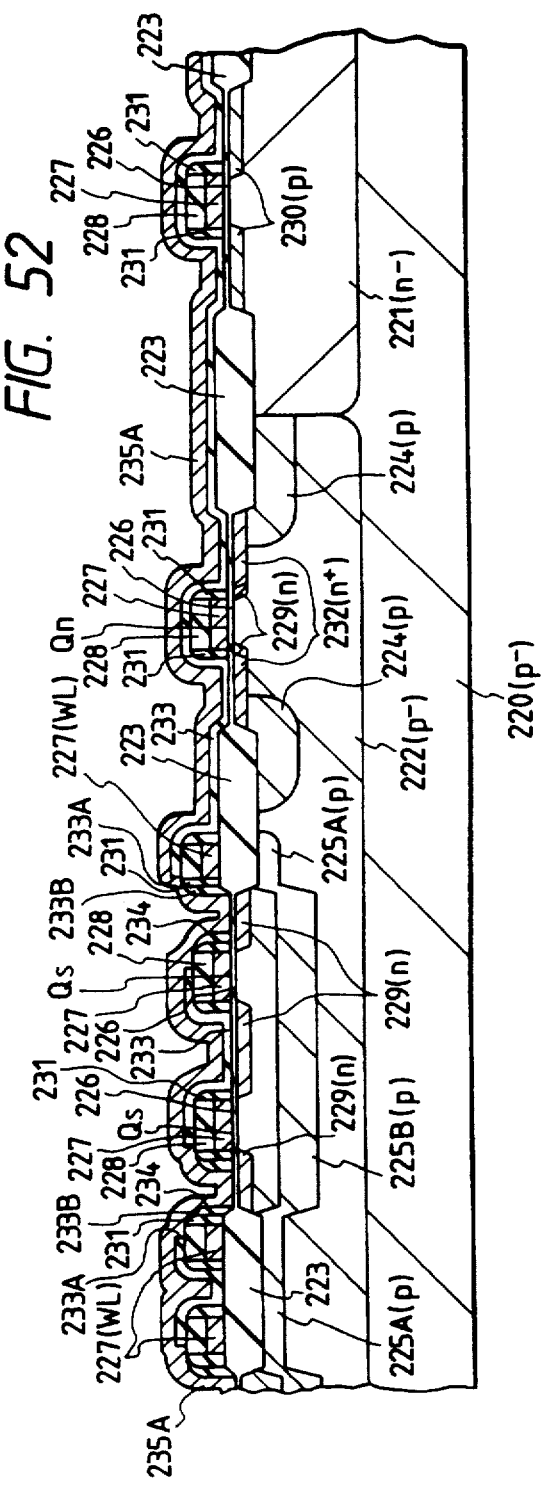

Then, as shown in FIG. 52, a polycrystalline silicon film which forms the lower electrode layer 235 of the information storage capacitor C having a stacked structure of the memory cell M is formed by deposition throughout the whole substrate surface including the upper surface of the inter-layer insulating film 233. This polycrystalline silicon film is partially connected to the n-type semiconductor regions 229 through the connection holes 233A and 234. This polycrystalline silicon film is formed at a thickness of 150 to 250 nm by deposition according to a CVD method in a second-layer gate wiring process during the manufacture of the semiconductor integrated circuit device. An n-type impurity which reduces the resistance value, e.g. phosphorus, is introduced into the said polycrystalline silicon film by a thermal diffusion method after the deposition of the film. This n-type impurity is introduced at a low concentration so that the impurity diffused in a large amount in the n-type semiconductor region 229 through the connection hole 234 may not be diffused to the channel forming region side of the memory cell selecting MISFET Qs.

Figure 53:
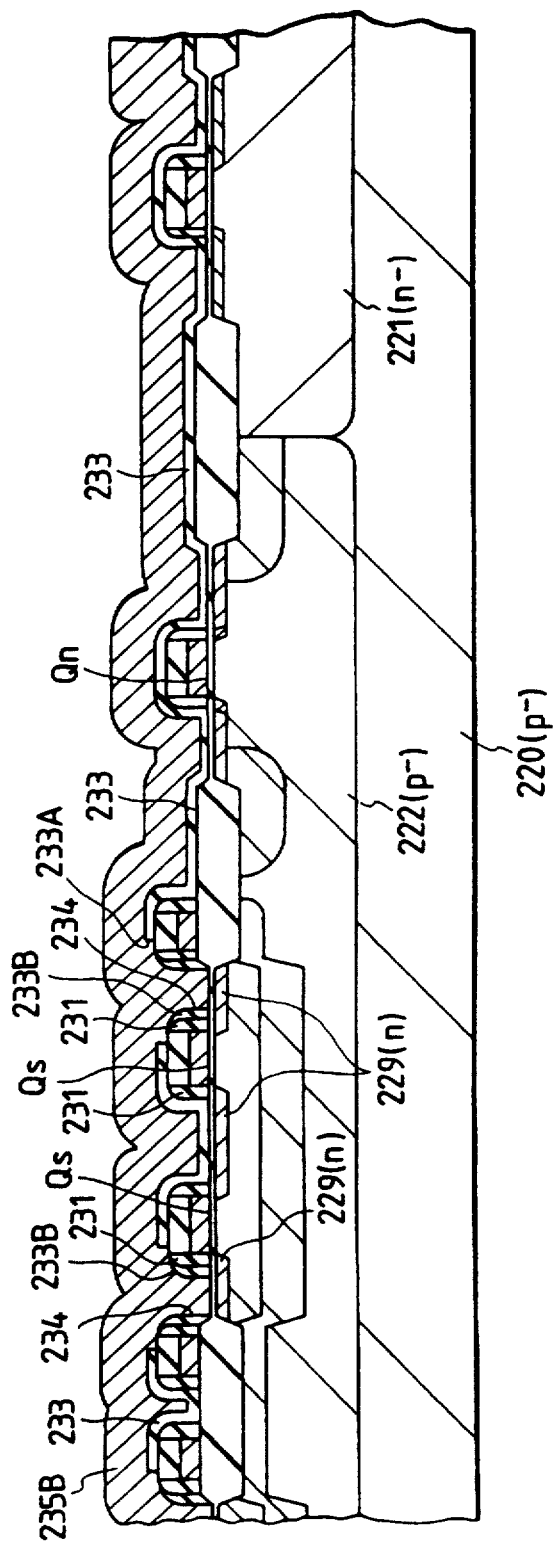

Next, as shown in FIG. 53, a polycrystalline silicon film is further deposited on the above polycrystalline silicon film. This polycrystalline silicon film as an upper layer is formed at a thickness of 250 to 350 nm by deposition according to a CVD method. An n-type impurity, e.g. P, which reduces the resistance value is introduced into the upper polycrystalline silicon film by a thermal diffusion method after the deposition of the film. This n-type impurity is introduced at a high concentration in order to improve the amount of electric charge stored in the information storage capacitor C of a stacked structure.

Figure 54:
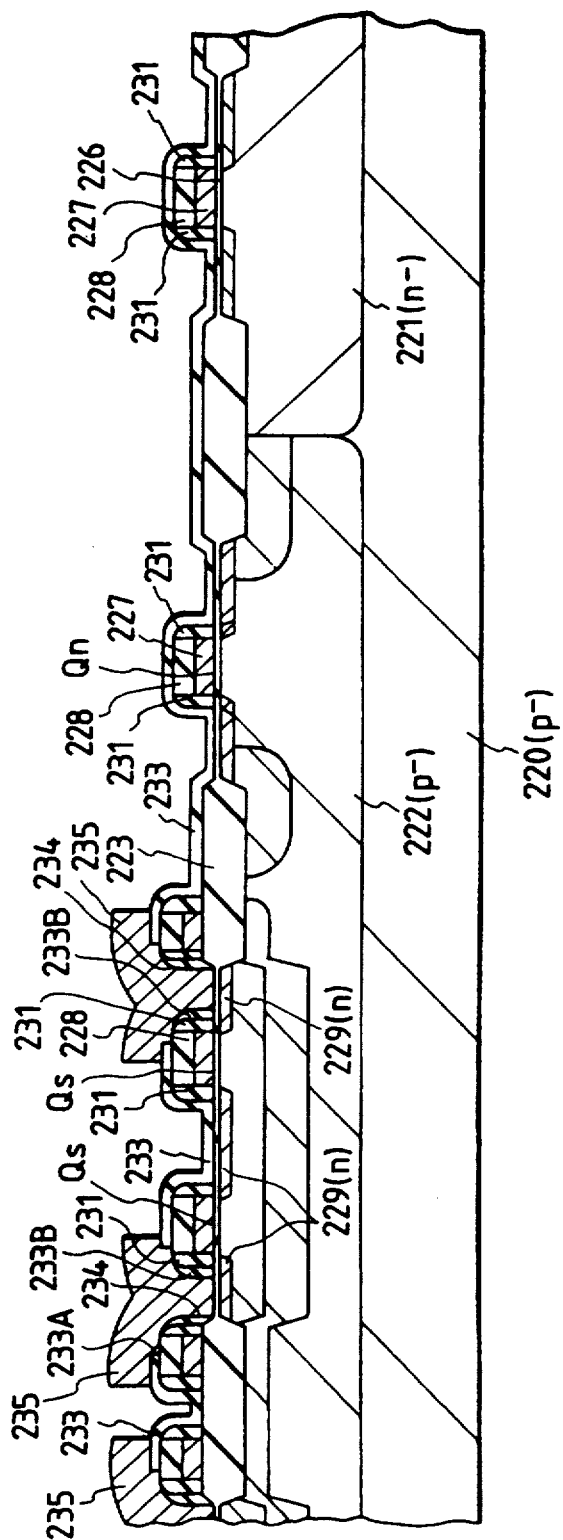

Then, as shown in FIG. 54, the above two-layer polycrystalline silicon film is processed into a predetermined shape by using a photolithography technique and an anisotropic etching technique to form a lower electrode layer 235. The photolithography technique involves an etching mask (photoresist film) forming process and an etching mask removing process. The etching mask removing process is carried out by a downstream plasma treatment using a gaseous mixture of carbon fluoride gas (CHF₃) and oxygen gas for example. This treatment is effective in diminishing the damage of each element of the DRAM 201.

Thus, in the DRAM 201 wherein the memory cell M is constituted by a series circuit of the memory cell selecting MISFET Qs and the information storage capacitor C of a stacked structure, a composite film formed by successive lamination of a polycrystalline silicon film with an n-type impurity introduced therein at a low concentration which impurity reduces the resistance value and a polycrystalline silicon film with the said n-type impurity introduced therein at a high concentration, is used as the lower electrode layer 235 on the side connected to one n-type semiconductor region 229 of the memory cell selecting MISFET Qs of the information storage capacitor C having a stacked structure. By this construction, the lower electrode layer 235 of the capacitor C of the memory cell M can be formed thick and the area of each side wall of the lower electrode layer 235 can be increased in the height direction accordingly, so it is possible to increase the amount of electric charge stored in the capacitor and reduce the area of the memory cell M to improve the integration density. Since the impurity concentration of the surface of the polycrystalline silicon film as an upper layer of the lower electrode layer 235 is high, it is possible to increase the amount of electric charge stored in the capacitor and improve the integration density. Moreover, since the impurity concentration of the polycrystalline silicon film of the lower electrode layer 235 is made low and the amount of the n-type impurity diffused to one n-type semiconductor region 229 side of the memory cell selecting MISFET Qs can thereby be decreased, it is possible to reduce the short channel effect of the memory cell selecting MISFET Qs and reduce the area of the memory cell M to further improve the integration density. In the present invention, the lower electrode layer 235 may be formed by depositing the polycrystalline silicon film in three or more layers and introducing the n-type impurity into each of those layers.

In the DRAM 201 wherein the memory cell M is constituted by a series circuit of the memory cell selecting MISFET Q and the information storage capacitor C of a stacked structure, the method of the present invention includes a process of depositing a first-layer polycrystalline film on the whole surface of the inter-layer insulating films 233 involving the upper surfaces of the memory cell selecting MISFETs Qs in the p⁻-type well region 222 and thereafter introducing an n-type impurity which reduces the resistance value into the first-layer polycrystalline silicon film; a process of depositing a second-layer polycrystalline silicon film on the whole surface of the first-layer polycrystalline silicon film and thereafter introducing an n-type impurity which reduces the resistance value into the second-layer polycrystalline silicon film; and a process of applying a predetermined patterning to each of the second- and first-layer polycrystalline silicon films successively by means of anisotropic etching to form the lower electrode layer 235 of the information storage capacitor C having a stacked structure. In this construction, even if the lower electrode layer 235 of the capacitor C is made thick, it is possible to enhance the anisotropy of the anisotropic etching and increase the etching speed because a the amount of the impurity introduced therein is ensured to a certain extent and there is attained uniformity. The improvement in anisotropy of the anisotropic etching permits the reduction in size of the lower electrode layer 235, so it is possible to decrease the area of the memory cell M and improve the integration density of the DRAM 201.

Dielectric Film Forming Process

Figure 55:
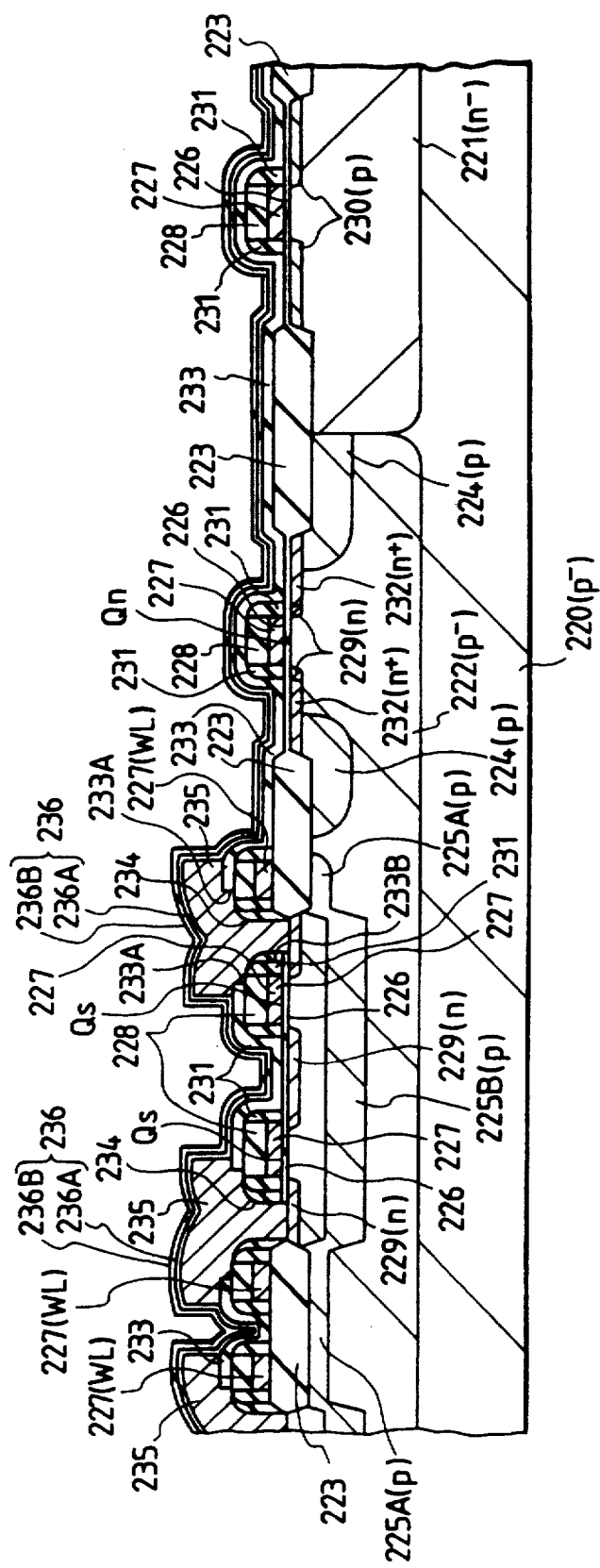

Next, as shown in FIG. 55, a dielectric film 236 is formed throughout the whole substrate surface including the upper surfaces of the lower electrode layers 235 of the information storage capacitors C having a stacked structure of memory cells M. As noted previously, the dielectric film 236 basically has a two-layer structure formed by successive lamination of a silicon nitride film 236A and a silicon oxide film 236B. For example, the silicon nitride film 236A as the lower layer is formed at a thickness of 5 to 7 nm by deposition according to a CVD method. In forming the silicon nitride film 236a, the inclusion of oxygen should be minimized. In the case where the silicon nitride film 236A is formed on the lower electrode layer 235 (polycrystalline silicon film) o the usual production level, an extremely small amount of oxygen is included therein, so a natural silicon oxide film is formed between the lower electrode layer 235 and the silicon nitride film 236A.

The silicon oxide film 236B as the upper layer of the dielectric film 236 is formed at a thickness of 1 to 3 nm by applying a high-pressure oxidation method to the silicon nitride film 236A as the lower layer. When the silicon oxide film 236B is formed, the lower silicon nitride film 236A is somewhat reduced in its thickness. Basically, the silicon oxide film 236B is formed in an oxygen gas atmosphere held at a high pressure of 1.5 to 10 Torr and a high temperature of 800° to 1,000° C. In this embodiment 2, the silicon oxide film 236B is formed at a high pressure of 3 to 3.8 Torr, at an oxygen (source gas) flow rate in the oxidation of 2 l/min and a hydrogen (source gas) flow rate of 3 to 8 l/min. The silicon oxide film 236B according to the high-pressure oxidation method can be formed to a desired thickness in a shorter time than in the formation of a silicon oxide film at atmospheric pressure. Thus, since the high-pressure oxidation method can shorten the heat treatment time at a high temperature, it is possible to shallow the pn junction of the source and drain regions in the memory cell selecting MISFET Qs, etc. The foregoing natural silicon oxide film can be made thin if the inclusion of oxygen is reduced. It is also possible to nitride the natural silicon oxide film and form the dielectric film 236 as a two-layer film although the number of manufacturing processes is increased.

Gate Wiring Process 3

Next, a polycrystalline silicon film is deposited throughout the whole substrate surface including the upper surfaces of the dielectric films 236. This polycrystalline silicon film is formed at a thickness of 80 to 120 nm in a third-layer gate wiring process during the manufacture of the semiconductor integrated circuit device by deposition according to a CVD method. Thereafter, an n-type impurity which reduces the resistance values, e.g. P, introduced into the said polycrystalline silicon film by a thermal diffusion method.

Figure 56:
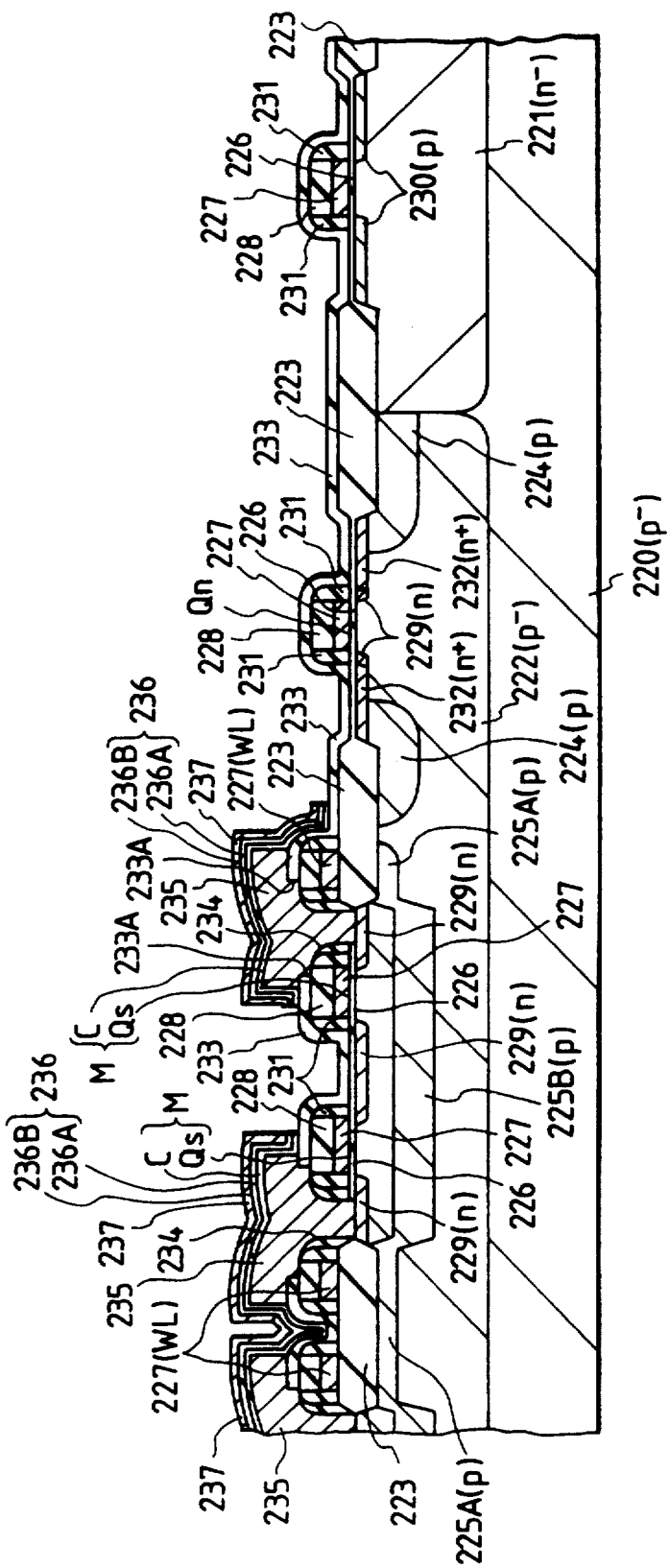

Next, an etching mask is formed on the above polycrystalline silicon film throughout the whole surface of the memory cell array 211E except the connection region between one n-type semiconductor region 229 of each memory cell selecting MISFET Qs and the complementary data line 250. For example, the etching mask is formed by a photoresist film according to a photolithography technique. Thereafter, as shown in FIG. 56, anisotropic etching is applied successively to the above polycrystalline silicon film and the dielectric film 236, using the said etching mask, to form an upper electrode layer 237. Now, the information storage capacitor C of a stacked structure is almost completed. As a result, the memory cell M of the DRAM 201 is completed. Thereafter, the etching mask is removed.

Figure 57:
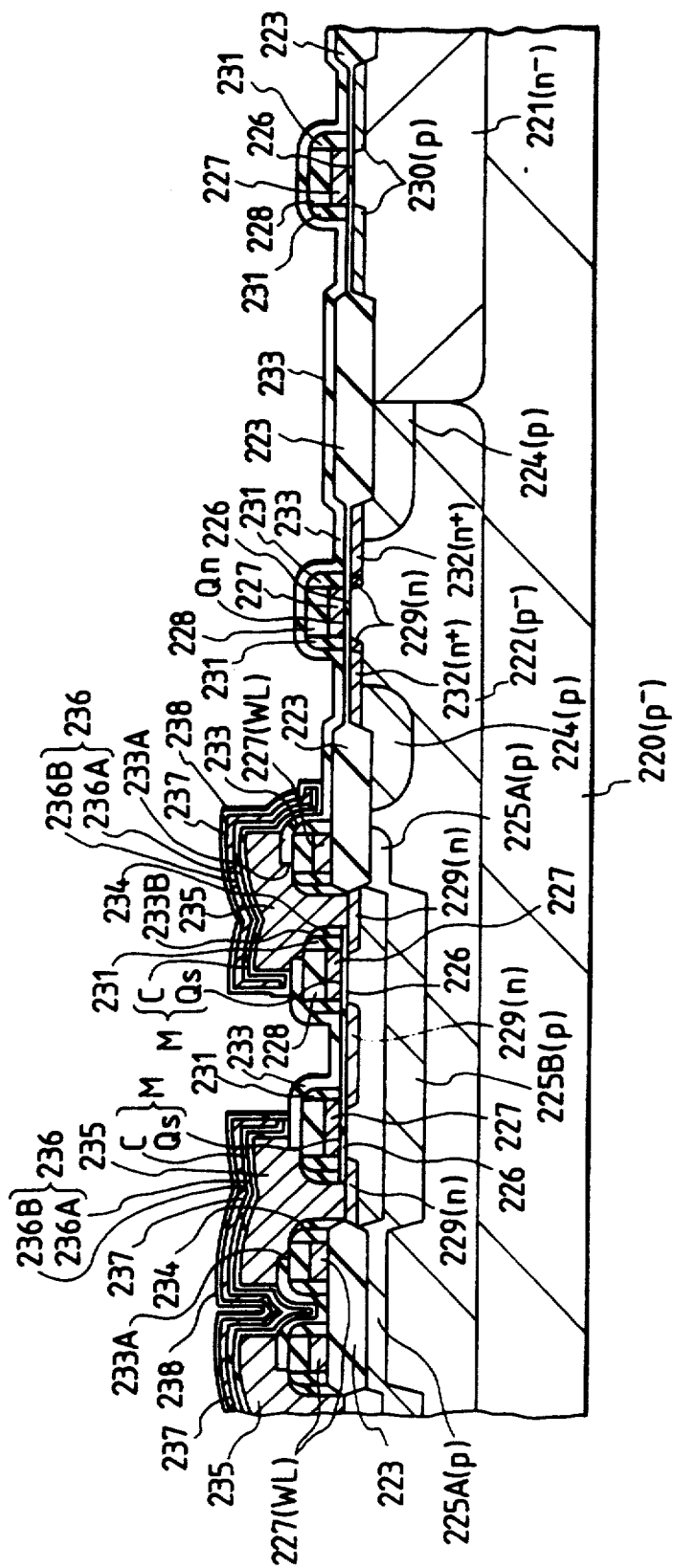

Then, as shown in FIG. 57, an insulating film (silicon oxide film) 238 is formed on the surface of the upper electrode layer 237 by the application of a thermal oxidation treatment. This process of forming the insulating film 238 is process of oxidizing an etching residue (polycrystalline silicon film) remaining on the underside surface (the surface of the inter-layer insulating film 233) after patterning of the upper electrode layer 237. In the information storage capacitor C of a stacked structure, the two layers lower—electrode layer 235 and upper electrode layer 237 —are deposited on the memory cell selecting MISFET Qs, so there is formed a large stepped shape, particularly in the connection between the complementary data line 250 and the memory cell M, so that an etching residue is apt to occur. This etching residue short-circuits the complementary data line 250 and the upper electrode layer 237.

Thus, in the DRAM 201 wherein the memory cell M is constituted by a series circuit comprising the memory cell selecting MISFET Qs with one n-type semiconductor region 229 connected to the complementary data line 250 and the information storage capacitor C of a stacked structure formed by successive lamination of the lower electrode layer 235, dielectric film 236 and upper electrode layer 237 which overlie the MISFET Qs, the method of the present invention includes a process of forming a polycrystalline silicon film on the dielectric film 236 of the memory cell M by deposition according to a CVD method and applying a predetermined patterning to the polycrystalline silicon film by means of anisotropic etching to form the upper electrode layer 237 and a process of forming the insulating film 238 (silicon oxide film) on the surface of the upper electrode layer 237 by a thermal oxidation method. By this construction, the etching residue of the polycrystalline silicon film remaining on the stepped portion of the underside surface after the patterning of the polycrystalline silicon film can be oxidized by the subsequent thermal oxidation process, so it is possible to prevent short-circuit of the upper electrode layer 37 and the complementary data line 250 and improve the yield in the production.

High-Concentration Semiconductor Region Forming Process 2

Figure 58:
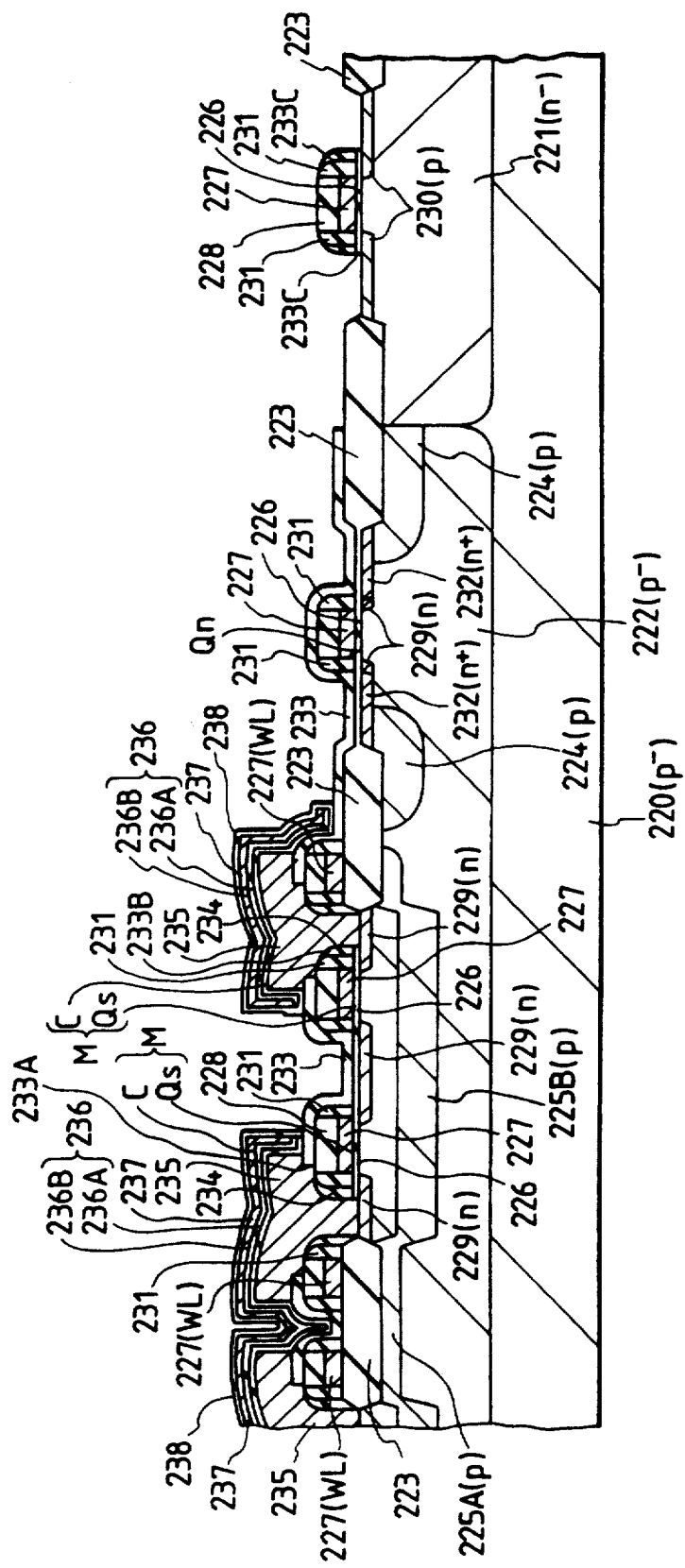

Next, in the region where the p-channel MISFET Qp of the peripheral circuit is to be formed, anisotropic etching is applied to the inter layer insulating film 233 formed in the foregoing process to form side wall spacers 233C as shown in FIG. 58. The side wall spacers 233C are formed on the side walls of the side wall spacers 231 by self-alignment with respect to the gate electrode 227. The side wall spacers 233C are formed to lengthen the size in the gate length direction of the side wall spacers 231 of the p-channel MISFET Qp. The side wall spacers 231 and 233C are formed so that the total size thereof in the gate length direction is about 200 nm as mentioned previously.

Then, an insulating film (not shown) is formed on the whole substrate surface including the upper surface of the upper electrode layer 237 of each information storage capacitor C of a stacked structure, that of the n-channel MISFET Qn and that of the region where the p-channel MISFET Qp is to be formed. This insulating film is used mainly as a contamination preventing film at the time of introduction of impurity. For example, as this insulating film there is used a silicon oxide film formed at a thickness of about 10 nm by deposition according to a CVD method using an inorganic silane gas and nitrogen oxide gas as source gases.

Figure 59:
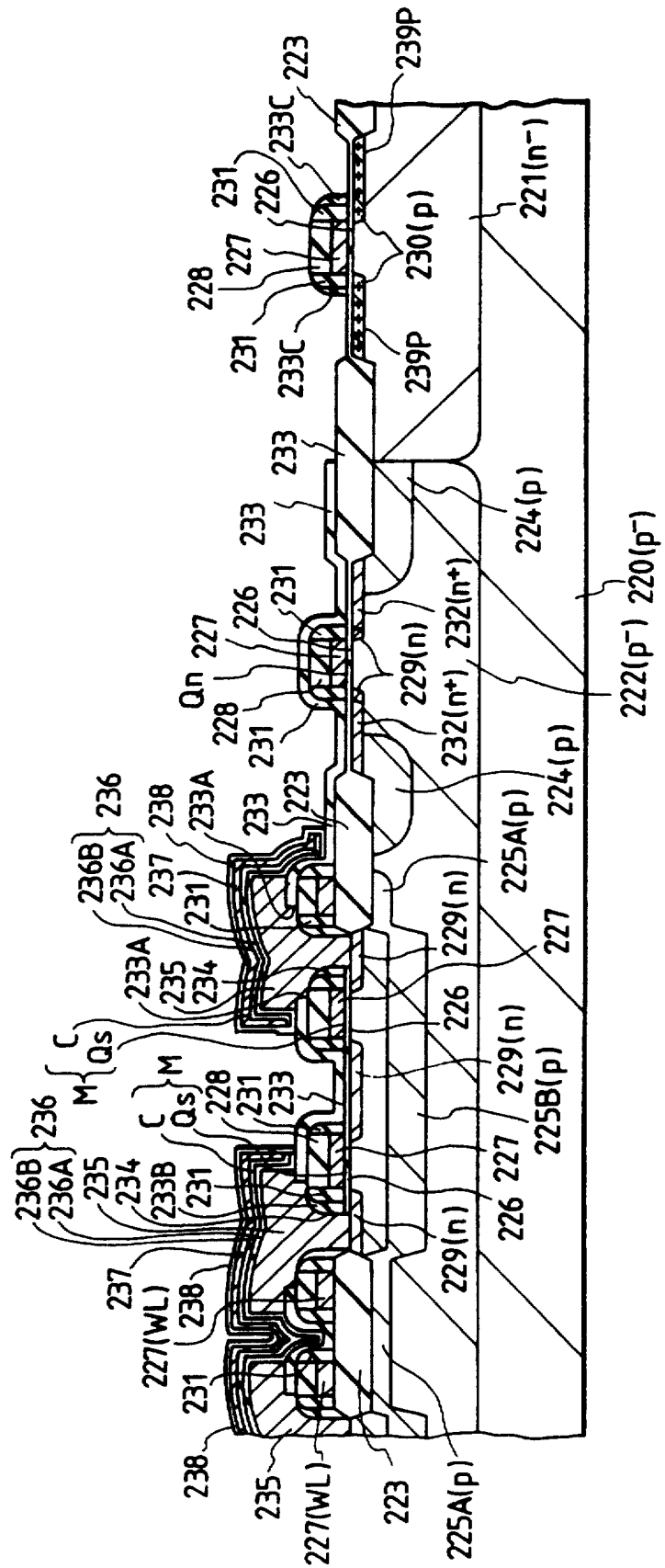

Next, as shown in FIG. 59, a p-type impurity 239p is introduced into the region where the p-channel MISFET Qp of the peripheral circuit is to be formed (ion implantation process 9). In this case, the side wall spacers 231 and 233C are mainly used as impurity introducing masks. During the introduction of the p-type impurity 239p, the other regions than the p-channel MISFET Qp forming region, namely, the memory cell array 211E and n-channel MISFET Qn forming regions, are each covered with an impurity introducing mask (photoresist film) (not shown). For example, the p-type impurity 239p is introduced by an ion implantation method with energy of about 80 KeV, using $BF_2$ (or B) at an impurity concentration of $3 \times 10^{15}$ atoms/cm$^2$ or so (implantation current: 20 mA, for 10 minutes or so).

Thereafter, $p^+$-type semiconductor regions 239 are formed by heat treatment, which is carried out, for example, at a high temperature of 900° to 1,000° C. for 20 to 40 minutes. By the formation of the $p^+$-type semiconductor regions 239 there is completed the p-channel MISFET Qp of LDD structure. The p-channel MISFET Qp is formed after increasing the size in the gate length direction of the side wall spacers 231 by the formation of the side wall spacers 233C and after the application of heat treatment (e.g. the dielectric film 236) for forming the information storage capacitor C having a stacked structure of the memory cell M. That is, in the p-channel MISFET Qp it is possible to diminish the diffusion of the $p^+$-type semiconductor regions 239 to the channel forming region side and reduce the short channel effect.

The above ion implantation process 9 may be performed in the following manner. In this case, defects can be remedied completely even if the heat treatment is conducted at 900° to 800° C. lower than the above annealing temperature. First, Ge$^+$ (germanium) is implanted, like the above $BF_2$, at a concentration of $5 \times 10^{14}$ atoms/cm$^2$ and with energy of 10 to 20 KeV to render the implanted portion fully amorphous, then B$^+$ (monovalent ion of boron) is implanted at an impurity concentration of $2 \times 10^{15}$ atoms/cm$^2$ and with energy of 2 to 5 KeV, followed by post-treatment in the same manner as above. Such a beforehand implantation of Ge$^+$, etc. will hereinafter be referred to as "pre-amorphous ion implantation." In the case of implanting B$^+$ (monovalent ion of boron) directly without going through such preamorphous treatment, there may be used an implantation current of 20 mA, an impurity concentration of $2 \times 10^{15}$ atoms/cm$^2$, energy of 2 to 5 KeV and a wafer implantation surface temperature of $-100°$ C. or so for cooling to facilitate rendering the implanted portion amorphous, and ion implantation may be carried out under these conditions in the same way as in the implantation of BF$_2$ described above.

Thus, in the DRAM 201 having both the memory cell M constituted by a series circuit of the memory cell selecting MISFET Qs and the information storage capacitor C of a stacked structure, and the complementary MISFET of LDD structure which constitutes the peripheral circuit, the method of the present invention includes a process of successively forming the gate insulating film 226 and the gate electrode 227 of each of the memory selecting MISFET of the memory cell M, the n-channel MISFET Qn of the peripheral circuit and the p-channel MISFET Qp thereof; a process of forming the n- and p type semiconductor regions 229, 230 of a low impurity concentration forming the LDD structure of each of the memory cell selecting MISFET Qs, n-channel MISFET Qn and p-channel MISFET Qp by self-alignment with respect to the gate electrode 227; a process of forming the side wall spacers 231 on the side walls of the gate electrode 227 of each of the memory cell selecting MISFET Qs, n-channel MISFET Qn and p-channel MISFET Qp; a process of forming the n$^+$-type semiconductor regions 232 having a high impurity concentration of the n-channel MISFET Qn by self-alignment with respect to the side wall spacers 231; a process of forming the information storage capacitor C having a stacked structure of the memory cell M; a process of forming the side wall spacer 233C on the side walls of the gate electrode 227 of the p-channel MISFET Qp through the side wall spacers 231 by self-alignment with respect to the gate electrode 227; and a process of forming the p$^+$-type semiconductor regions 239 of a high impurity concentration of the p-channel MISFET Qp by self-alignment with respect to the side wall spacers 233C. By this construction, in the n-channel Qn, since the size in the gate length direction of the n-type semiconductor regions 229 of a low impurity concentration forming the LDD structure is defined by the side wall spacers 231 of a single layer, it is possible to shorten the size in the gate length direction of the n-type semiconductor regions 229, while in the p-channel MISFET Qp, the amount of the p$^+$-type semiconductor regions 239 of a high impurity concentration spread to the channel forming region side is restricted by the side wall spacers 231 and 233C of plural layers, and since the p$^+$-type semiconductor regions 239 of a high impurity concentration are formed after the application of heat treatment for forming the information storage capacitor C having a stacked structure of the memory cell M, it is possible to decrease the amount of the p$^+$-type semiconductor regions 239 spread to the channel forming region side.

Further, there is included a process of forming the inter-layer insulating film 233 after the process of forming the n$^+$-type semiconductor regions 232 having a high impurity concentration of the n-channel MISFET Qn and before the process of forming the information storage capacitor C having a stacked structure of the memory cell M. After the formation of the inter-layer insulating film 233, the side wall spacers 233C are formed by utilizing the inter-layer insulating film 233. By this construction, the process of forming the side wall spacers 233C can be carried out partially (film depositing process) by utilizing the process of forming the inter-layer insulating film 233. Consequently, the number of manufacturing processes for the DRAM 201 can be decreased accordingly.

Inter layer Insulating Film Forming Process 2

Next, an inter-layer insulating film 240 is laminated onto the whole substrate surface including the upper surfaces of the various constituent elements of the DRAM 201. As the inter-layer insulating film 240 there is used a silicon oxide film formed, for example, by deposition according to a CVD method using an inorganic silane gas and nitrogen oxide gas as source gases. The inter-layer insulating film 240 is formed at a thickness of, say, 250 to 350 nm.

Figure 60:
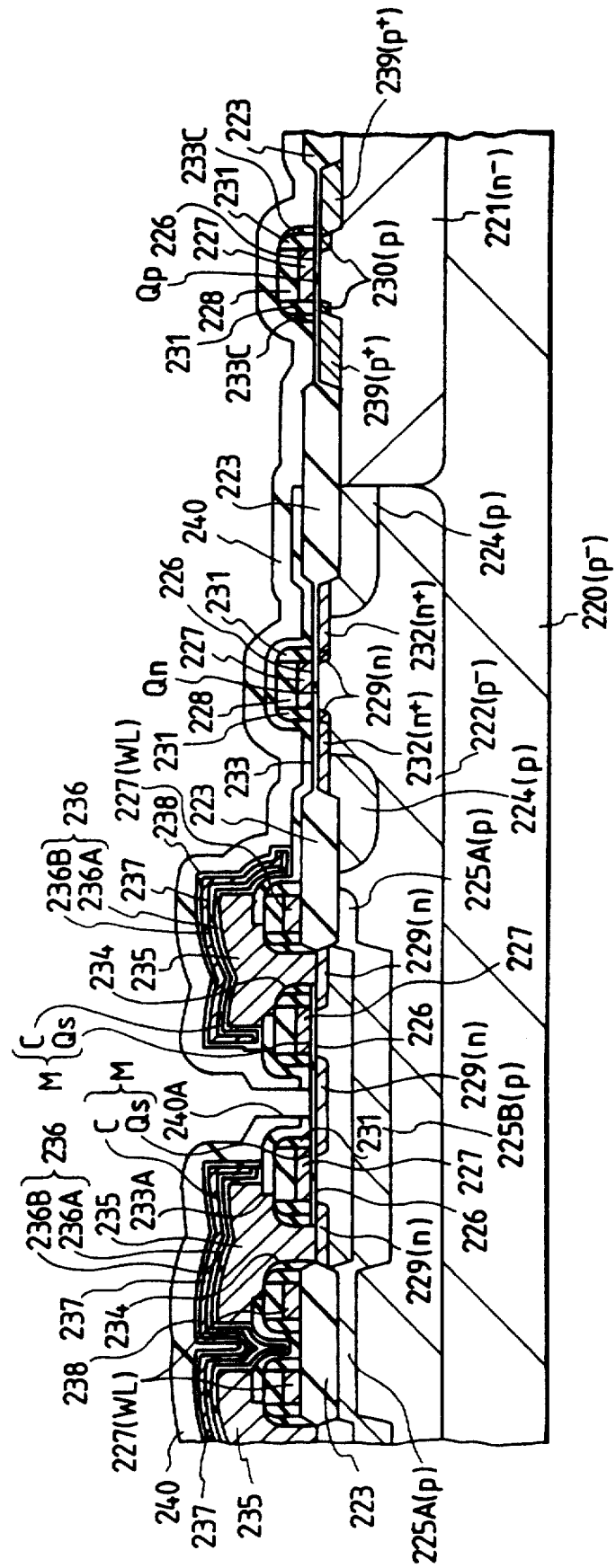

Then, as shown in FIG. 60, in the connection between the memory cell M and the complementary data line 250, a connection hole 240A is formed in the inter-layer insulating film 240, for example by anisotropic etching.

Gate Wiring Process 4

Figure 61:
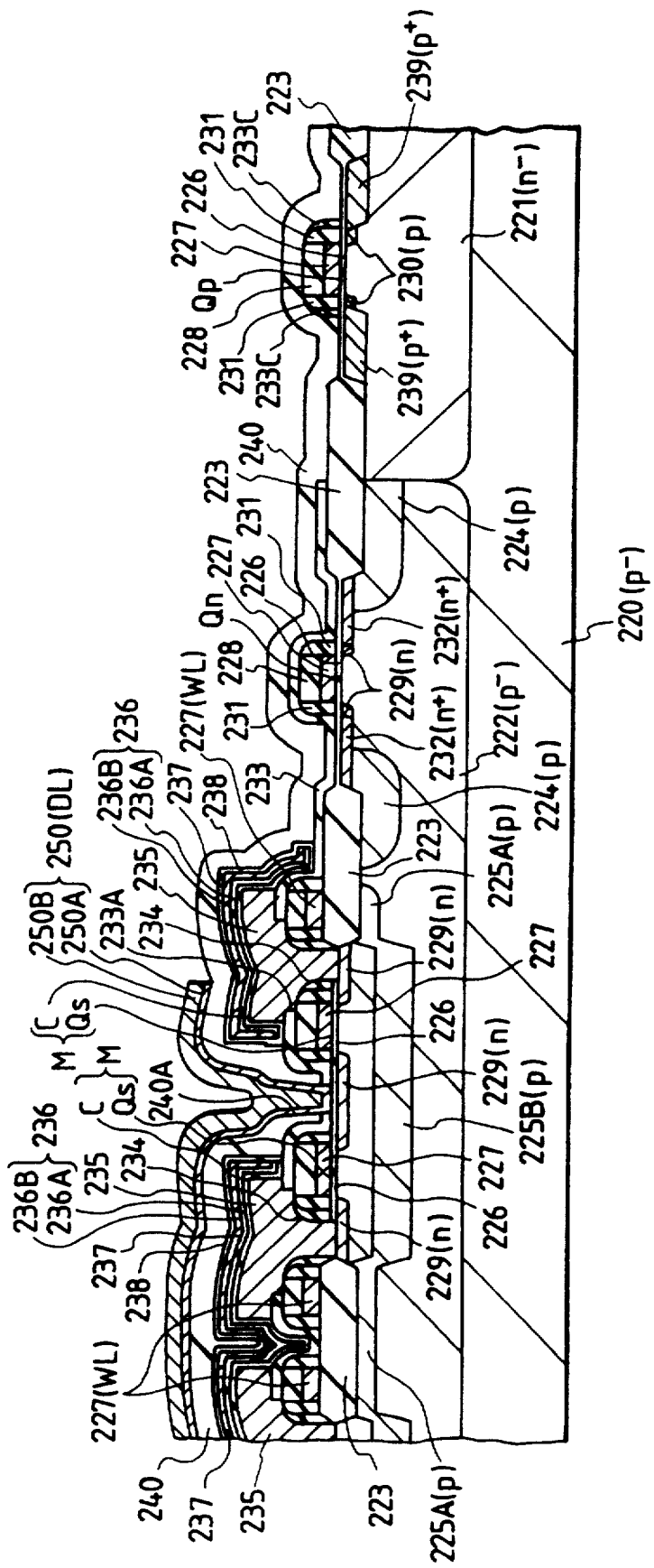

Next, as shown in FIG. 61, a complementary data line (DL) 250 is formed through the connection hole 240A, the data line 250 being connected to one n-type semiconductor region 229 of the memory cell selecting MISFET Qs and extending on the inter-layer insulating film 240. The complementary data line 250 is formed in a fourth gate wiring process during the manufacture of the semiconductor integrated circuit device. It has a two-layer structure formed by successive lamination of a polycrystalline silicon film 250A and transition metal silicide film 250B. The polycrystalline silicon film 250A as the lower layer is formed at a thickness of, say, 80 to 120 nm by deposition according to a CVD method. After the deposition, an n-type impurity, e.g. phosphorus, is introduced into the polycrystalline silicon film 250A by a thermal oxidation method. Since the polycrystalline silicon film 250A thus deposited by a CVD method is high in step coverage at a stepped portion of the connection hole 240A, it is possible to diminish the disconnection of the complementary data line 250. In the case where the connection hole 240A partially overlaps the upper surface of the insulating film 223 for element isolation in the connection between the memory cell M and the complementary data line 250 due to a mask alignment error between the connection hole 240A and the insulating film 223 for element isolation in the manufacturing process, it is possible to connect the n-type semiconductor region 229 and the complementary data line 250 with each other by diffusing an n-type impurity from the polycrystalline silicon film 250A to the main surface portion of the p$^-$-type well region 222, so it is possible to prevent short-circuit between the complementary data line 250 and the p$^-$-type well region 222. For example, as the upper transition metal silicide film 250B there is used a WSi$_2$ film formed at a thickness of 100 to 200 nm by deposition according to a CVD method. The transition metal silicide film 250B as the upper layer is formed mainly for reducing the resistance value of the complementary data line 250B and increasing the speed of information writing operation and that of information reading operation. Since the upper transition metal silicide film 250B is deposited by a CVD method, it is possible to diminish the disconnection of the complementary data line 250.

The complementary data line 250 is formed by patterning into a predetermined shape by means of anisotropic etching for example after the deposition of the lower polycrystalline silicon film 250A and that of the upper transition metal silicide film 250B.

Inter-layer insulating Film Forming Process 3

Next, an inter-layer insulating film 251 is formed throughout the whole substrate surface including the upper surface of the complementary data line 250. The inter-layer insulating film 251 has a two-layer structure formed by successive lamination of a silicon oxide film 251A and a BPSG film 252B. For example, the silicon oxide film 251B as the lower layer is formed at a thickness of 100 to 200 nm by deposition according to a CVD method using an inorganic silane gas and nitrogen oxide gas as source gases. The lower silicon oxide film 251A is formed for preventing the leakage of impurities (P and B) of the upper BPSG film 251B. The BPSG film 251B as the upper layer is formed at a thickness of 250 to 350 nm by deposition according to a CVD method for example. Flow is applied to the BPSG film 251B at a temperature of about 800° C. or higher in a nitrogen gas atmosphere to flatten the surface thereof.

Figure 62:
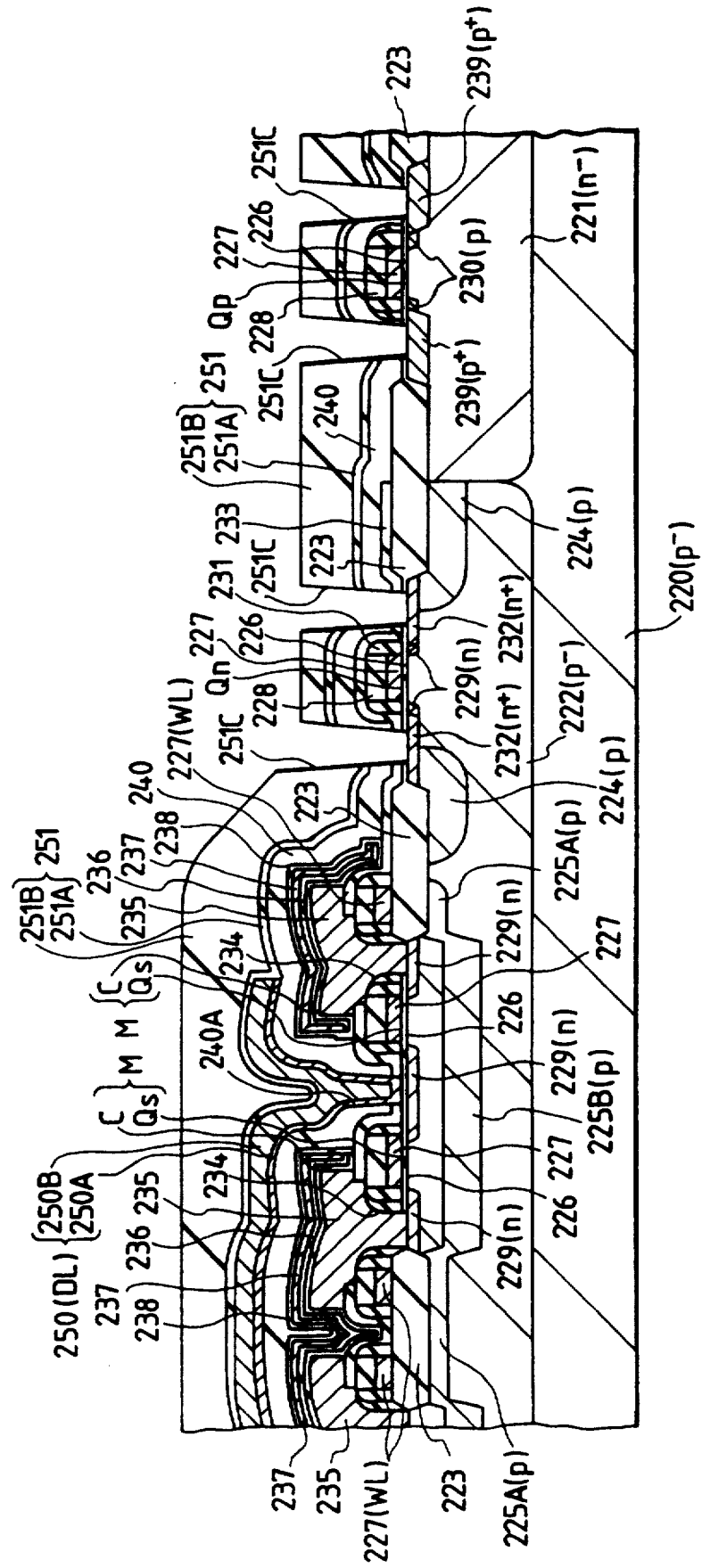

Next, as shown in FIG. 62, connection holes 251C are formed in the inter-layer insulating film 251. The connection holes 251C are formed by removing the inter-layer insulating film 251 portions positioned on the n+-type semiconductor regions 232, on the p+-type semiconductor regions 239, on the lines 250 (not shown) and on the upper electrode layer 237 in the DRAM 201. For example, the connection holes 251C are formed by anisotropic etching.

In the p-channel MISFET Op forming region, the impurity concentration of the surface of the p+-type semiconductor regions 239 is lower than that of the P+-type semiconductor regions 232 because of a large diffusion coefficient of the p-type impurity. Due to overetching at the time of forming the connection holes 251C, the surface portions of the p+-type semiconductor regions 239 wherein the impurity concentration is high are etched, so that the impurity concentration of the surfaces thereof becomes still lower. Further, since lines 252 connected to the p+-type semiconductor regions 239 are formed by a transition metal film (W film), the work function difference is larger than that of the n+-type semiconductor regions 232. In view of this point, in the p-channel MISFET Qp and in the region defined by the connection holes 251C, a p-type impurity may be introduced into the surfaces of the p+-type semiconductor regions 239 to increase the impurity concentration of the said surfaces. By this construction it is made possible to reduce the resistance value in the connection between the p+-type semiconductor regions 239 of the p-channel MISFET Qp and the lines 252.

Wiring Process 1

Figure 63:
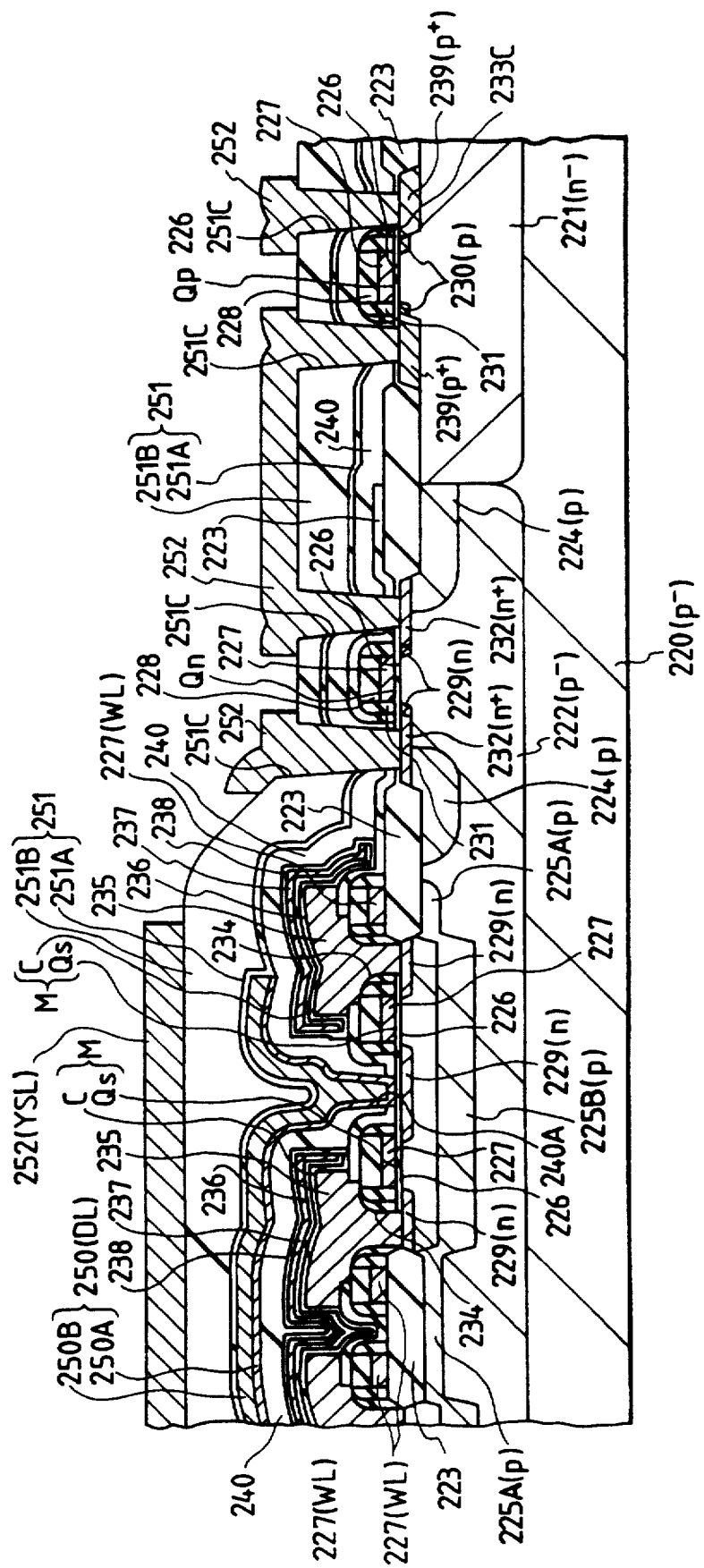

Next, as shown in FIG. 63, lines (incl. column select signal lines) 252 are formed on the inter-layer insulating film 251 for connection with the n+- and p−-type semiconductor regions 232, 239 through the connection holes 251C. For example, the lines 252 are formed at a thickness of 350 to 450 nm as a transition metal film, e.g. tungsten film, by deposition according to a sputtering method. The lines 252 can be formed by patterning into a predetermined shape, for example by means of anisotropic etching, after the deposition throughout the whole surface of the inter-layer insulating film 251.

Inter-layer Insulating Film Forming Process 4

Figure 64:
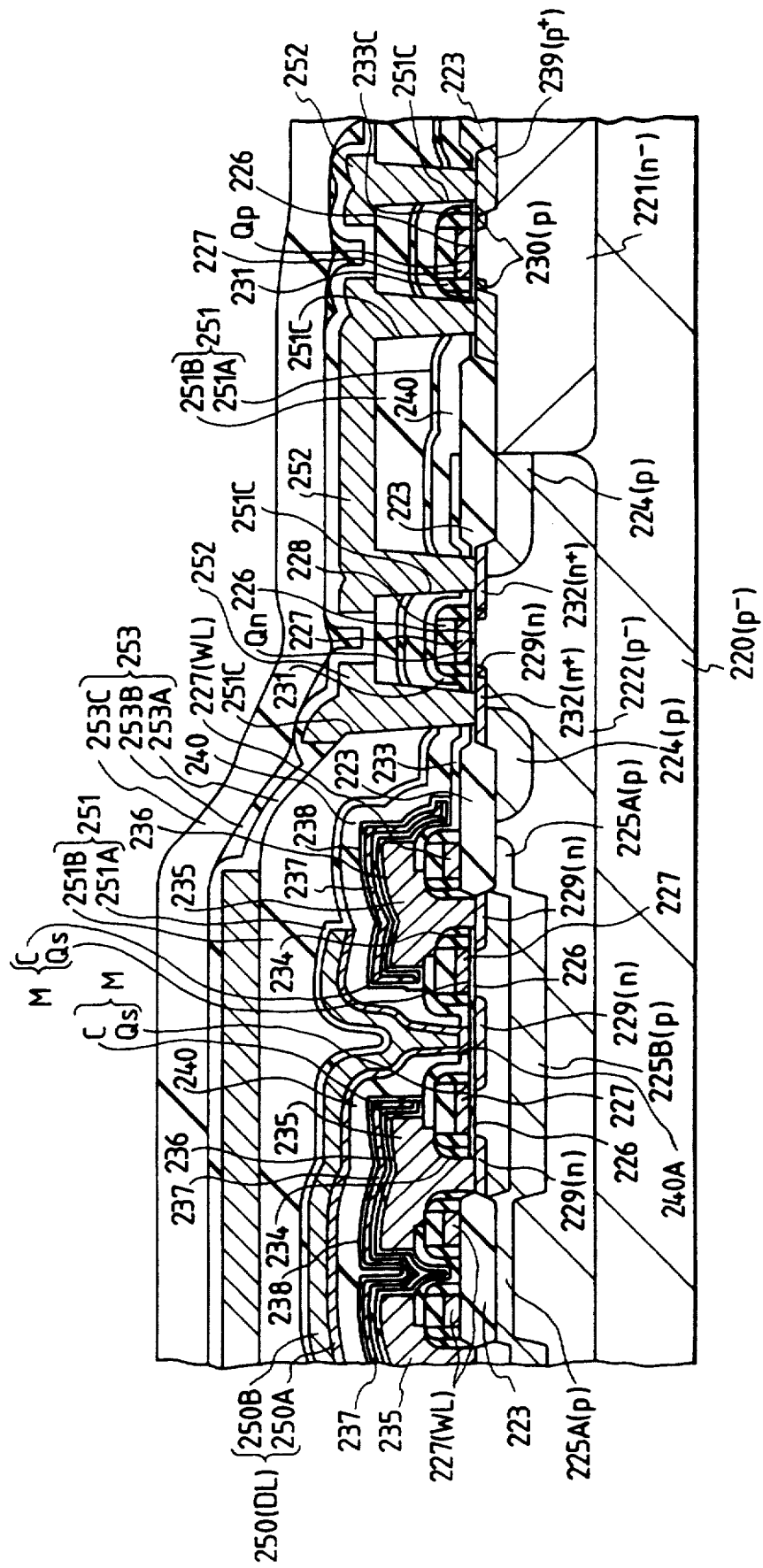
Figure 65:
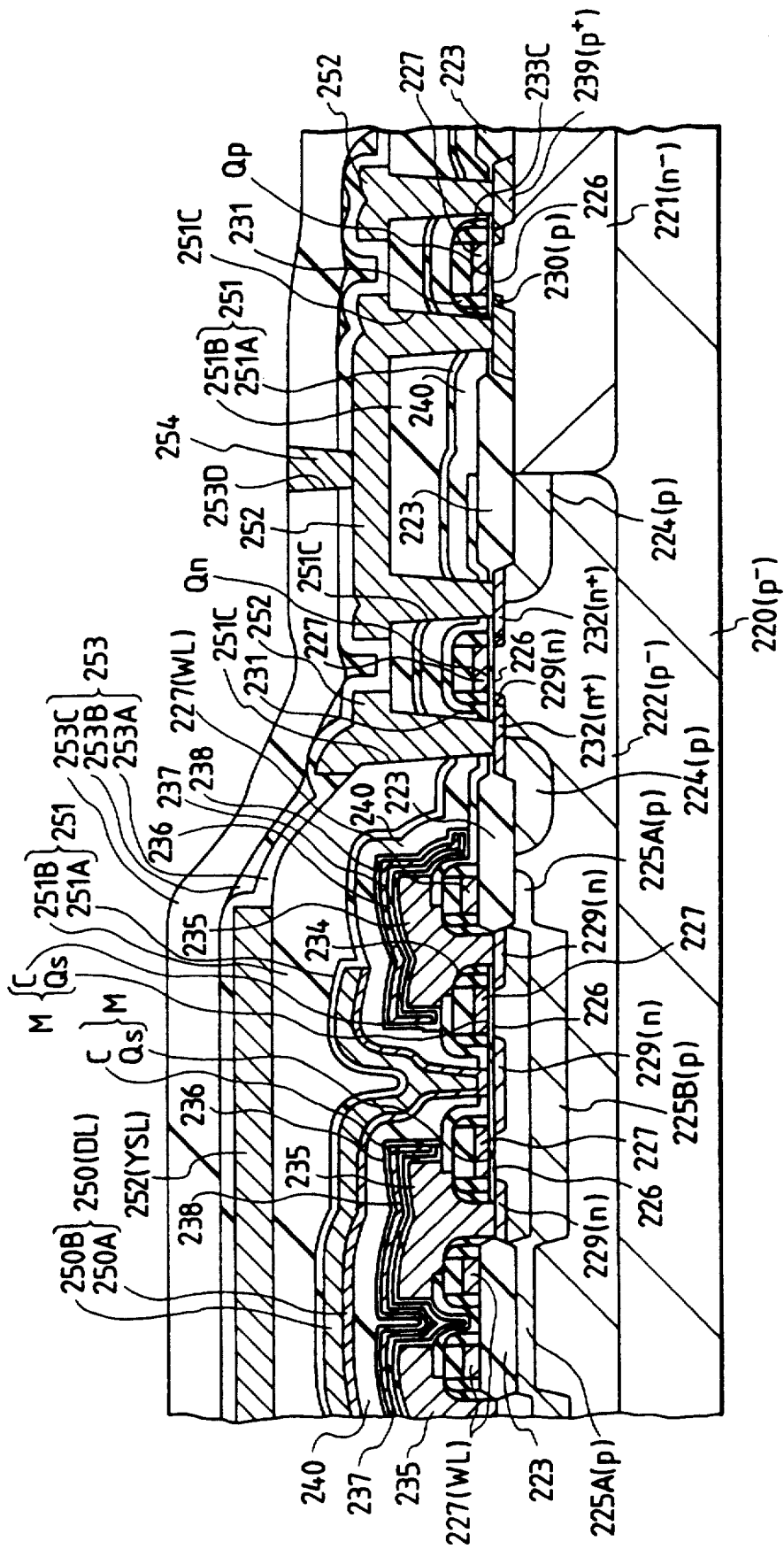

Then, as shown in FIG. 64, an inter-layer insulating film 253 is formed throughout the whole substrate surface including the upper surfaces of the lines 252. It has a three-layer structure formed by successive lamination of a silicon oxide film (a deposition type insulating film) 253A, a silicon oxide film (a application type insulating film) 253B and a silicon oxide film (a deposition type insulating film) 253C. The silicon oxide film 253A as a lower layer is formed at a thickness of 250 to 350 nm by deposition according to a C-CVD method using tetraethoxysilane gas as a source gas. The silicon oxide film 253B as a middle layer is provided for flattening the surface of the inter-layer insulating film 253. It is formed by application several times (2 to 5 times) (to a total thickness of 100 to 150 nm) according to a SOG method, then subjecting the film to a baking treatment (at about 450° C.) and retracting the surface thereof by etching. By this retraction through etchings, the silicon oxide film 253B is formed only in a concave portion of the stepped surface shape of the lower silicon oxide film 253A. The middle layer of the inter-layer insulating film 253 may be formed by a film of an organic substance, e.g. a polyimide resin film, in place of the silicon oxide film 253B. The silicon oxide film 253C as an upper layer is formed at a thickness of 250 to 350 nm by deposition according to a C-CVD method using tetraethoxysilane gas as a source gas for example with a view to enhancing the strength of the inter-layer insulating film 253 as a whole.

Next, a predetermined portion of the line 253 as the inter-layer insulating film is removed to form a connection hole 253D. In forming the connection hole 253D, there is performed anisotropic etching for example.

Then, a transition metal film 254 is laminated (embedded) onto the surface of the line 252 portion exposed to the interior of the connection hole 253D. As the transition metal film 254 there is used, for example, a tungsten film formed at a thickness of 600 to 800 nm by deposition according to a selective CVD method. The following is a reaction formula of the said tungsten film:

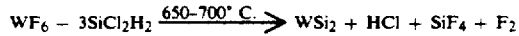

Wiring Process 2

Figure 66:
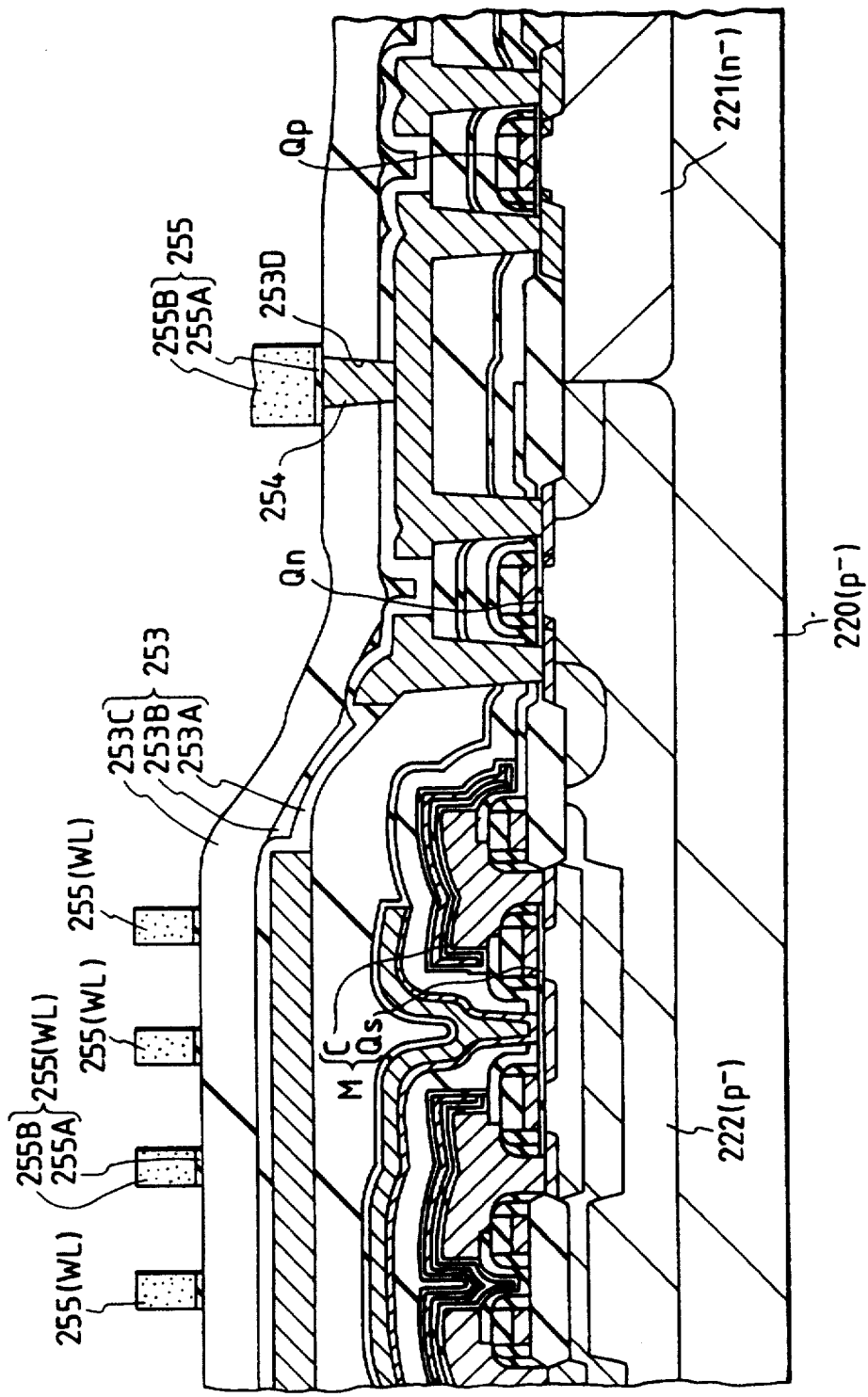

Next, as shown in FIG. 66, lines 255 (incl. shunting word lines) are formed on the inter-layer insulating film 253 for connection with the transition metal film 254 embedded in the connection hole 253D. The lines 255 each have a two-layer structure formed by successive lamination of a transition metal nitride film (or a transition metal silicide film) 255A and an aluminum film (or an aluminum alloy film) 255B. For example, the transition metal nitride film 255A as the lower layer is a TiN film formed at a thickness of 130 to 180 nm by deposition according to a sputtering method. The transition metal nitride film 255A is formed to prevent a precipitating phenomenon of silicon and also prevent an alloying reaction of tungsten and aluminum. For example, the aluminum alloy film 255B as the upper layer is formed at a thickness of 600 to 800 nm by deposition according to a sputtering method. The lines 255 can be formed by patterning into a predetermined shape, for example by means of anisotropic etching, after successive lamination of the lower transition metal silicide film 255A and the upper aluminum alloy film 255B.

Passivation Film Forming Process

Next, as shown in FIG. 21, a passivation film 256 is formed throughout the whole substrate surface including the upper surfaces of the lines 255. As previously noted, the passivation film 256 is a composite film formed by successive lamination of a silicon oxide film 256A and a silicon nitride film 256B. The silicon oxide film 256A as the lower layer is formed by deposition according to a C-CVD method using tetraethoxysilane gas as a source gas, while the silicon nitride film 256B as the upper layer is formed by deposition according to a plasma CVD method.

Though not shown in FIG. 21, a resin film is applied to the upper surface of the passivation film 256. For example, this resin film, which is for improving an α-ray soft error withstand pressure, is a polyimide resin film formed at a thickness of 8 to 12 μm by application according to a potting technique (incl. a resin dropwise application process, a baking process and a patterning process). The resin film is basically applied throughout the whole surface of the DRAM 201 except the positions corresponding to external terminals in which opening are formed. The resin film may be divided into plural portions on the surface of the DRAM 201. That is, the resin film is formed in the regions of the DRAM 201 where an α-ray soft error withstand pressure is to be ensured, such as, for example, the memory cell array 211E and part of the direct peripheral circuitry, not disposed in the indirect peripheral circuitry and the other portion of the direct peripheral circuitry, and the regions in question are used as divided regions.

Thus, by dividing the resin film, it is possible to diminish the stress of the resin film and prevent cracking of the passivation film.

Embodiment 3

In this embodiment, the ion implantation technique of the embodiment 1 is applied to the manufacture of a bipolar IC. As to annealing conditions, etc. after ion implantation, those set forth in the previous embodiment 2 are applicable as they are, so will not be repeated here. The upper surface temperature of wafer during ion implantation in a later-described ion implantation process is not specially limited if only it is within a common-sense range. But, the lower the wafer upper surface temperature, the easier the remedy of defects.

As a memory cell in a semiconductor integrated circuit device having bipolar transistor type memory there is known a pnp load type memory cell. This memory cell is constituted by a flip-flop circuit comprising two, information writing/reading npn-type bipolar transistor and pnp-type bipolar transistor for load.

The information writing/reading bipolar transistor comprises a collector region, a base region and an emitter region. The collector region mainly comprises an $n^-$-type epitaxial layer laminated onto a $p^-$-type semiconductor substrate and an $n^+$-type buried collector region. The base region is constituted by a p-type semiconductor region formed on a main surface portion of the epitaxial layer. The emitter region is constituted by an $n^+$-type semiconductor region formed on a main surface portion of the base region.

The bipolar transistor for load uses the base region of the information writing/reading bipolar transistor as a collector region and the collector region thereof as a base region. An emitter region of the bipolar transistor for load is constituted by a p-type semiconductor region formed in the same process as the process of forming the base region of the information writing/reading bipolar transistor.

In the memory cell thus constructed, the information writing/reading bipolar transistor and the bipolar transistor for load are surrounded with an element isolation region and thereby isolated electrically from the other regions. As to the semiconductor integrated circuit device having a bipolar transistor type memory, it is described, for example, in "Nikkei Electronics—Mar. 10, 1986 number, "Nikkei MacGraw-Hill, Inc., pp. 199–217.

In the above memory cell, holes flowing from the emitter region (p-type semiconductor region) of the bipolar transistor for load into the base region ($n^-$-type epitaxial layer) are stored as storage carrier. This storage carrier impedes an information inverting operation of the flip-flop circuit and deteriorates the information writing characteristic (decreases the speed of information writing operation). The storage carrier can be decreased by reducing the volume of the epitaxial layer (the base region of the bipolar transistor for load). More specifically, this is effected by stretching the collector region and the emitter region (p-type semiconductor region) of the bipolar transistor for load to a depth of contact with the $n^+$-type buried collector region.

However, the stretching of the collector and emitter regions of the bipolar transistor for load causes the problem of decreasing the integration density because it increases a planar area of the memory cell.

Further, the stretching of the said collector and emitter regions also stretches the base region of the npn-type bipolar transistor which constitutes a peripheral circuit, e.g. a decoder circuit or an input or output circuit. This stretching of the base region narrows the spacing between the base region and the buried collector region or causes the two to come into contact with each other. As a result, the collector-base capacitance of the bipolar transistor for peripheral circuit increases and hence the operating speed decreases.

According to this embodiment 3, in order to overcome the above-mentioned problems, in a semiconductor integrated circuit device having a bipolar transistor type memory the concentration of an n-type impurity at the upper end of a buried collector region of an information writing/reading bipolar transistor of a pnp or npn load type memory cell is made higher than that of a buried collector region of a bipolar transistor for peripheral circuit.

In this construction, the volume of epitaxial layer can be reduced by the n-type region implanted into the upper end of the buried collector region, so the storage carrier can be diminished to improve the information writing characteristic of the memory cell and both the collector and emitter regions of the bipolar transistor for load can be made smaller to reduce the memory cell area. Consequently, it is possible to improve the integration density.

Further, since it is possible to decrease the flow-up quantity of the buried collector region of the bipolar transistor for peripheral circuit and reduce the collector-base capacitance, it is possible to attain the speed-up of operation of the peripheral circuit.

The construction of this embodiment 3 will be described below in more detail. In all the drawings, the portions having the same functions are indicated by the same reference numerals, and repeated explanations thereof will be omitted.

Figure 67:
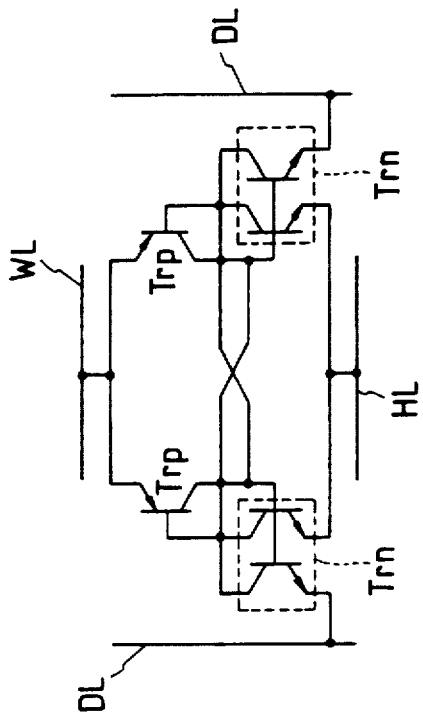
FIG. 67 is an equivalent circuit diagram of a memory cell in a bipolar transistor type memory, showing a method for producing a semiconductor integrated circuit device according to an embodiment 3 of the present invention.

The memory cell of the bipolar transistor type memory mounted on the semiconductor integrated circuit device of this embodiment 3 is as illustrated in FIG. 67 (an equivalent circuit diagram).

As shown in FIG. 67, the pnp load type memory cell is provided in an intersecting portion of complementary digit lines DL extending in the row direction and word line WL, data holding line HL both extending in the column direction. The pnp load type memory cell is constituted by a flip-flop circuit comprising two pnp-type bipolar transistors for load and four information writing/reading npn-type bipolar transistors Trn.

Figure 68:
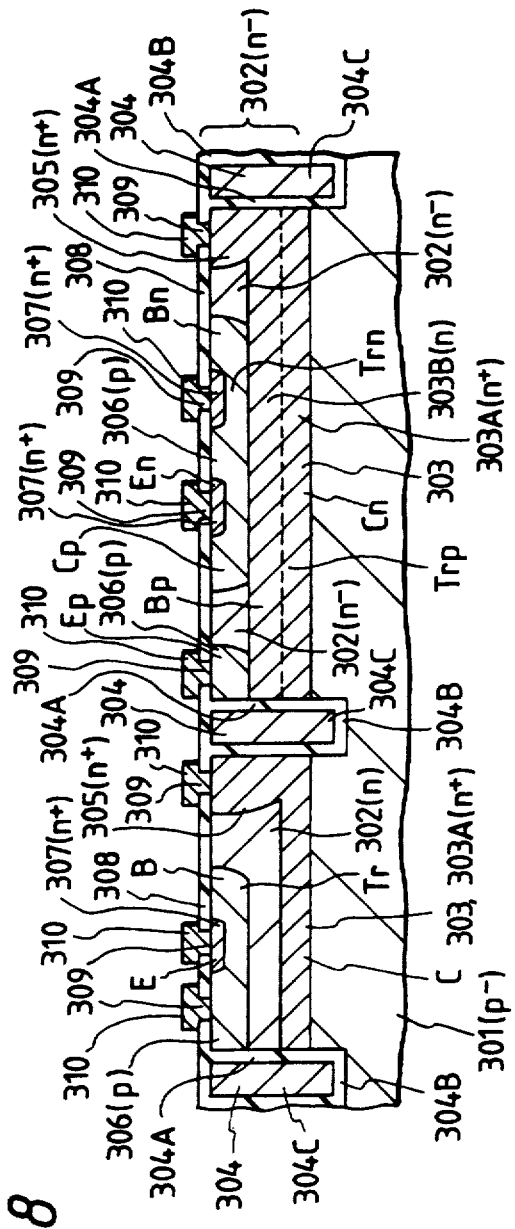
FIG. 68 is a sectional view of a principal portion, showing a concrete construction of the memory cell and peripheral circuit components in the semiconductor integrated circuit device.

FIG. 68 is a sectional view showing principal portions of the memory cell and peripheral circuit elements.

As shown in FIG. 68, an $n^-$-type epitaxial layer 302 is laminated onto a $p^-$-type semiconductor substrate 301.

An element isolation region 304 is provided in the main surface portion of the epitaxial layer 302 between bipolar transistor forming regions which constitute peripheral circuit elements. The element isolation region 304 comprises a trench 304A, an insulating film 304B and a buried member 304C.

The trench 304A surrounds the memory cell comprising the information writing/reading bipolar transistors Trn and the bipolar transistors Trp for load, and defines the region thereof. Also, the trench 304A surrounds the npn-type bipolar transistor Tr for peripheral circuit and defines the region thereof. Further, the trench 304A is formed in U shape, the bottom of which reaches the semiconductor substrate 301.

The insulating film 304B is, for example, a silicon oxide film, a silicon nitride film, or a composite film thereof, formed along a silicon surface of the semiconductor substrate 301 exposed into the trench 304A.

The buried member 304C is buried in the trench 304A through the insulating film 304B. For example, the buried member 304C is formed using a polycrystalline silicon which is equal in thermal expansion coefficient to the semiconductor substrate 301 and the epitaxial layer 302. The buried member 304C may be formed by an insulating film.

Each information writing/reading (npn-type) bipolar transistor Trn of the pnp load type memory cell comprises a collector region Cn, a base region Bn and an emitter region En, as shown on the right-hand side in FIG. 68.

Figure 70:
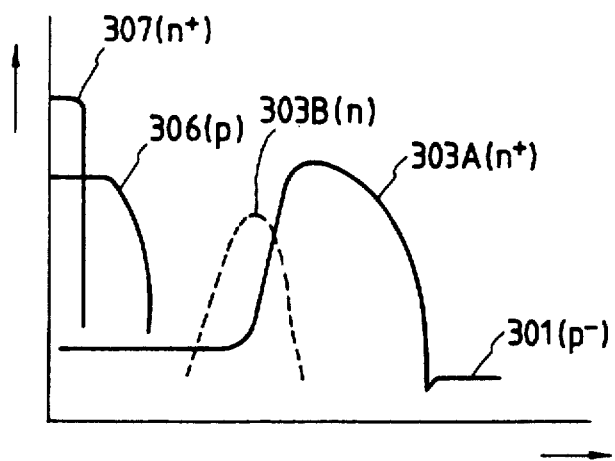
FIG. 70 is an impurity concentration profile diagram of the memory cell in the semiconductor integrated circuit device.

The collector region Cn comprises a buried collector region 303 which comprises an $n^+$-type semiconductor region 303A and an n-type semiconductor region 303B (a pedestal collector), a potential raising $n^+$-type semiconductor region 305 connected to the buried collector region 303 to raise the potential thereof, and the epitaxial layer 302. The $n^-$-type semiconductor region 303A of the buried collector region 303 is formed by an n-type impurity such as antimony (Sb), as shown in FIG. 70 (an impurity concentration profile diagram of the memory cell).

The n-type semiconductor region 303B is formed by such an n-type impurity as arsenic (As), phosphorus (P), or a combination thereof with antimony (Sb), which are lower in the diffusion rate than the above n-type impurity such as antimony (ion implantation process 10).

The buried collector region 303 having the above construction is formed by introducing the n-type impurity which forms the $n^+$-type semiconductor region 303A beforehand into the surface of the semiconductor substrate 301 and then laminating the epitaxial layer 302 thereto. In particular, since the diffusion rate of the n-type impurity in the epitaxial layer 302 is high, the n-type semiconductor region 303B can be made extremely small in the spacing thereof from the base region Bn (or Cp, Ep, p-type semiconductor region 306) or can be brought into contact therewith.

The base region Bn is constituted by a p-type semiconductor region 306 provided in the main surface portion of the epitaxial layer 302. The emitter region En is constituted by an $n^+$-type semiconductor region 307 provided in the main surface portion of the base region Bn.

The (pnp-type) bipolar transistor Trp comprises a collector region Cp, a base region Bp and an emitter region Ep. The collector region Cp is constituted by the base region Bn of the information writing/reading bipolar transistor Trn. The base region Bp is constituted by the collector region (buried collector region) 303 and the epitaxial layer 302. The emitter region Ep is formed in the same process as the process of forming the base region Bn and is constituted by the p-type semiconductor region 306 provided for the base region.

Electrodes 310 are connected to the semiconductor regions 305, 306 and 307, respectively. The electrodes 310 are each formed by an aluminum film and are connected to the semiconductor regions 305, 306 and 307 through connection holes 309 formed in the inter-layer insulating film 308.

In the information writing/reading (npn-type) bipolar transistor Trn, the kind and concentration of impurity of each of the semiconductor regions 305, 306 and 307 are as follows. Arsenic is implanted $10^{20}$ cm$^{-3}$ or so in the emitter region En (307), boron is implanted $10^{18}$ cm$^{-3}$ or so in the base region Bn (306), and antimony $10^{19}$ cm$^{-3}$ or so in the buried collector region 303. In the pedestal collector 303B is implanted a divalent (or trivalent) ion of phosphorus $5 \times 10^{12}$ cm$^{-2}$ with an implantation energy of 500 KeV or so. The volume concentration of the pedestal collector 303B is about $10^{17}$ cm$^{-3}$, and the implantation current is about 20 mA.

Thus, the buried collector region 303 of each information writing/reading bipolar transistor Trn of the pnp load type memory cell is constituted by both the semiconductor region 303A and the semiconductor region 303B formed by an n-type impurity whose diffusion rate is higher than that of the semiconductor region 303A. In this construction, the buried collector region 303 can be given a gentle tail region by the semiconductor region 303B, so that the volume of the epitaxial layer 302 can be reduced. This results in decrease in the number of holes flowing from the emitter region Ep of the bipolar transistor Trp for load into the base region Bp thereof, and the storage carrier can be diminished, so it is possible to facilitate the information inverting operation of the flip-flop circuit and improve the information writing characteristic (the speed of information writing operation). In the buried collector region 303, moreover, since the n-type impurity flows up in the region defined by the element isolation regions 304, it is possible to planarly reduce the collector region Cp (base region Bn) and the emitter region Ep. This planar reduction permits the reduction in area of the pnp load type memory cell and improvement of the integration density.

On the other hand, the bipolar transistor Tr for peripheral circuit used as a peripheral circuit such as, for example, a decoder circuit or an input or output circuit, comprises a collector region C, a base region B and an emitter region E, as shown on the left-hand side of FIG. 68. The collector region C is constituted by a buried collector region 303 which is formed by an n$^-$-type semiconductor region 303A. The base region b is constituted by a p-type semiconductor region 306, and the emitter region E is constituted by an n$^+$-type semiconductor region 307.

Figure 69:
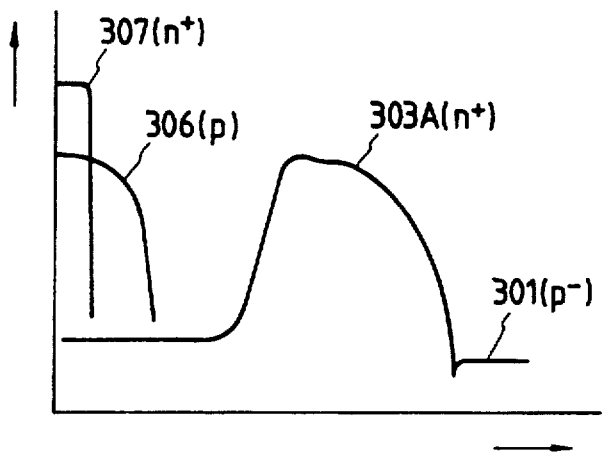
FIG. 69 is an impurity concentration profile diagram of the peripheral circuit components in the semiconductor integrated circuit device.

The buried collector region 303 is constituted by only a semiconductor region 303A which is formed by an n-type impurity, e.g. Sb, as shown in FIG. 69 (an impurity concentration profile diagram of peripheral circuit elements).

Thus, by constituting the buried collector region 303 of the bipolar transistor Tr for peripheral circuit using the semiconductor region 303A formed by an n-type impurity whose diffusion rate is low, it is possible to decrease the flow-up quantity of the buried collector region 303 and isolate the collector region C (buried collector region 303) and the base region B from each other to a sufficient extent, so it is possible to decrease the collector-base capacitance. This decrease of the collector-base capacitance permits speed-up of the operation of the bipolar transistor Tr for peripheral circuit.

That is, according to this embodiment 3, the base-side concentration of the buried collector region 303 (303A and 303B) of the information writing/reading bipolar transistor Trn is made higher than that of the collector region 303 (303A) of the bipolar transistor Tr for peripheral circuit, whereby not only the information writing characteristic is improved but also the integration density is improved and the speed-up of operation can be attained.

As to the above bipolar transistor type memory cell, an npn load type memory cell may be constituted by information writing/reading pnp-type bipolar transistors and npn-type bipolar transistors for load.

This embodiment 3 is applicable not only to a semiconductor integrated circuit device with only bipolar transistors mounted thereon but also to a semiconductor integrated circuit device with both bipolar transistors and complementary MISFETs (CMOSs) mounted thereon.

Embodiment 4

The drive-in diffusion technique which the present inventors have studied will be outlined below.

After base extraction electrodes connected by self-alignment to a p-type external base region of a bipolar transistor formed on the main surface of a semiconductor substrate is formed by a polycrystalline silicon film containing a p-type impurity, a p-type impurity is introduced into the main surface portion of the semiconductor substrate surrounded with the said base extraction electrodes to form a p-type intrinsic base region. Thereafter, an insulating film (silicon oxide film) for isolation is formed on the surface of the polycrystalline film of each base extraction electrode by a thermal oxidation method. Subsequently, a non-doped polycrystalline silicon film not containing an impurity for forming emitter extraction electrodes is deposited on the main surface portion of the p-type intrinsic base region surrounded with the base extraction electrodes. Then, an n-type impurity, e.g. arsenic, is introduced into the said non-doped polycrystalline silicon film, and a portion thereof thus introduced into the non-doped polycrystalline silicon film is diffused from the polycrystalline silicon film to the main surface of the p-type intrinsic base region by the drive-in diffusion technique using a heat treatment to form an n type emitter region. Once the emitter region is formed by such a method, there can be realized a shallow junction of 0.2 μm or so.

However, the present inventors found out the following problem during the development of a bipolar transistor by the foregoing SEPT. This problem will be explained below with reference to FIGS. 88 and 89.

Figure 88:
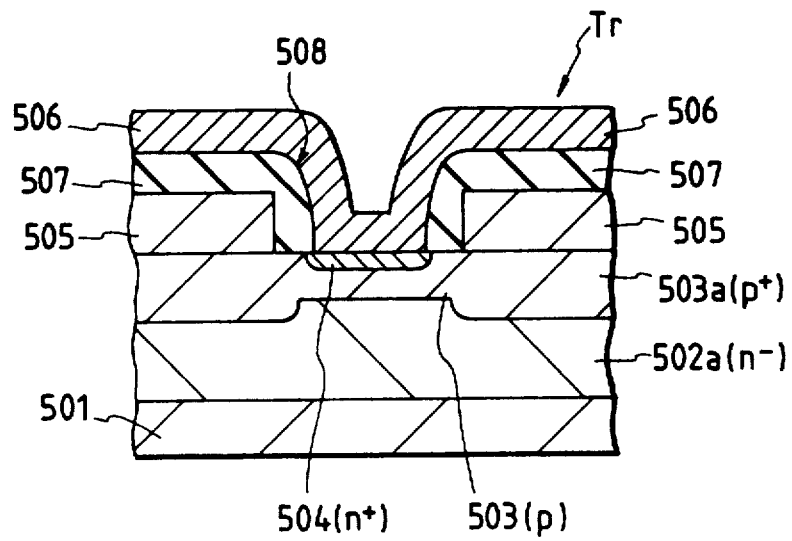
FIG. 88 is a partially enlarged sectional view of a bipolar transistor manufactured by the application of a drive-in diffusion technique which the present inventor has studied.
Figure 89:
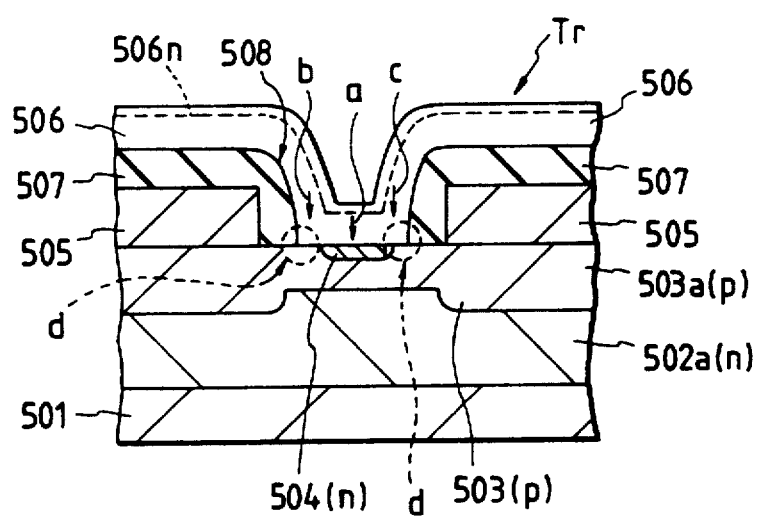
FIG. 89 is a partially enlarged sectional view showing a state wherein there occurred a defective emitter-base conduction in the bipolar transistor illustrated in FIG. 88.

In FIG. 88 there is shown a principal portion of a double polysilicon self-aligned bipolar transistor fabricated by the application of the foregoing drive-in diffusion technique. On the main surface of a semiconductor body comprising a p-type Si semiconductor substrate 501 and an n$^-$-type epitaxial layer (an n$^-$-type collector region) 502a formed thereon there is formed a bipolar transistor Tr having a p-type intrinsic base region 503 and an n-type emitter region 504. A p$^+$-type external base region 503a is formed in a surrounding relation to the intrinsic base region 503, and base extraction electrodes 505 formed by a polycrystalline silicon film with p-type impurity introduced therein are provided on the external base region 503a. The base extraction electrodes 505 are electrically connected to the external base region 503. On each of the base extraction electrodes 505 and side portions thereof there is provided an insulating film 507 for electrical isolation between emitter extraction electrodes 506 formed by a polycrystalline silicon film with an n-type impurity introduced therein and the base extraction electrodes 505. The emitter extraction electrodes 506 are electrically connected to the n-type emitter region 504 through an emitter opening (contact hole) 508.

As a result of our study about a process of forming a polycrystalline silicon film in the emitter opening (contact hole) 508 for forming the emitter extraction electrodes 506 in realizing the above double polysilicon structure, the following fact became clear. The polycrystalline silicon film for forming the emitter extraction electrodes 506 is deposited following a stepped shape of the emitter opening 508. Since the polycrystalline silicon film 506 is deposited by a CVD methods, it is formed at a substantially uniform thickness on both flat and stepped portions. However, the thickness of the thus-formed polycrystalline silicon film 506 in the direction perpendicular to the main surface of the semiconductor body is larger at the peripheral edge portion (stepped portion) of the emitter opening 508 than at the central flat portion of the same opening. As a result, in the case where an n-type impurity (As) is introduced into the polycrystalline silicon film 506 by ion implantation, as indicated by a broken line in FIG. 89, a peak position of the concentration of the n-type impurity (As) 506n introduced into the polycrystalline silicon film at the peripheral portion of the emitter opening 508 is isolated from the main surface of the semiconductor body in comparison with a peak position at the central flat portion of the emitter opening.

Consequently, in the case where heat treatment is applied for drive-in diffusion after ion implantation of the n-type impurity 506n, the diffusion paths of the n-type impurity (As) 506n diffused from the peripheral stepped portions to the main surface portion of the p-type base region 503 are longer than that of the n-type impurity (As) 506n diffused from the central flat portion of the polycrystalline silicon film of the emitter extraction electrodes 506 to the main surface portion of the p-type base region 503. More specifically, as is apparent from FIG. 89, the diffusion paths b and c of the n-type impurity 506n introduced into the polycrystalline silicon film of the peripheral portion of the emitter opening 508 is longer than the diffusion path a of the n-type impurity 506n introduced into the polycrystalline silicon film of the central portion of the same opening. In this case, if a shallow emitter junction is to be formed, the n-type impurity (As) 506n will not be diffused up to the outer periphery of the emitter opening 508 in the main surface portion of the p-type base region 503. Even if the n-type impurity (As) 506n is diffused to the main surface portion of the p-type base region 503, it will be impossible to obtain an impurity concentration sufficient to invert the conductivity type of the p-type base region 503. Consequently, even if the n-type emitter region 504 is formed in the region defined by the emitter opening 508, the p-type base region 503 is present around the emitter region 504 just under the emitter opening 508, so that the emitter extraction electrodes 506 and the p-type base region 503 are short-circuited in regions d shown in FIG. 89. This short-circuit reduces the yield in the manufacture of the semiconductor integrated circuit device and deteriorates the electrical reliability thereof. Particularly, such a problem becomes more and more conspicuous as the integration density of the device becomes higher.

For example, in a semiconductor integrated circuit device having a contact hole 0.8 μm or less in size and 0.3 μm or more in the difference height, it is difficult for the drive-in diffusion technique to stably form a semiconductor region 0.2 μm or less in junction depth on the main surface portion of the semiconductor body just under the said contact hole.

The short-circuit between the emitter extraction electrodes 506 and the p-type base region 503 can be prevented by raising the heat treatment temperature and lengthening the heat treatment time to thereby lengthen the diffusion distance of the n-type impurity for the formation of an emitter region in the drive-in diffusion technique. However, if heat treatment is performed at a high temperature for a long time, the emitter junction thereby formed will be deep, so that the high frequency characteristic of a bipolar transistor or the attainment of a high integration density thereof will be impeded.

Further, the present inventors have made studies about using the foregoing pre-amorphousizing technique in place of the above drive-in diffusion technique for forming the emitter region of the double polysilicon self-aligned transistor. More particularly we have developed a process wherein the main surface of the p-type base region 503 is rendered amorphous prior to the formation of a polycrystalline silicon film serving as the emitter extraction electrodes 506, and thereafter the n-type impurity for forming the emitter region 504 is introduced by ion implantation.

Even according to such pre-amorphousizing technique it is necessary to perform a heat treatment at a high temperature for a long time in order to remedy crystal defects, etc., so it has been difficult to form an emitter region having a shallow junction and with little leak current.

Typical inventions out of those disclosed in this embodiment will be outlined below.

A typical semiconductor integrated circuit device according to the present invention is characterized by having a semiconductor region (impurity doped layer) formed by ion implantation of a predetermined impurity which is performed while maintaining the temperature of the semiconductor body main surface at 20° C. or lower and a heat treatment which is conducted not higher than 95° C.

A typical semiconductor integrated circuit device manufacturing method is characterized by including a process of preparing a semiconductor substrate having a main surface, a process of cooling the main surface to a temperature of 20° C. or lower, a process of introducing a predetermined impurity into the main surface by ion implantation, and a process of applying a heat treatment to the thus-introduced impurity at a temperature of 950° C. or lower to form a semiconductor region in the main surface of the semiconductor substrate.

Desired effects can be attained by the above construction of the present invention. This is for the following reason.

Having made studies about the ion implantation technique which had been considered difficult to form a shallow junction of 0.2 μm or less, the present inventors found out the following.

The causes of crystal defects formed on the main surface of a semiconductor substrate at the time of ion implantation are broadly classified into two. According to one cause, accelerated impurity atoms destroy the crystal structure of the semiconductor substrate and the resulting defect is thermally diffused during ion implantation and spreads into the semiconductor substrate. According to the other cause, a contaminant element different from the above impurity atom is introduced into the semiconductor substrate during ion implantation and is thermally diffused.

Particularly, in the case where an amorphous layer is formed on the main surface of the semiconductor substrate by ion implantation, the former, i.e., the thermal diffusion of defect during ion implantation, induces a composite defect (hereinafter referred to sometimes as "transition region") in the interface between the above amorphous layer and a single crystal region formed just thereunder, and this composite defect causes residual defects near the junction of the semiconductor region after the application of a heat treatment for activating the semiconductor region (doped layer). As to the structure of this composite defect, the larger the width thereof, the more complicated the structure, and hence it is required to perform the heat treatment to a greater extent for the remedy of the composite defect.

Thus, it became clear for the first time by the study of the present inventors that the degree of the heat treatment after ion implantation does not depend on the depth of the amorphous layer formed by ion implantation but depends on the width of the aforementioned composite defect (transition region) formed at the time of ion implantation.

It also turned out that the contaminant element introduced into the substrate during ion implantation and diffused thermally, e.g. the gas (e.g. oxygen) from the photoresist used as a mask during ion implantation, as well as other contaminant substances such as gas impurities and metals, act as the nucleus of the composite defect caused by defects in ion implantation.

Figure 90A:
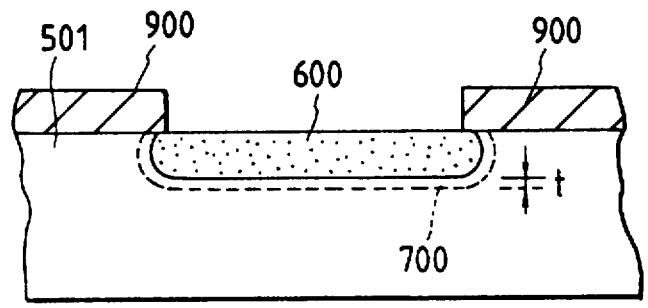
FIG. 90(A) is a partial sectional view of a semiconductor substrate, showing a state wherein a transition region was formed just after ion implantation.
Figure 90B:
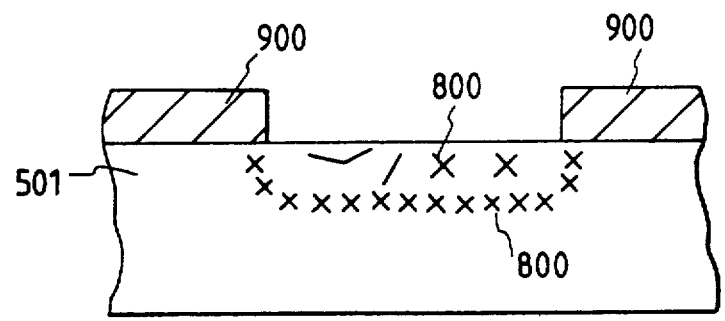
FIG. 90(B) is a partially sectional view of the semiconductor substrate, showing residual defects after heat treatment.

In the case where the temperature of the semiconductor substrate is high during ion implantation, as shown in FIG. 90(A), defects caused by accelerated impurity atoms (ions) are thermally diffused easily from the main surface of the semiconductor substrate 501 to the interior thereof to form a quasi-stable composite defect 700 at the interface between an amorphous layer 600 formed by ion implantation and a non-amorphous layer (single crystal region). In the same figure, the reference numeral 900 denotes an impurity introducing mask, e.g. SiO$_2$ film or photoresist. The higher the temperature of the semiconductor substrate 501, the larger the width t of the composite defect 700, and the larger the width t of the composite defect 700, the greater the degree of heat treatment required for eliminating the composite defect 700. FIG. 90(B) shows residual defects formed when the subsequent heat treatment was not performed to a satisfactory extent.

In the present invention, in view of the above point, the semiconductor substrate is cooled sufficiently, for example, to a temperature of 20° C. or lower at the time of ion implantation. By this cooling, the thermal diffusion of defects is prevented or suppressed, whereby the width of the composite defect formed at the amorphous layer—non-amorphous layer interface can be made small. It is also possible to suppress the introduction and thermal diffusion of a contaminant element into the semiconductor substrate.

As a result, the degree of the heat treatment required for eliminating the composite defect is reduced and the thermal diffusion of the ion-implanted impurity is diminished, so it becomes possible to form a semiconductor region having a shallow junction. According to the present invention, defects induced by ion implantation can be remedied easily by only a heat treatment using a temperature of around 600° C. which is considered to be a minimum level required for the recrystallization of the amorphous layer.

The embodiment 4 of the present invention will be described below in detail.

A semiconductor device (npn-type bipolar transistor Tr, p-channel MISFET Qp, n-channel MISFET Qn) is constituted on the main surface of a body semiconductor body formed by laminating an n$^-$-type epitaxial layer 402 onto the main surface of a p$^-$-type semiconductor 401 which is formed by single crystal silicon.

The npn-type bipolar transistor Tr comprises an n-type collector region, a p-type base region and an n-type emitter region, and the region thereof is defined mainly by the semiconductor substrate 401, insulating films 408 for element isolation, p-type channel stopper regions 407, p$^-$-type well regions 406 and p$^+$-type buried semiconductor regions 404. The transistor Tr is electrically isolated from other semiconductor elements.

The said collector region comprises an n$^+$-type buried semiconductor region (NBL) 403, an n$^-$-type well region 405, an n$^+$-type semiconductor region (collector extraction region) 409 and an n$^+$-type semiconductor region 417. To the n$^+$-type semiconductor region 417 is connected a collector line 426C through contact holes 425 formed in inter-layer insulating films 419 and 424. The line 426c is formed in the first-layer wiring process using, for example, aluminum film or an aluminum alloy film containing additives (Cu, Si).

The base region comprises p$^+$-type semiconductor regions (external base regions) 412 formed on the main surface of the well region 405 and a p-type semiconductor region (intrinsic base region) 422 formed on the said main surface. The emitter region is constituted by an n$^+$-semiconductor region 423. This n$^+$-type semiconductor region is formed through a low-temperature ion implantation of an n-type impurity, e.g. arsenic, at a semiconductor body temperature of not higher than 20° C. and subsequent low-temperature heat treatment at 950° C. or lower. The emitter junction depth is not larger than 0.2 μm. To the p$^+$-type semiconductor regions 412 are connected base extraction electrodes 411C through contact holes formed by removing insulating films (with no reference numeral affixed thereto) which correspond to gate insulating films 410 of MISFET Qn and Qp. The base extraction electrodes 411C are each a composite film comprising a polycrystalline silicon film and a high melting metal silicide (WSi$_2$, MoSi$_2$, TaSi$_2$, TiSi$_2$) film formed thereon. In the above polycrystalline silicon film is incorporated a p-type impurity, e.g. boron, for reducing the resistance value.

To the n$^+$-type semiconductor region 423 is connected an emitter line 426E through an emitter extraction electrode 421. For example, the emitter extraction electrode 421 is formed by a polycrystalline silicon film with an n-type impurity incorporated therein, and it is electrically connected to the n$^+$-type semiconductor region 423 through a contact hole 420 formed in the inter-layer insulating film 419 and further through a contact hole defined by side wall spacers 416 which are formed on side walls of the base extraction electrodes 411C. The emitter line 426E is connected to an emitter extraction electrode 421 through a contact hole 425 formed in the inter-layer insulating film 424. The emitter extraction electrode 421 is formed in the second-layer polycrystalline silicon film forming process, while the emitter line 426E is formed in the same fabrication process as that of the collector line 426C.

The region of n-channel MISFET Qn is defined mainly by insulating films 408 for element isolation and p-type channel stopper regions 407 and is electrically isolated from the other semiconductor elements. The MISFET Qn, which is formed on the main surface of a p$^-$-type well region 406, comprises a gate insulating film 410, a gate electrode 411A, a pair of n-type semiconductor regions 414 of a low concentration and a pair of n$^+$-type semiconductor regions 417 of a high concentration, each serving as a source or drain region.

The well region 406 has an impurity concentration of, say, $10^{16}$ to $10^{17}$ atoms/cm$^2$, and below the well region 406 is provided a p$^+$-type buried semiconductor region 404 for reducing the resistance value of the well region. As the gate insulating film 410 there is used a silicon oxide film formed at a thickness of about 200Å, for example by oxidizing the main surface of the well region 406. The gate electrode 411A is constituted by a composite film comprising the same conductor film as that of the base extraction electrodes 411C, i.e., the polycrystalline silicon film, and a high melting metal silicide film formed thereon. An n-type impurity is introduced into the polycrystalline silicon film of the gate electrode 411A. The n-type semiconductor regions 414 are adjacent to the channel forming region sides of the n$^+$-type semiconductor regions 417. To the semiconductor regions 417 each serving as a source or drain region of the MISFET Qn are connected lines 426n through contact holes 425 formed in inter-layer insulating films 419 and 424. The lines 426n are each constituted by a conductor film formed in the same fabrication step as that of the foregoing collector line 426C and emitter line 426E.

The region of p-channel MISFET Qp is defined mainly by insulating films 408 for element isolation and is electrically isolated from the other semiconductor elements. The p channel MISFET Qp, which is formed on the main surface of an n$^-$-type well region 405, comprises a gate insulating film 410, a gate electrode 411B, a pair of p-type semiconductor regions 415 of a low concentration and a pair of p+-type semiconductor regions 418 of a high concentration, each serving as a source or drain region. The well region 405 has an impurity concentration of, say, $10^{15}$ to $10^{17}$ atoms/cm$^2$ and constitutes a channel forming region of the MISFET Qp. Below the well region 405 is formed an n+-type buried semiconductor region 403 for reducing the resistance value of the well region. The gate insulating film 410 is formed in the same fabrication process as that of the gate insulating film 410 of the MISFET Qn. The gate electrode 411B is constituted by a composite film comprising the same conductor film as that of the foregoing base extraction electrodes 411C and gate electrode 411A, i.e., the polycrystalline silicon film, and a high melting metal silicide film formed thereon. Into the polycrystalline silicon film of the gate electrode 411B is introduced an electroconductive p-type impurity different from the impurity introduced into the polycrystalline silicon film of the gate electrode 411A. The p-type semiconductor regions 415, like the foregoing n-type semiconductor region 414, is formed by self-alignment with respect to the gate electrode 411B. The p+-type semiconductor regions 418 are formed by self-alignment with respect to the gate electrode 411B through side wall spacers 416.

To the semiconductor regions 418, each serving as a source or drain region, are connected lines 426p through contact holes 425 formed in inter-layer insulating films 419 and 424.

Thus, according to the present invention, the emitter region of the double polysilicon self-aligned bipolar transistor is constituted by the n-type semiconductor region 423 formed through the ion implantation of an n-type impurity at a semiconductor body temperature of not higher than 20° C. and further through a low-temperature heat treatment at 950° C. or lower, without using the drive-in diffusion or preamorphousizing technique.

Therefore, it is possible to form an emitter region having a shallow junction and a having no or few crystal defects near the said junction, so it is possible to attain high integration density and high reliability of the bipolar portion of the bipolar CMOS.

Figure 72:
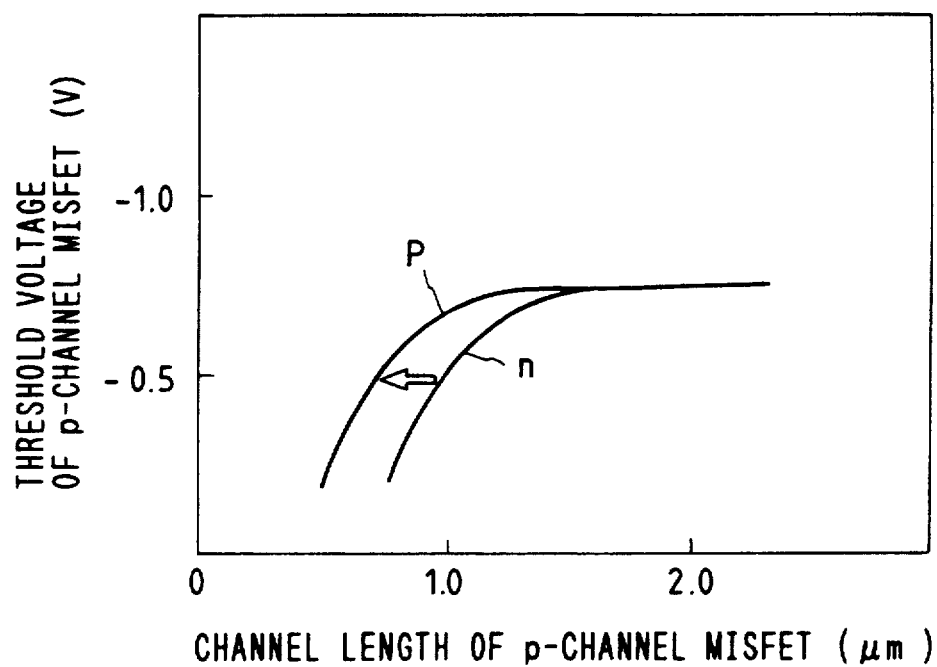
FIG. 72 is a graph showing a channel length—threshold voltage relation in a p-channel MISFET.

In the CMOS portion of the bipolar CMOS, the n-channel MISFET Qn of the CMOS is constituted by the n-type gate electrode 411A, and the p-channel MISFET Qp constituted by the p-type gate electrode 411B. An equation for determining a threshold voltage Vth of the MISFET will be given below. As is apparent from this equation, the amount Qc of a threshold voltage adjusting impurity to be introduced into the channel forming region (well region 405) can be changed by constituting the p-channel MISFET QP using the p-type gate electrode 411B.

$$Vth = \phi MS + 2\phi F - \frac{Q_{SS}}{C_{OX}} - \frac{Q_B}{C_{OX}} + \frac{Q_C}{C_{OX}} \quad (1)$$

where, $\phi MS$: work function between the semiconductor body and the gate electrode $\phi F$: Fermi level of the semiconductor body Qss: surface charge density Cox: capacitance of the gate insulating film $Q_B$: substrate charge $Q_c$: amount of impurity introduced into the channel forming region Thus, when the gate electrode 411B of the p-channel MISFET Qp is constituted by p-type, the work function (work function difference between the well region 405 and the gate electrode 411B with respect to the well region 405 side) $\phi$MS of the first term in the above equation is larger than that of the gate electrode constituted by n-type. More particularly, the work function $\phi$MS is $+1.1$ V in the case of the p-type gate electrode (WSi$_2$/polycrystalline silicon film) 411B. Further, it is $+0.9$ V in the case of a single layer of a p-type polycrystalline silicon film and is $+0.2$ V in the case of a single layer of a high melting metal silicide (WSi$_2$). In the case of an n-type polycrystalline silicon film, the work function $\phi$MS is approximately $-0.3$ V. Therefore, the amount Qc of a threshold voltage adjusting impurity introduced in the fifth term (Qc/Cox) of the foregoing equation (1) is smaller in the case where the p-channel MISFET Qp is constituted by the p-type gate electrode 411B, as compared with the case where the Qp is constituted by an n-type gate electrode. That is, in the p-channel MISFET Qp, the impurity concentration of the channel forming region (well region 405) can be increased, so a depletion region extending from the semiconductor regions 415 or 418 as source or drain regions to the channel forming region side can be made small. By reducing the extension of the depletion region it is made possible to prevent a short-channel effect of the p-channel MISFET Qp, as shown in FIG. 72 (a diagram illustrating a channel length—threshold voltage relation), so it is possible to reduce the channel length of the p-channel MISFET Qp and thereby reduce the occupied area thereof. As a result, it is possible to attain a high integration density of the bipolar CMOS.

Since the n-channel MISFET Qn is constituted by the n-type gate electrode 411A and is large in the work function $\phi$MS, so the amount Qc of a threshold voltage adjusting impurity introduced is small and eventually it is possible to prevent the short channel effect.

Now, a concrete fabrication method for the above bipolar CMOS will be described below briefly with reference to FIGS. 73 to 82 (sectional views of a principal portion of the bipolar CMOS, showing process by process).

Figure 73:
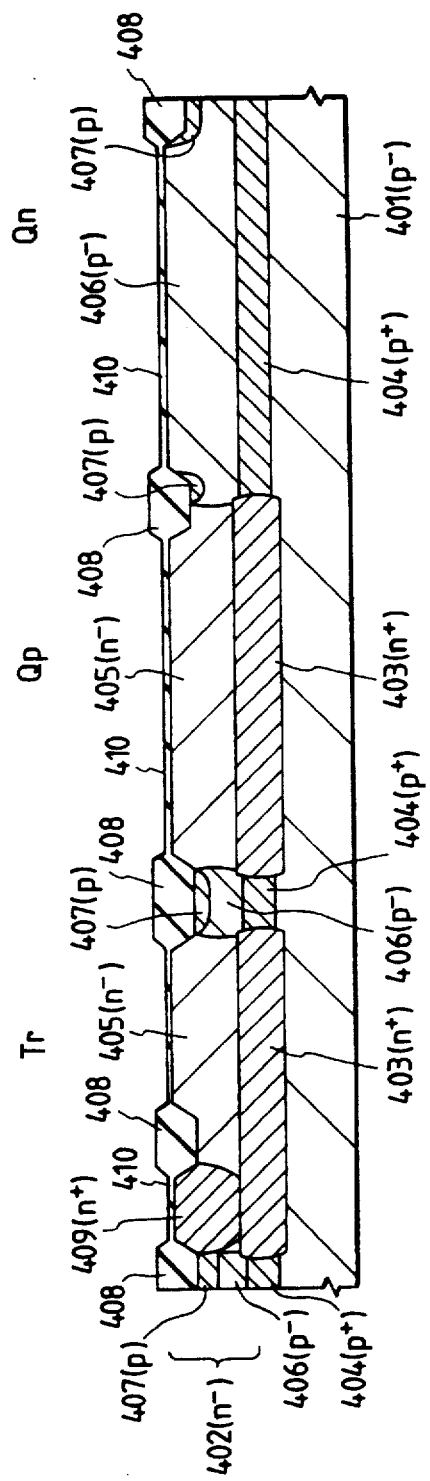
Figure 74:
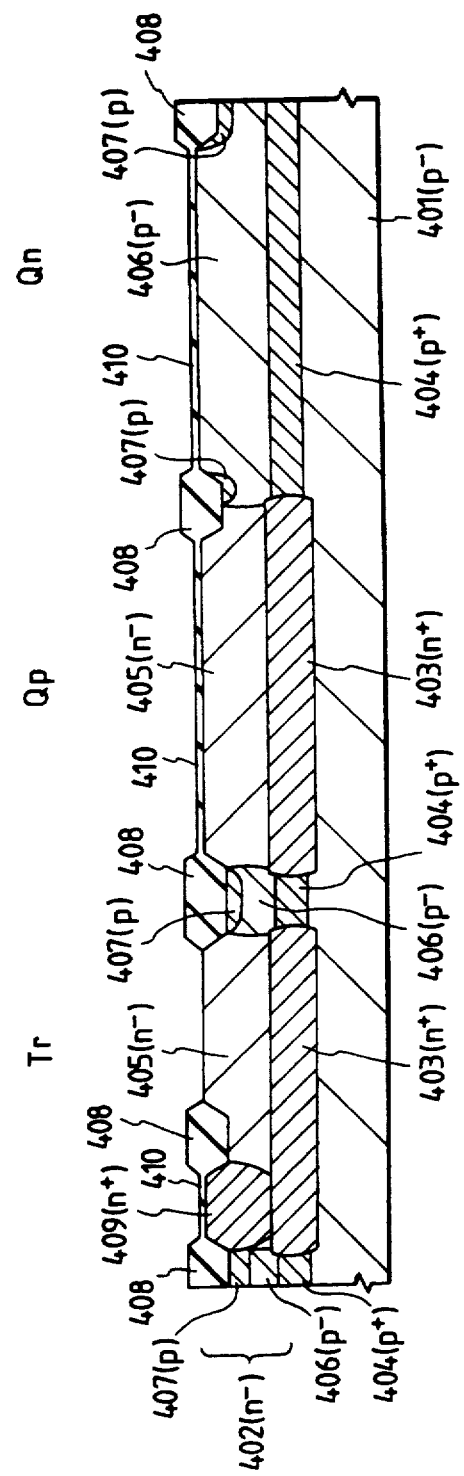

First, as shown in FIG. 73, an n-type impurity is introduced selectively into the main surface of a bipolar transistor Tr forming region and that of a p-channel MISFET Qp forming region in a p$^-$-type monocrystalline semiconductor substrate 401. Thereafter, a p-type impurity is introduced selectively into the main surface of an n-channel MISFET Qn forming region and that of an element isolation region in the semiconductor substrate 401.

Next, an n$^-$-type monocrystalline epitaxial layer 402 is allowed to grow on the main surface of the semiconductor substrate 401 by an epitaxial growth method. As a result, an n+-type buried semiconductor region 403 and a p+-type buried semiconductor region 404 are formed in a boundary portion between the semiconductor substrate 401 and the epitaxial layer 402.

Then, an n-type impurity is introduced into the main surfaces of the bipolar transistor Tr forming region and the p-channel MISFET Qp forming region in the epitaxial layer 402 to form n$^-$-type well regions 405. Thereafter, a p-type impurity is introduced into the main surfaces of the n-channel MISFET Qn forming region and the element isolation region in the epitaxial layer 402 to form p$^-$-type well regions 406.

Next, an insulating film (field insulating film) 408 for element isolation is formed on the main surface portion between semiconductor element forming regions in each of the well regions 405 and 406, for example by thermally oxidizing the main surface of the epitaxial layer 402. In each well region 406, a p-type channel stopper region 407 is formed on the main surface portion under the insulating film 408 for element isolation by thermal diffusion of a p-type impurity introduced into a desired region of the well region 406 in substantially the same fabrication process as the thermal oxidation process for forming the insulating film 408 for element isolation.

Then, a thin silicon oxide film (not shown) is formed on the main surface of each of the well regions 405 and 406. This silicon oxide film is formed for the purpose of diminishing heavy metal contamination and surface damages of the well regions 405 and 406, which are caused by the introduction of impurity.

Next, an n-type impurity is introduced selectively into the main surface portion where a collector extraction region of the bipolar transistor Tr is to be formed in the well region 405, to form an n+-type semiconductor region 409. For example, the semiconductor region 409 is formed by the ion implantation of the n-type impurity.

Then, a threshold voltage regulating impurity is introduced selectively into the main surface of the MISFET Qp forming region in the well region 405 and that of the MISFET Qn forming region in the well region 406. As this threshold voltage regulating impurity there is used a p-type impurity, e.g. boron, which is introduced into the main surfaces of the well regions 405 and 406 through a silicon oxide film (not shown) by ion implantation.

Next, a gate insulating film 410 is formed on the main surface of each of the well regions 405 and 406 other than the region of the insulating film 408 for element isolation. As the gate insulating film 410 there is used a silicon oxide film formed by oxidizing the main surfaces of the well regions 405 and 406.

Then, the gate insulating film 410 on the portion of the bipolar transistor Tr where base and emitter regions thereof are to be formed is removed selectively.

Next, a conductor film 411 is formed on the whole surface over the semiconductor body including the bipolar transistor Tr, n-channel MISFET Qn and p-channel MISFET Qp forming regions. The conductor film 411 is connected directly to the well region 405 in the portion of the bipolar transistor Tr where the base and emitter regions are formed and is formed on the gate insulating film 410 in the collector extraction region. On the other hand, in each of the MISFET Qn and Qp forming regions, the conductor film 411 is formed on the gate insulating film 410. The conductor film 411 forms a part of each of later-described base extraction electrodes 411C of the bipolar transistor Tr and gate electrodes 411A, 411B of the MISFET. As the conductor film 411 there is used a polycrystalline silicon film having no impurity incorporated therein or having a low impurity concentration, formed by a CVD method.

Next, an impurity introducing mask 417 is formed on the base and emitter forming regions of the bipolar transistor Tr and the gate electrode forming region of the p-channel MISFET Qp. As the mask 427 there is used a silicon oxide film formed by a CVD method for example.

Then, using the mask 427, an n-type impurity is introduced into the conductor film 411 exposed from the mask to form an n-type conductor film 411n, which constitutes an n-type gate electrode. The introduction of the n-type impurity into the conductor film 411 is performed by diffusion (or ion implantation). Thereafter, the mask 427 is removed.

Next, as shown in FIG. 77, an insulating film 428 is formed on the exposed surfaces of the conductor films 411 and 411n. The insulating film 428 is provided mainly for preventing heavy metal contamination caused by the introduction of impurity and it is a silicon oxide film formed by oxidizing the surfaces of the conductor films 411 and 411n.

Then, an impurity introducing mask 429 is formed on the insulating film 428 in the collector extraction region of the bipolar transistor Tr and the gate electrode forming region of the n-channel MISFET Qn For example, the mask 429 is formed by a photoresist film.

Next, using the mask 429, a p-type impurity is introduced into the conductor film 411 through the insulating film 428 exposed from the mask to form a p-type conductor film 411p. The p-type conductor film 411p forms a part of each of p-type gate electrode of the p-channel MISFET Qp and p-type extraction electrodes of the bipolar transistor Tr. The n-type conductor film 411n may be formed after the formation of the p-type conductor film 411p.

Then, the mask 429 and the insulating film 428 are removed successively. Thereafter, as shown in FIG. 78, a high melting metal silicide film 411m is formed on the conductor films 411n and 411p. For example, WSi$_2$ film formed by sputtering is used as the high melting metal silicide film 411m. Each boundary portion of the high melting metal silicide film 411m between the n-type conductor film 411n and the p-type conductor film 411p is removed because the impurities introduced into these films may be diffused and this diffusion is not desirable in point of characteristics.

Figure 79:
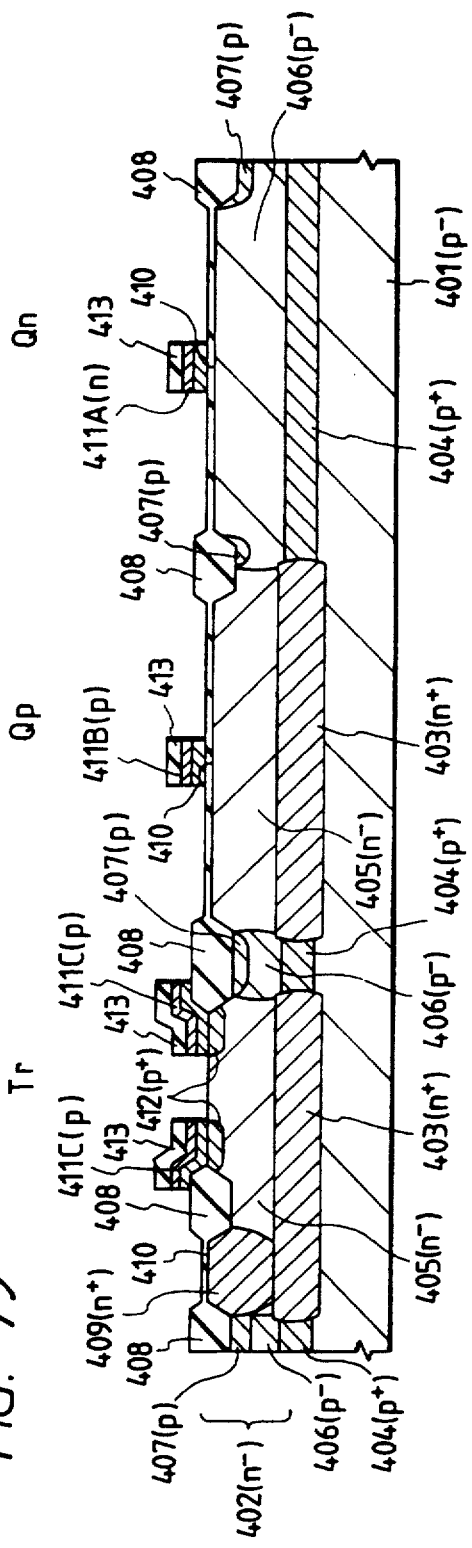

Next, an insulating film 413 is formed on the high melting metal silicide film 411m, as shown in FIG. 79. For example, a silicon oxide film formed by a CVD method is used as the insulating film 413.

Then, a predetermined patterning is applied to the insulating film 413, high melting metal silicide film 411m, n-type conductor film 411n and p-type conductor film 411p successively to form an n-type gate electrode 411A, a p-type gate electrode 411B and p-type base extraction electrodes 411C. For example, the said patterning is performed by an anisotropic etching such as REI (Reactive Ion Etching). The n-type gate electrode 411A constitutes a gate electrode of the n-channel MISFET Qn, while the p-type gate electrode 411B constitutes a gate electrode of the p-channel MISFET Qp. The p-type base extraction electrodes 411C constitute base extraction electrodes of the bipolar transistor Tr. In the p-type base extraction electrodes 411C, as shown in FIG. 79, the p-type impurity introduced into the polycrystalline silicon film is diffused self-alignmentwise to the well region 405 to form p+-type semiconductor regions 412 serving as external base regions.

Thus, in the bipolar CMOS, the conductor film 411 is formed throughout the whole surface of the substrate, then the n- and p-type conductor films 411n, 411p are formed by introducing n- and p-type impurities selectively into the conductor film 411, followed by the application of a predetermined patterning, whereby the n- and p-type gate electrodes 411A, 411B and the p-type base extraction electrodes 411C ca be formed in the same fabrication process using the same conductor film 411, so it is possible to decrease the number of fabrication processes. Particularly, in this embodiment, since the p-type gate electrode 411B and the p-type base extraction 411C can be formed in the same fabrication process, it is possible to decrease the number of fabrication processes for the bipolar CMOS; besides, as noted previously, it is possible to attain a high integration density of the bipolar CMOS by preventing the short channel effect of the p-channel MISFET Qp.

Next, an insulating film is formed on the exposed surfaces of the n- and p-type gate electrodes 411A, 411B, the p-type base extraction electrodes 411C and also on the exposed surfaces of the well regions 405, 406. This insulating film is useful in diminishing heavy metal contamination and damages caused by the introduction of impurities.

Figure 80:
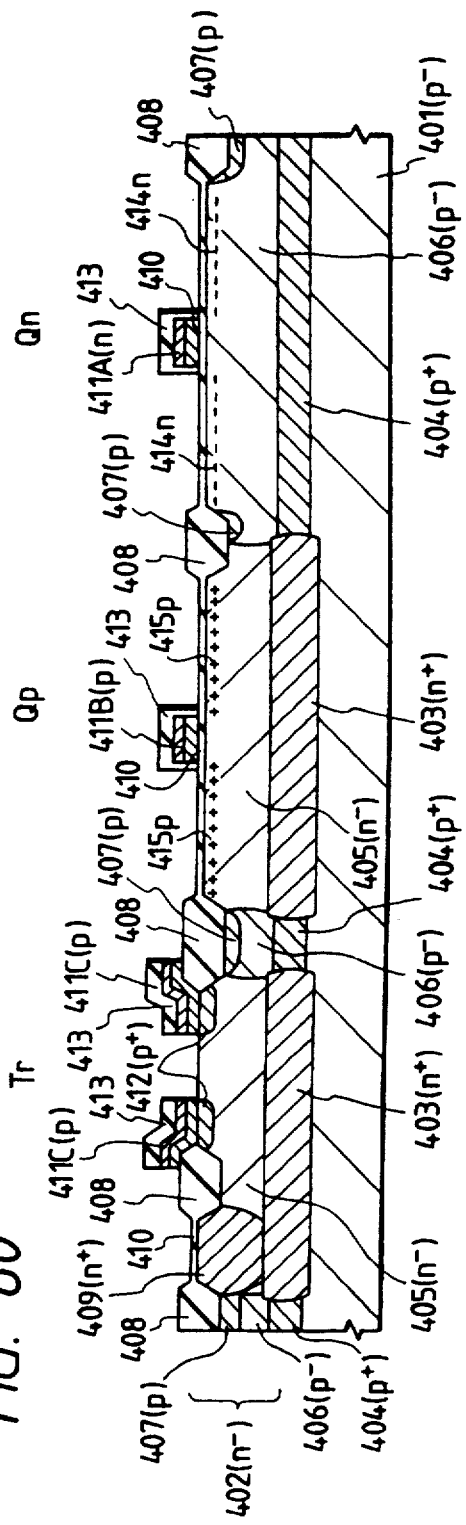

Then, as shown in FIG. 80, using mainly the gate electrode 411A as an impurity introducing mask, an n-type impurity 414n is introduced selectively into the main surface of the well region 406 in the n-channel MISFET Qn forming region by ion implantation. Thereafter, using mainly the gate electrode 411B as an impurity introducing mask, a p type impurity 415p is introduced into the main surface of the well region 405 in the p-channel MISFET Qp selectively also by ion implantation.

Figure 81:
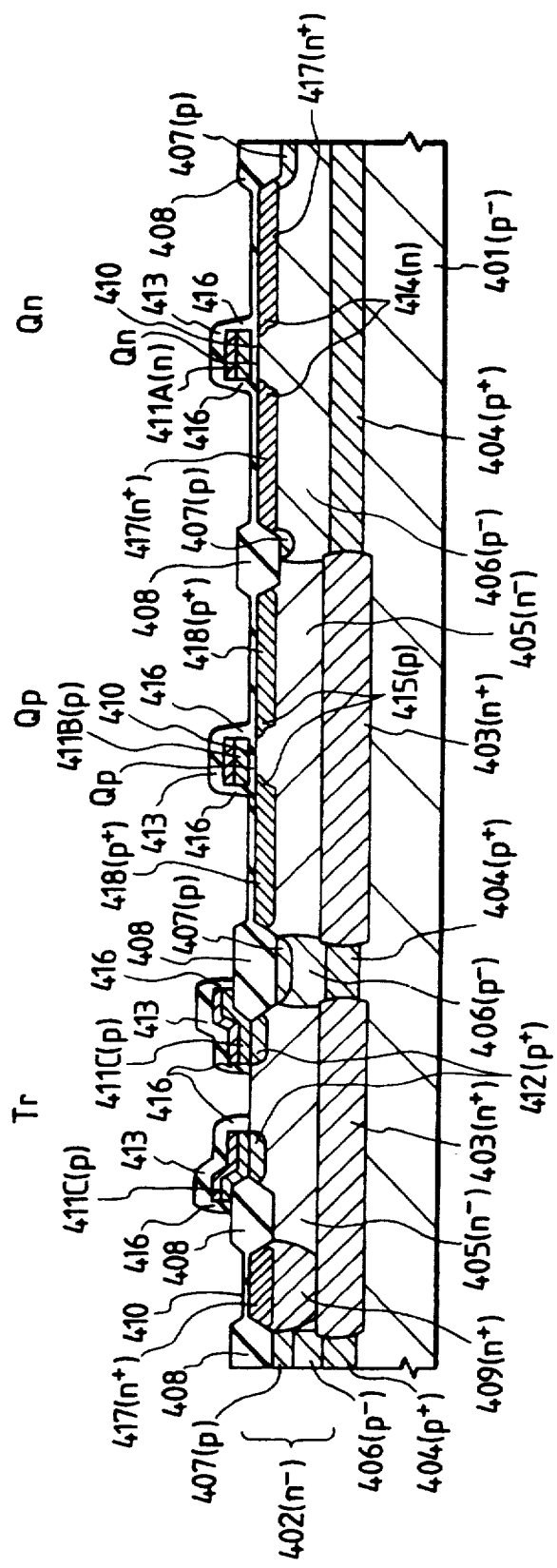

Next, as shown in FIG. 81, side wall spacers 416 are formed on the side walls of the n- and p-type gate electrodes 411A, 411b and the p-type base extraction electrodes 411C. The side wall spacers 416 are formed by depositing a silicon oxide film throughout the whole surface over the semiconductor body according to a CVD method and applying an anisotropic etching such as RIE to the said silicon oxide film.

Then, using mainly the side wall spacers 416 as impurity introducing masks, an n-type impurity is introduced into the main surface of the well region 406 in the n-channel MISFET Qn forming region. By the introduction of this n-type impurity and of the foregoing n-type impurity 414n there are formed n+-type semiconductor regions 417 and n-type semiconductor regions 414. Now, the n-channel MISFET Qn is almost completed. The n-type impurity which forms the semiconductor region 417 is introduced also into the collector extraction region (semiconductor region 409) selectively.

Next, using mainly the side wall spacers 416 as impurity introducing masks, a p-type impurity is introduced into the m in surface of the well region 405 in the p-channel MISFET Qp forming region. By the introduction of this p-type impurity and of the foregoing p-type impurity 415p there are formed p+-type semiconductor regions 418 and p-type semiconductor regions 415, as shown in FIG. 11. Now, the p-channel MISFET Qp is almost completed.

Figure 82:
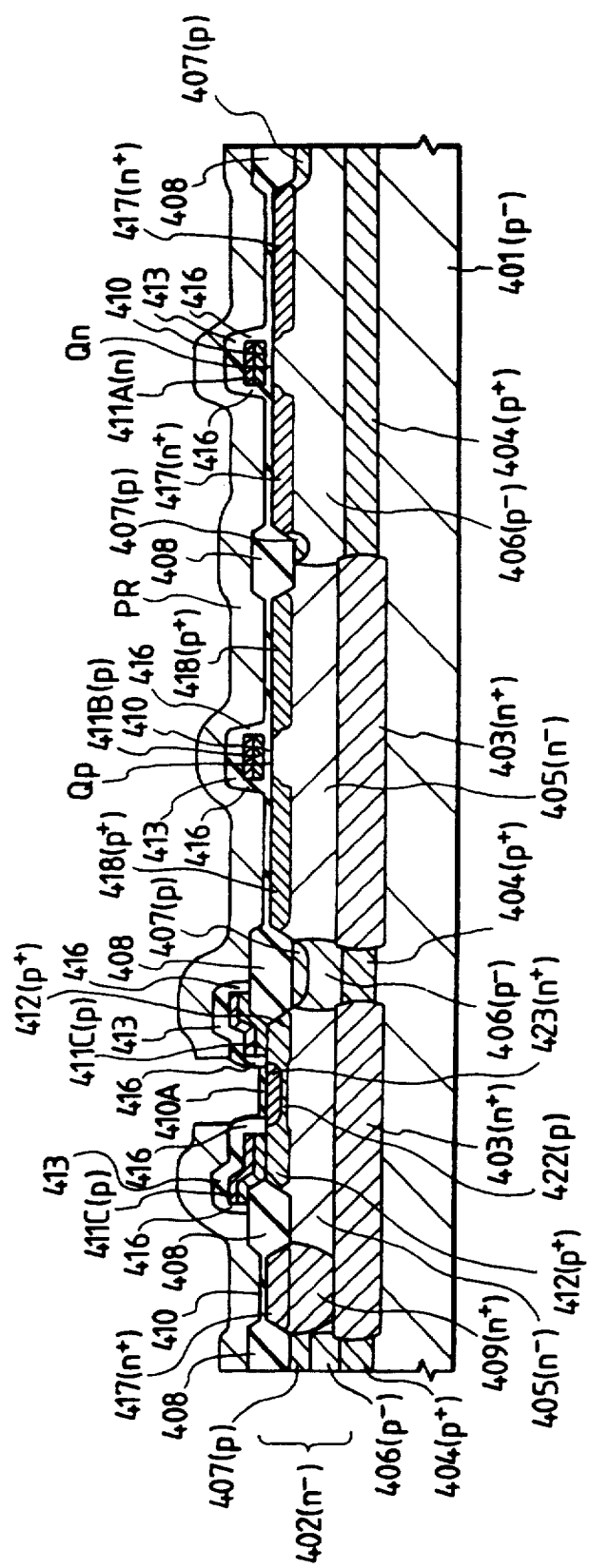

Then, as shown in FIG. 82, a thin silicon oxide film 410A is formed on the main surface of the n-type well region 405 defined by the base extraction electrodes 411C and the side wall spacers 416 formed on the side walls thereof. For example, the silicon oxide film 410A is formed by thermally oxidizing the main surface of the n-type well region 405.

Next, there is formed a photoresist film which covers the other portion than the region where the silicon oxide film 410A was formed, by the conventional photolithography and etching technique.

Then, using the above photoresist film and the side wall spacers 416 as impurity introducing masks, a p-type impurity, e.g. boron, is ion-implanted through the silicon oxide film 410A to form a p-type intrinsic base region on the main surface of the n-type well region 405. After the removal of the foregoing photoresist film, a heat treatment is applied to the p-type intrinsic base region 422, which is thereby connected to the p+-type external base regions 412.

Next, a photoresist film PR having the same pattern as that of the above photoresist film is formed on the semiconductor body using the conventional photolithography and etching technique.

Then, using the photoresist film PR and the side wall spacers 416 as impurity introducing masks, an n-type impurity, e.g. arsenic, is introduced by ion implantation through the silicon oxide film 410A to form an n+-type semiconductor region 423 which serves as an emitter region.

After the removal of the photoresist film, a heat treatment is applied to the n+-type semiconductor region 423 for the purpose of recrystallization of an amorphous layer formed by the above ion implantation and activation of the n+-type semiconductor region 423.

How to form the n+-type semiconductor region 423 is not specially limited. For example, arsenic is used as an n-type impurity and it is introduced by ion implantation under the conditions of acceleration energy 50 KeV, dose $5 \times 10^{15}$ atoms/cm$^2$ and semiconductor body temperature $-20°$ C., thereafter a heat treatment is applied to the semiconductor body at a temperature of 800° to 850° C. for 10 minutes or so, whereby an emitter junction having a depth of 0.1 to 0.15 μm or less is realized. Thereafter, the silicon oxide film 410A is removed.

Figure 83:
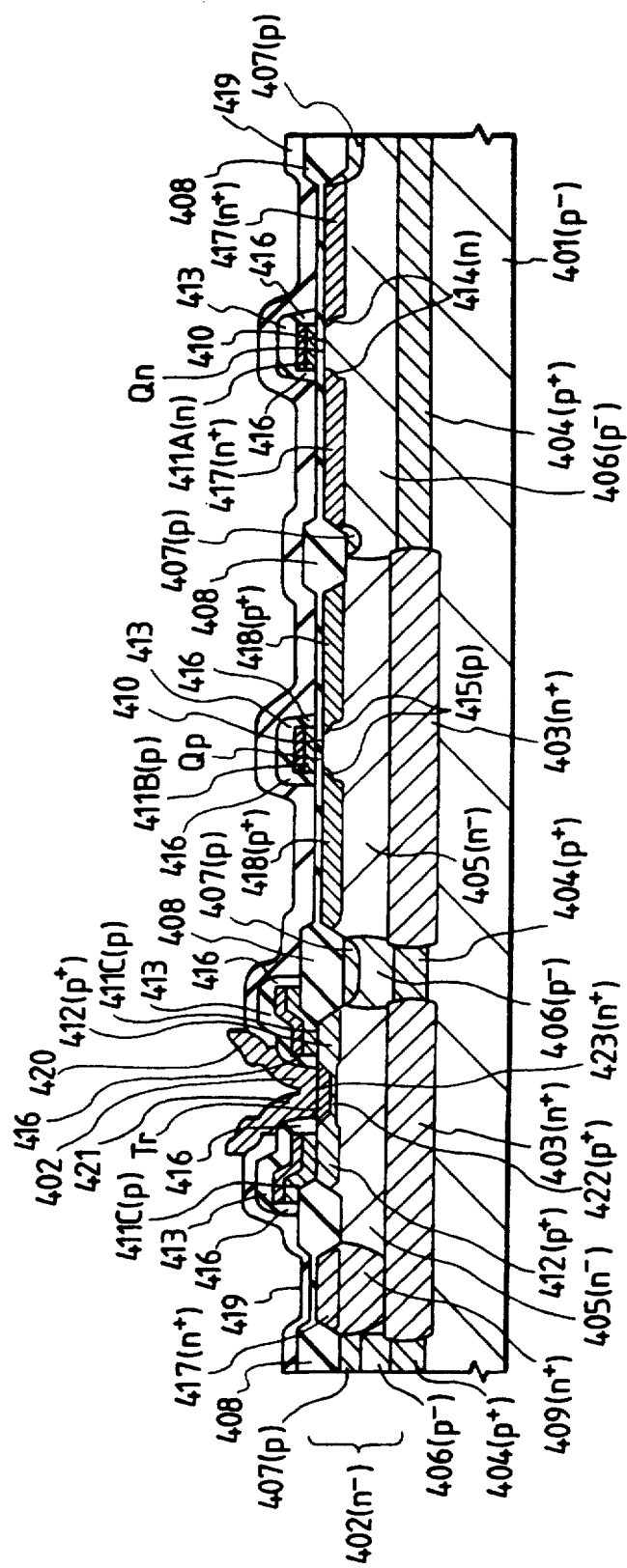

Next, as shown in FIG. 83, an inter-layer insulating film 419 is formed to cover the whole surface over the semiconductor body, and the emitter region forming portion of the bipolar transistor Tr is removed to form a contact hole 420.

Figure 71:
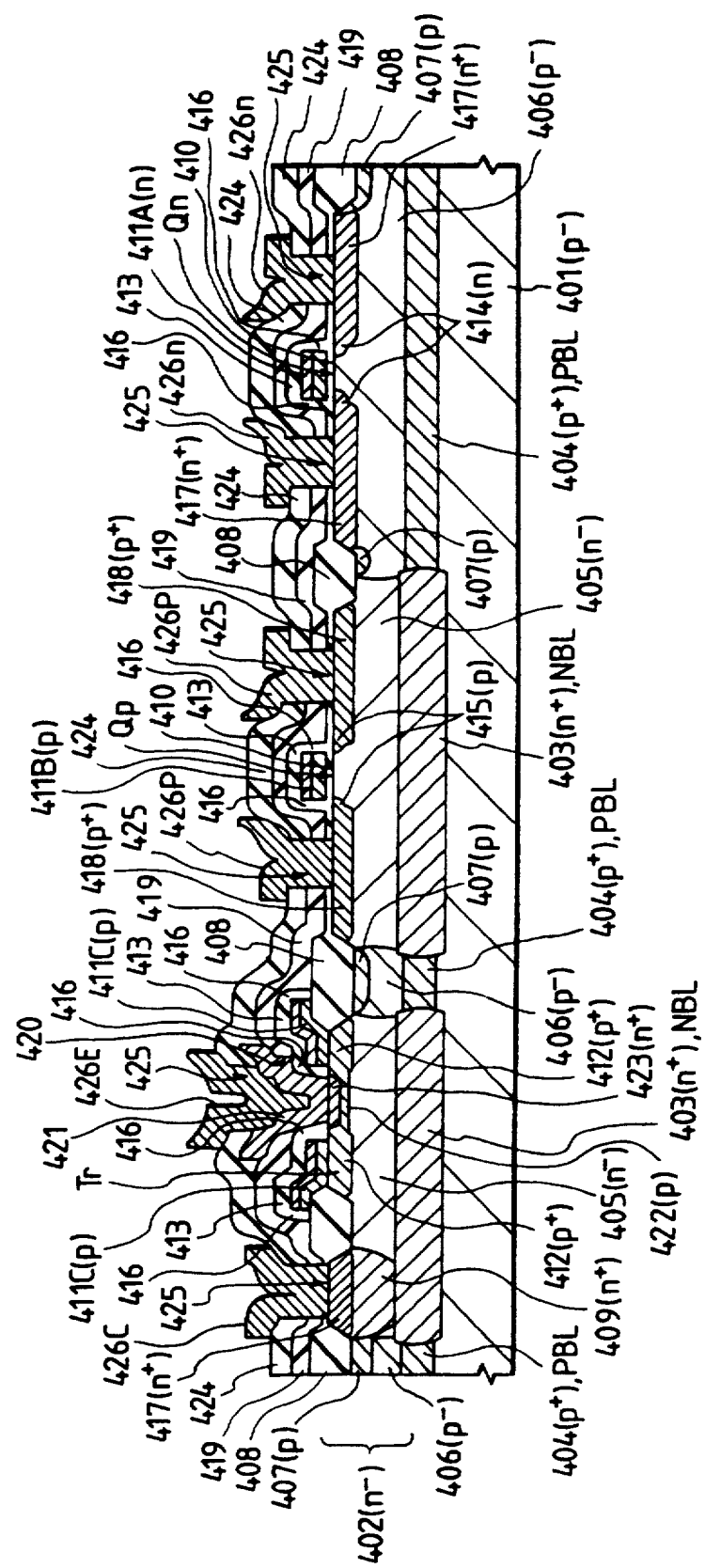
FIG. 71 is a sectional view of a principal portion of a semiconductor integrated circuit device according to an embodiment 4 of the present invention.

Then, an emitter extraction electrode 421 is formed in contact with the surface of the emitter region 423 through the contact hole 420. The emitter extraction electrode 421 is formed by a polycrystalline silicon film containing an n-type impurity which reduces the resistance value. Now, the npn-type bipolar transistor Tr is almost completed. Thereafter, as shown in FIG. 71, an inter-layer insulating film 424, contact holes 425, as well as lines 426E, 426C, 426P and 426n, are formed successively to complete the bipolar CMOS of this embodiment.

The reason why a semiconductor region having a junction depth of 0.2 μm or smaller can be formed by the foregoing low-temperature ion implantation and low-temperature heat treatment will be explained below in more detail on the basis of the results of tests conducted by the present inventors.

When a predetermined impurity is introduced by ion implantation under conditions in which an amorphous layer is formed on the main surface of a monocrystalline semiconductor body, residual crystal defects or dislocation after a heat treatment required for the recrystallization of the said amorphous layer is observed over a certain width at the interface (hereinafter referred to sometimes as "transition region") between the said amorphous layer and a single crystal region (hereinafter referred to sometimes as "non-amorphous layer") located just thereunder. In the following tests, therefore, taking note of the transition region formed at the amorphous layer/non-amorphous layer interface, a detailed analysis will be made about the correlation of the structure of crystal defects an dislocation observed just after ion implantation with residual defects after heat treatment.

In the following tests, five items were set as parameters of ion implantation, which are acceleration energy, dose, kind of ion, beam current in ion implantation, and the temperature of a semiconductor substrate (wafer) in ion implantation.

As a sample wafer there was used a wafer having a 4°-off plane direction from (100), and ion implantation was performed through a silicon oxide film (50Å or so) formed on the wafer by thermaly oxidation, unless otherwise noted.

I. First Test (1) Outline

In this test, a sample was prepared by preamorphousizing the silicon surface region in a contact hole and subsequent boron ion implantation with a low acceleration energy, using acceleration energy in silicon ion implantation and ion implantation dose as parameters, also prepared was a sample in the same way except that there was performed a subsequent heat treatment. With respect to these samples, a section analysis was conducted using a transmission electron microscope (hereinafter referred to simply as "TEN") to check both the dependence of defects on acceleration energy in ion implantation and the dependence of defects on ion implantation dose.

(2) Method a. Dependence of defects on acceleration energy in ion implantation

① A sample was prepared by the ion implantation of silicon into a sample wafer at different ion implantation acceleration energies of 30, 40 and 60 KeV and subsequent ion implantation of boron, and also there was prepared a sample in the same way except that there was conducted a subsequent heat treatment of 800° C. for 10 minutes.

Further, with respect to wafers which had been ion-implanted using silicon and boron ions under the same conditions as above, a heat treatment was applied to each of them at 950° C. for 25 minutes to obtain samples.

② Each sample was subjected to section analysis using a TEM.

b. Dependence of defects on ion implantation dose

Ion implantation of silicon and that of boron were performed at different ion implantation doses of $1 \times 10^{15}/cm^2$, $2 \times 10^{15}/cm^2$ and $5 \times 10^{15}/cm^2$ while other conditions were the same, followed by heat treatment, to obtain samples, which were then subjected to section analysis using a TEM.

(3) Results a. Dependence of defects on acceleration energy in ion implantation

There was observed a tendency to increase in the width of the amorphous layer with increase of the acceleration energy in ion implantation. At the same time, there was observed a tendency to increase in the width of the transition region formed at the amorphous/non-amorphous boundary.

Recrystallization of the amorphous layer was effected completely by the heat treatment at 800° C. for 10 minutes, but in all of the acceleration energy values there were observed residual defects in the transition region formed at the amorphous/non-amorphous boundary. Further, it was observed that the extent of residual defects in the wafer depth direction increased with increase of acceleration energy and that a complicated defect structure was present.

On the other hand, after the heat treatment at 950° C. for 25 minutes, no residual defects were observed at acceleration energy values of 30 and 40 KeV, but at a high acceleration energy of 60 KeV there were observed residual defects.

From the above results it turned out that the larger the ion implantation energy, the larger the width of the amorphous layer and that of the transition region and the greater the degree of heat treatment for eliminating defects.

b. Dependence of defects on ion implantation dose

Also when the ion implantation dose was changed like $1 \times 10^{15}/cm^2$, $2 \times 10^{15}/cm^2$ and $5 \times 10^{15}/cm^2$, there was observed the same tendency as above. More particularly, it was observed that with increase of dose, the width of the amorphous layer and that of the transition region became larger and that after the heat treatment at 950° C. for 25 minutes, there remained defects in the transition region only at the dose of $5 \times 10^{15}/cm^2$.

From the above results, it turned out that with increase of dose, the width of the amorphous layer and that of the transition region became larger and that the degree of heat treatment for eliminating defects increased.

II. Second Test (1) Outline

Ion-implanted samples were prepared under substantially the same acceleration energy, dose and other conditions while changing only the element for ion implantation, and also prepared were samples which had gone through subsequent heat treatment. These samples were subjected to section analysis using a TEM to check the dependence of defects on the element for ion implantation.

(2) Method

Using the same ion implanter, samples were prepared by introducing silicon, arsenic and antimony into separate wafers by ion implantation at an ion acceleration energy of 40 KeV and a dose of $2 \times 10^{15}/cm^2$, and also prepared were samples which had gone through subsequent heat treatment at 950° C. for 10 minutes.

Then, each sample was subjected to section analysis using a TEM.

The atomic weights of silicon, arsenic and antimony are 28, 75 and 122, respectively.

(3) Results

As to a defect structure formed just after ion implantation, there was observed a marked tendency to decrease in the depth of the amorphous layer and the width of the transition region with increase of the atomic weight. It was observed that the defect structure was more sharp when the element implanted was heavy.

In the samples which had gone through the heat treatment after the ion implantation, residual defects were observed in the transition region formed at the amorphous layer non-amorphous layer boundary only in the implantation of silicon ion having a relatively small atomic weight. In the use of arsenic and antimony there were observed no residual defects in the transition region.

From the above results it turned out that the larger the atomic weight of the element for ion implantation, the more sharp the damage distribution, and that therefore the transition region was narrow and a greater degree of heat treatment was required.

In the sample obtained by the ion implantation of antimony and subsequent heat treatment, there were observed fine residual defects in the amorphous layer. But this is probably caused by the precipitation of antimony because of a low solid-solubility of antimony into silicon.

Figure 84:
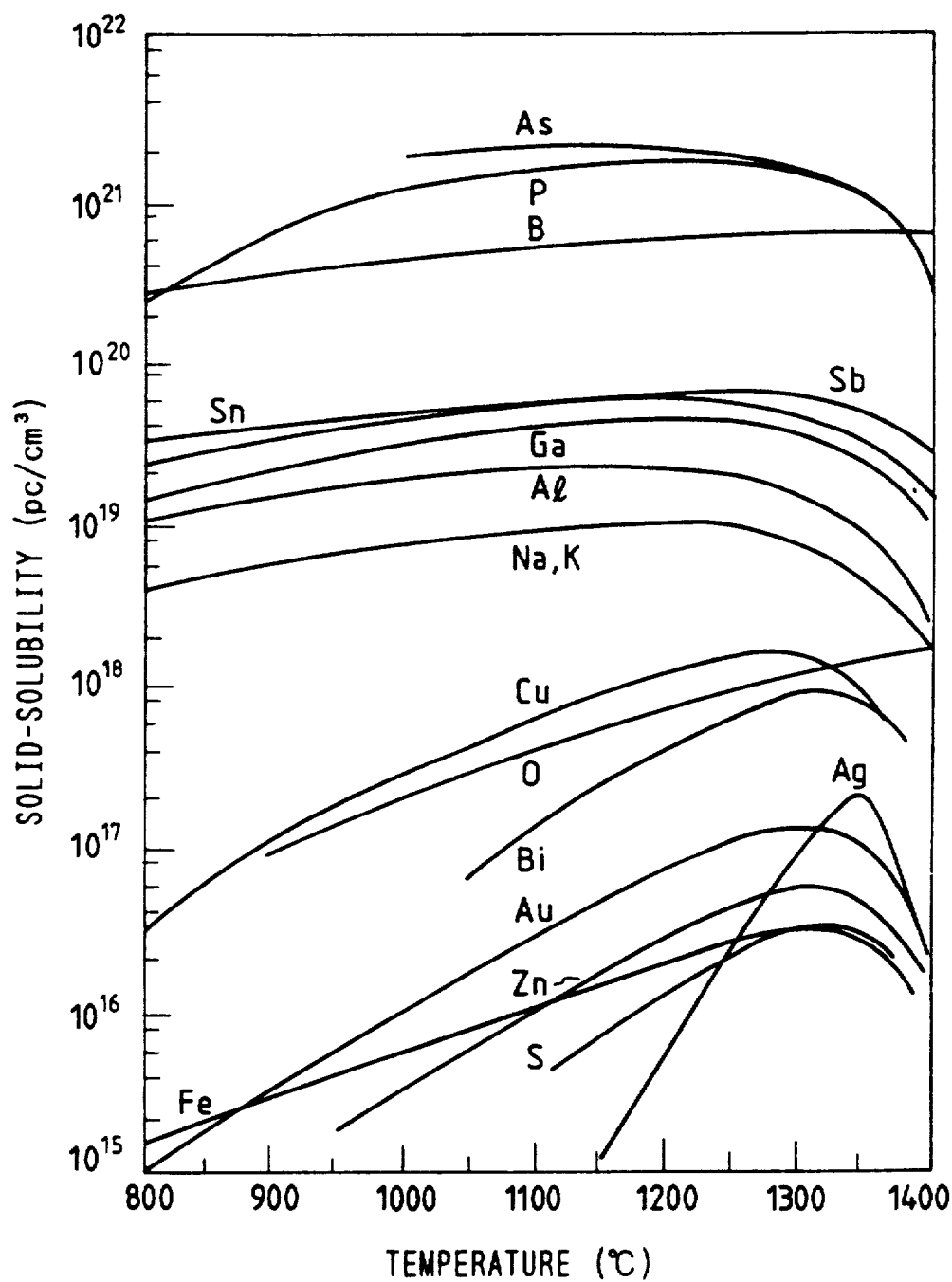
FIG. 84 is a graph showing a solid-solubility in Si of impurity elements.

Solid-solubilities of various impurity elements into silicon are as shown in FIG. 84.

III. Third Test (1) Outline

In this test, ion implantation was performed under the same ion acceleration energy, dose and other conditions, using three ion implanters different in characteristics, and then a comparison was made with respect to residual defects to check the effect of the beam current value and the rise of the wafer (semiconductor substrate) temperature in ion implantation on the defect structure of the transition region formed at the amorphous layer/non-amorphous layer interface.

(2) Method

As ion implanters there were used a predeposition machine (a product of Varian Co.; hereinafter referred to as the "first ion implanter"), a second ion implanter having substantially the same wafer temperature suppressing function in ion implantation as that of the first ion implanter and having a beam current value of several hundred $\mu A$ order which is about one tenth of that of the first ion implanter, and a third ion implanter which exhibits a weak temperature suppressing function in ion implantation and whereby the wafer temperature is increased as ion implantation proceeds.

The beam current values of the first, second and third ion implanters are at the ratio of 104 : 1.8 : 1, and the wafer temperatures in ion implantation using the first, second and third ion implanters are 60°, 80° and max. 300° C., respectively.

Using the first to third ion implanters, samples were prepared by the ion implantation of arsenic ion at an ion acceleration energy of 120 KeV and a dose of $5 \times 10^{15}/cm^2$, and also prepared were samples which had gone through subsequent heat treatment at 950° C. for 10 minutes. Then, each sample was subjected to section analysis using a TEM.

Results on the beam current dependence were obtained by comparison between the first and the second ion implanter with respect to defect structures, and results on the wafer temperature dependence were obtained by comparison between the second and the third ion implanter with respect to defect structures.

In this test, the thickness of a through silicon oxide film in ion implantation was set at 100Å.

(3) Results

First, as to the influence of the beam current value in ion implantation on defect structure, there was no significant difference between the depth of the amorphous layer and the width of the transition region.

On the other hand, as to the influence of the rise of the wafer temperature in ion implantation on defect structure, there was observed a marked tendency to decrease in the depth of the amorphous layer and increase in the width of the transition region with increase of the wafer temperature.

Figure 85:
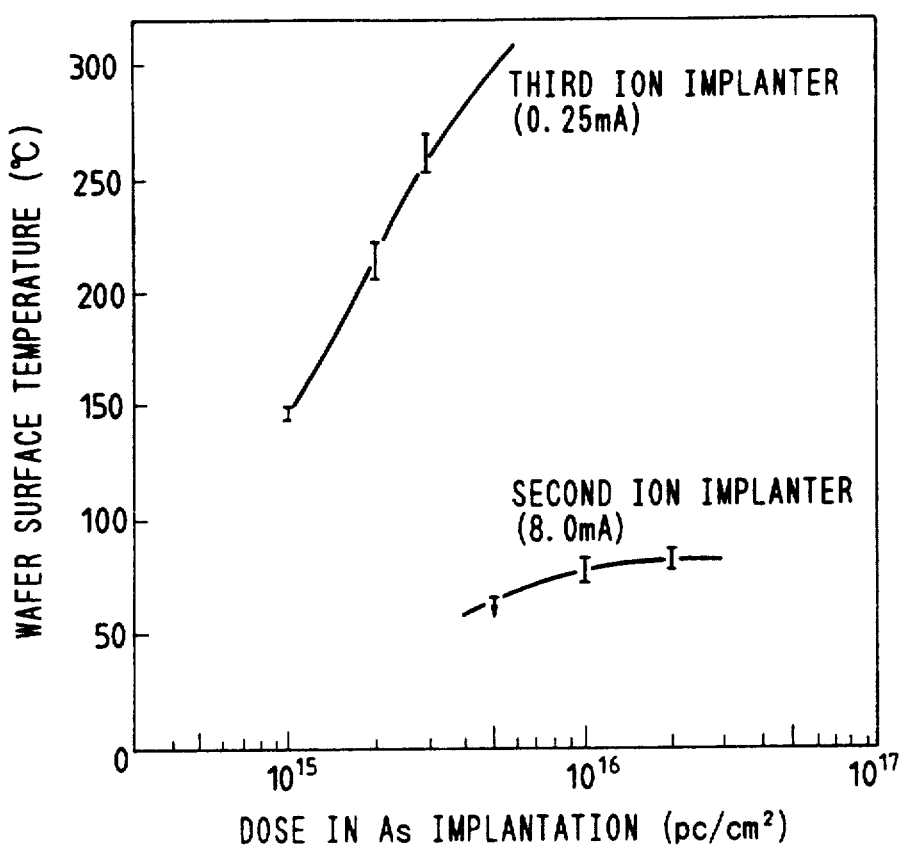
FIG. 85 is a graph showing dependence on dose of the wafer surface temperature in arsenic ion implantation.

As shown in FIG. 85, this is presumed to be because in the third ion implanter the wafer temperature rises with increase of the ion implantation time so the defect structure of the transition region formed at the amorphous layer/non-amorphous layer interface becomes peculiar. More particularly, the wafer temperature rises as ion implantation proceeds and the thermal diffusion of defects induced by ion implantation is activated, so that a composite defect (transition region) is distributed in the wafer in a deeper position than the position of the defects formed in the initial stage of ion implantation. Further, when the wafer temperature rises in ion implantation up to a level exceeding the recrystallization temperature of the amorphous layer, the recrystallization of the amorphous layer proceeds from the amorphous layer/non-amorphous layer interface and a recrystallized region is formed between the transition region and the amorphous layer. This is presumed to be the cause of the foregoing tendency.

The width of the transition region formed by the third ion implanter is larger than that of the transition region formed by the second ion implanter. Besides, the depth of the former was also larger than that of the latter.

Further, a comparison was made between the use of the first ion implanter and the use of the second ion implanter about the state of residual defects after the application of a heat treatment at 950° C. for 10 minutes to defect layers formed by the ion implantation of arsenic. As a result, it turned out that the residual defects were fewer in the use of the first ion implanter than in the use of the third ion implanter.

From the above results it became clear that the magnitude of beam current does not exert influence on the width and depth of the transition region and that the wafer temperature has a great influence on the width and depth of the transition region.

Further, it turned out that the narrower the transition region, the smaller the quantity of residual defects after heat treatment.

IV. Fourth Test (1) Outline

In this is test, in order to confirm that the structure of a defect layer formed by ion implantation depends strongly on the wafer temperature, samples were prepared using copper ion and using the wafer temperature in ion implantation as a parameter, ion-implanted defect layers were subjected to section analysis using a TEM.

(2) Method

Samples were prepared by the ion implantation of copper at an acceleration energy of 150 KeV, a dose of $1 \times 10^{15}/cm^2$ and wafer temperatures set at $-30°$, 50°, 200° and 400° C. Then, each sample was subjected to section analysis using a TEM.

(3) Results

At high wafer temperatures of 400° and 200° the wafer surface portion in the copper ion implanted region maintained the state of crystal silicon without becoming amorphous, and a defect capable of being recognized by the sectional observation through the TEM was not formed in the silicon crystals of the said surface portion. Further, just under the said surface portion there was distributed a fine stacking fault widely in the depth direction and this distribution showed an expanding tendency with increase of the wafer temperature.

On the other hand, when wafer temperatures in ion implantation were set at low temperatures of 50° C. and $-30°$ C., the wafer surface portion became amorphous, and at the amorphous layer/non-amorphous layer interface just under the wafer surface portion there was observed the formation of a transition region in which discontinuous defects were distributed.

Further, from a comparison between the samples obtained using wafer temperatures set at 50° C. and −30° C., respectively, it turned out that the more enhanced the wafer cooling in ion implantation, the narrower the transition region, and that the wafer temperature in ion implantation acts as an important factor in the formation of the transition region.

The reason why the defect layer formed by ion implantation depends strongly on the wafer temperature in ion implantation is presumed to be as follows. The thermal diffusion of atomic holes, interstitial atoms and composite thereof created by ion implantation is activated, so that ion implantation defects are diffused widely around the generation site of those holes and atoms. But the defects are not accumulated on the side close to the wafer surface which functions as an extinguishing site of such defects, thus affording a monocrystalline silicon layer free of residual defects, while the defects diffused deeply into the wafer form a stacking fault because there is no such extinguishing site as that of the surface. With rise of the wafer temperature, the diffusion distance of defects into the wafer becomes deeper, and for this reason it is presumed that the distribution of a fine stacking fault expands. Also in the case where an amorphous layer is formed by ion implantation, the transition region width shows an expanding tendency with rise of the wafer temperature set in ion implantation. Therefore, the thermal diffusion of defects induced by ion implantation is presumed to be a main cause of expansion of the transition region width.

V. Other Tests

For making a detailed structural analysis of the transition region at the amorphous layer/non-amorphous layer interface, the samples obtained by the ion implantation of arsenic using the first to third ion implanters were observed for crystal lattice image in the transition region by using a TEM of a high resolving power.

Atomic arrays at amorphous/non-amorphous interfaces formed by the ion implantation of arsenic using the first and third ion implanters were analyzed. As a result, concaves and convexes of about twenty atomic layers were formed at the amorphous/non-amorphous interface formed by the ion implantation of arsenic using the first ion implanter, and in the monocrystalline silicon region just thereunder there was distributed a stacking fault of about ten atomic layers.

On the other hand, at the amorphous/non-amorphous interface formed by the ion implantation of arsenic using the third ion implanter, there were formed concaves and convexes in the range of several ten atomic layers like that in the use of the first ion implanter, and in the crystal region just under the interface a more complicated stacking fault was distributed in a higher density than in the use of the first ion implanter.

From the above results of analysis it became clear that the transition region at the amorphous/non-amorphous interface comprised concaves, convexes and a stacking fault of the interface atomic level and that the higher the wafer temperature in ion implantation, the more complicated the stacking fault and the higher the density thereof. It also turned out that the reason why the wider the transition region, the easier the formation of residual defects after heat treatment, is because the stacking fault having a complicated structure is distributed widely in a high density.

In another test, in order to check the process of recovery of a defect layer, the recovery process by a low-temperature annealing of an amorphous layer formed through the ion implantation of arsenic using the first ion implanter was analyzed in section by means of a TEM.

In this case, as conditions for the ion implantation there were adopted an acceleration energy of 120 KeV and an implantation dose of $5\times 10^{15}/cm^2$, and the low-temperature heat treatment was performed for 5 minutes using a lamp annealing apparatus.

As a result, recrystallization of the amorphous layer started from the amorphous/non-amorphous interface at a heat treatment temperature of 450° C. or so, and the amount of the amorphous layer recrystallized within a certain time increased with rise of the heat treatment temperature.

Figure 86:
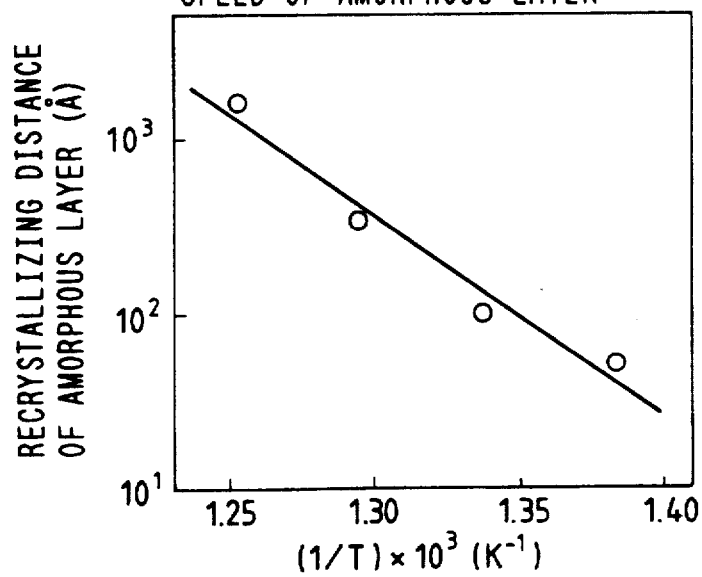
FIG. 86 is a graph obtained by plotting the amount of an amorphous layer recrystallized within a certain time with respect t the reciprocal of heat treatment temperature.

FIG. 86 shows a graph obtained by plotting the amount of the amorphous layer recrystallized within a certain time, using the reciprocal of the heat treatment temperature. In this case, an activation energy in the recrystallization of the amorphous layer is equal to an average bond energy of silicon atoms with each other.

As to the transition region, a somewhat expanding tendency was observed with increase of the heat treatment temperature from 450° C. to 475° C. and 500° C. This is presumed to be because the thermal diffusion of defects induced by ion implantation proceeds as the recrystallization proceeds.

VI. Conclusion

The transition region a formed at the amorphous/non-amorphous interface just after ion implantation is a defect composite, and the wider the defect composite, the more complicated the defect structure and the larger the greater the degree of heat treatment required for eliminating the defects.

The following table shows a relation between the width of the transition region and residual defects after heat treatment.

TABLE 1

| No. | Dose of Ion Energy (KeV/cm$^{-2}$) | Width of Transition Region (Å) | Heat Treatment | Residual Defect |
|---|---|---|---|---|
| 1 | Si/30/2E15 | 200 | 950/25 | non |
| 2 | Si/40/2E15 | 220 | 950/25 | non |
| 3 | Si/60/2E15 | 270 | 950/25 | present |
| 4 | Si/40/1E15 | 200 | 950/25 | non |
| 5 | Si/40/5E15 | 300 | 950/25 | present |
| 6 | As/20/2E15 | 50 | 900/15 | non |
| 7 | As/120/2E15 | 250 | 900/10 | present |
| 8 | As/120/5E15 | 230 | — | — |
| 9 | As/120/1E16 | 260 | — | — |
| 10 | Si/40/2E15 | 220 | 950/10 | present |
| 11 | As/40/2E15 | 220 | 950/10 | non |
| 12 | Sb/40/2E15 | 100 | 950/10 | non |

From the above table it is seen that there is no residual defect after heat treatment in the case where the width of the transition region is 200Å or smaller, while there remain defects when the width of the transition region exceeds 200Å. From this fact it is understood that the width of the transition region has a great influence on the formation of residual defects.

For obtaining a shallow junction it is necessary to diminish the degree of heat treatment, and for diminishing the degree of heat treatment it is necessary to narrow the width of the defect composite, i.e. the transition region, as noted previously. More concretely, as is apparent from the foregoing various tests, it is necessary to diminish the ion acceleration energy which is a parameter in ion implantation, decrease the dose, select an ion large in atomic weight, and decrease the wafer temperature. However, ion acceleration energy, dose, and the kind of ion, should be determined on the basis of the characteristics of the device to be manufactured. These parameters cannot be selected optionally from only the standpoint of decreasing the width of the defect composite. Also, the value of beam current is peculiar to the device used and cannot be selected optionally. Thus, the degree of freedom in setting conditions of the parameters in question is small. Besides, these parameters get entangled complicatedly and in this state influence the width of the transition region. Therefore, it is impossible to set conditions of these parameters each independently. On the other hand, as to the wafer temperature in ion implantation, the degree of freedom in setting conditions is large because it does not depend on device characteristics. In setting parameter conditions, therefore, it is more practical to determine other conditions from the standpoint of device characteristics, etc. and make only adjustment on the wafer temperature.

Figure 87A:
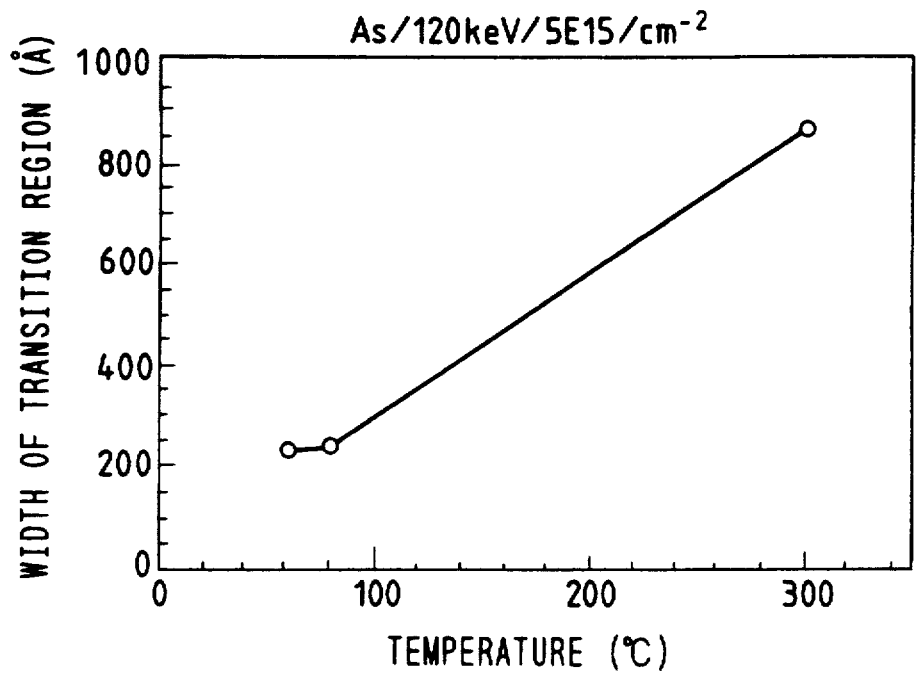
FIG. 87(a) is a graph showing a relation between the wafer temperature and the width of a transition region in the implantation of arsenic ion.
Figure 87B:
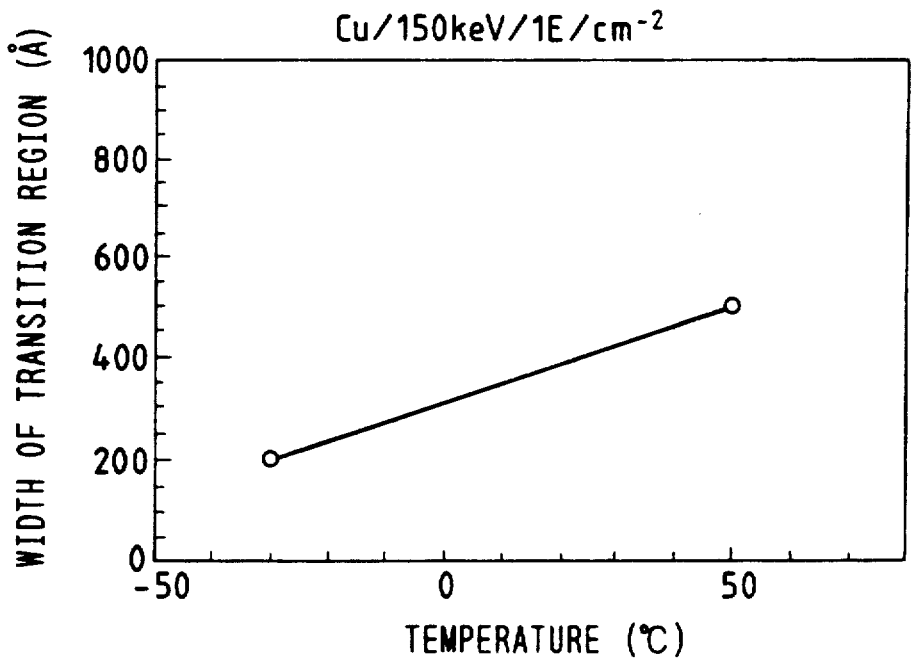
FIG. 87(b) is a graph showing a relation between the wafer temperature and the transition region width in copper ion implantation.

In FIG. 87(a) there is shown a relation between the wafer temperature and the width of the transition region in the implantation of arsenic ion at an acceleration energy of 150 KeV and a dose of $5 \times 10^{15}/cm^2$, while in FIG. 87(b) there is shown a relation between the wafer temperature and the width of the transition region in the implantation of copper ion at an acceleration energy of 150 KeV and a dose of $1 \times 10^{15}/cm^2$.

From these figures it is seen that if the temperature of the wafer, i.e., the semiconductor substrate, in ion implantation is reduced, the width of the transition region becomes smaller accordingly. Thus, it is desirable to minimize the wafer temperature. As to the junction of semiconductor regions (doped layers) which is considered necessary for devices available at present, e.g. bipolar transistors and MOSFETs, although other parameter conditions also exert influence, if the wafer temperature is set at 200° C. or lower, the width of the transition region can be controlled to 200Å or smaller, and a junction of a desired depth (about 0.2 µm or less) can be formed by a heat treatment at 950° C. for 30 minutes or so.

According to this embodiment, as is apparent from the above test results, the following effects can be attained.

By cooling the semiconductor substrate to a sufficient extent during ion implantation, it is possible to prevent or suppress the thermal diffusion of crystal defects formed in ion implantation, whereby the the width of the transition region formed at the boundary between the amorphous layer and the crystal region just thereunder can be reduced. Besides, since the generation of contaminant elements and the thermal diffusion into the semiconductor substrate are suppressed, it is possible to reduce the degree of heat treatment necessary for eliminating a defect composite and form a semiconductor region having a shallow junction.

The present invention has been described above concretely on the basis of embodiments thereof, but it goes without saying that the present invention is not limited to the above embodiments and that various modifications may be made within the scope not departing from the gist of the invention.

The present invention is also applicable to the ion implantation for a hetero junction transistor using a mixed silicon-germanium layer formed by implanting germanium ion into the surface layer of a semiconductor substrate comprising silicon according to an ion implantation method, a hetero bipolar transistor having an emitter diffusion layer formed by the ion implantation of arsenic, phosphorus, or antimony, into a mixed silicon-germanium layer, and an SOI (Silicon On Insulator) type wafer.

Further, the present invention is applicable not only to the formation of an emitter region but also to the formation of such semiconductor regions as source and drain regions of MOS.

The following is a brief description of effects obtained by typical inventions out of those exemplified above.

By sufficiently cooling the semiconductor substrate during ion implantation, it is possible to prevent or suppress the thermal diffusion of defects formed in ion implantation, whereby the width of the transition region formed at the boundary between the amorphous layer and the crystal region located just thereunder can be made small. Besides, since the generation and thermal diffusion of contaminant elements are suppressed, it is possible to reduce the degree of heat treatment necessary for eliminating a defect composite and hence it is possible to form a semiconductor integrated circuit device having a semiconductor region (doped layer) of a shallow junction.

What is claimed is:

1. An ion implantation method for implanting a desired ion into a wafer to be processed, the wafer being in an ion implantation chamber, wherein the wafer is at a temperature of at most 0° C. during the implanting of the desired ion, wherein the wafer is cooled during the implanting using a cooling device, and wherein near the wafer, in the ion implantation chamber, there is provided an auxiliary cooling device having an auxiliary cooling surface held at a temperature lower than the temperature of the wafer to prevent undesired contamination, extraneous ion, molecular condensation, adsorption and adhesion to the wafer, the auxiliary cooling device being separate from the cooling device.

2. An ion implantation method according to claim 1, wherein said auxiliary cooling surface is provided separately from one or more cryosurfaces of a cryopump for evacuating an ion implantation chamber with the wafer received therein, and the temperature of the auxiliary cooling surface can be made higher than that of the cryosurface held at the lowest temperature out of said one or more cryosurfaces.

3. An ion implantation method according to claim 2, wherein the temperature of said auxiliary cooling surface is lower at least 10° C. than the temperature of the wafer in a stand-by state.

4. A method according to claim 1, wherein said wafer is a silicon wafer.

5. A method according to claim 1, wherein the wafer is cooled so as to have a temperature of 0° C. to −150° C. during the ion implantation.

6. An ion implantation method according to claim 1, wherein, in implanting the desired ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

7. An ion implantation method according to claim 6, wherein after implanting the desired ion into the wafer to be processed, the wafer is subjected to a heat treatment so as to form a semiconductor region containing the desired ion.

8. An ion implantation method, wherein the implantation of ion is performed while a wafer to be processed resting on a wafer stage for ion implantation provided within an ion implantation chamber is cooled, during the ion implantation, to a temperature of at most 0° C., wherein the wafer is cooled using a cooling device, and wherein in the ion implantation chamber there is provided an auxiliary cooling device having an auxiliary cooling surface near the wafer, said auxiliary cooling surface being held at a temperature lower than the temperature of the wafer to prevent undesired contamination, extraneous ion, molecular condensation, adsorption and adhesion to the wafer, the auxiliary cooling device being separate from the cooling device.

9. An ion implantation method according to claim 8, using a beam current of 5 mA or more.

10. An ion implantation method according to claim 9, wherein the cooling of the wafer is performed using helium as a refrigerant in the cooling device.

11. An ion implantation method according to claim 10, wherein the cooling of the wafer is performed by utilizing an adiabatic expansion of the refrigerant in the cooling device.

12. An ion implantation method according to claim 8, wherein the wafer is a silicon wafer.

13. An ion implantation method according to claim 8, wherein, in implanting the ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

14. An ion implantation method involving implanting a desired ion into a plurality of wafers to be processed held on a wafer holding means while said wafer holding means is rotated at high speed, wherein the wafer is cooled during the ion implantation so that the wafer has a temperature of at most 0° C. during the implanting of the desired ion, the wafer holding means being held in an ion implantation chamber during said implanting, wherein the wafer is cooled using a cooling device, and wherein in the ion implantation chamber there is provided an auxiliary cooling device having an auxiliary cooling surface near the plurality of wafers, said auxiliary cooling surface being held at a temperature lower than the temperature of the plurality of wafers to prevent undesired contamination, extraneous ion, molecular condensation, adsorption and adhesion to the plurality of wafers, the auxiliary cooling device being separate from the cooling device.

15. An ion implantation method according to claim 14, wherein while the wafer is cooled, a refrigerant fluid can be circulated through said wafer holding means also during the rotation of the holding means.

16. An ion implantation method according to claim 14, wherein the plurality of wafers are silicon wafers.

17. An ion implantation method according to claim 14, wherein, in implanting the desired ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

18. A method for producing a semiconductor integrated circuit device wherein a semiconductor integrated circuit is formed on a wafer to be processed by implanting an impurity ion into the wafer, said method being characterized in that:

when an ion-implanted layer is not rendered amorphous to a satisfactory extent by implanting a desired impurity ion into the wafer at a predetermined concentration using an ion implanter whereby the wafer is held at room temperature in a stand-by state, the wafer is cooled to a temperature at which the ion-implanted layer is rendered amorphous to a satisfactory extent, and in this state the desired impurity ion is implanted into the wafer at said predetermined concentration, with the wafer cooled to a temperature of at most 0° C. while implanting the desired impurity ion, the wafer being held in an ion implantation chamber during said implanting, wherein the wafer is cooled while implanting the desired impurity ion using a cooling device, and wherein in the ion implantation chamber there is provided an auxiliary cooling device having an auxiliary cooling surface near the wafer, said auxiliary cooling surface being held at a temperature lower than the temperature of the wafer to prevent undesired contamination, extraneous ion, molecular condensation, adsorption and adhesion to the wafer, the auxiliary cooling device being separate from the cooling device.

19. A method according to claim 18, wherein said desired impurity ion is boron element ion.

20. A method according to claim 18, wherein said temperature at which the ion-implanted layer is rendered amorphous, to which the wafer is cooled, is −50° C. to −100° C., and wherein the wafer is cooled to a temperature of −50° C. to −100° C. during implantation of the desired impurity ion.

21. A method according to claim 18, wherein said temperature at which the ion-implanted layer is rendered amorphous, to which the wafer is cooled, is −5° C. to −100° C.

22. A method according to claim 18, wherein the wafer is a silicon wafer.

23. A method according to claim 18, wherein, in implanting the desired impurity ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

24. A method for producing a semiconductor integrated circuit device, comprising:

a process of implanting an impurity ion which comprises a predetermined molecular ion into a first main surface, of a wafer, on which a semiconductor device is to be formed, the impurity ion being implanted while said first main surface is in a cooled state having a temperature of at most 0° C., the wafer being held in an ion implantation chamber during said implanting, where the wafer is cooled, to provide said cooled state, using a cooling device, and wherein in the ion implantation chamber there is provided an auxiliary cooling device having an auxiliary cooling surface near the wafer, said auxiliary cooling surface being held at a temperature lower than the temperature of the wafer to prevent undesired contamination, extraneous ion, molecular condensation, adsorption and adhesion to the wafer, the auxiliary cooling device being separate from the cooling device.

25. A method according to claim 24, wherein said molecular ion contains boron.

26. A method according to claim 24, wherein said first main surface is a main surface of a silicon wafer.

27. A method according to claim 24, wherein, in implanting the impurity ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

28. An ion implantation method, wherein the implantation of ion into a wafer is performed while the wafer to be processed is at a temperature of at most room temperature during the ion implantation, the ion implantation being performed with the wafer in an ion implantation chamber, wherein the wafer is cooled, to provide the wafer at a temperature of at most room temperature, using a cooling device, and wherein in the ion implantation chamber there is provided an auxiliary cooling device having an auxiliary cooling surface near the wafer, said auxiliary cooling surface being held at a temperature lower than the temperature of the wafer to prevent undesired contamination, extraneous ion, molecular condensation, adsorption and adhesion to the wafer, the auxiliary cooling device being separate from the cooling device.

29. An ion implantation method according to claim 28, wherein said temperature of the wafer, during the implantation of ion, is at most 0° C.

30. An ion implantation method according to claim 29, wherein, during the ion implantation, the wafer is cooled so as to achieve said temperature of at most 0° C.

31. An ion implantation method according to claim 29, wherein said temperature of the wafer, during the implantation of ion, is 0° C. to −150° C.

32. An ion implantation method according to claim 28, wherein, during the implantation, the wafer is cooled so as to achieve said temperature of at most room temperature.

33. An ion implantation method according to claim 28, wherein said wafer is a semiconductor wafer.

34. An ion implantation method according to claim 28, wherein the implantation of ion is performed so as to form impurity-doped regions in the semiconductor wafer.

35. An ion implantation method according to claim 28, wherein said wafer is a silicon wafer.

36. An ion implantation method according to claim 35, wherein the implantation of ion is performed so as to form impurity-doped regions in the silicon wafer.

37. An ion implantation method according to claim 28, wherein, in implanting the ion into the wafer to be processed and performing a subsequent heat treatment, a main surface portion of the wafer is rendered amorphous, with a remaining part of the wafer being non-amorphous and a transition region being located between the main surface portion and the remaining part, said transition region having a width that is not larger than 200Å.

* * * * *

UNITED STATES PATENT AND TRADEMARK OFFICE
CERTIFICATE OF CORRECTION

PATENT NO. : 5,244,820
DATED : September 14, 1993
INVENTOR(S) : T. KAMATA, M. HONDA, J. SUGIURA, N. OWADA & H. YAMAGUCHI It is certified that error appears in the above-identified patent and that said Letters Patent is hereby corrected as shown below:

On the title page of the above-identified patent, left-hand column, in the line between "all of Japan" and "[21] Appl. No. 921,988", insert the following:

--[73] Assignee: Hitachi, Ltd., Tokyo, Japan--

Signed and Sealed this

Sixteenth Day of May, 1995

Attest:

BRUCE LEHMAN

*Attesting Officer*      *Commissioner of Patents and Trademarks*